(12) United States Patent
Choung et al.

(10) Patent No.: US 12,408,547 B2
(45) Date of Patent: Sep. 2, 2025

(54) ORGANOMETALLIC COMPOUND, ORGANIC LIGHT EMITTING DIODE AND ORGANIC LIGHT EMITTING DEVICE INCLUDING THE ORGANOMETALLIC COMPOUND

(71) Applicant: LG DISPLAY CO., LTD., Seoul (KR)

(72) Inventors: Ku-Sun Choung, Paju-si (KR); Hee-Jun Park, Paju-si (KR); Sung-Jin Park, Paju-si (KR); Jae-Min Moon, Paju-si (KR); Yoo-Jeong Jeong, Paju-si (KR); Hee-Ryong Kang, Hwaseong-si (KR); Kyoung-Jin Park, Hwaseong-si (KR); Hyun Kim, Hwaseong-si (KR); Ga-Won Lee, Hwaseong-si (KR); Seung-Hyun Yoon, Hwaseong-si (KR)

(73) Assignee: LG DISPLAY CO., LTD., Seoul (KR)

( * ) Notice: Subject to any disclaimer, the term of this patent is extended or adjusted under 35 U.S.C. 154(b) by 819 days.

(21) Appl. No.: 17/544,366

(22) Filed: Dec. 7, 2021

(65) Prior Publication Data
US 2022/0199919 A1    Jun. 23, 2022

(30) Foreign Application Priority Data
Dec. 17, 2020   (KR) .................. 10-2020-0177499

(51) Int. Cl.
*H10K 85/40* (2023.01)
*C07F 15/00* (2006.01)
(Continued)

(52) U.S. Cl.
CPC ......... *H10K 85/40* (2023.02); *C07F 15/0033* (2013.01); *C09K 11/06* (2013.01);
(Continued)

(58) Field of Classification Search
CPC ...... H10K 85/342; H10K 85/40; H10K 50/19; C07F 15/0033; C09K 2211/185
See application file for complete search history.

(56) References Cited

U.S. PATENT DOCUMENTS 8,946,697 B1     2/2015 Ma et al.
2018/0090686 A1*  3/2018 Yoon .................... H10K 85/622
(Continued)

FOREIGN PATENT DOCUMENTS

CN   105646590 A   6/2016
CN   107880025 A   4/2018
(Continued)

*Primary Examiner* — Vu A Nguyen
(74) *Attorney, Agent, or Firm* — Birch, Stewart, Kolasch & Birch, LLP

(57) ABSTRACT

The present disclosure relates to an organometallic compound in Formula below and an organic light emitting diode and an organic light emitting device including the organometallic compound. The organometallic compound provides high emitting efficiency and longer lifespan, and the organic light emitting diode and the organic light emitting device have advantages in the emitting efficiency and the lifespan.

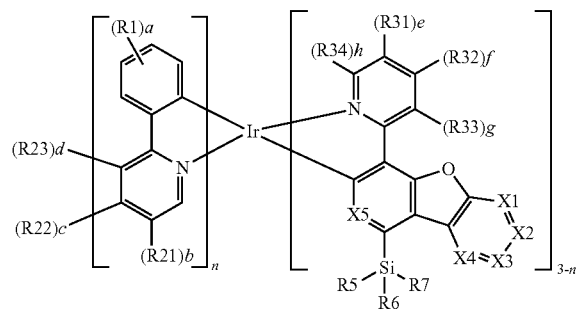

20 Claims, 7 Drawing Sheets

(51) Int. Cl.
    *C09K 11/06*       (2006.01)
    *H10K 50/11*       (2023.01)
    *H10K 50/19*       (2023.01)
    *H10K 101/10*     (2023.01)

(52) U.S. Cl.
    CPC .... *C07B 2200/05* (2013.01); *C09K 2211/104* (2013.01); *C09K 2211/1055* (2013.01); *C09K 2211/185* (2013.01); *H10K 50/11* (2023.02); *H10K 50/19* (2023.02); *H10K 2101/10* (2023.02)

(56) References Cited

U.S. PATENT DOCUMENTS

| | | |
|---|---|---|
| 2018/0287076 A1 | 10/2018 | Tsai et al. |
| 2019/0051844 A1 | 2/2019 | Ji et al. |
| 2020/0287143 A1* | 9/2020 | Kim .................... H10K 85/342 |

FOREIGN PATENT DOCUMENTS

| | | | | |
|---|---|---|---|---|
| CN | 111094310 A | 5/2020 | | |
| KR | 10-2014-0060241 A | 5/2014 | | |
| WO | WO 2019/093822 A1 | 5/2019 | | |
| WO | WO-2019093622 A1 * | 5/2019 | .......... | C07F 15/0033 |

* cited by examiner

ORGANOMETALLIC COMPOUND, ORGANIC LIGHT EMITTING DIODE AND ORGANIC LIGHT EMITTING DEVICE INCLUDING THE ORGANOMETALLIC COMPOUND

CROSS-REFERENCE TO RELATED APPLICATIONS

The present application claims the priority benefit of Korean Patent Application No. 10-2020-0177499 filed in the Republic of Korea on Dec. 17, 2020, which is hereby incorporated by reference in its entirety into the present application.

BACKGROUND OF THE DISCLOSURE

Technology Field

The present disclosure relates to an organometallic compound, and more specifically, to an organometallic compound having improved emitting efficiency and lifespan and an organic light emitting diode (OLED) and an organic light emitting device including the organometallic compound.

Discussion of the Background Art

As requests for a flat panel display device having a small occupied area have been increased, an organic light emitting display device, which can be referred to as an organic electroluminescent device, including an OLED has been the subject of recent research and development.

The OLED includes an electron injection electrode, i.e., a cathode, a hole injection electrode, i.e., an anode, and an organic light emitting layer, which is disposed between the electron injection electrode and the hole injection electrode and includes a host and a dopant. The OLED emits light by injecting electrons from a cathode as an electron injection electrode and holes from an anode as a hole injection electrode into an an organic light emitting layer, combining the electrons with the holes, generating an exciton, and transforming the exciton from an excited state to a ground state. A flexible substrate, for example, a plastic substrate, can be used as a base substrate where elements are formed. In addition, the organic light emitting display device can be operated at a voltage (e.g., 10V or below) lower than a voltage required to operate other display devices. Moreover, the organic light emitting display device has advantages in the power consumption and the color sense.

The dopant can be classified into a fluorescent material and a phosphorescent material.

In the fluorescent material, only singlet exciton is involved in the light emission such that the related art fluorescent material has low emitting efficiency. In the phosphorescent material, both the singlet exciton and the triplet exciton are involved in the light emission such that the phosphorescent material has higher emitting efficiency than the fluorescent material. However, the metal complex compound, which is a typical phosphorescent material, can have a short emitting lifespan and thus can have a limitation in commercialization. Accordingly, new compound having improved emitting efficiency and the lifespan is needed.

SUMMARY OF THE DISCLOSURE

The present disclosure is directed to an organometallic compound, an OLED and an organic light emitting device including the organometallic compound that substantially obviate one or more of the problems associated with the limitations and disadvantages of the related conventional art.

Additional features and advantages of the present disclosure are set forth in the description which follows, and will be apparent from the description, or evident by practice of the present disclosure. The objectives and other advantages of the present disclosure are realized and attained by the features described herein as well as in the appended drawings.

To achieve these and other advantages in accordance with the purpose of the embodiments of the present disclosure, as described herein, an aspect of the present disclosure provides an organometallic compound represented in Formula 1:

[Formula 1]

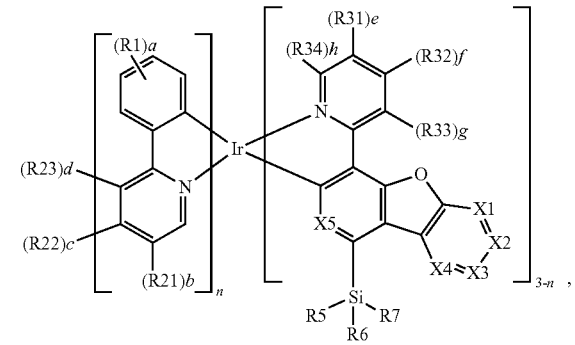

wherein each of X1 to X5 is independently N or $CR^4$, wherein each of R1, R21, R22, R23, R31, R32, R33 and R34 is independently selected from the group consisting of deuterium (D), halogen atom, C1 to C10 alkyl group unsubstituted or substituted with D or halogen atom, C3 to C20 cycloalkyl group unsubstituted or substituted with D, C6 to C30 aryl group unsubstituted or substituted with D or C1 to C10 alkyl and C3 to C30 heteroaryl group unsubstituted or substituted with D or C1 to C10 alkyl, wherein $R^4$ is selected from the group consisting of hydrogen (H), D, halogen atom, C1 to C10 alkyl group unsubstituted or substituted with D, C3 to C20 cycloalkyl group unsubstituted or substituted with D, C6 to C30 aryl group unsubstituted or substituted with D or C1 to C10 alkyl and C3 to C30 heteroaryl group unsubstituted or substituted with D or C1 to C10 alkyl, wherein each of R5, R6 and R7 is independently C1 to C10 alkyl group, and wherein each of a to h is independently 0 or 1, and n is an integer of 0 to 2.

Another aspect of the present disclosure provides an organic light emitting diode comprising a first electrode, a second electrode facing the first electrode, and a first emitting unit positioned between the first and second electrodes and including a first emitting material layer, wherein the first emitting material layer includes the above organometallic compound.

Another aspect of the present disclosure provides is an organic light emitting device comprising a substrate; and an organic light emitting diode disposed on the substrate, wherein the organic light emitting diode includes a first electrode, a second electrode facing the first electrode, and a first emitting unit positioned between the first and second electrodes and including a first emitting material layer, wherein the first emitting material layer includes the above organometallic compound.

It is to be understood that both the foregoing general description and the following detailed description are exemplary and explanatory and are intended to further explain the present disclosure as claimed.

BRIEF DESCRIPTION OF THE DRAWINGS

The accompanying drawings, which are included to provide a further understanding of the present disclosure and are incorporated in and constitute a part of this specification, illustrate embodiments of the present disclosure and together with the description serve to explain the principles of the present disclosure.

DETAILED DESCRIPTION OF THE EMBODIMENTS

Figure 1:
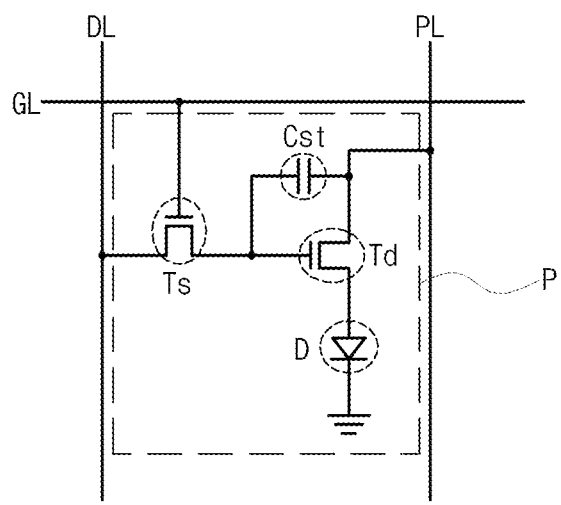
FIG. 1 is a schematic circuit diagram illustrating an organic light emitting display device of the present disclosure.

Reference will now be made in detail to some of the examples and preferred embodiments, which are illustrated in the accompanying drawings.

An organometallic compound of the present disclosure provides improved emitting efficiency and improved lifespan. The organometallic compound according to one or more embodiments of the present disclosure has a structure of Formula 1.

[Formula 1]

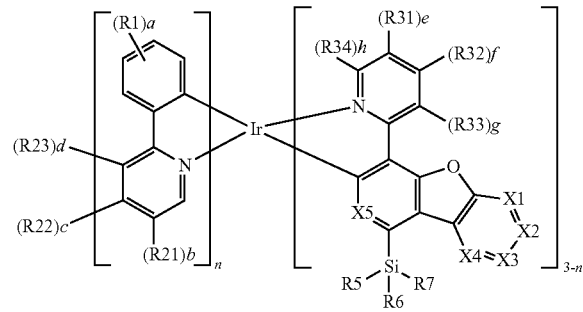

In Formula 1, each of X1 to X5 is independently N or $CR^4$, and each of R1, R21, R22, R23, R31, R32, R33 and R34 is independently selected from the group consisting of deuterium (D), halogen atom, C1 to C10 alkyl group unsubstituted or substituted with D or halogen atom, C3 to C20 cycloalkyl group unsubstituted or substituted with D, C6 to C30 aryl group unsubstituted or substituted with D or C1 to C10 alkyl and C3 to C30 heteroaryl group unsubstituted or substituted with D or C1 to C10 alkyl. $R^4$ is selected from the group consisting of hydrogen (H), D, halogen atom, C1 to C10 alkyl group unsubstituted or substituted with D, C3 to C20 cycloalkyl group unsubstituted or substituted with D, C6 to C30 aryl group unsubstituted or substituted with D or C1 to C10 alkyl and C3 to C30 heteroaryl group unsubstituted or substituted with D or C1 to C10 alkyl, and each of R5, R6 and R7 is independently C1 to C10 alkyl group. In addition, each of a to h is independently 0 or 1, and n is an integer of 0 to 2.

Namely, the organometallic compound is an iridium (Ir) complex. The organometallic compound includes a first ligand, which includes a pyridine moiety and a fused-ring moiety including oxygen (O) and being connected (combined, linked or joined) to the pyridine moiety, and an alkylsilyl group is connected to a specific position of the fused-ring moiety. The organometallic compound provides light having a wavelength range of about 500 to 540 nm, preferably about 520 to 525 nm. In the OLED and the organic light emitting device including the organometallic compound of the present invention, the emitting efficiency and the lifespan are improved.

For example, each of R1, R21, R22 and R23 can be independently unsubstituted C1 to C10 alkyl group, e.g., methyl. Each of R31, R32, R33 and R34 can be independently selected from the group consisting of unsubstituted C1 to C10 alkyl group, e.g., methyl, tert-butyl, neopentyl, unsubstituted C1 to C10 cycloalkyl group, e.g., cyclopentyl, and D-substituted C1 to C10 alkyl group, e.g., $CD_3$.

The organometallic compound of the present disclosure can further include a second ligand including a benzene moiety and a pyridine moiety connected to the benzene moiety. In the second ligand, at least one of hydrogens in the pyridine moiety can be substituted. Namely, in Formula 1, n can be 1 or 2, and at least one of b, c and d can be 1.

For example, in Formula 1, b can be 1, and c and d can be 0. The organometallic compound can be represented by Formula 2-1.

[Formula 2-1]

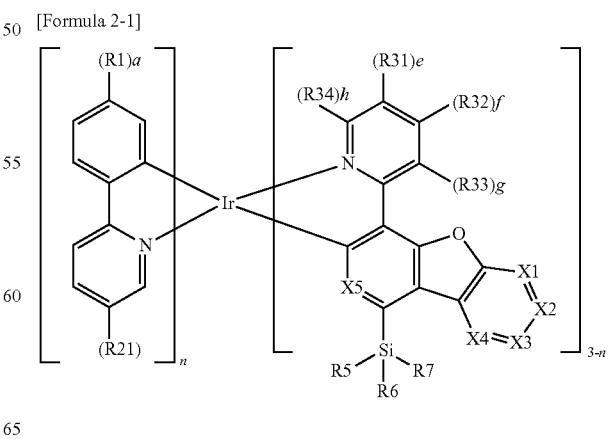

In addition, in the organometallic compound of the present disclosure, at least one of hydrogens in the pyridine moiety in the first ligand can be substituted. Namely, in Formula 1, at least one of e, f, g and h can be 1.

For example, in Formula 1, e can be 1, and f to h can be 0. The organometallic compound can be represented by Formula 2-2.

[Formula 2-2]

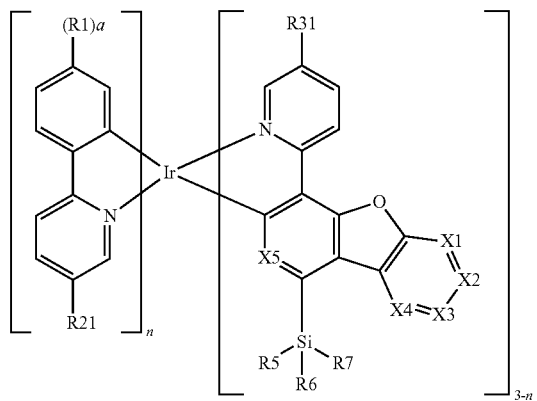

Alternatively, in Formula 1, f can be 1, and e, g and h can be 0. The organometallic compound can be represented by Formula 2-3.

[Formula 2-3]

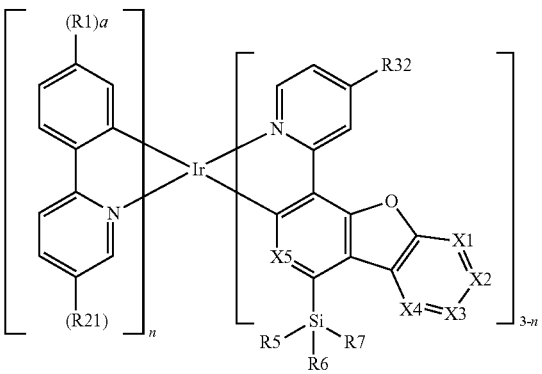

The organometallic compound in Formula 1 includes Ir as a central coordinate metal with the first ligand. The first ligand includes the pyridine moiety and the fused-ring moiety including O, and the alkylsilyl group is connected to a specific position of the fused-ring moiety. The OLED and the organic light emitting device including the organometallic compound provides improved emitting efficiency and lifespan.

In addition, the organometallic compound can further include the second ligand, which includes the benzene moiety and the pyridine moiety connected to the benzene moiety, and at least one of hydrogens in the pyridine moiety of the second ligand can be substituted with unsubstituted C1 to C10 alkyl. (Formula 2-1) As a result, in the OLED and the organic light emitting device including the organometallic compound, the emitting efficiency and the lifespan are further improved.

Moreover, at least one of hydrogens in the pyridine moiety of the first ligand can be substituted with unsubstituted or D-substituted C1 to C10 alkyl or unsubstituted C1 to C10 cycloalkyl group. (Formula 2-2 or 2-3) As a result, in the OLED and the organic light emitting device including the organometallic compound, the emitting efficiency and the lifespan are further improved.

Particularly, when the hydrogen in a second position of the pyridine moiety in the first ligand is substituted, the OLED and the organic light emitting device including the organometallic compound provides sufficiently long lifespan and high emitting efficiency.

In addition, with n=2 in Formula 1, e.g., a heteroleptic complex, the OLED and the organic light emitting device including the organometallic compound provides significantly long lifespan and high emitting efficiency.

The organometallic compound in Formula 1 can be one of the compounds in Formula 3.

[Formula 3]

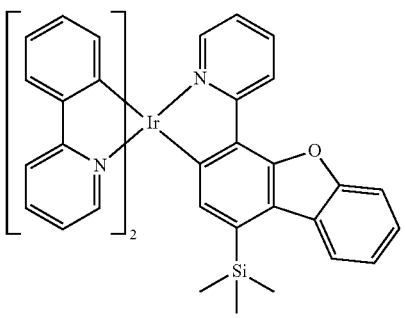

1

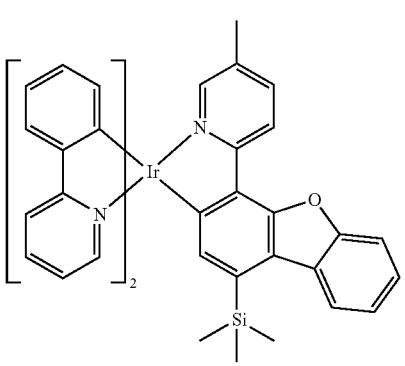

2

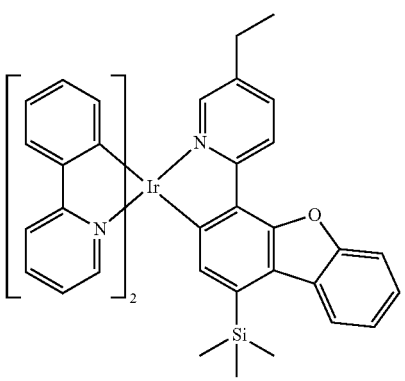

3

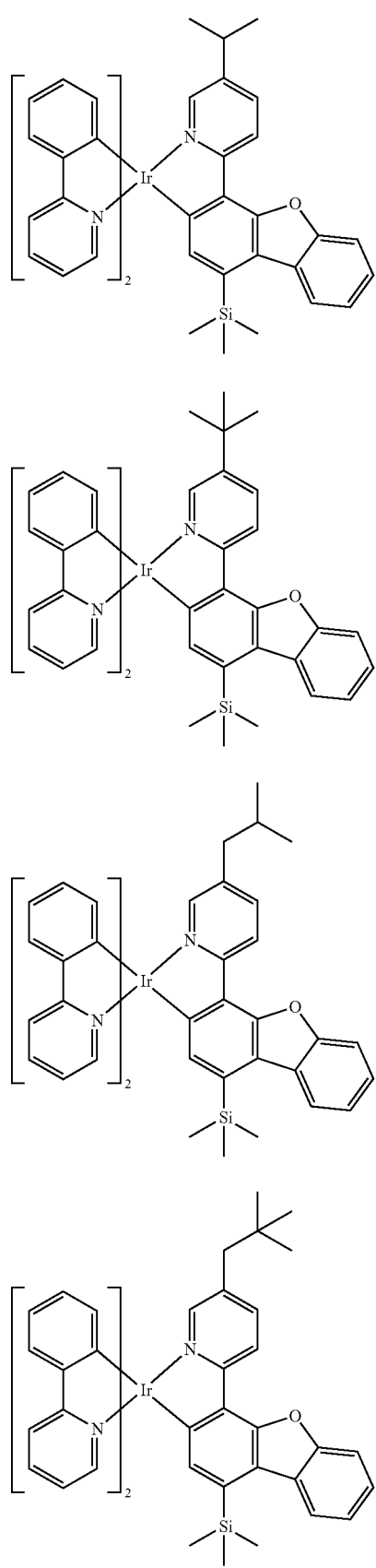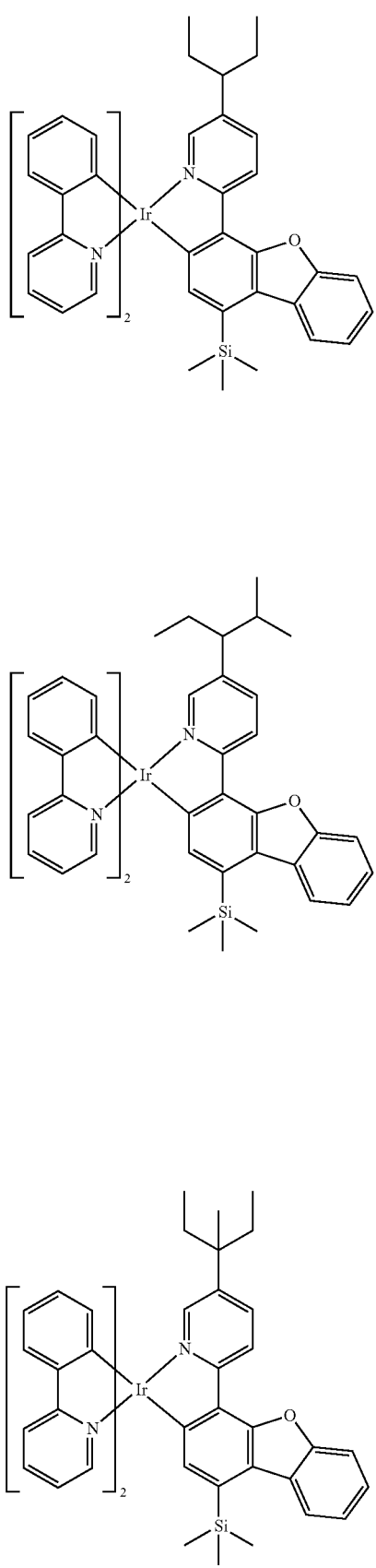

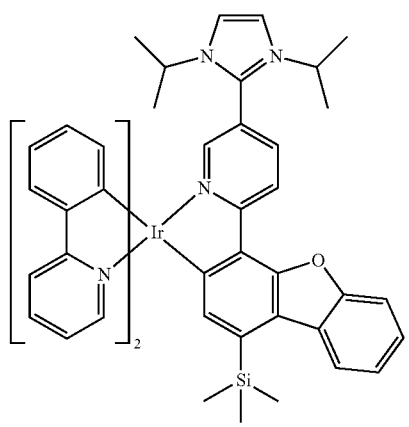
11
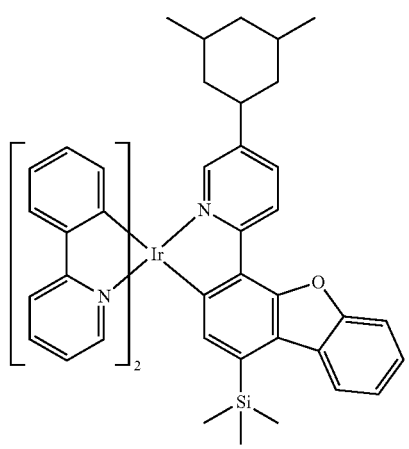
12
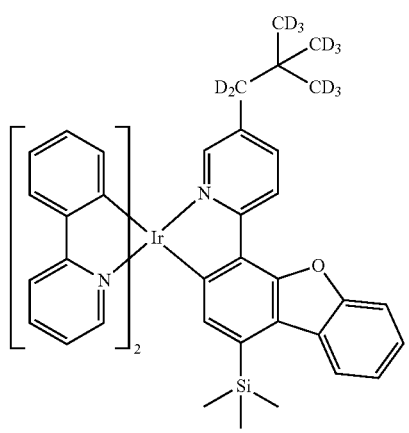
13
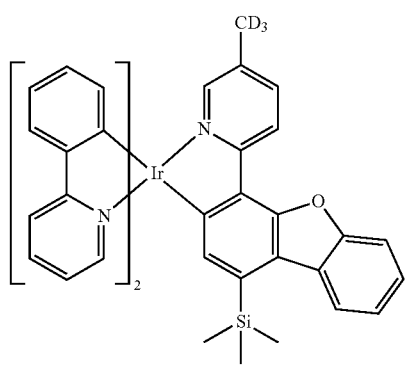
14
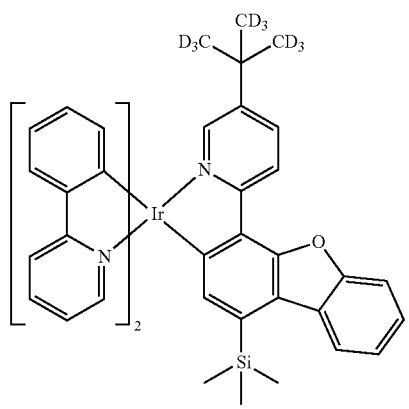
15
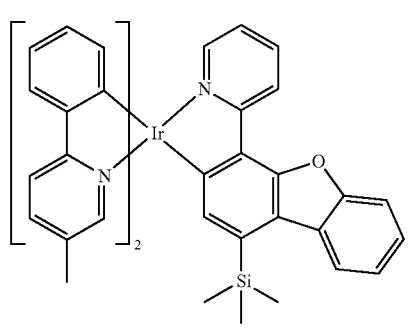
16
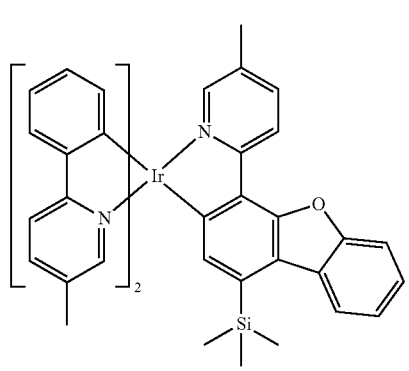
17
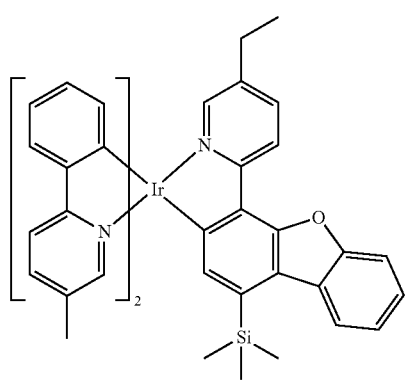
18

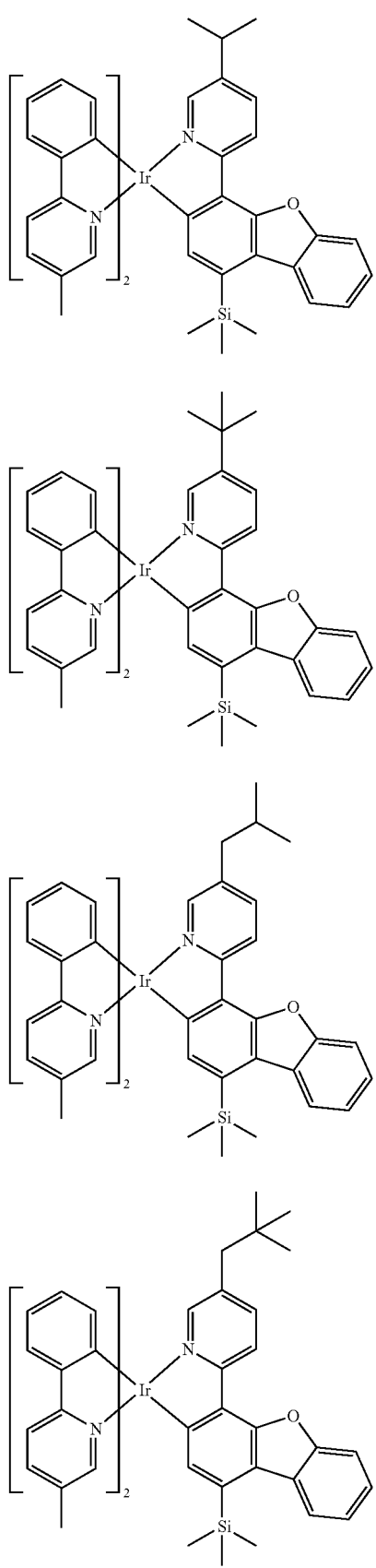
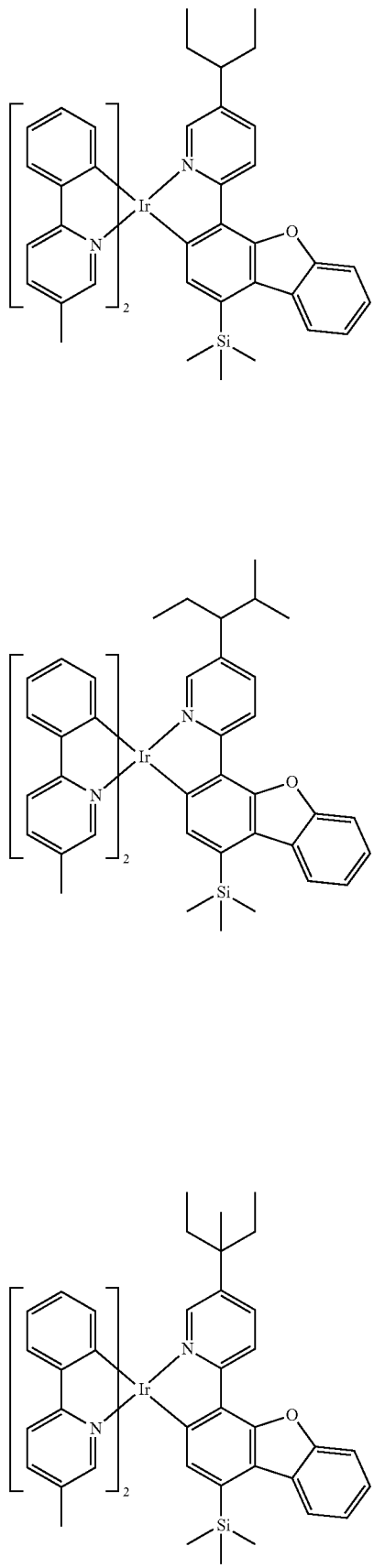

26
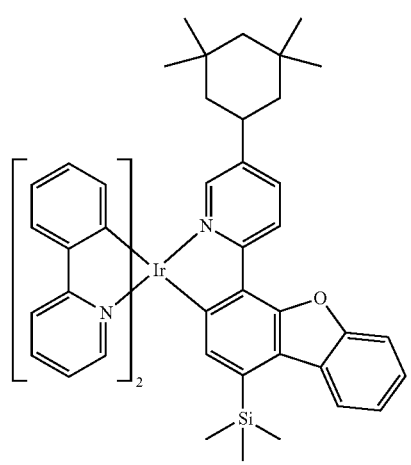
27
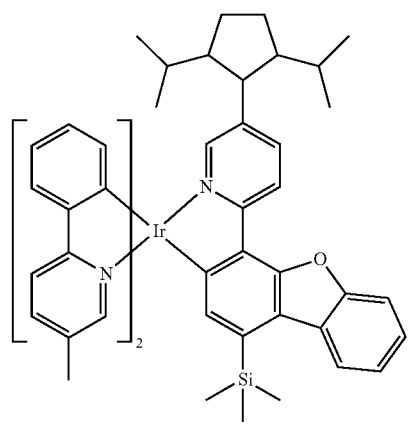
28
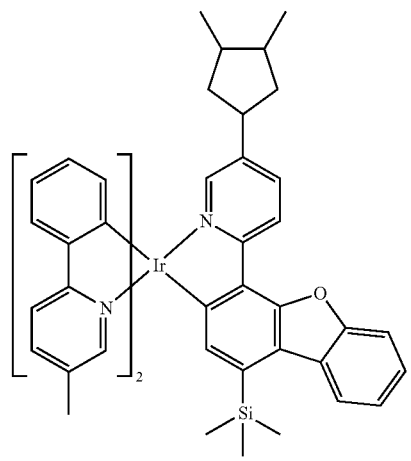
29
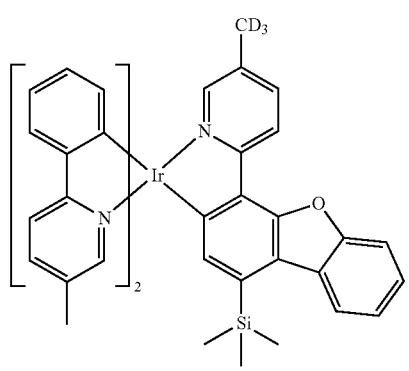
30
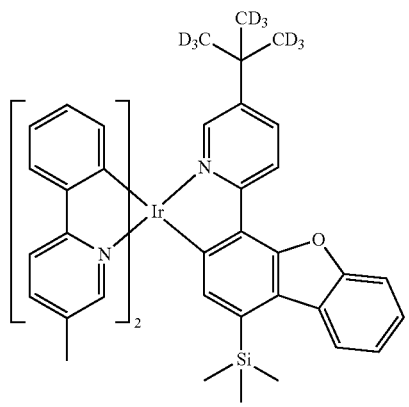
31
32
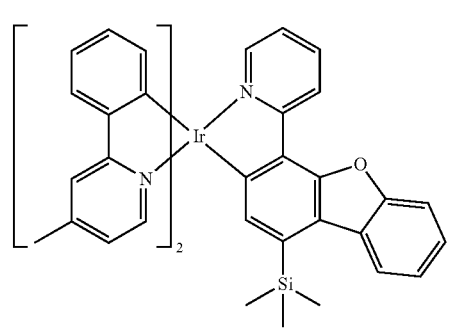

33
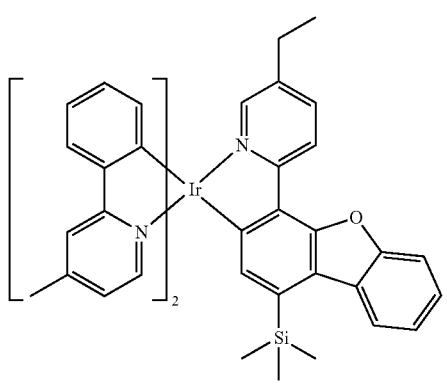
34
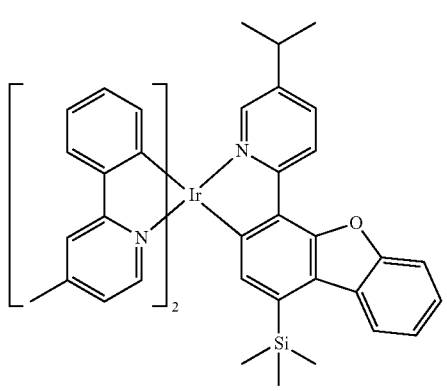
36
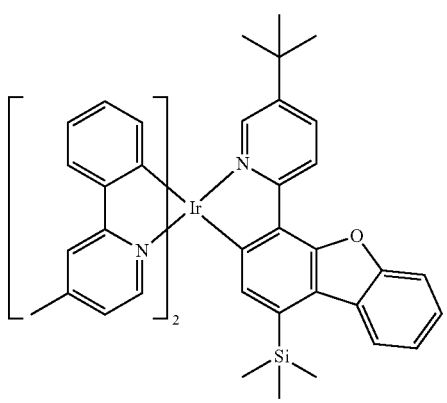
36
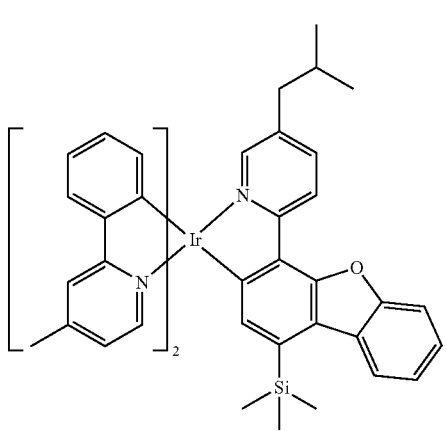
37
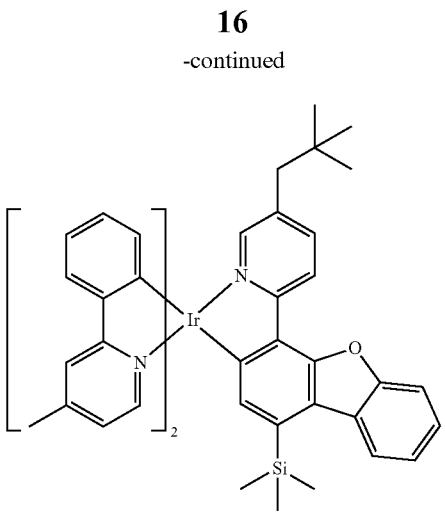
38
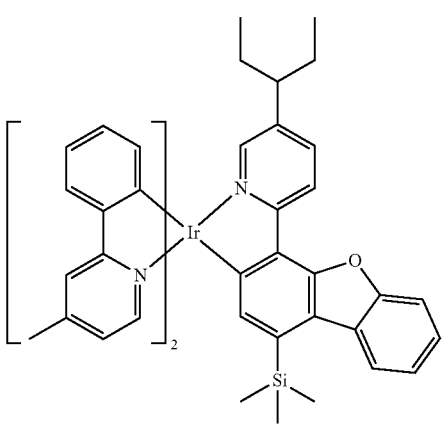
39
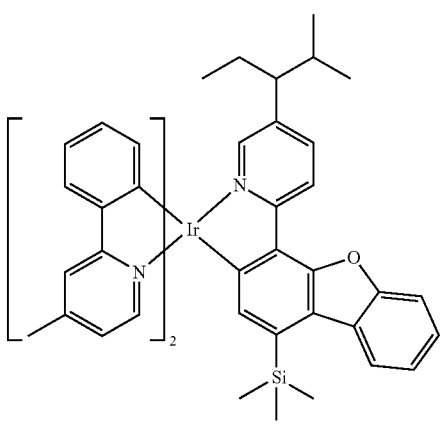

| 40 | 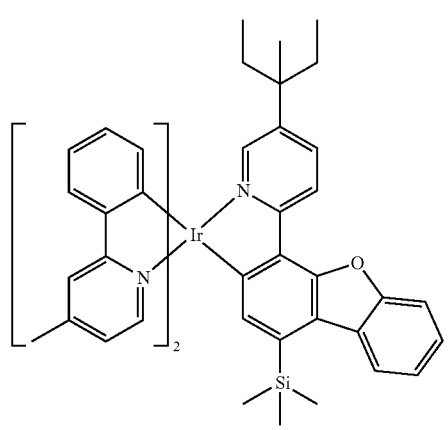 | 43 | 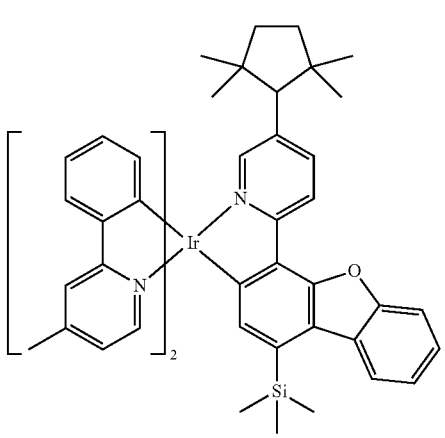 |
| 41 | 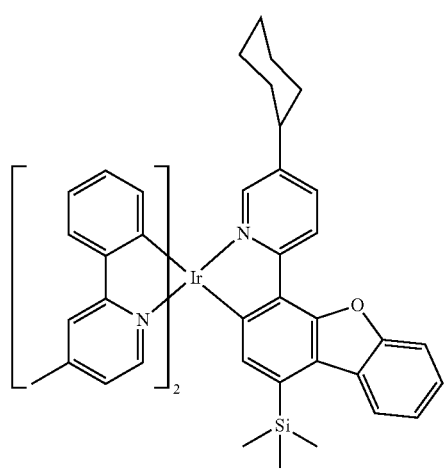 | 44 | 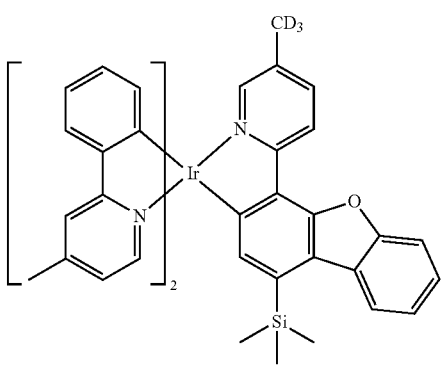 |
| | | 45 | 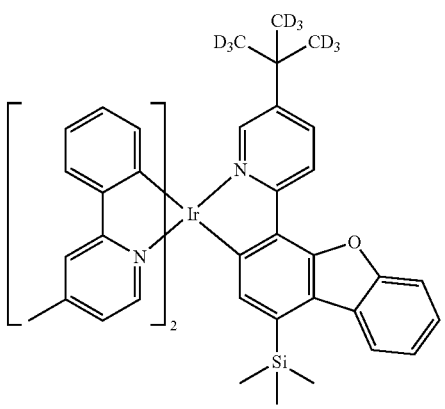 |
| 42 | 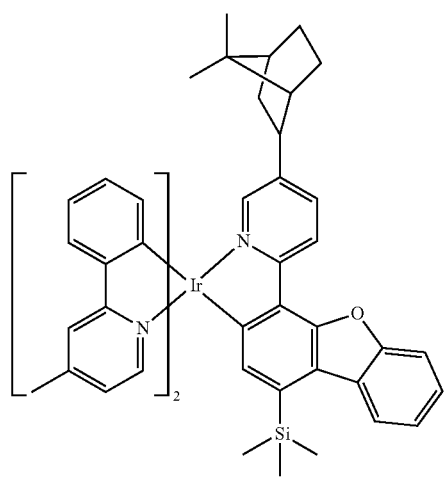 | 46 | 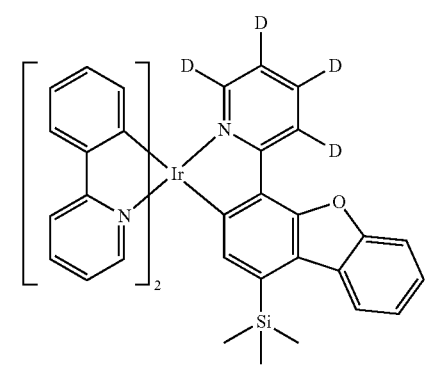 |

47
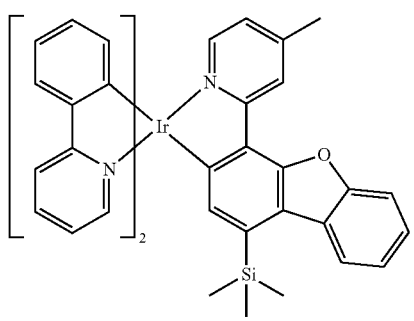
48
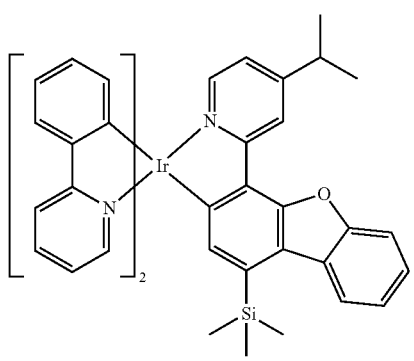
49
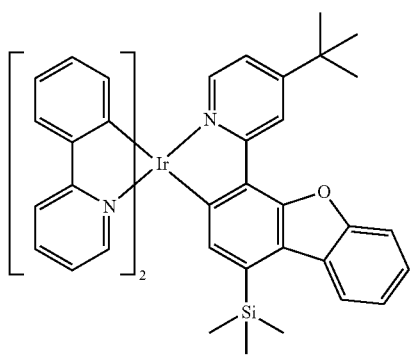
50
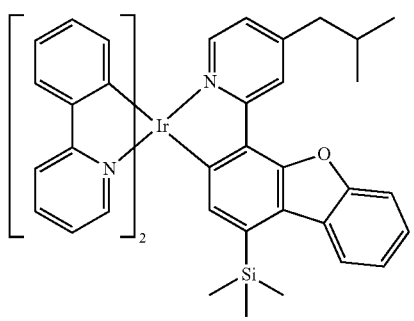
51
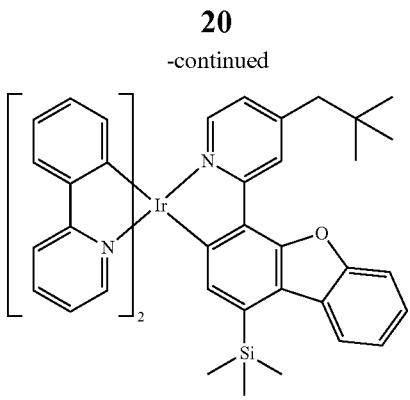
52
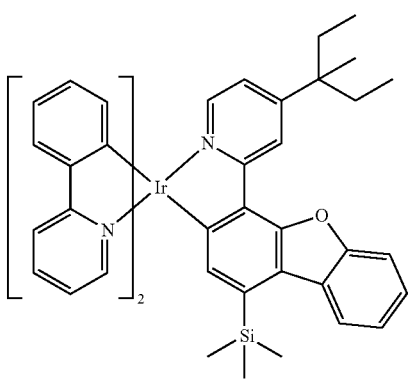
53
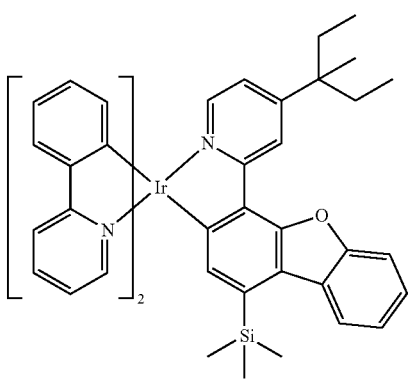
54
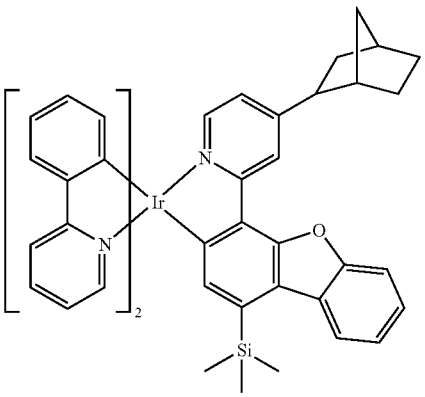

55 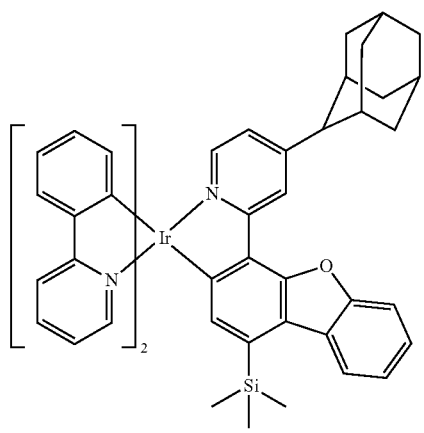
56 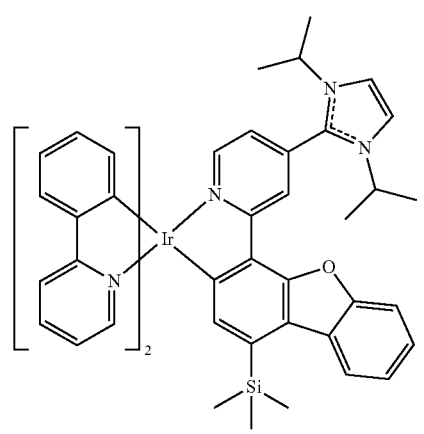
57 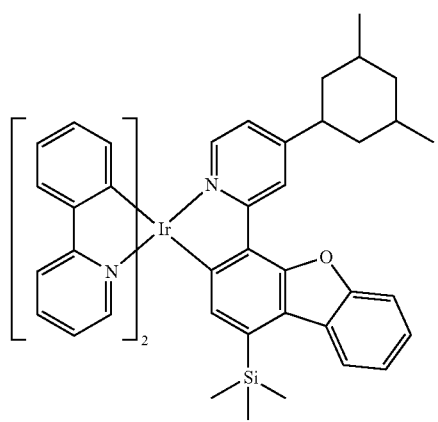
58 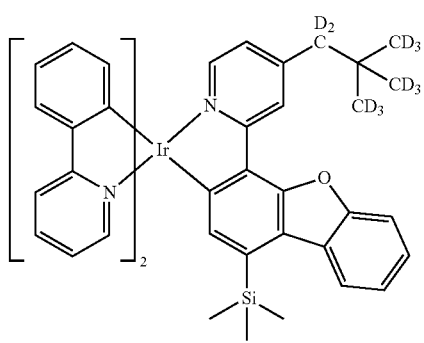
59 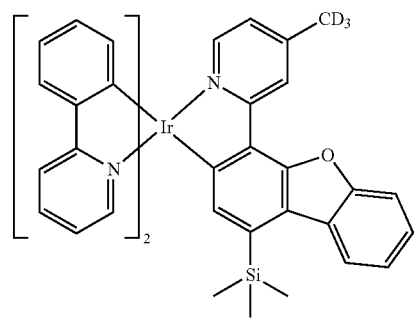
60 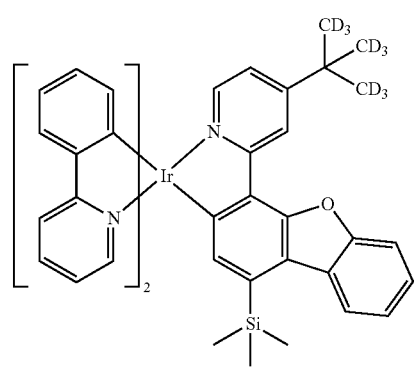
61 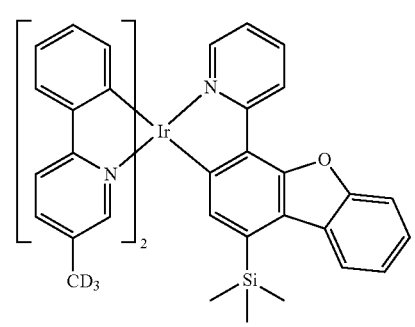
62 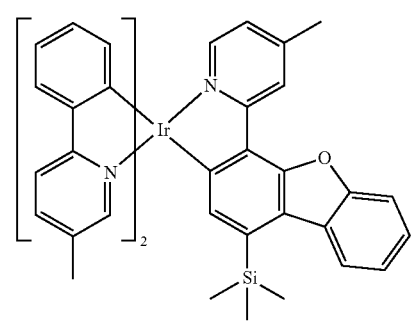

63
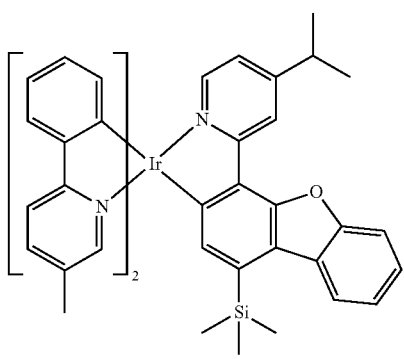
64
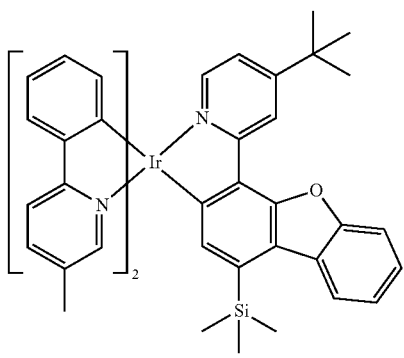
65
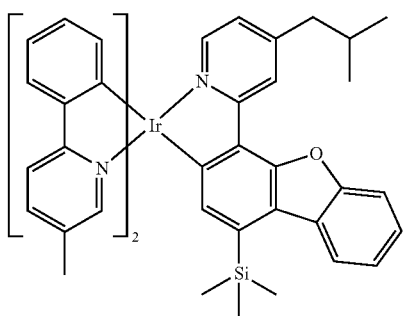
66
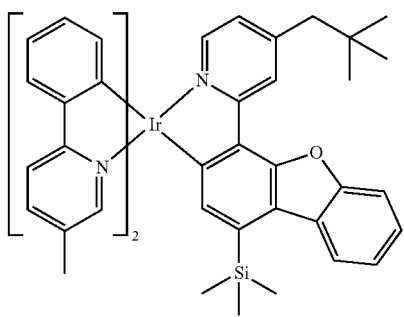
67
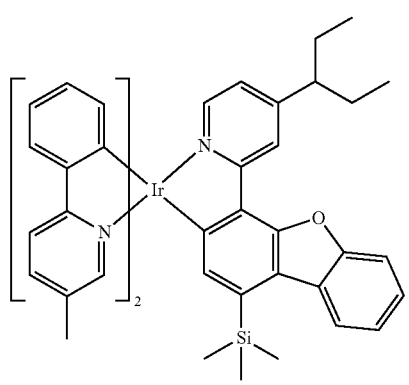
68
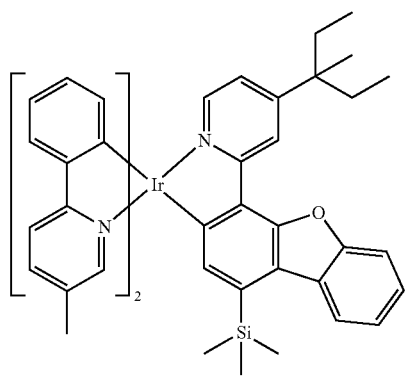
69
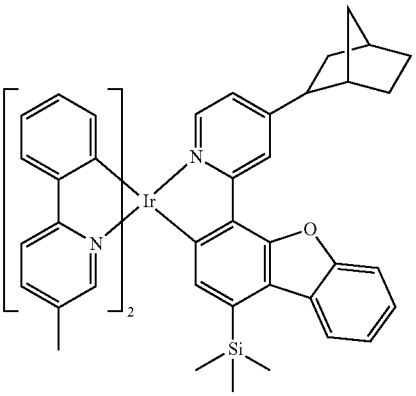
70
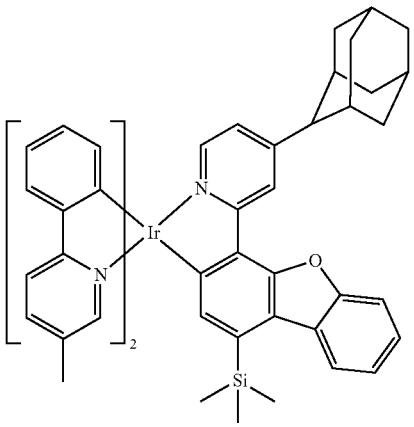

71 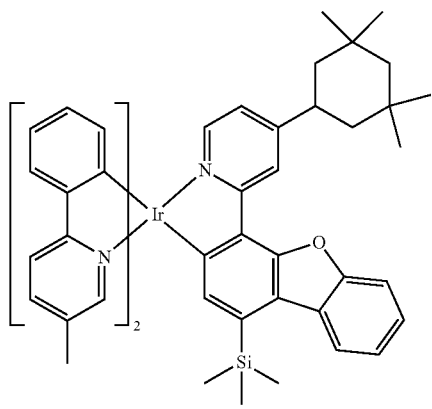
72 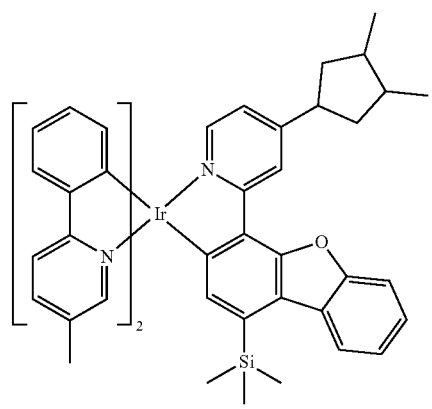
73 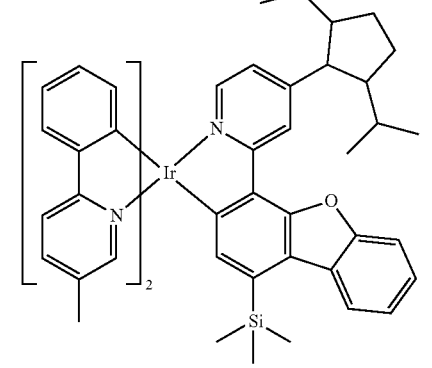
74 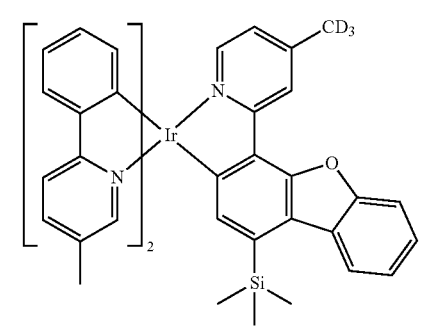
75 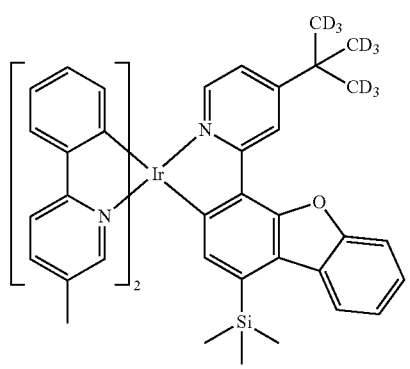
76 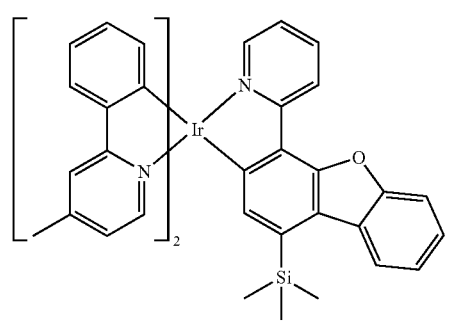
77 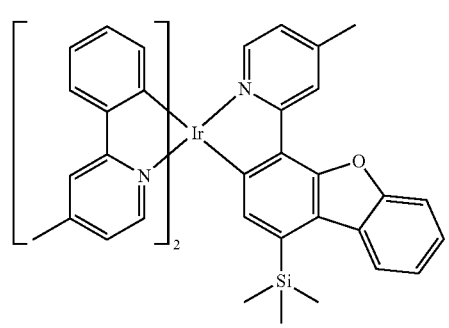
78 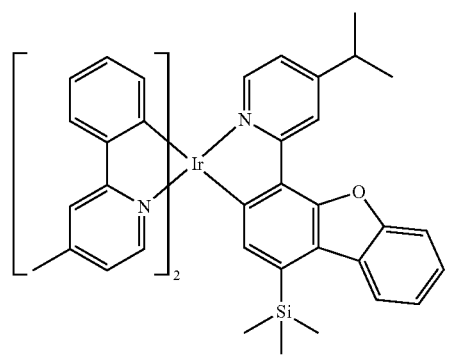

79
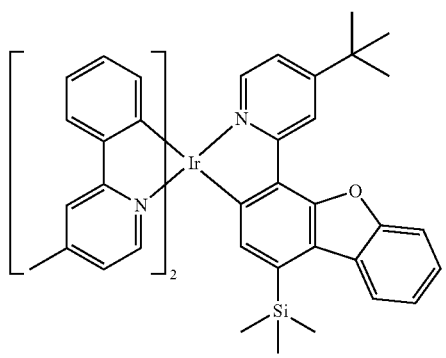
80
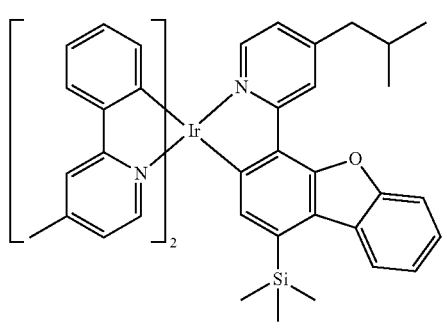
81
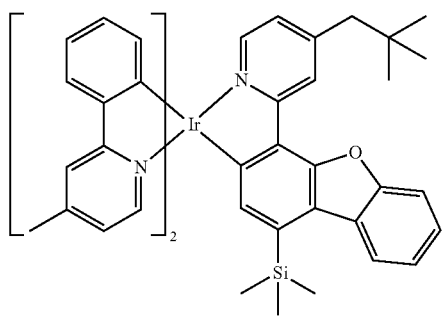
82
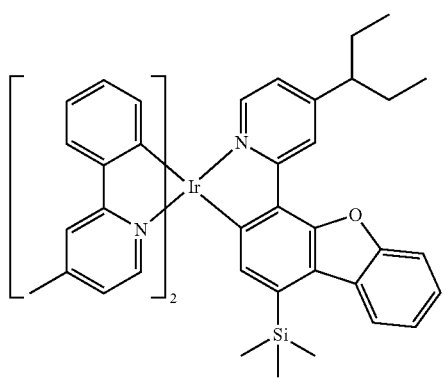
83
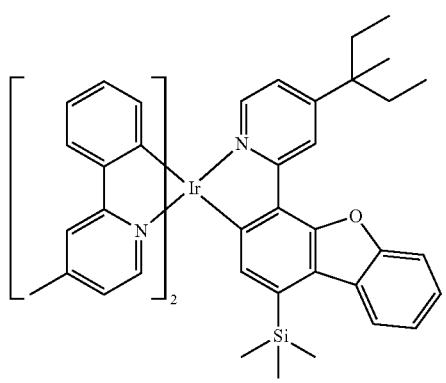
84
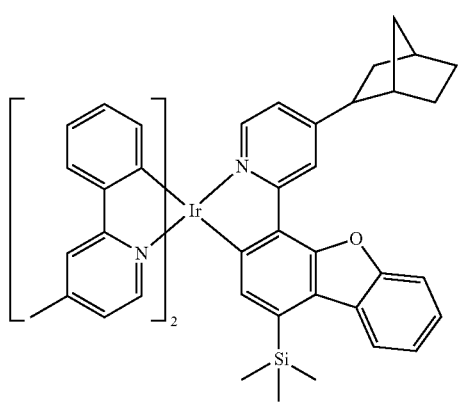
85
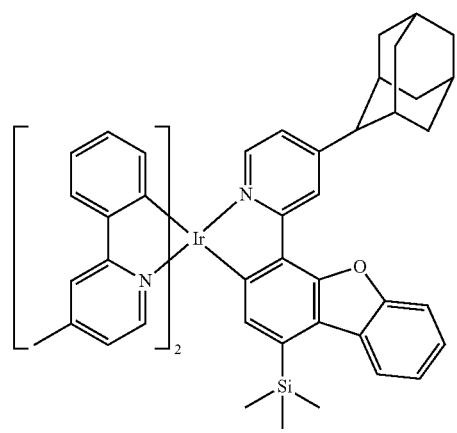
86
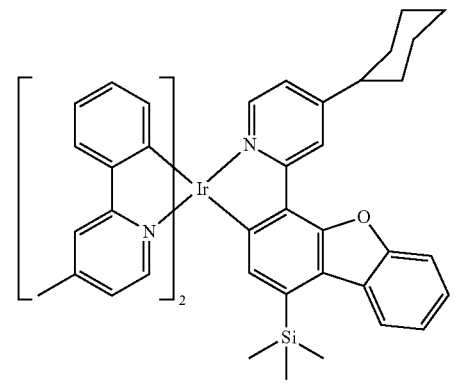

87
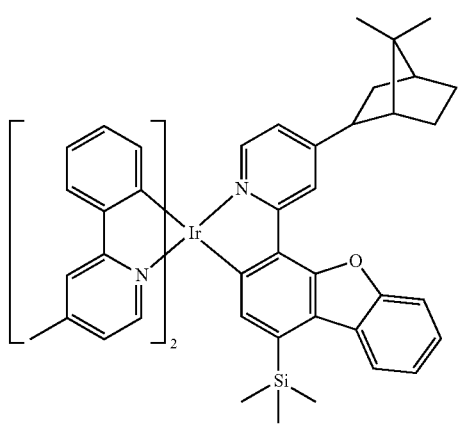
88
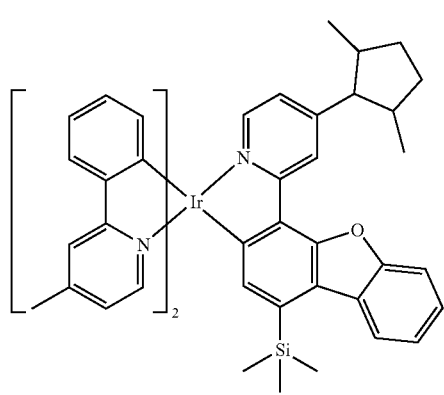
89
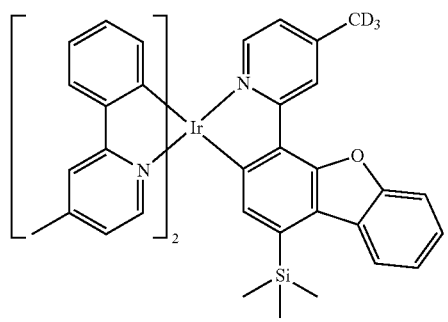
90
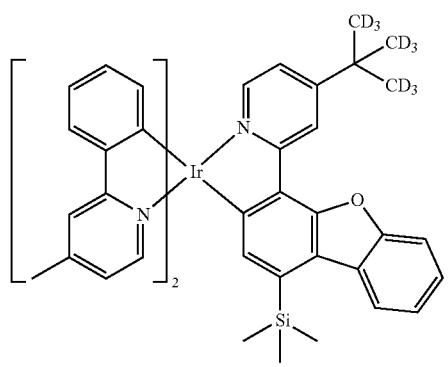
91
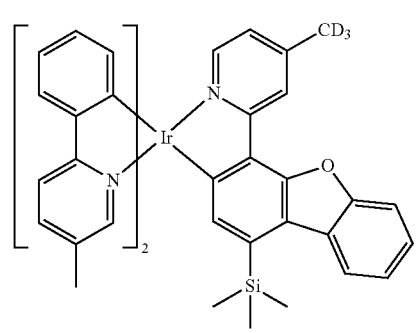
92
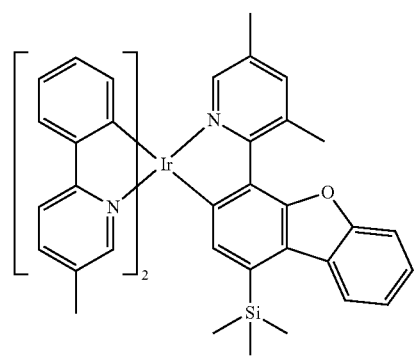
93
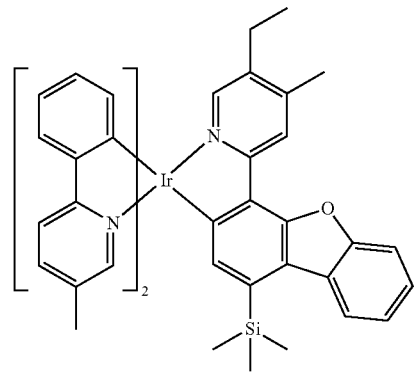
94
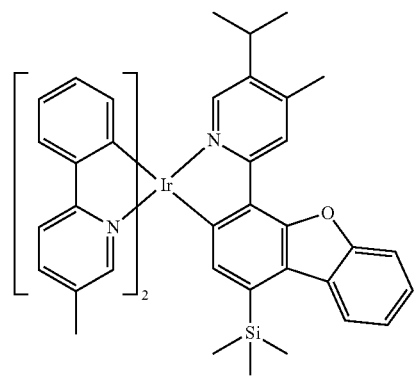

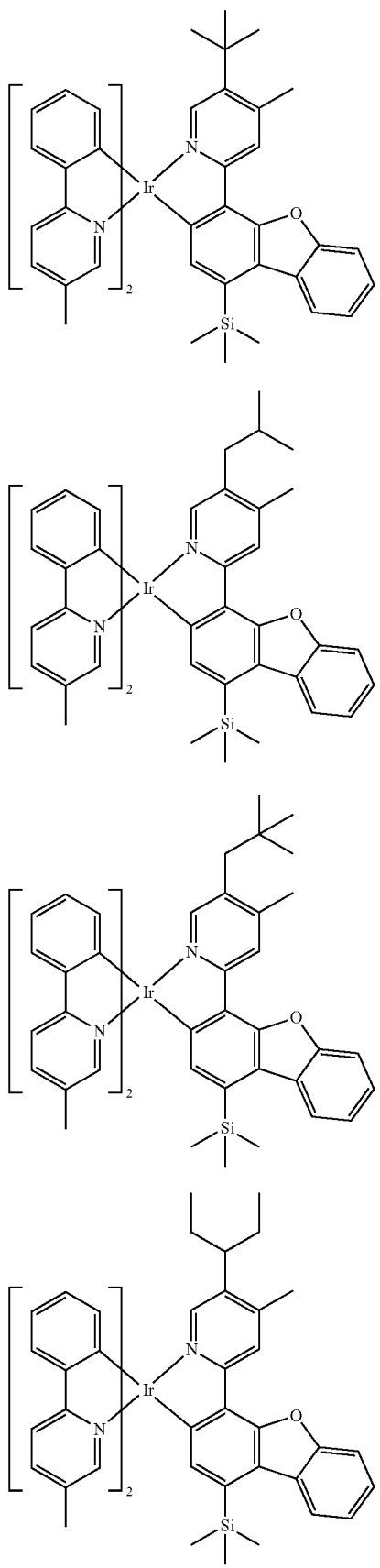
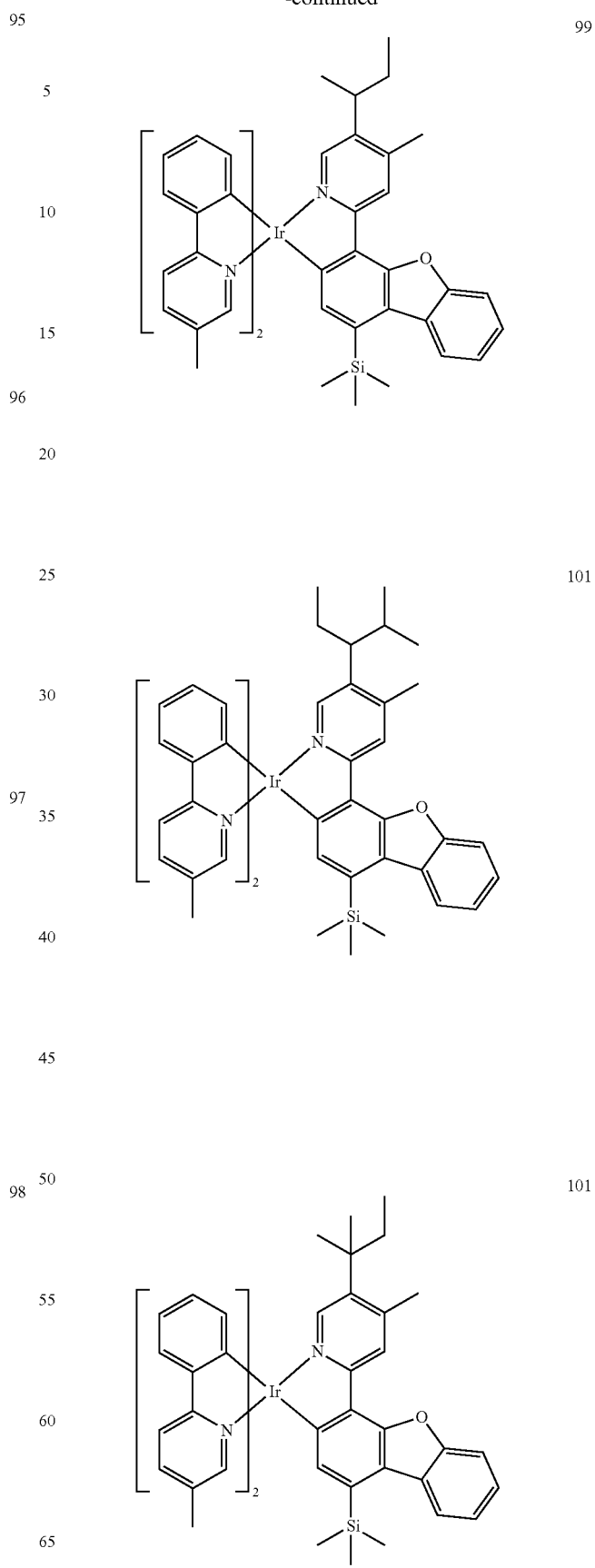

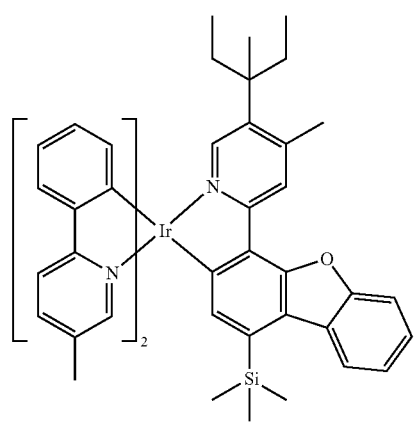
102
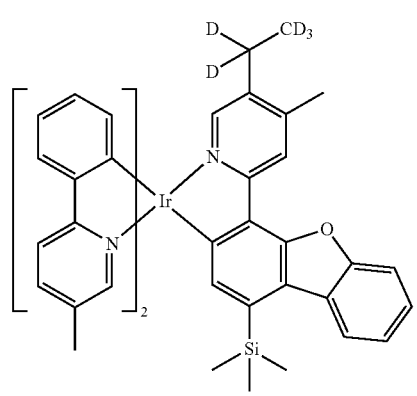
103
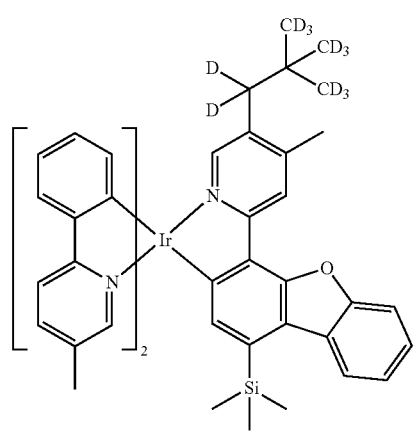
104
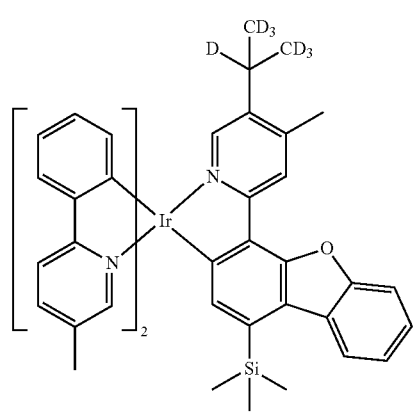
105
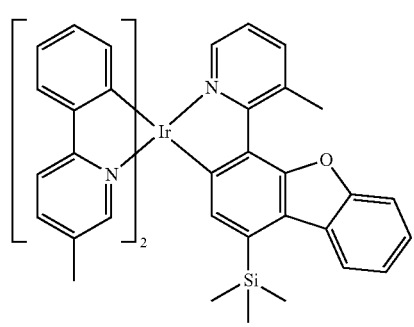
106
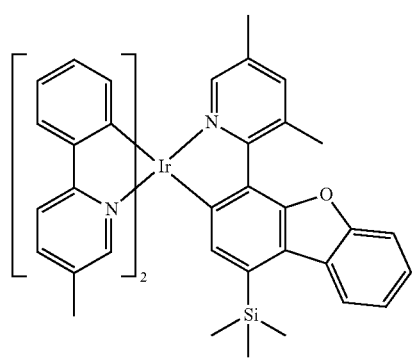
107
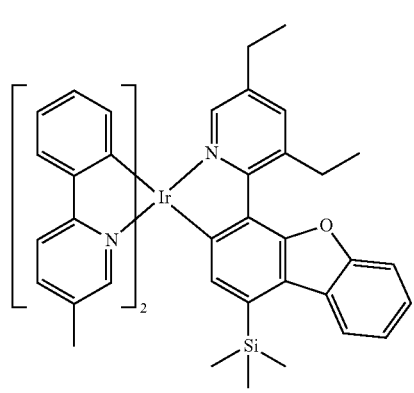
108
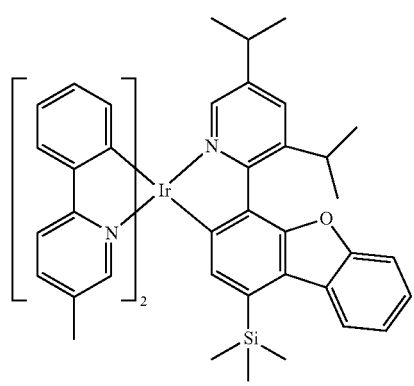
109

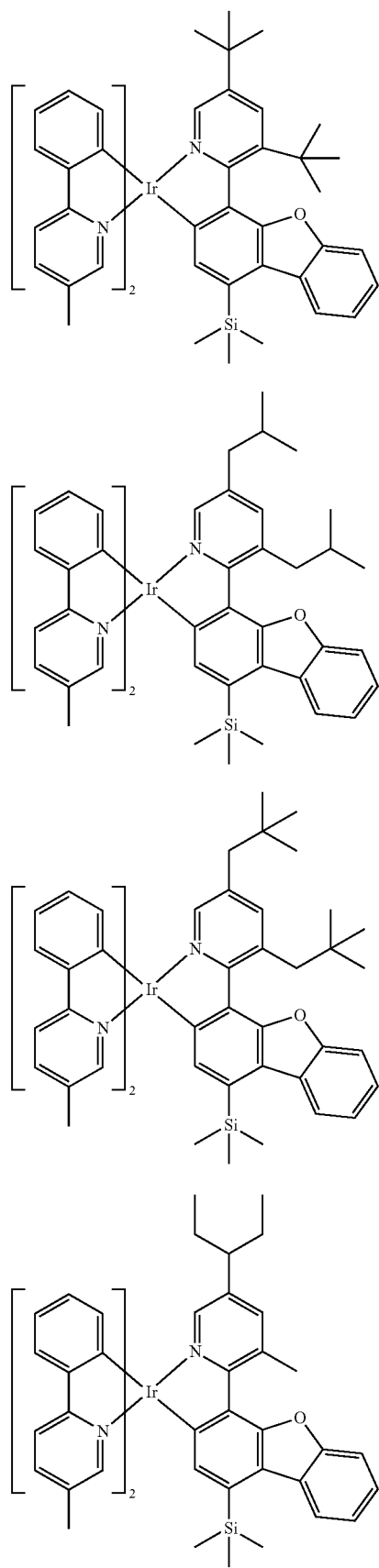
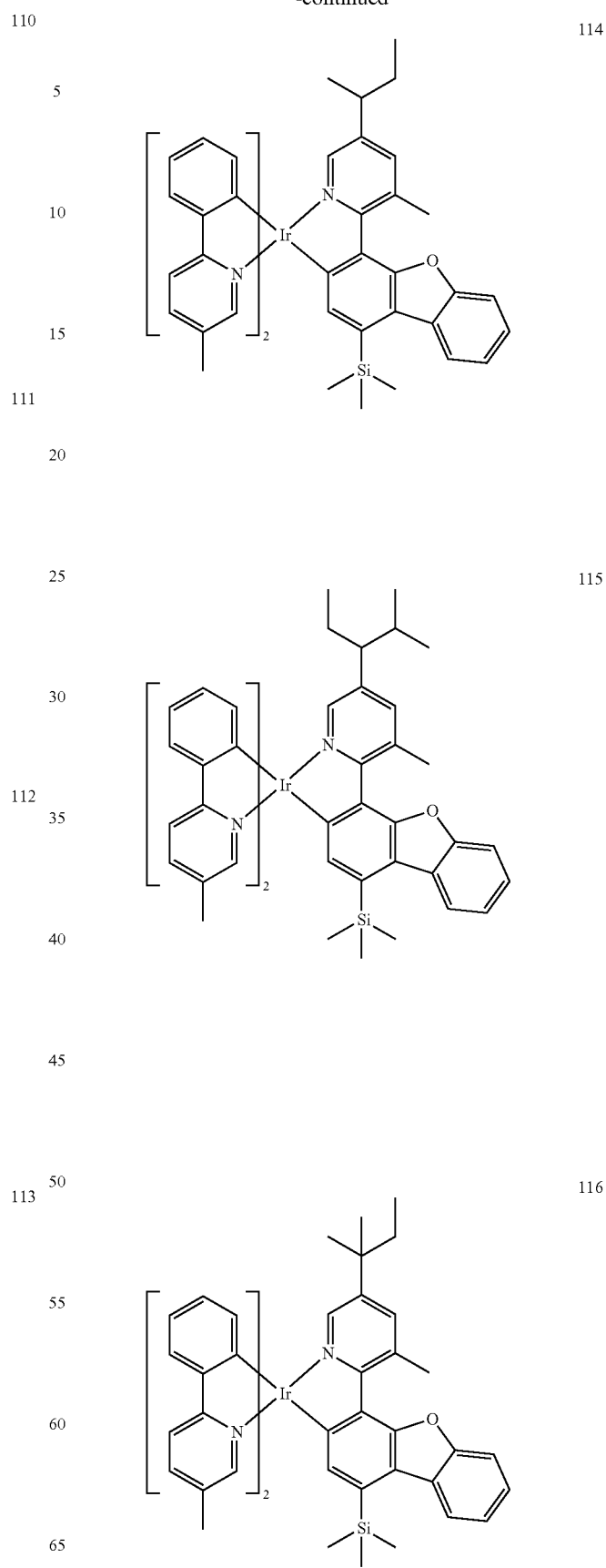

117 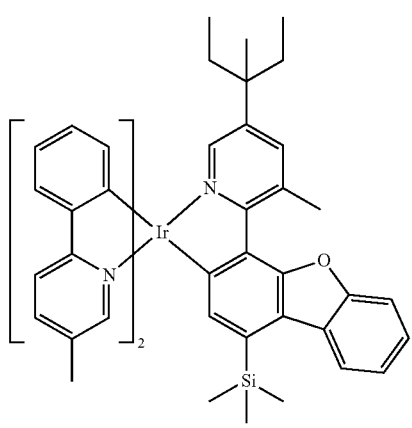
118 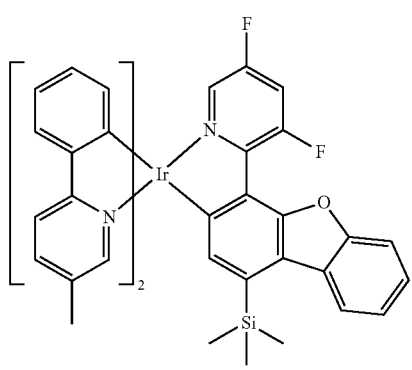
119 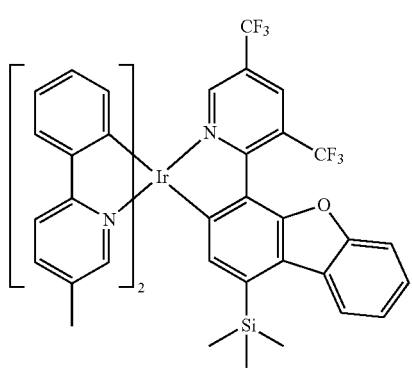
120 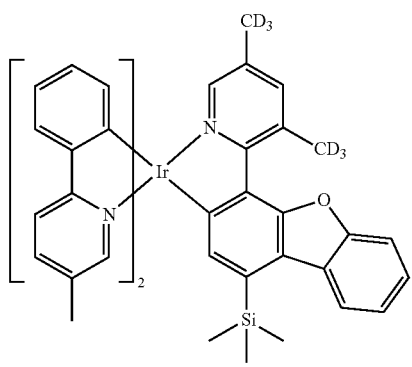
121 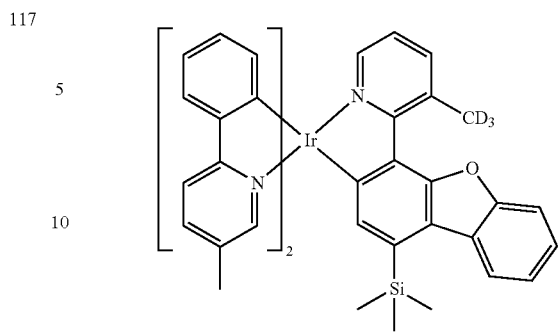
122 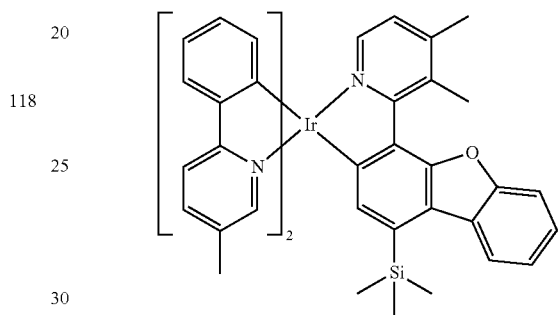
123 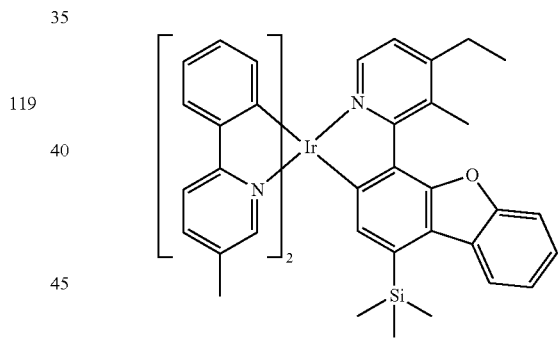
124 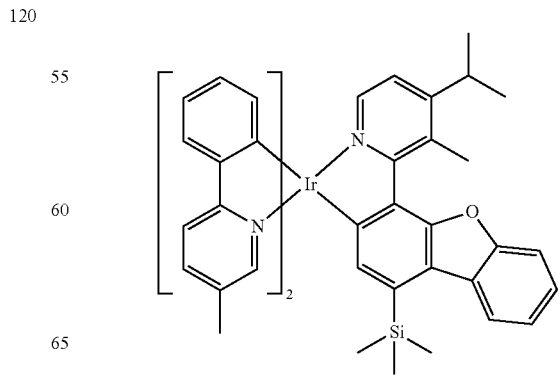

125
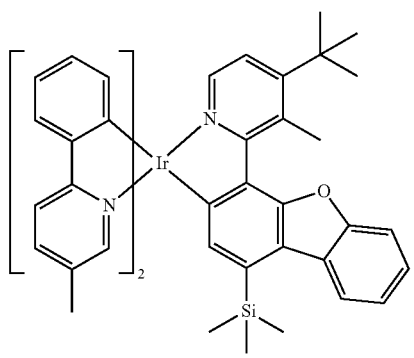
126
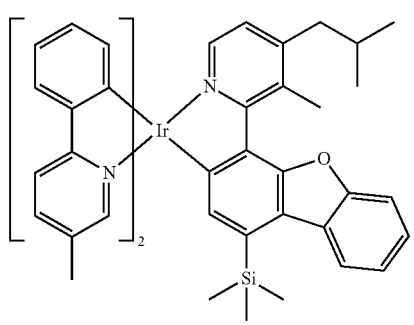
127
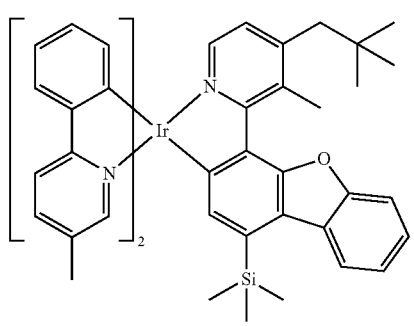
128
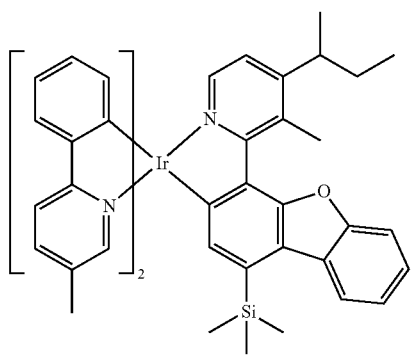
129
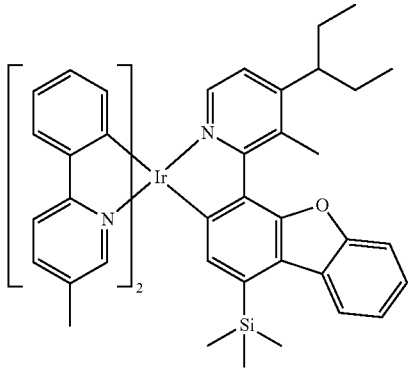
130
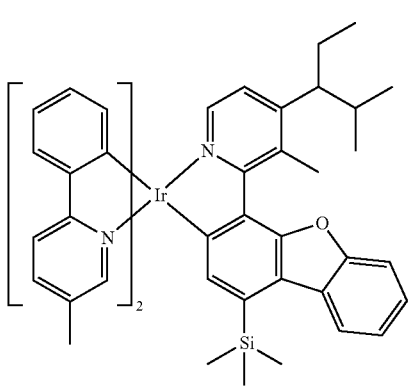
131
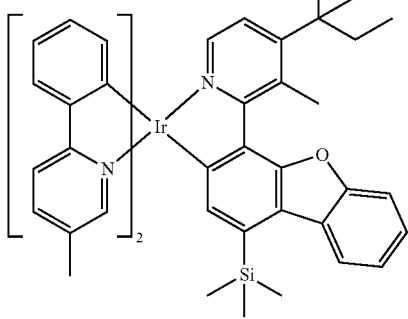
132
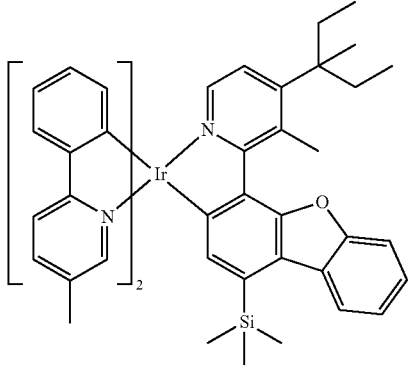

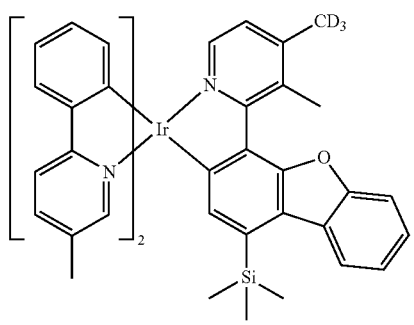 133
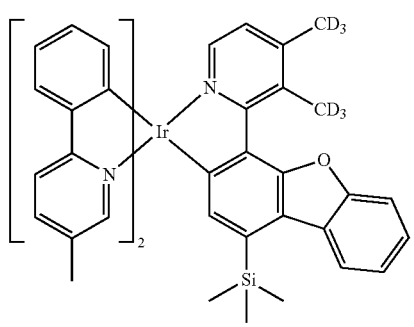 134
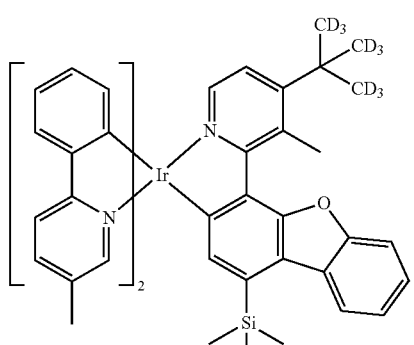 135
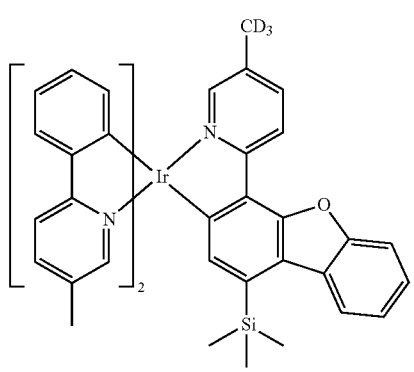 136
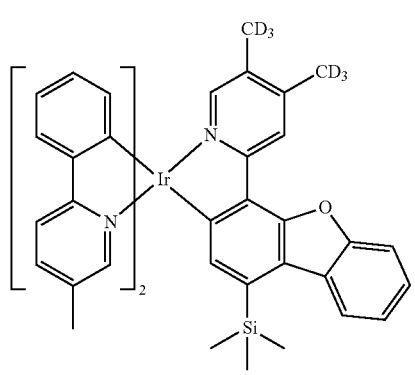 137
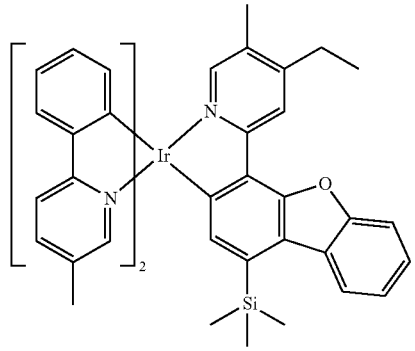 138
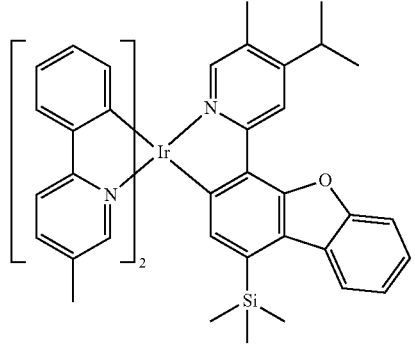 139
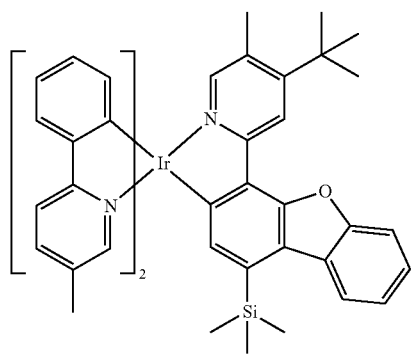 140

141
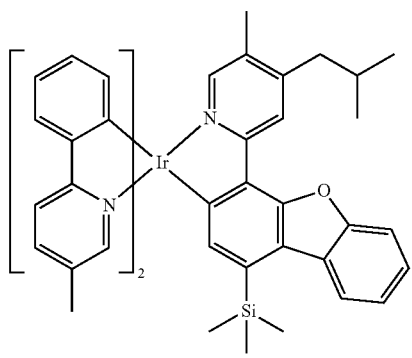
145
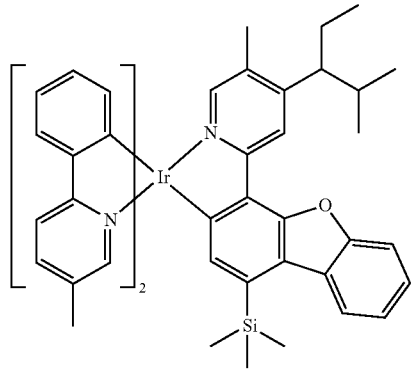
142
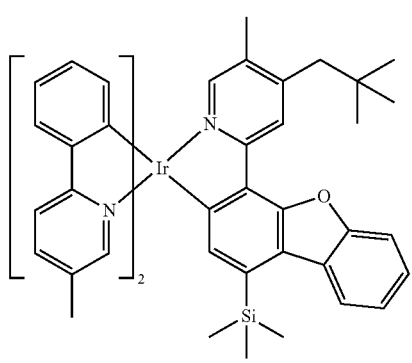
146
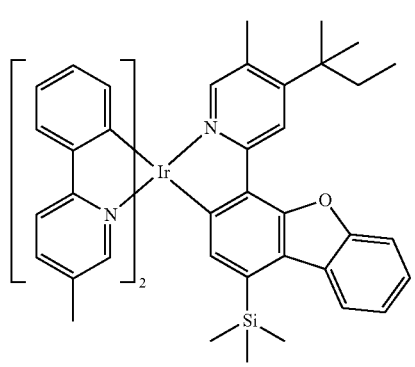
143
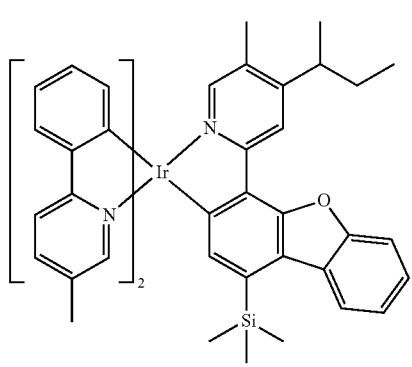
147
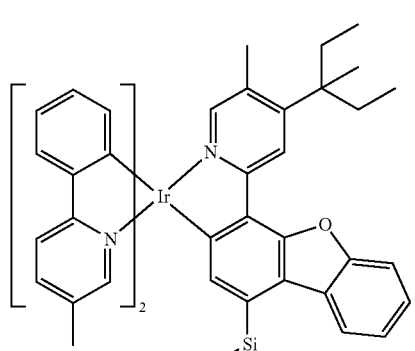
144
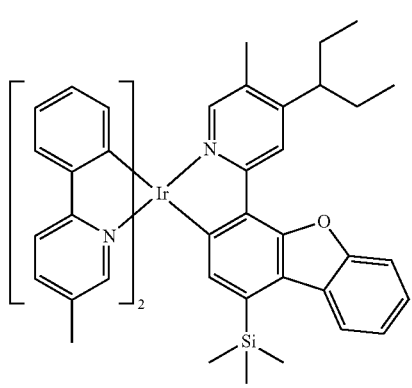
148
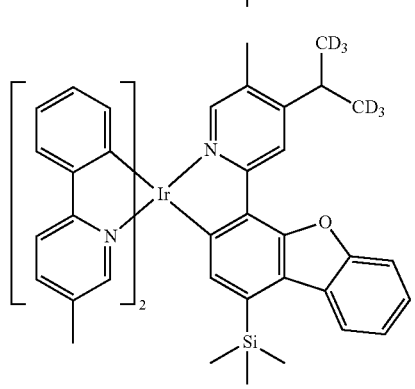

149
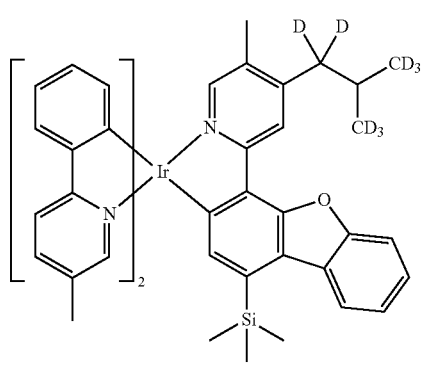
150
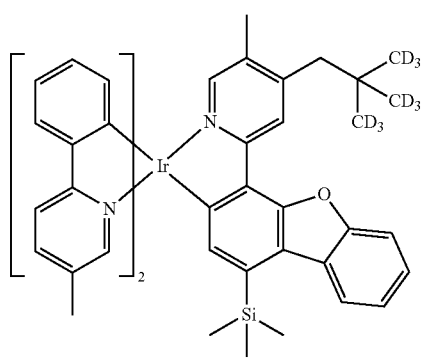
151
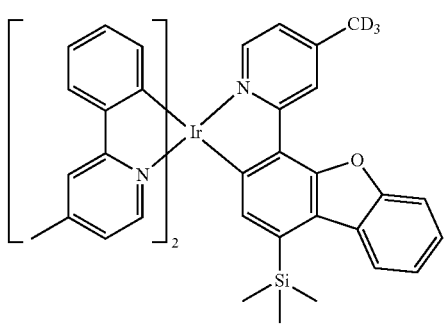
152
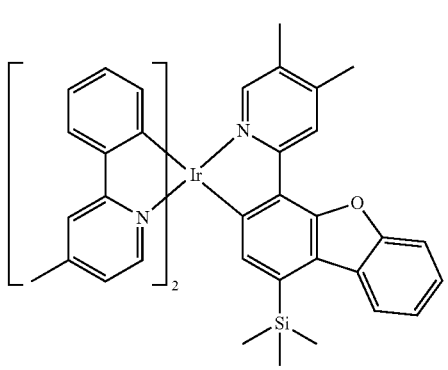
153
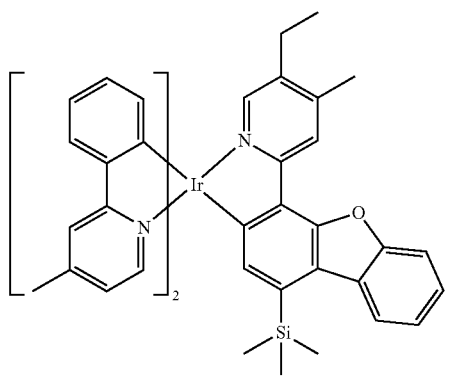
154
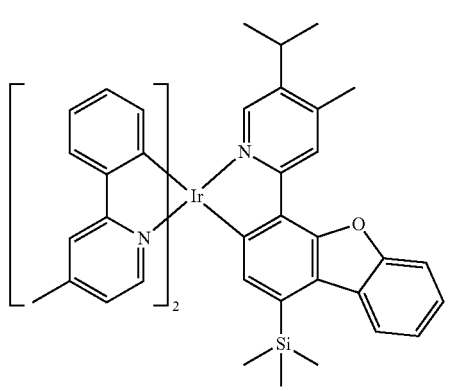
155
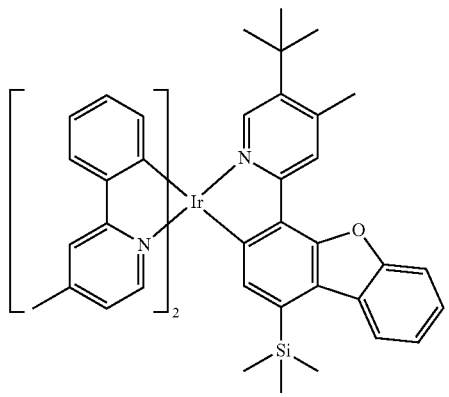
156
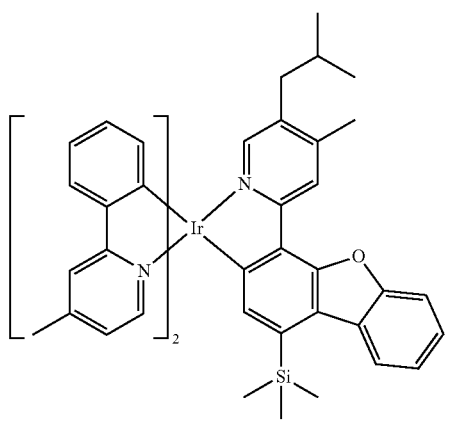

157
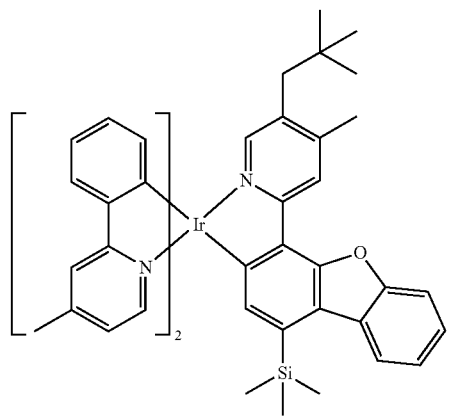
158
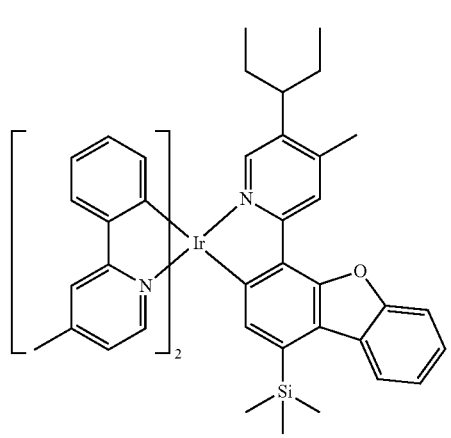
159
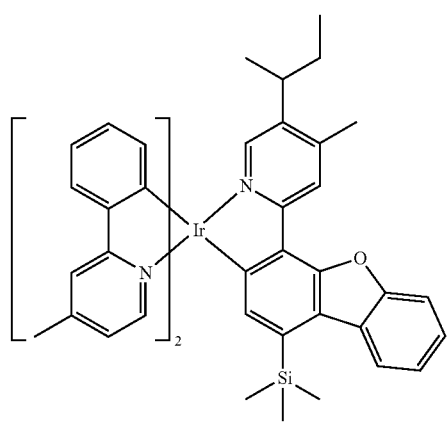
160
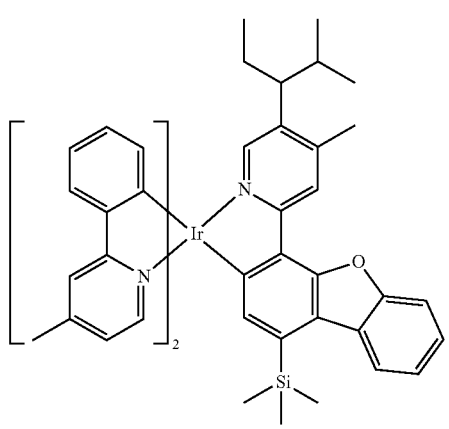
161
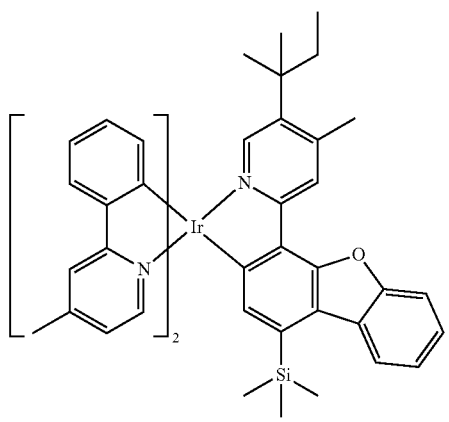
162
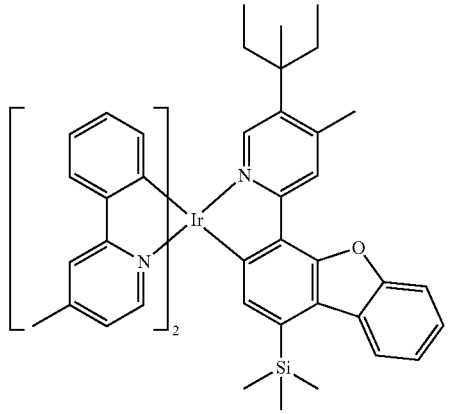
163
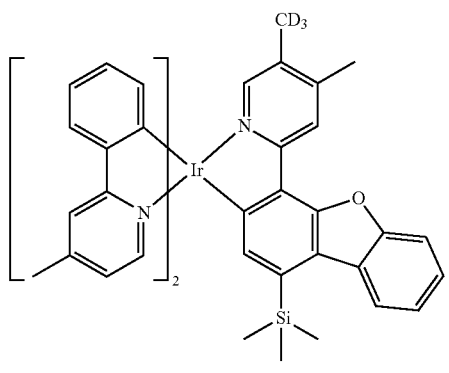

164
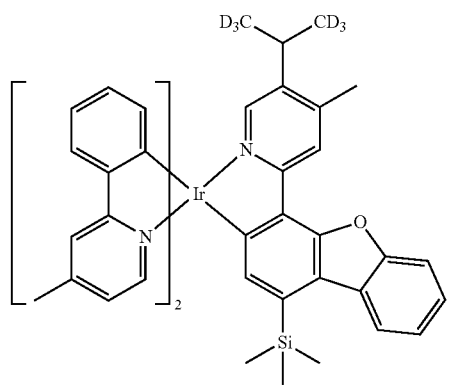
165
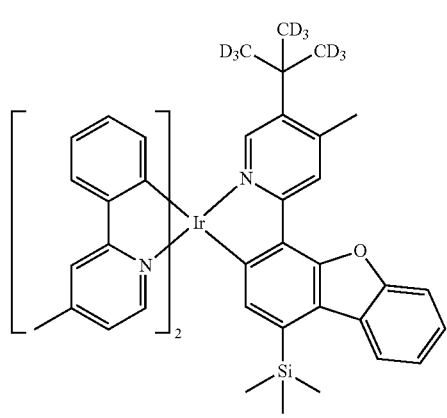
166
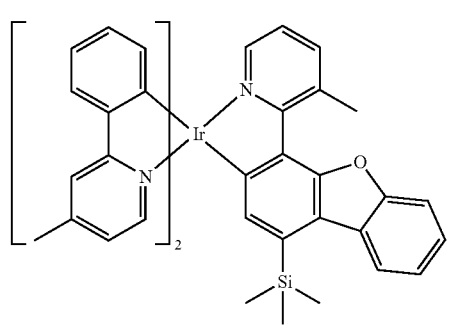
167
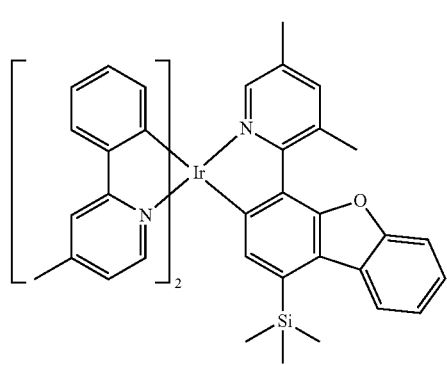
168
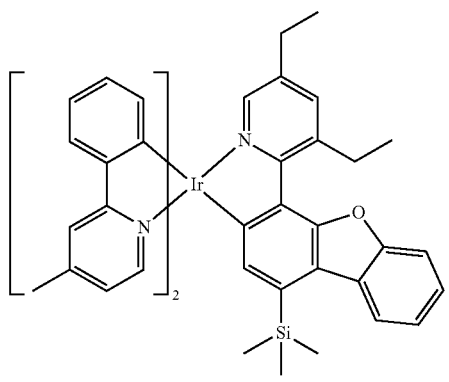
169
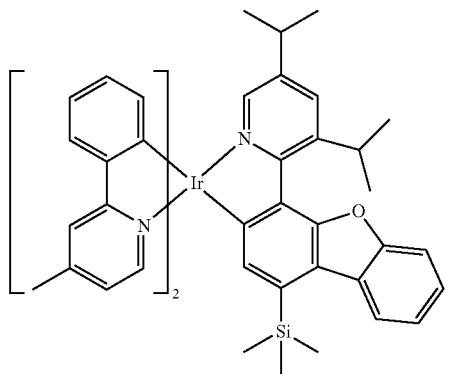
170
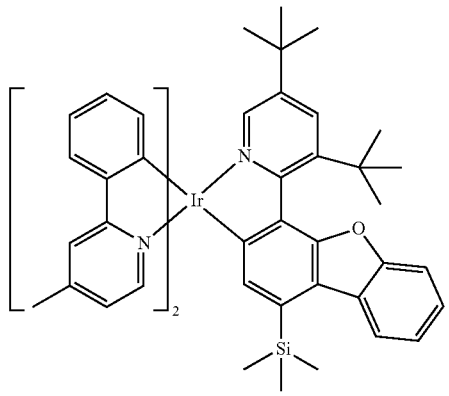
171
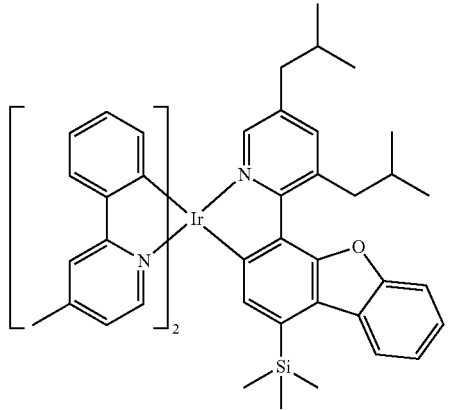

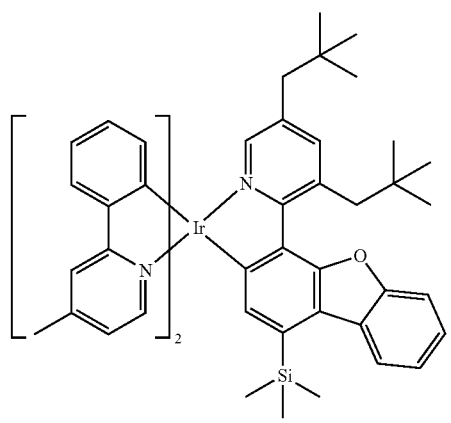
172
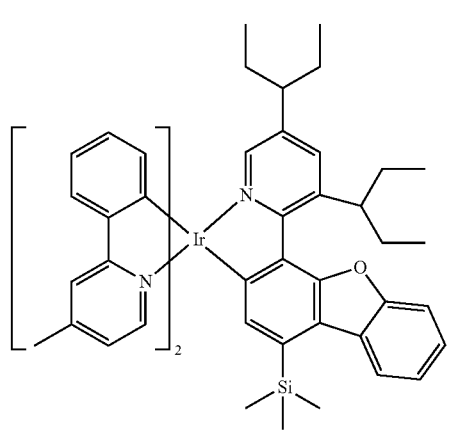
173
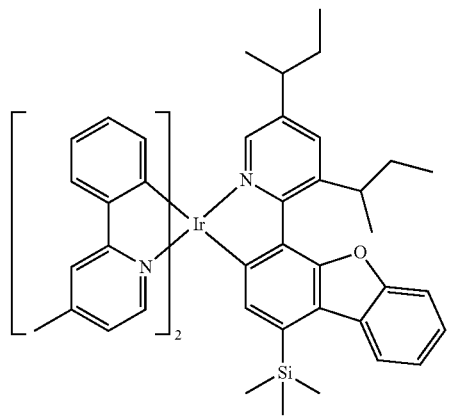
174
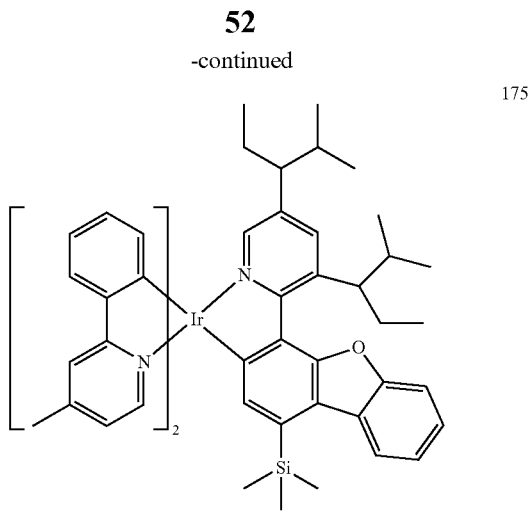
175
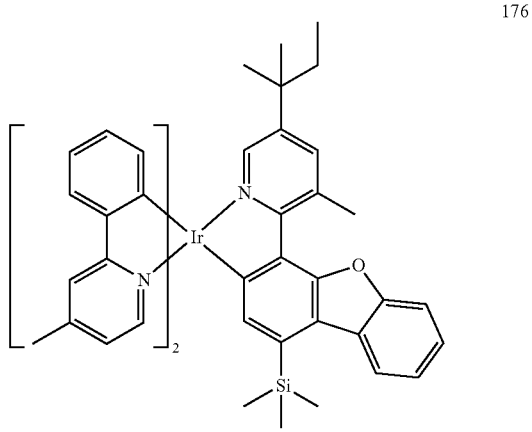
176
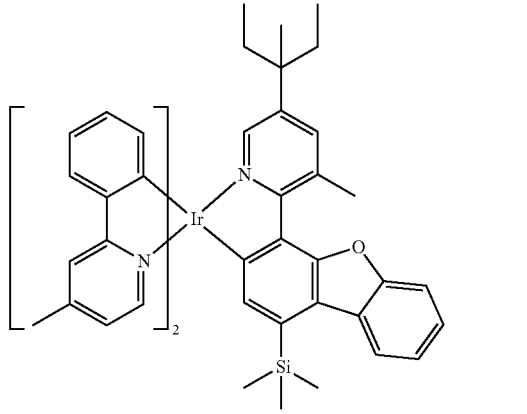
177
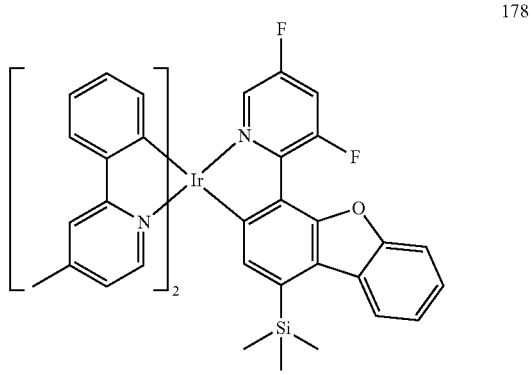
178

179
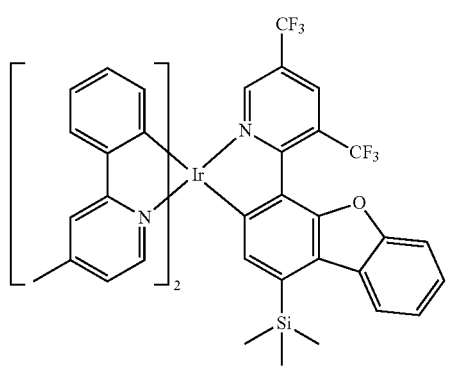
180
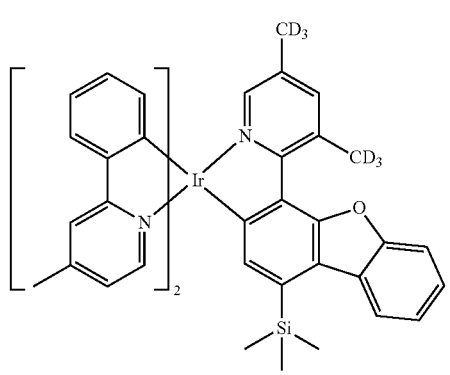
181
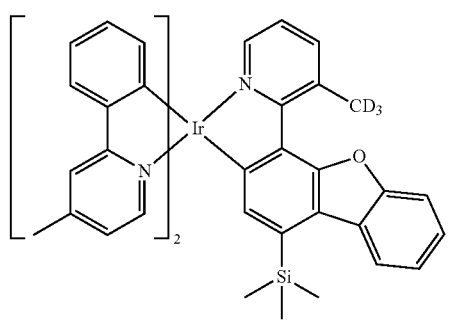
182
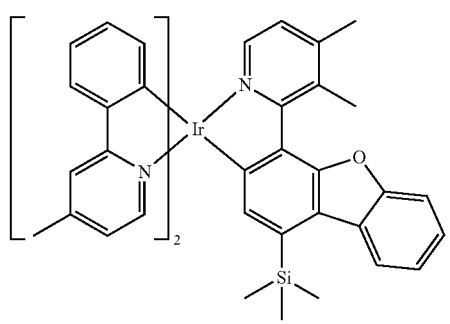
183
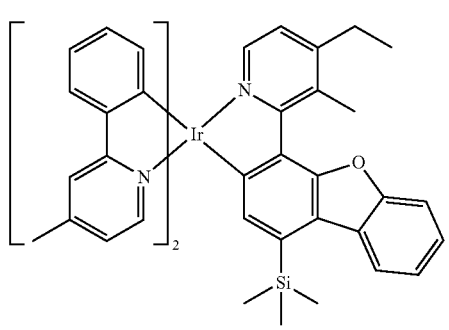
184
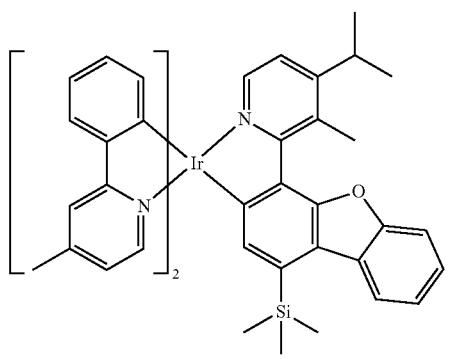
185
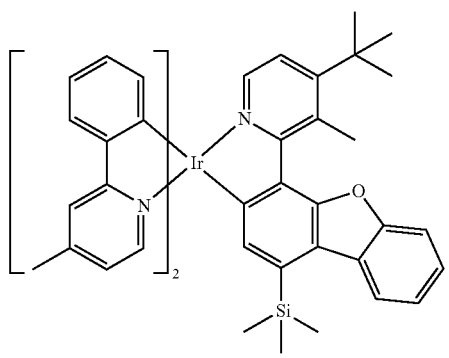
186
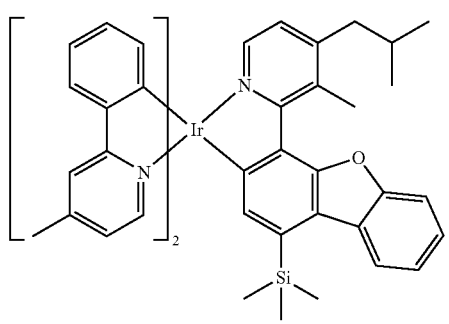

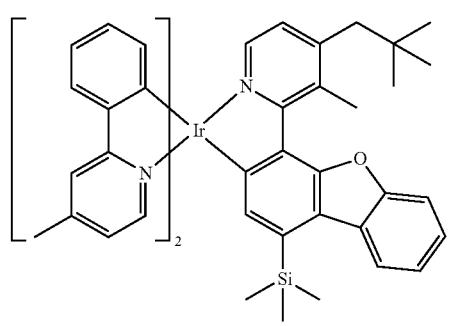
187
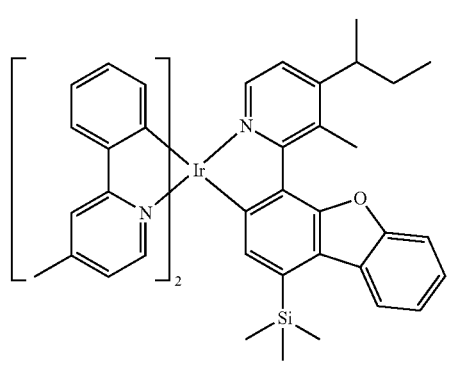
188
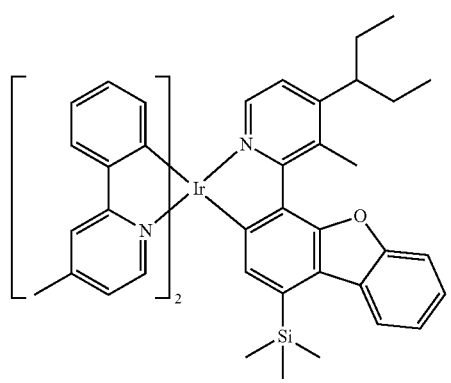
189
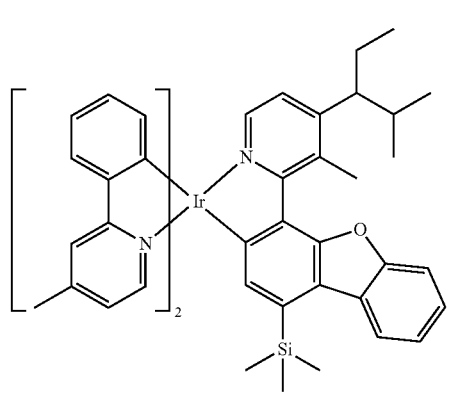
190
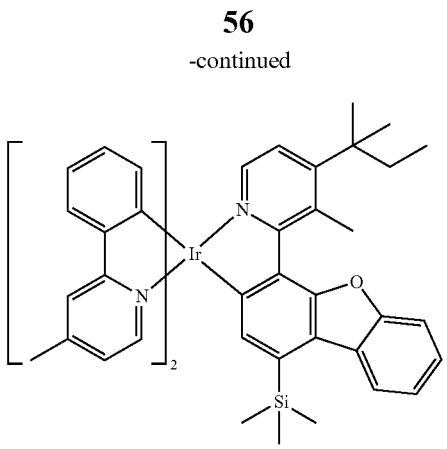
191
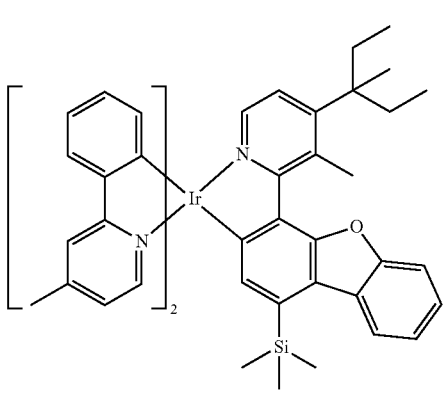
192
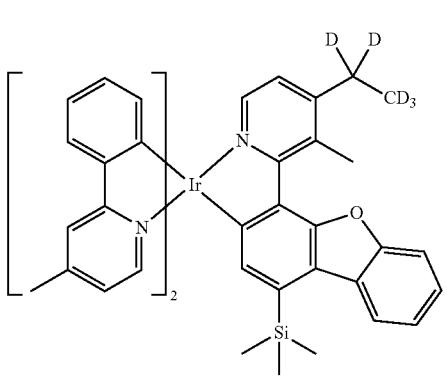
193
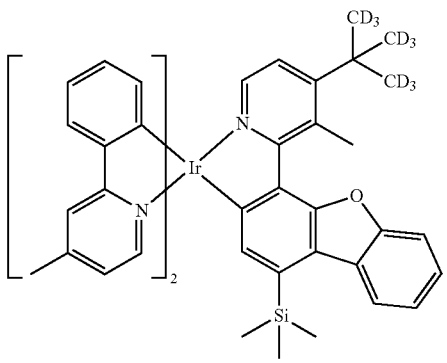
194

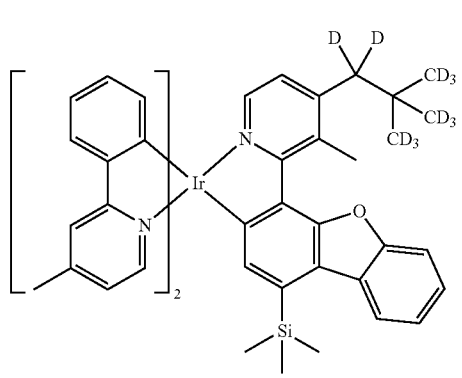
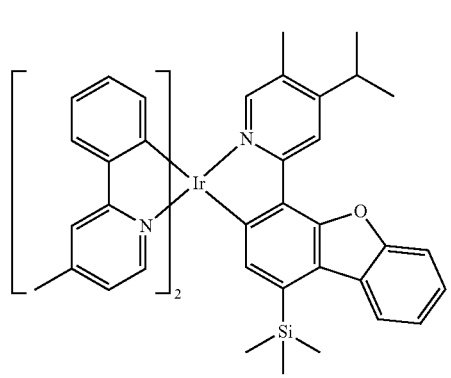

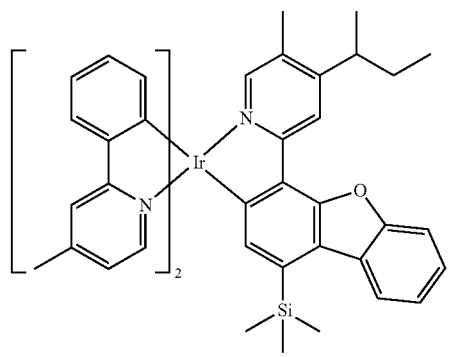 203
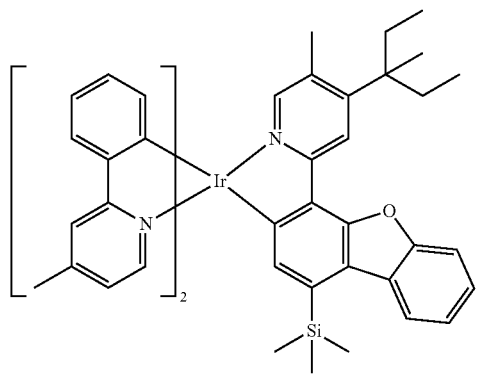 207
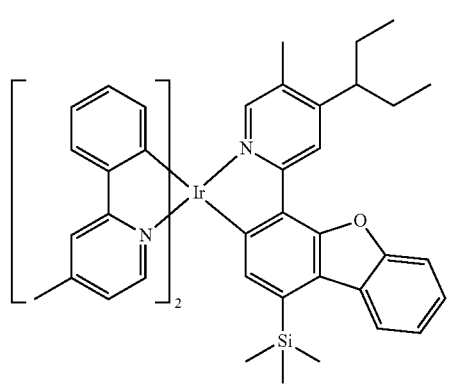 204
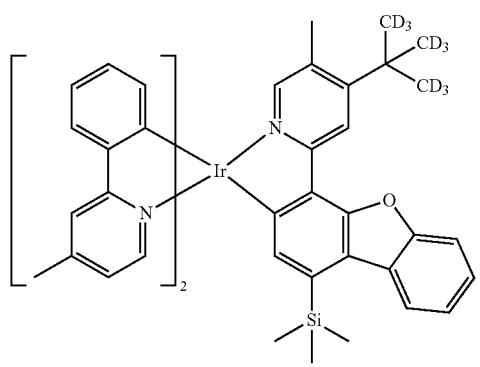 208
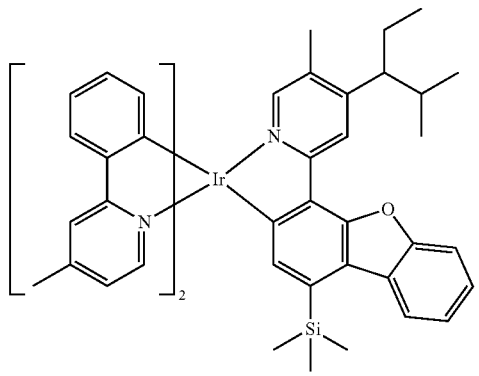 205
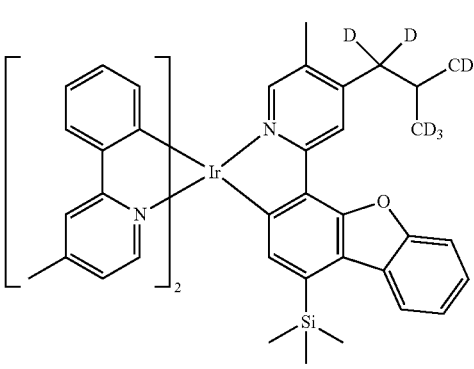 209
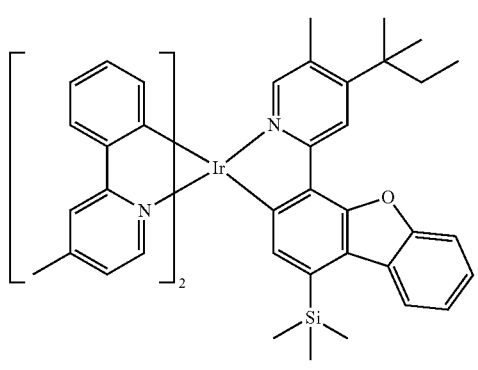 206
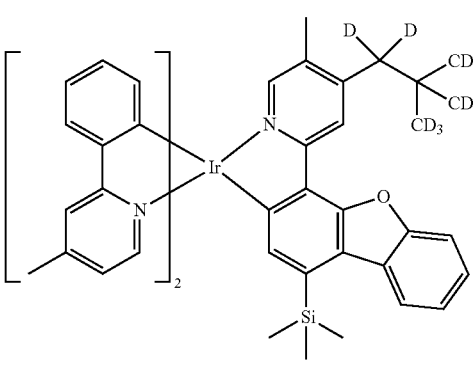 210

211 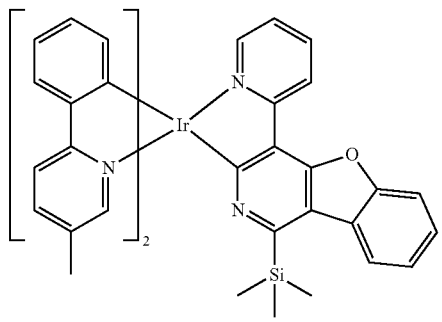
212 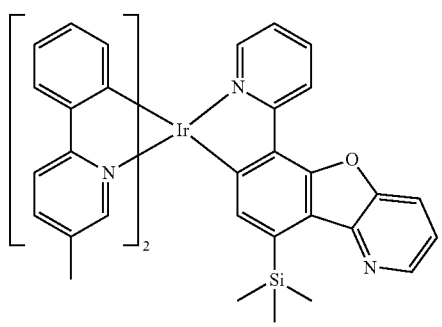
213 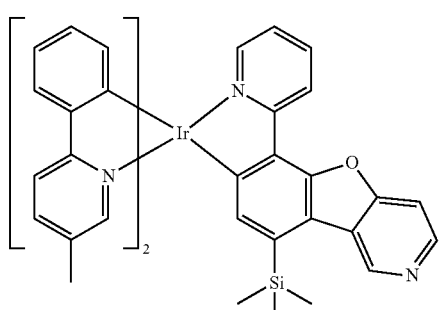
214 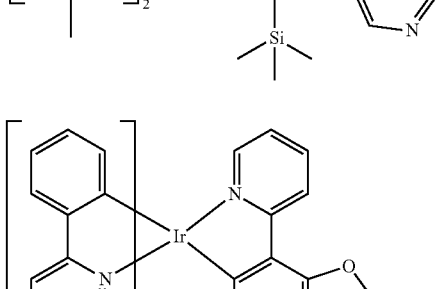
215 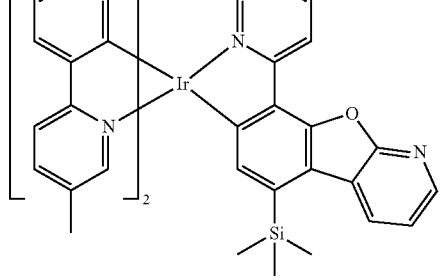
216 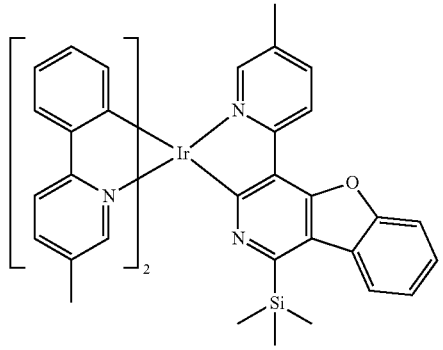
217 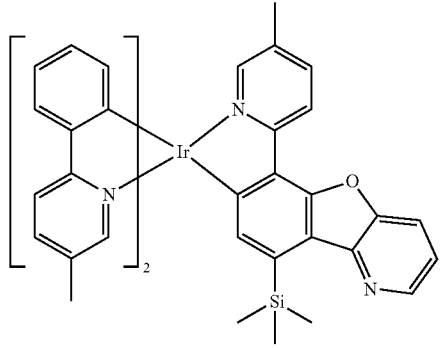
218 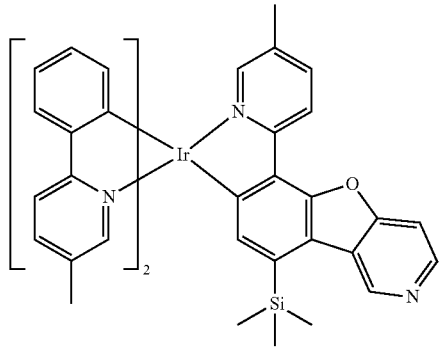
219 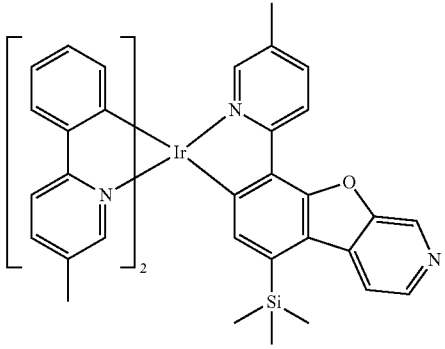

220 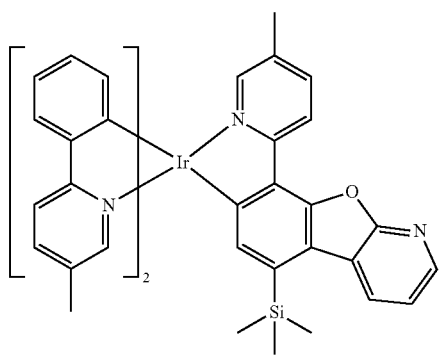
224 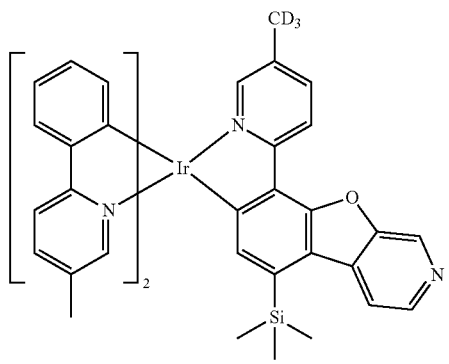
221 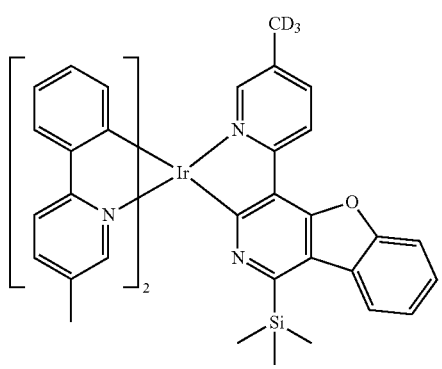
225 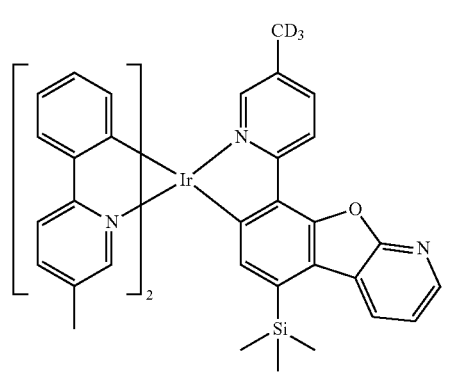
222 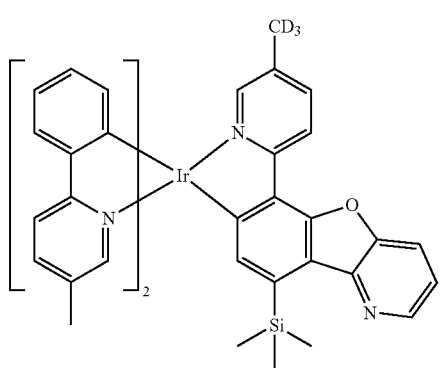
226 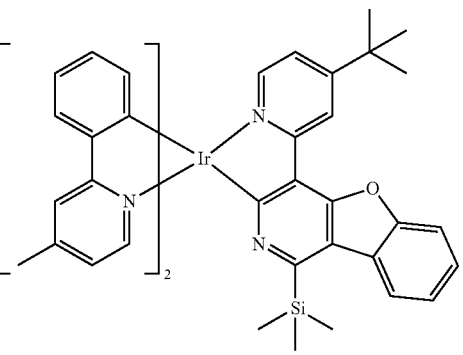
223 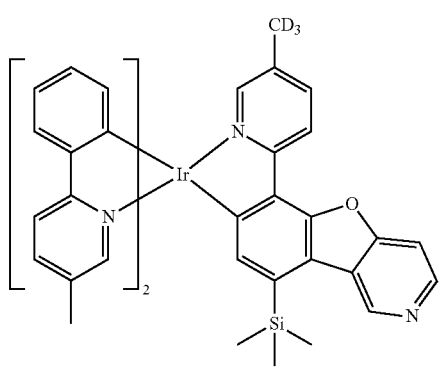
227 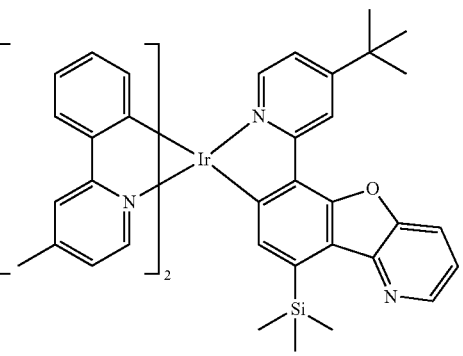

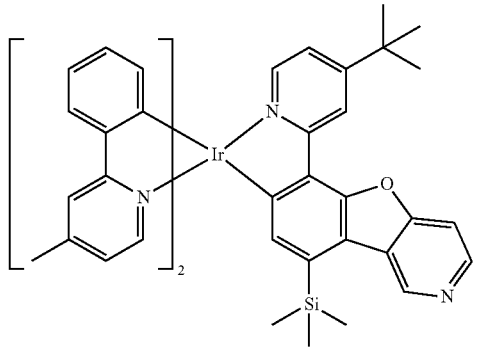
228
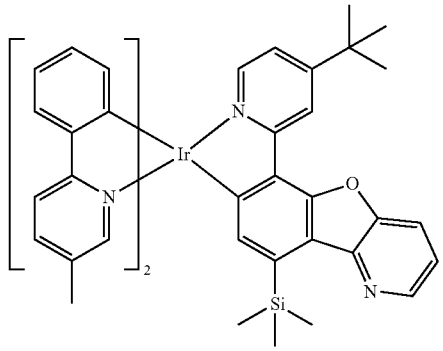
232
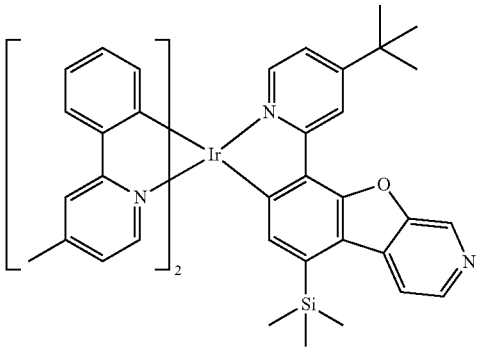
229
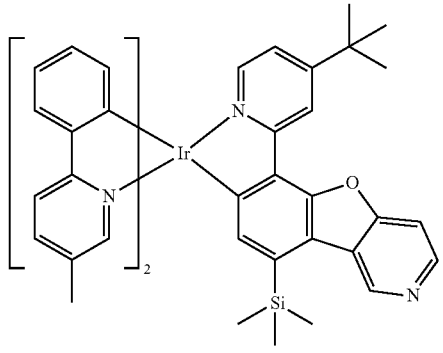
233
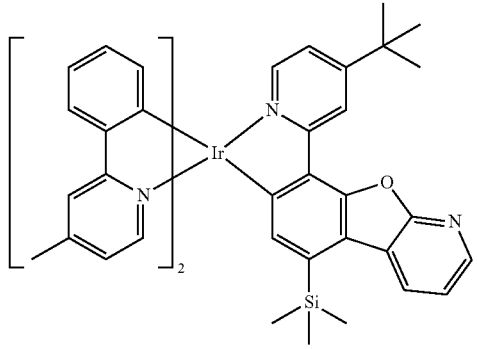
230
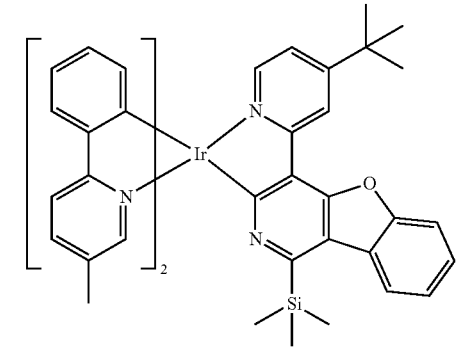
231

236
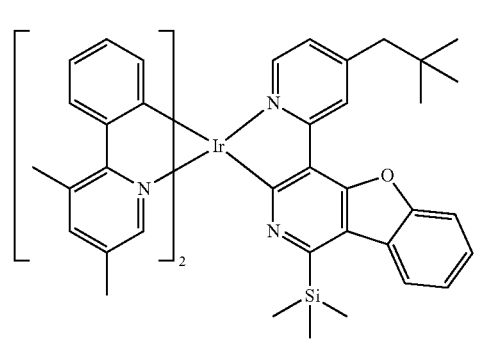
237
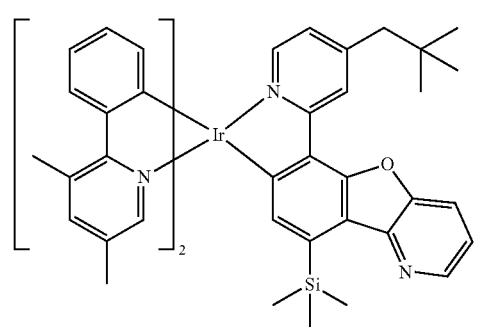
238
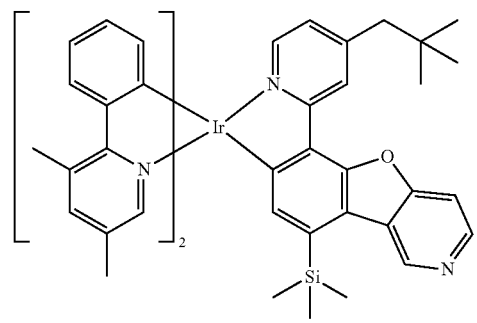
239
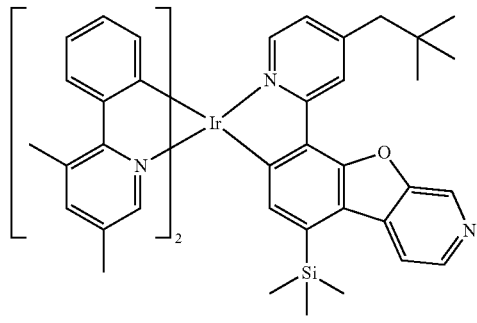
240
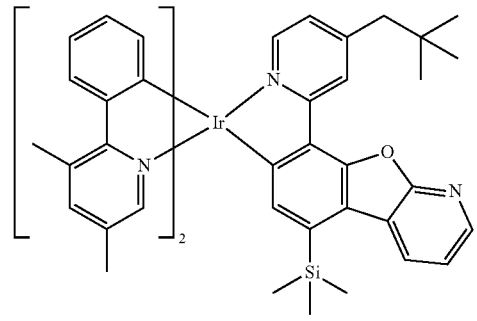
241
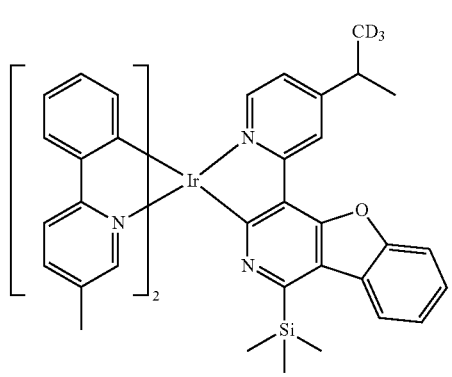
242
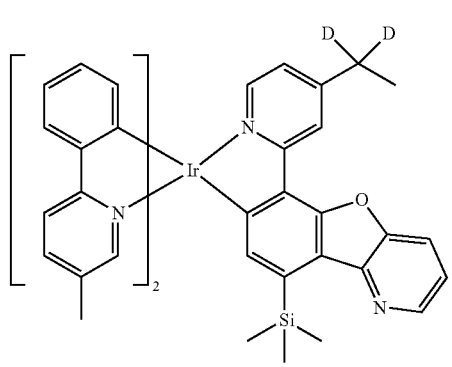
243
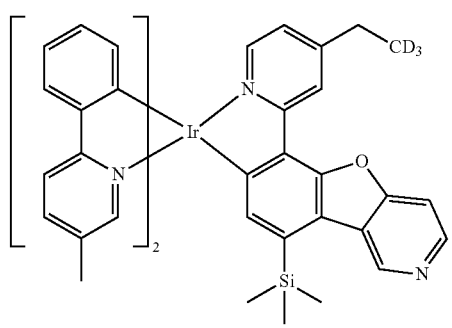
244
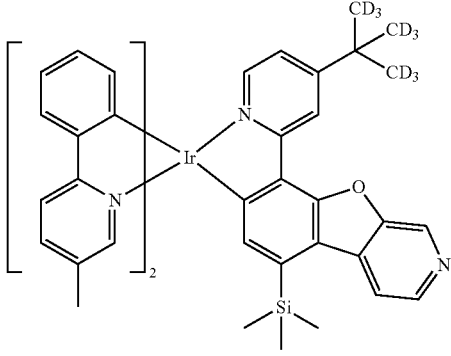

245 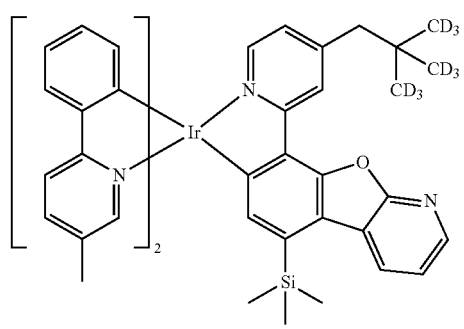
246 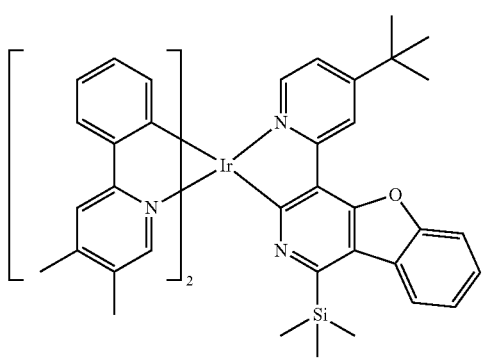
247 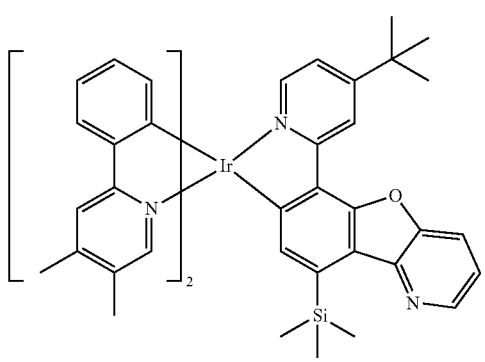
248 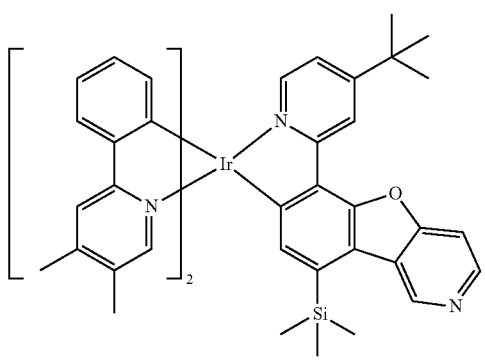
249 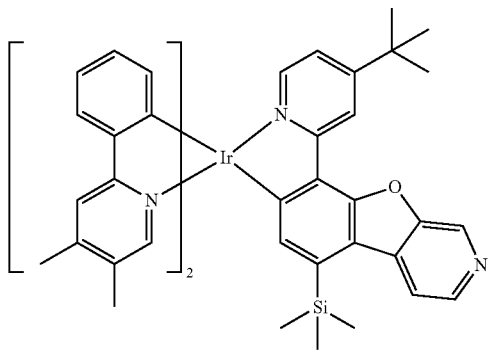
250 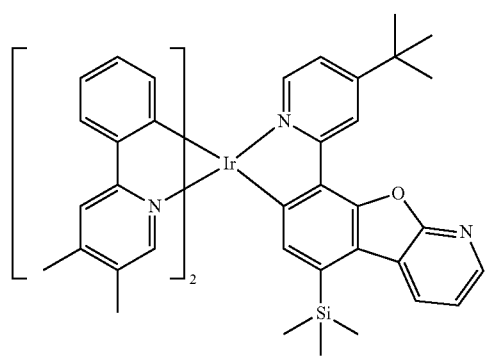
251 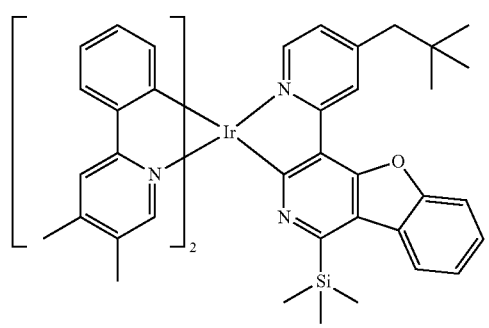
252 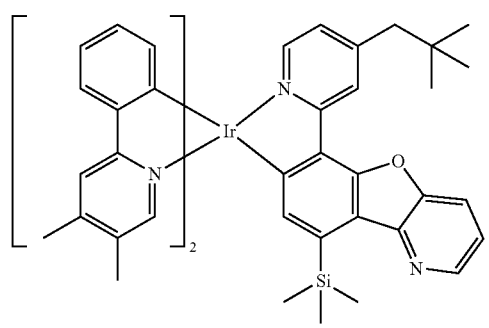

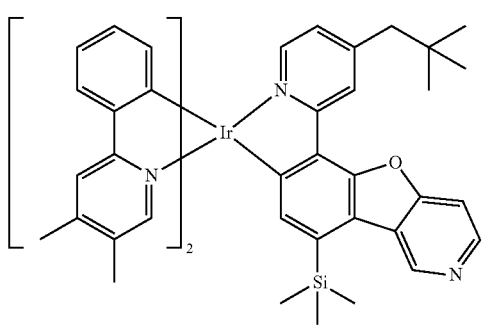
253
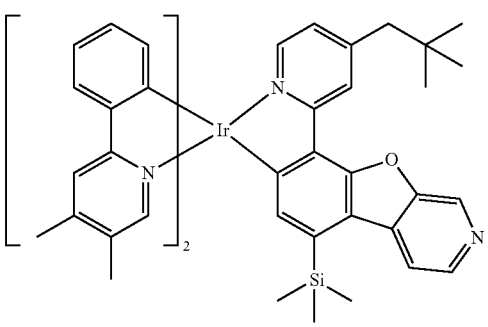
254
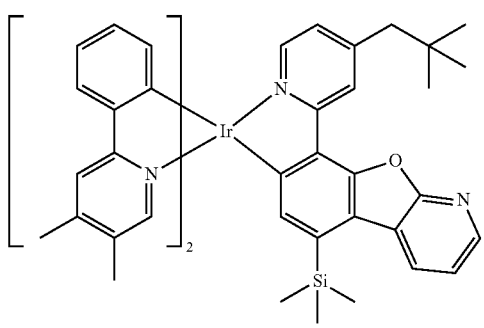
255
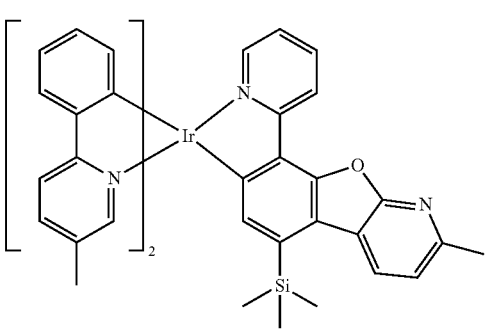
256
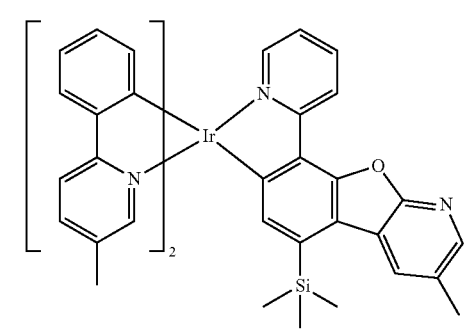
257
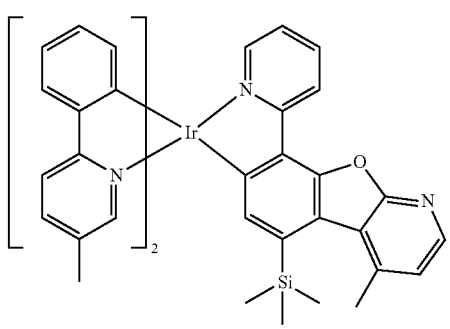
258
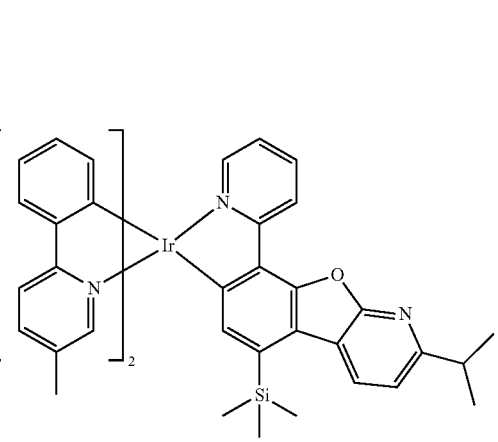
259
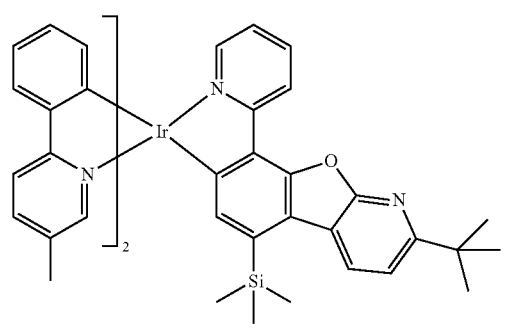
260
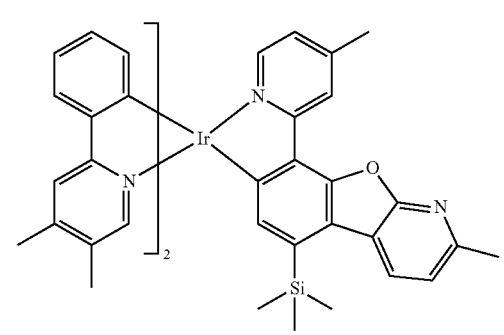
261

262 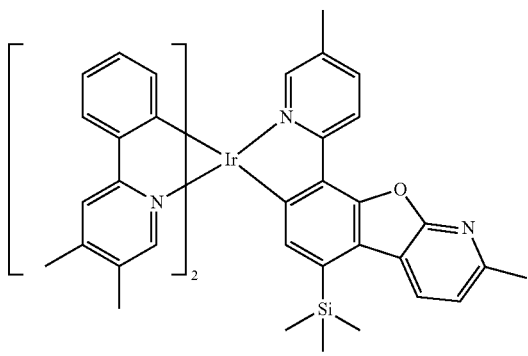
263 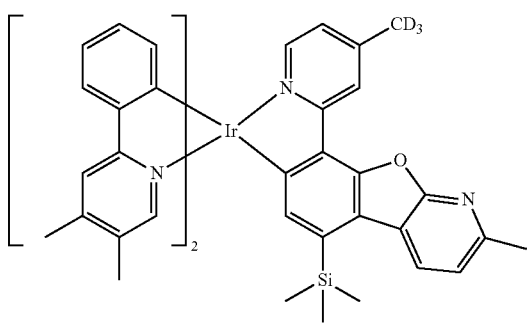
264 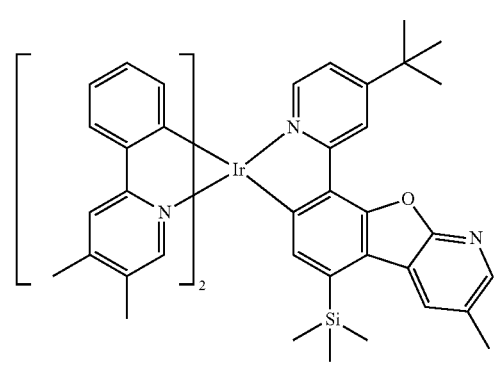
265 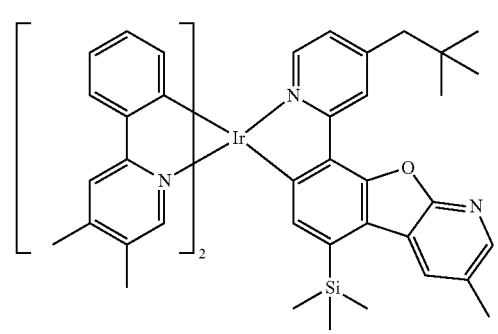
266 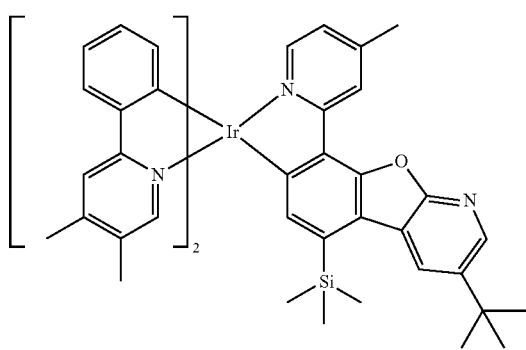
267 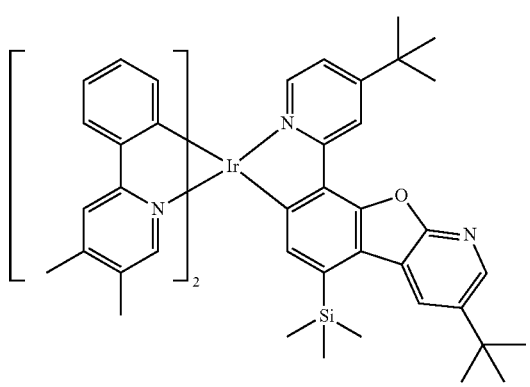
268 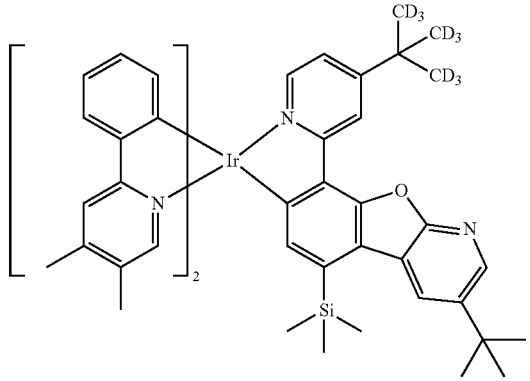
269

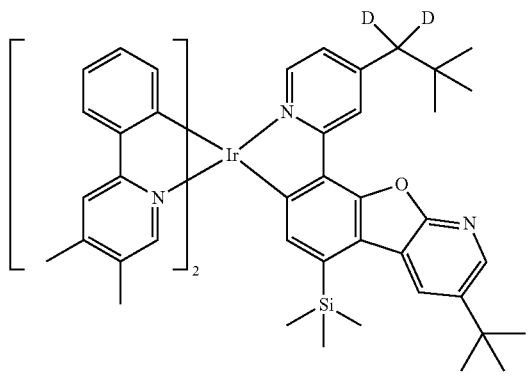
270
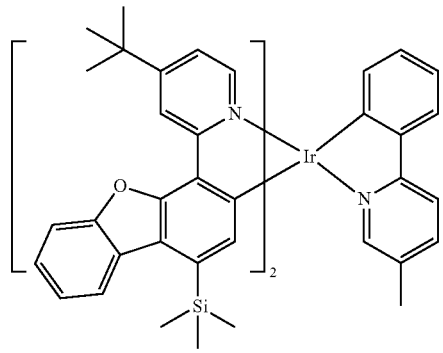
274
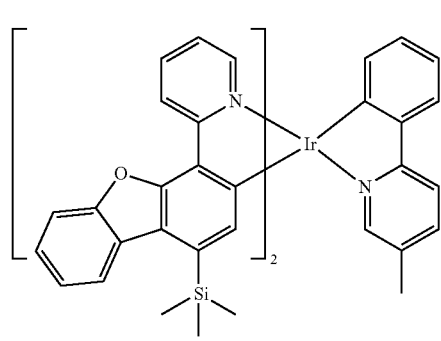
271
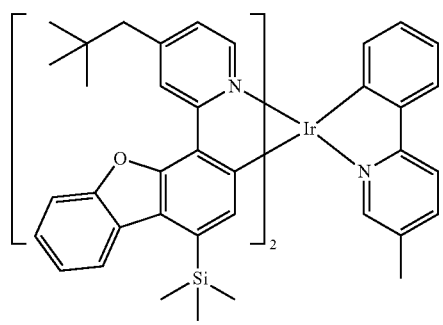
275
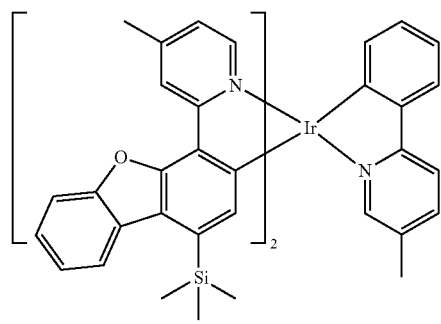
272
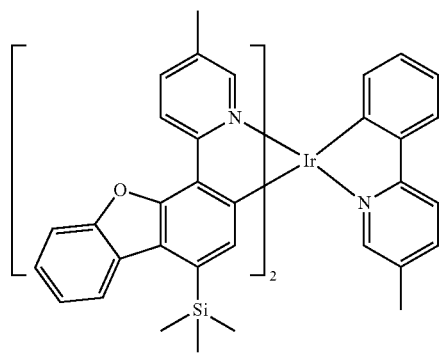
276
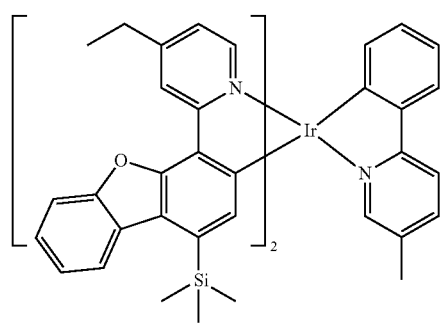
273
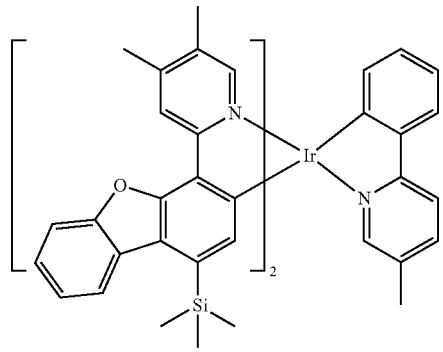
277

278 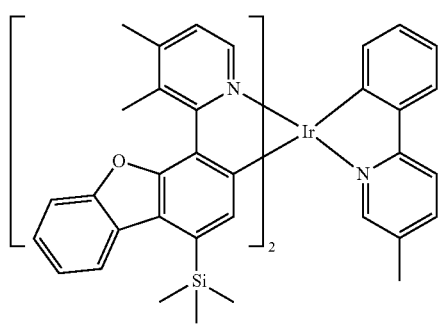
282 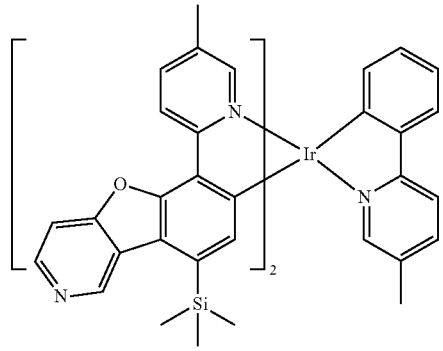
279 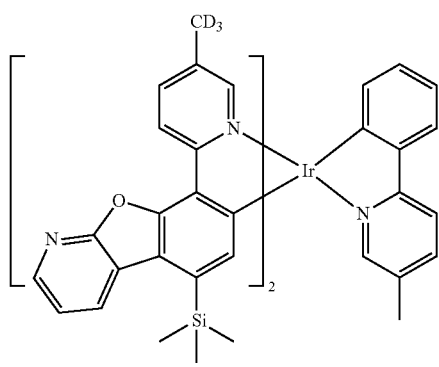
283 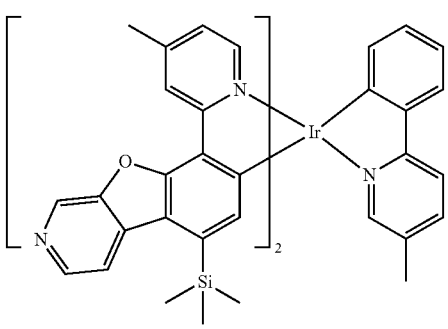
280 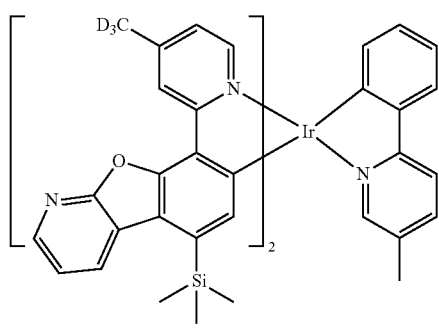
284 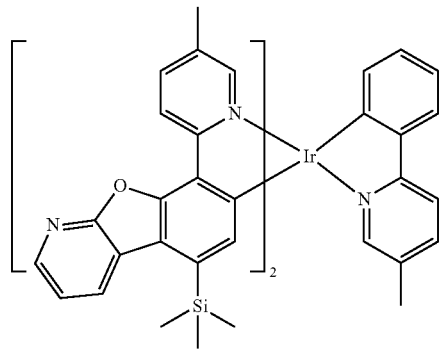
281 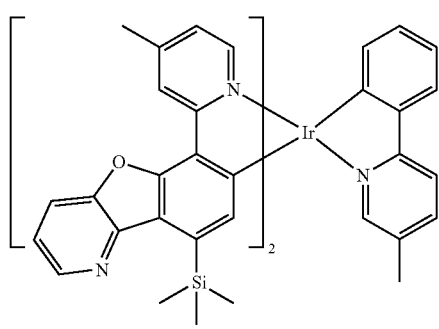
285 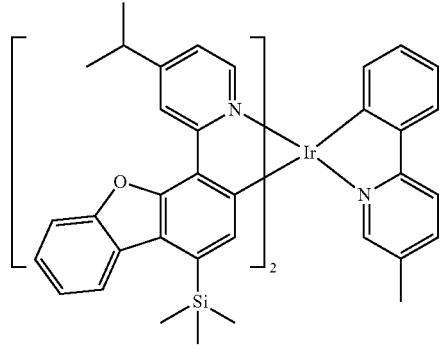

286
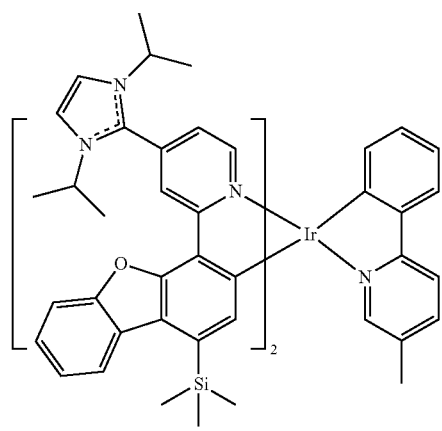
287
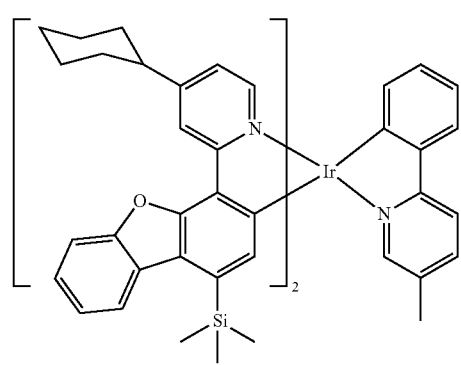
288
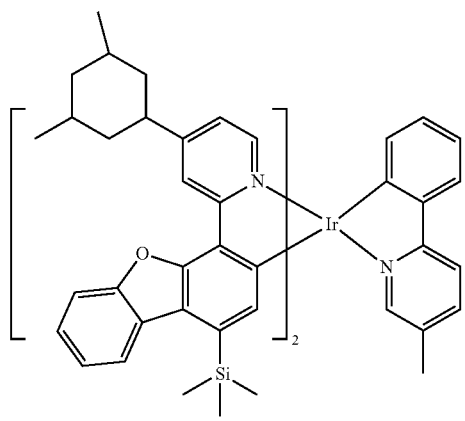
289
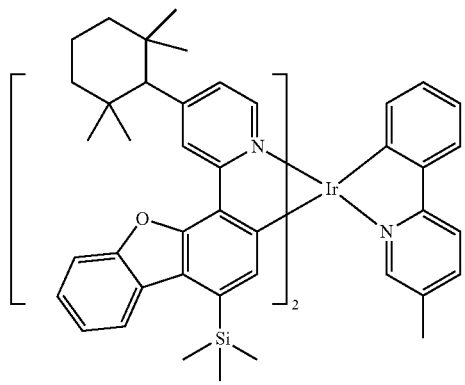
290
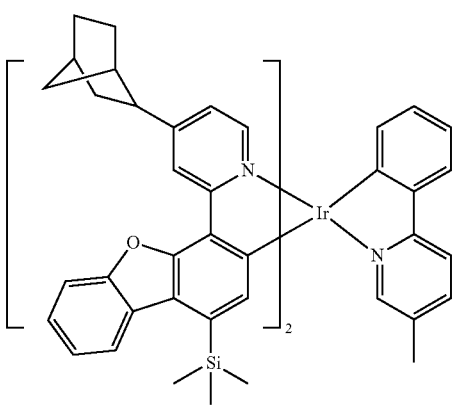
291
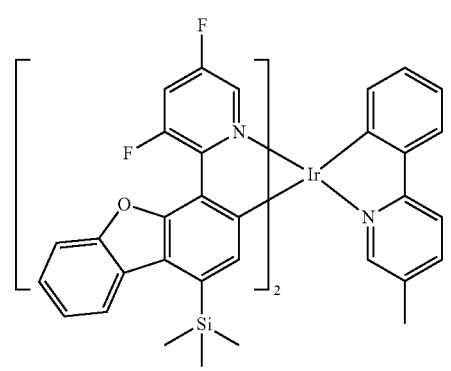
292
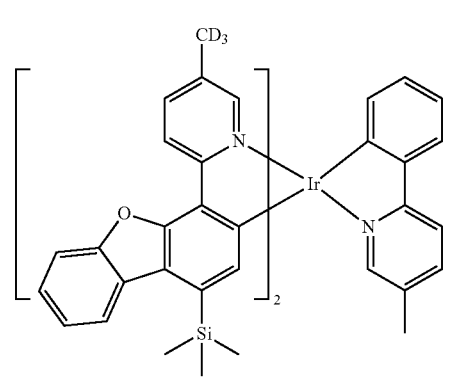
293
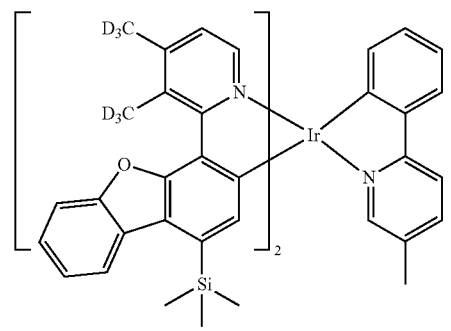

294
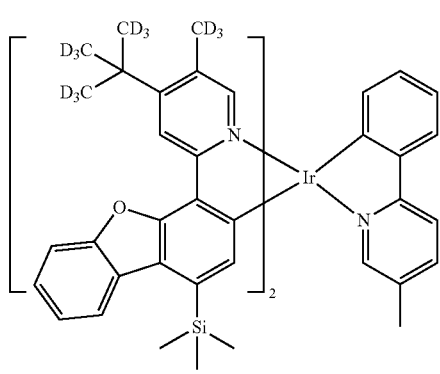
295
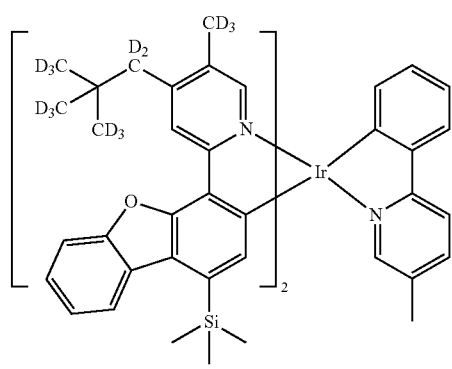
296
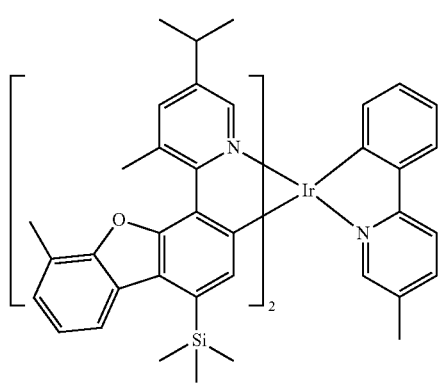
297
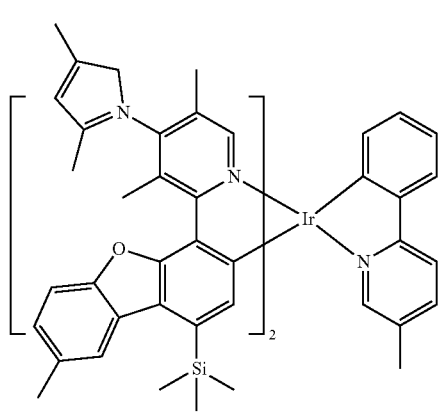
298
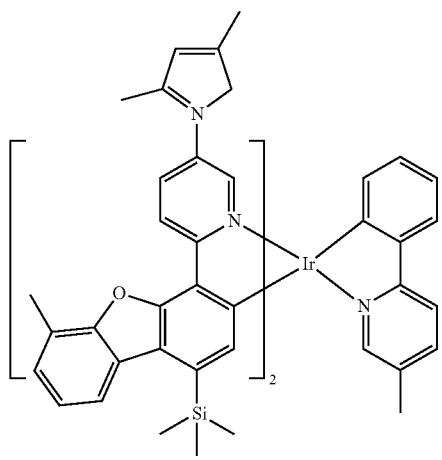
299
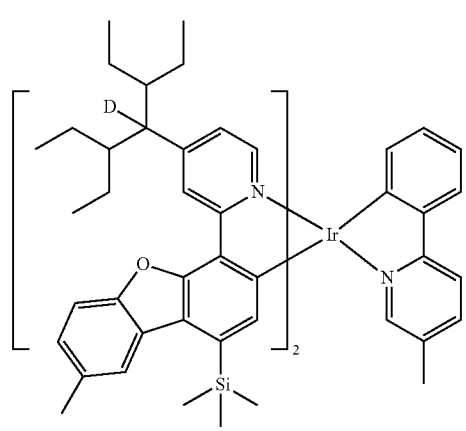
300
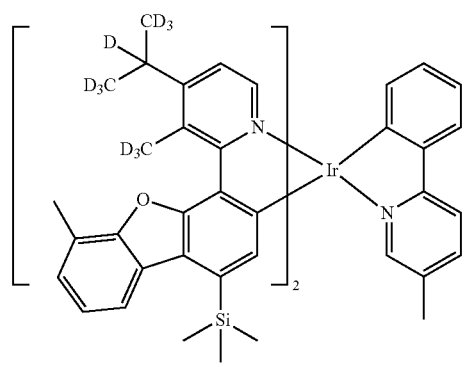
301
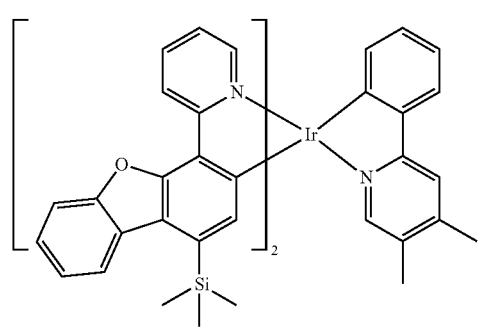

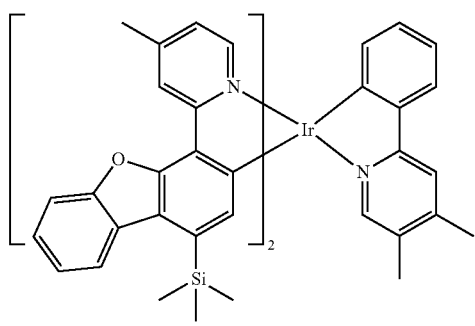
302
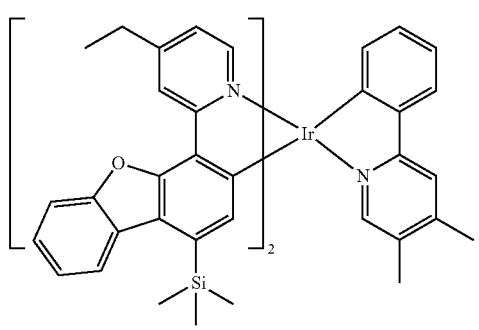
303
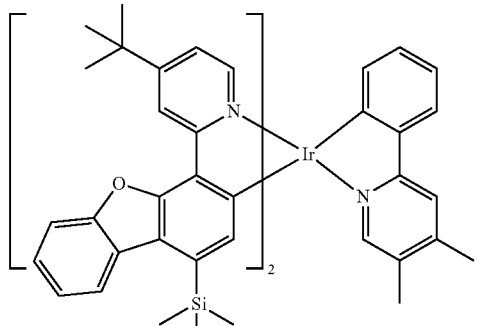
304
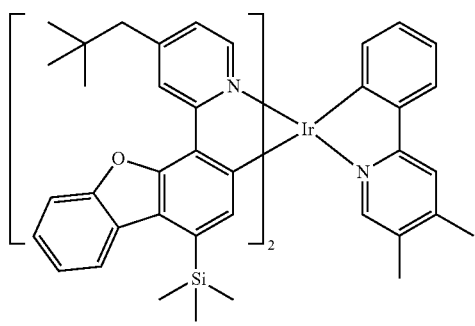
305
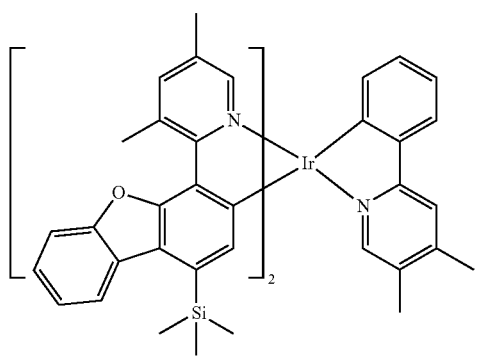
306
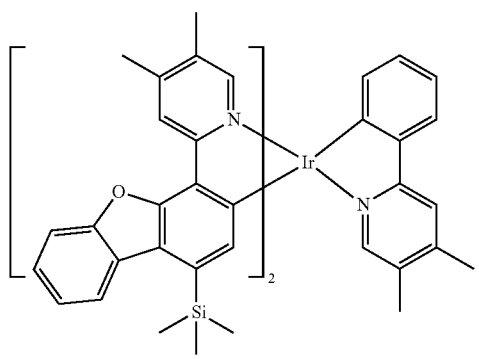
307
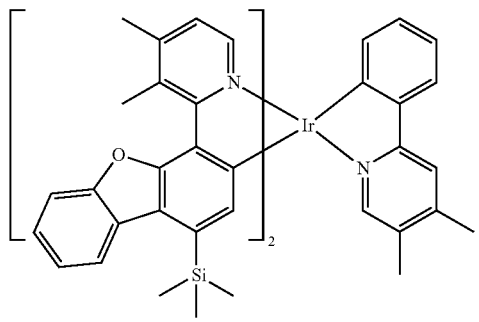
308
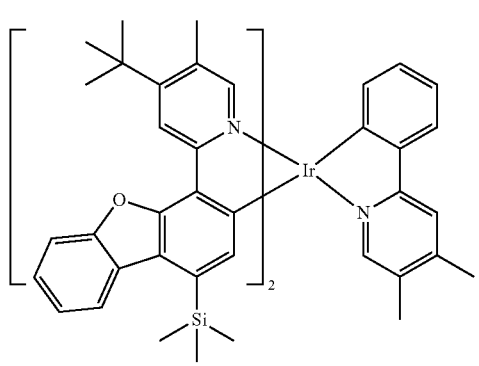
309

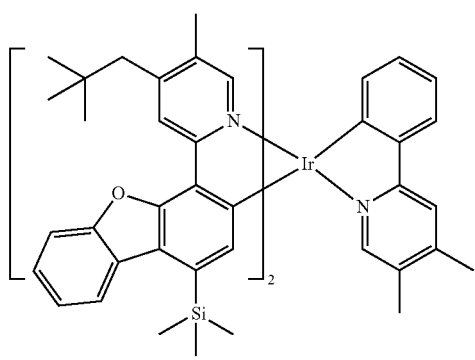
310
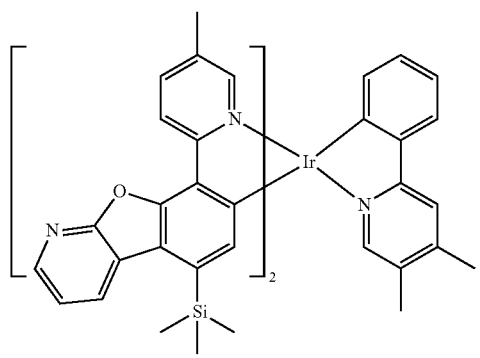
314
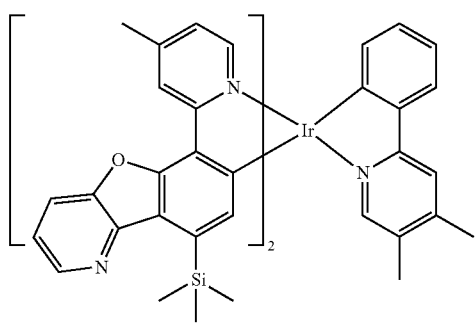
311
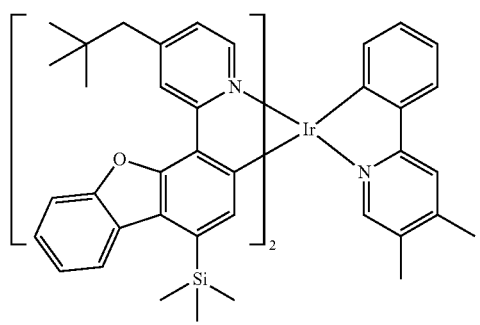
315
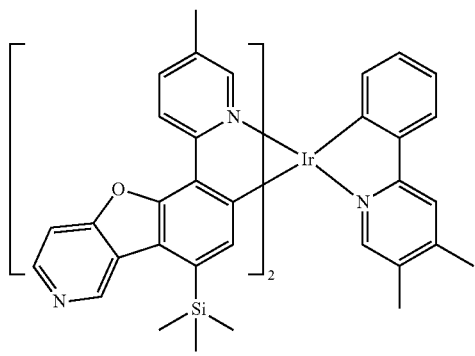
312
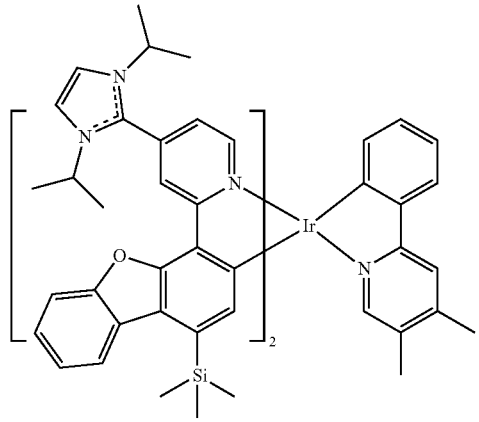
316
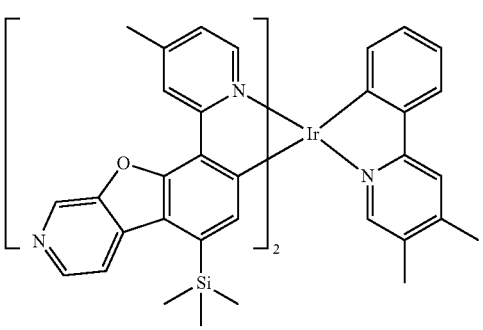
313
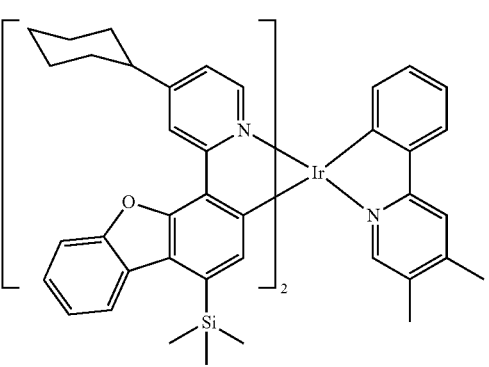
317

-continued
318
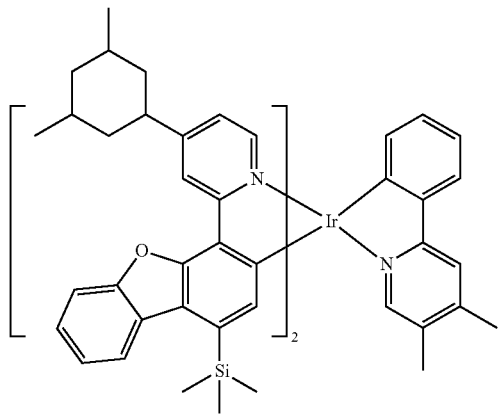
319
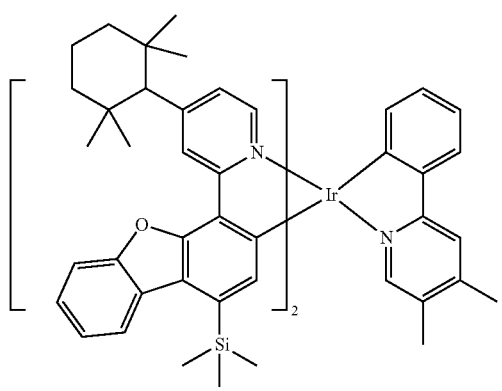
320
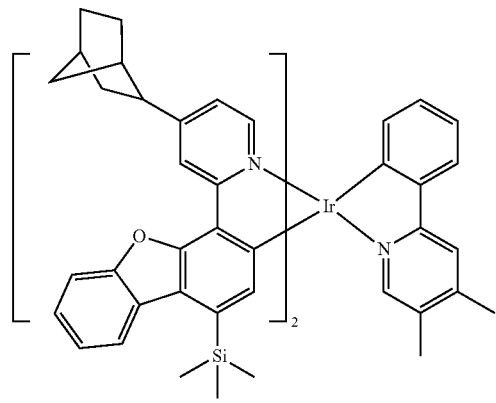
321
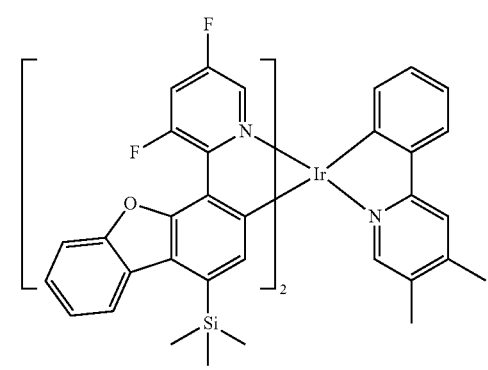
-continued
322
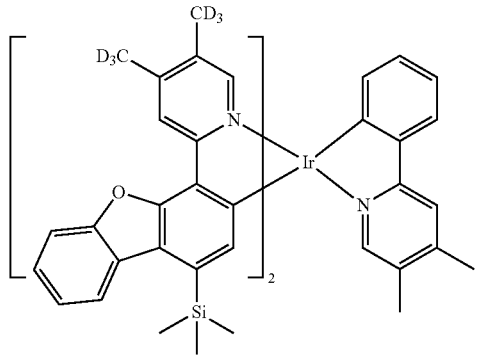
323
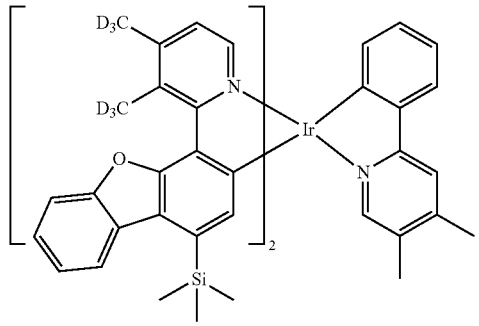
324
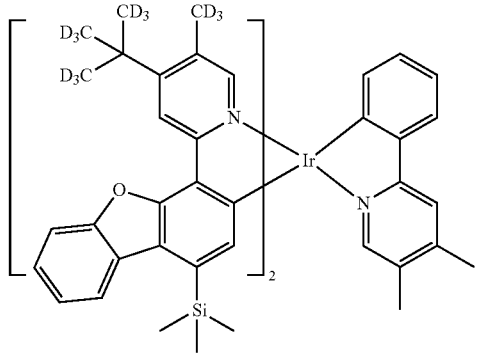
325
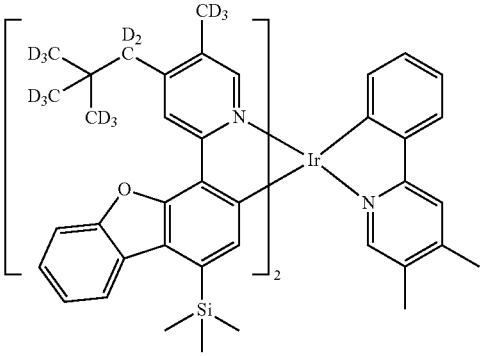

326
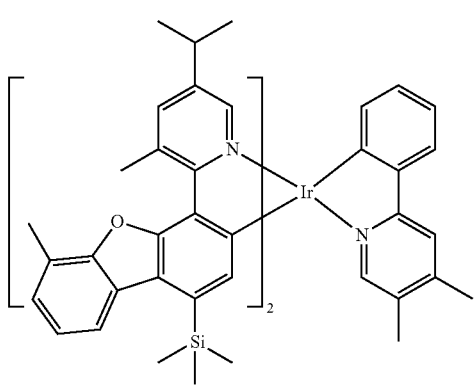
327
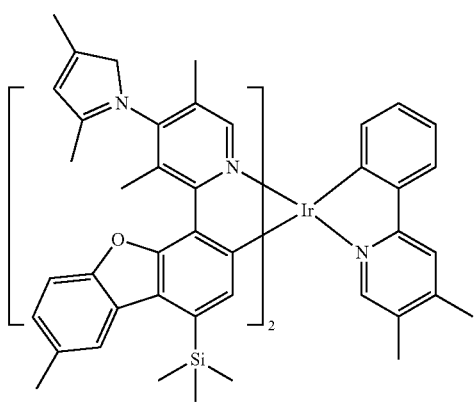
328
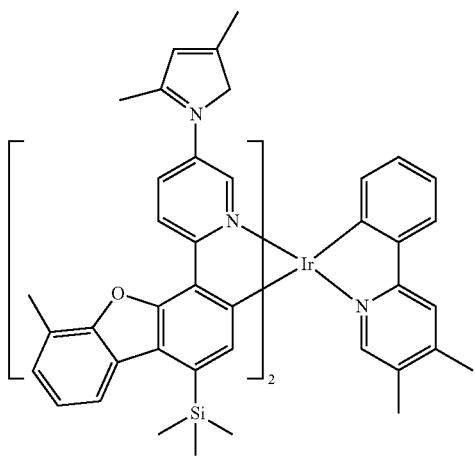
329
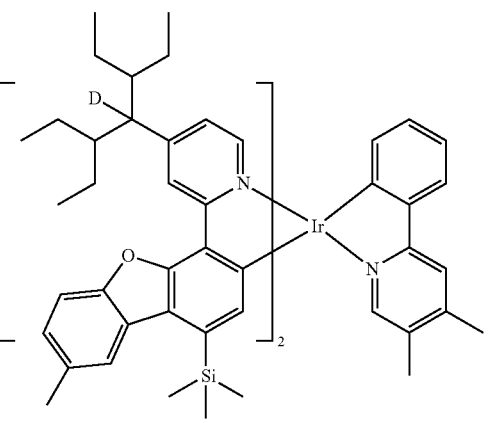
330
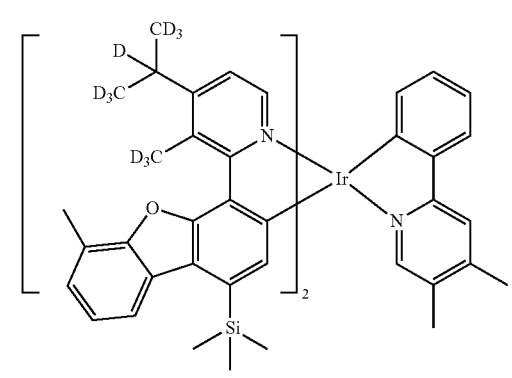
331
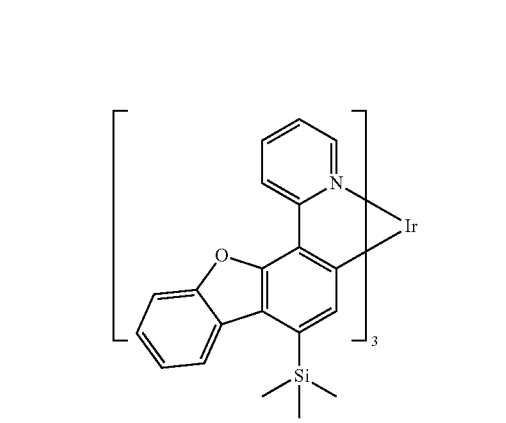
332
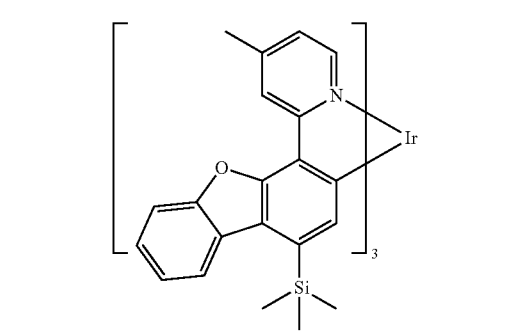
333
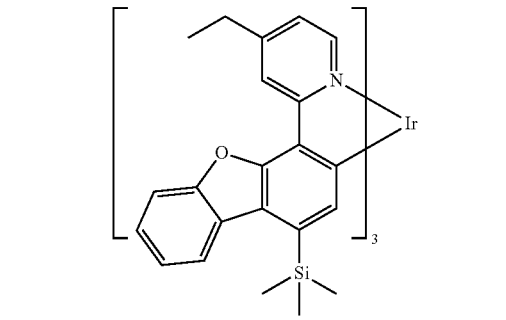

91
-continued
334
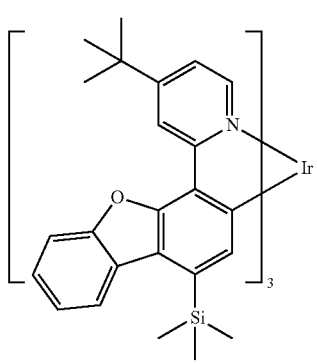
335
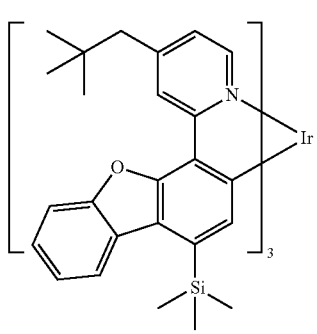
336
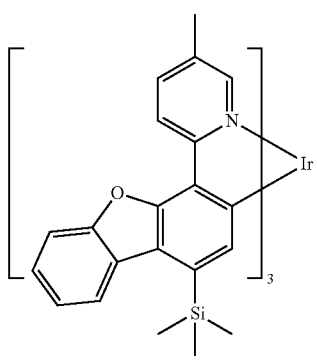
337
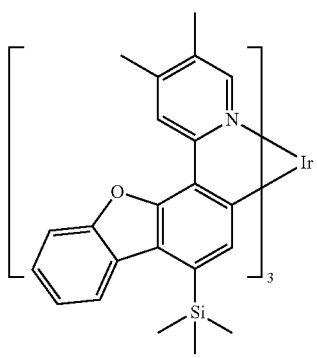
92
-continued
338
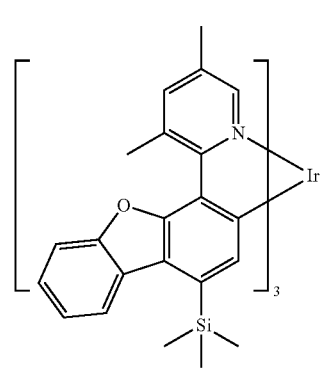
339
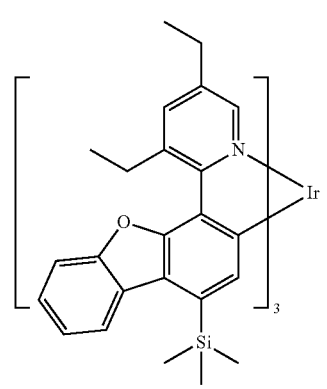
340
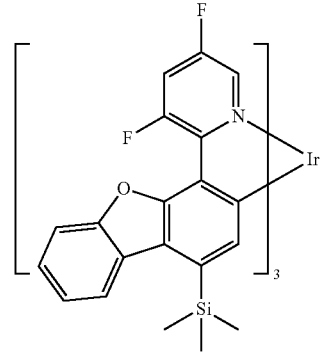
341
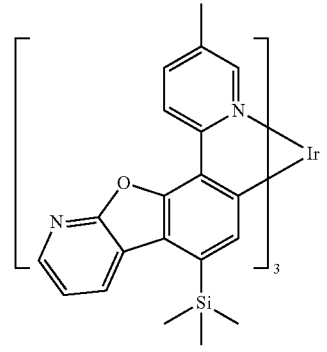

342 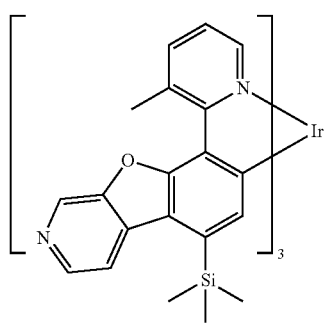
343 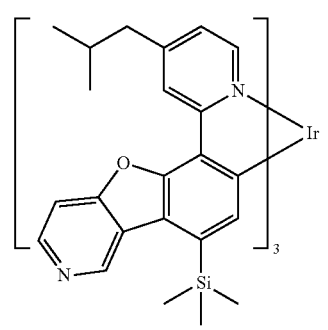
344 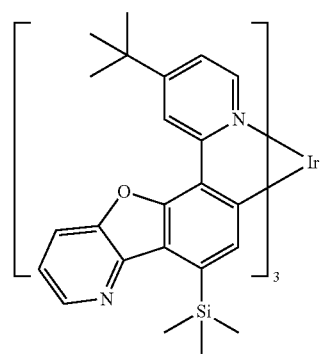
345 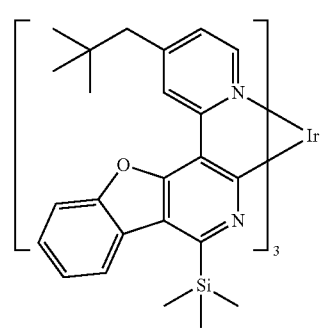
346 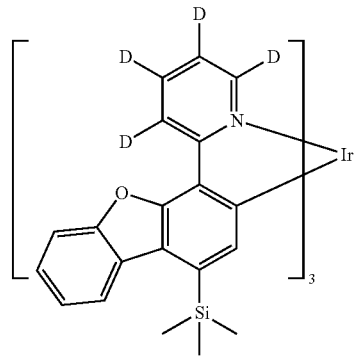
347 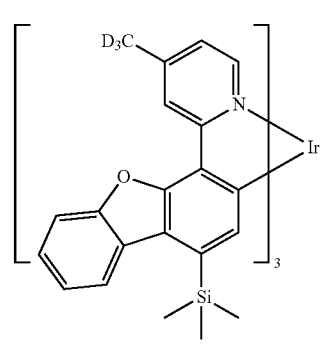
348 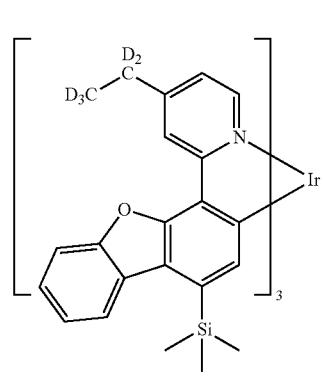
349 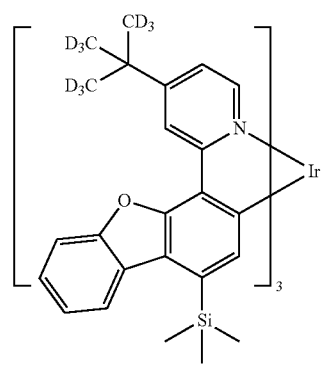

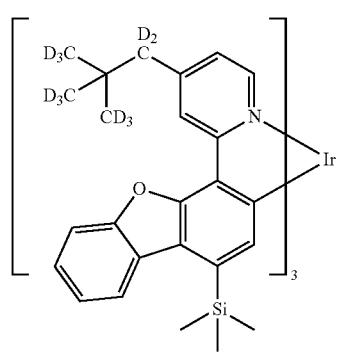
350
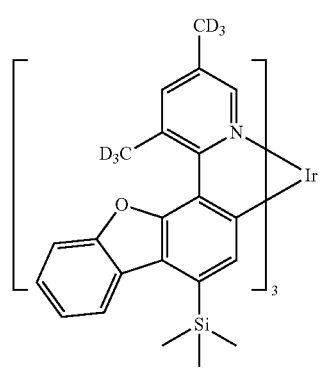
354
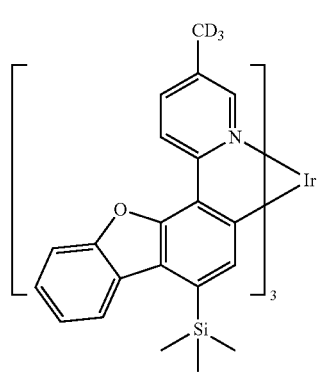
351
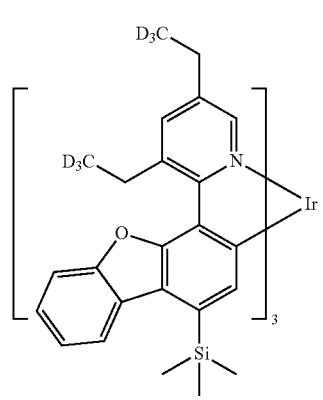
355
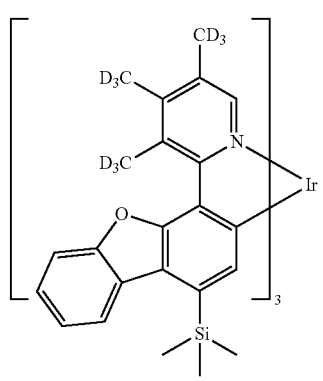
352
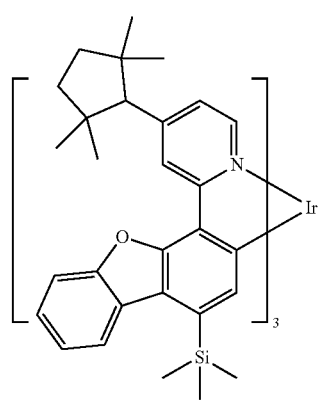
356
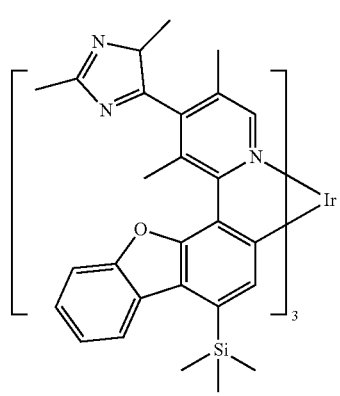
353
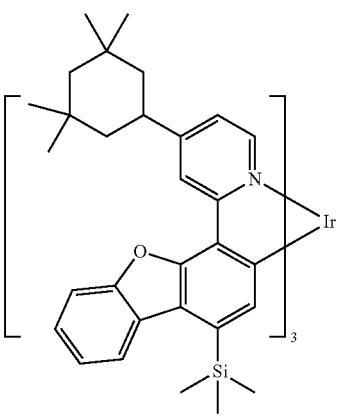
357

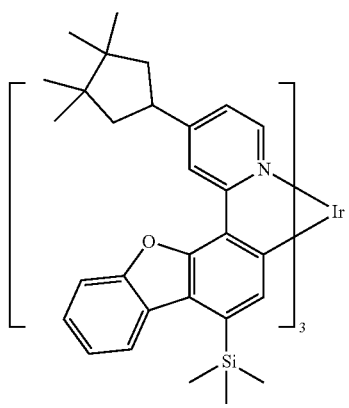
358
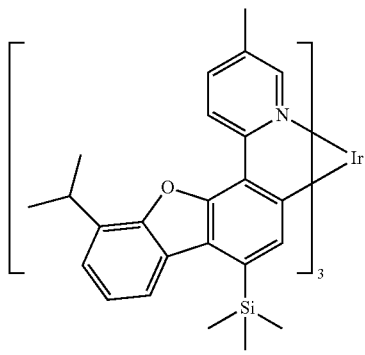
362
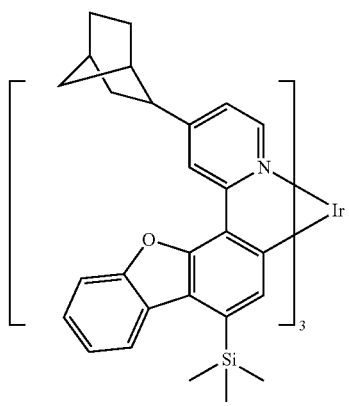
359
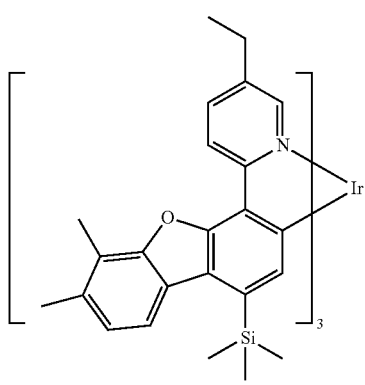
363
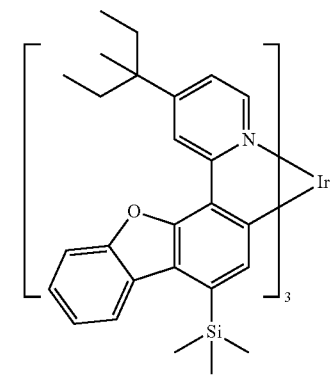
360
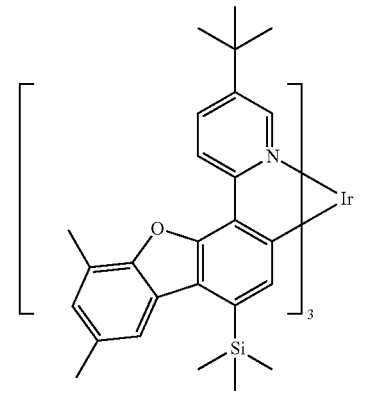
364
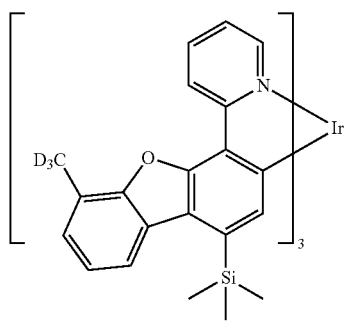
361
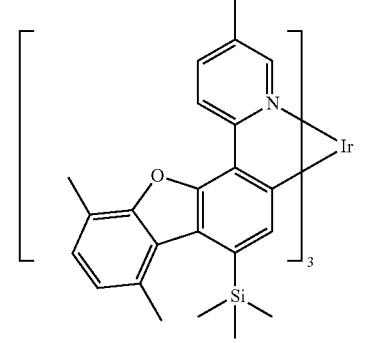
365

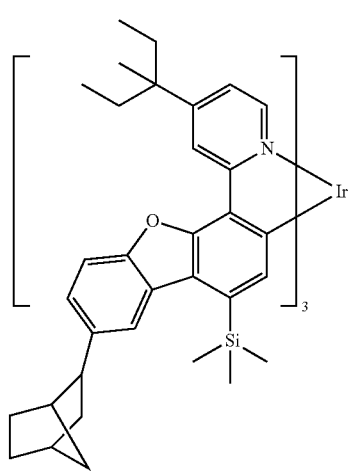
366
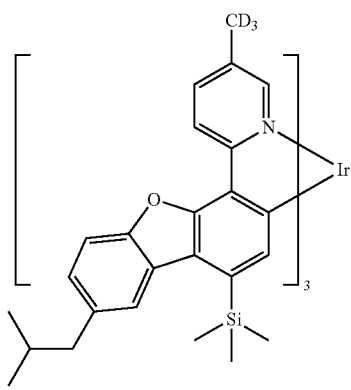
367
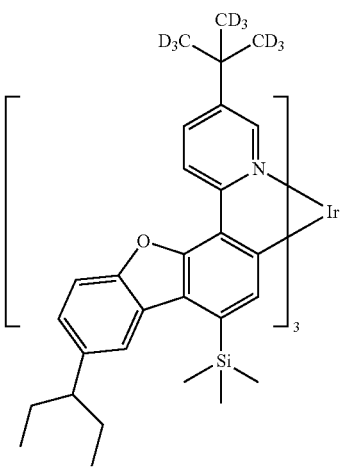
368
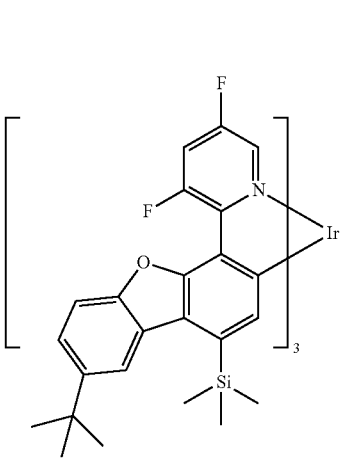
369
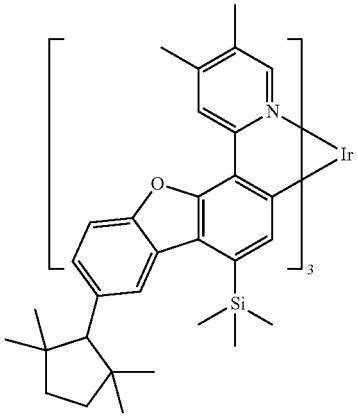
370
371

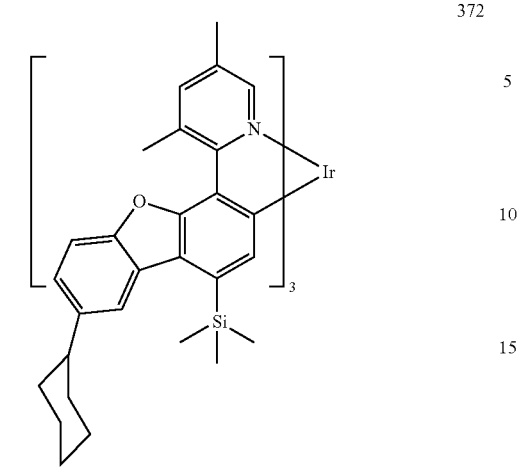
372
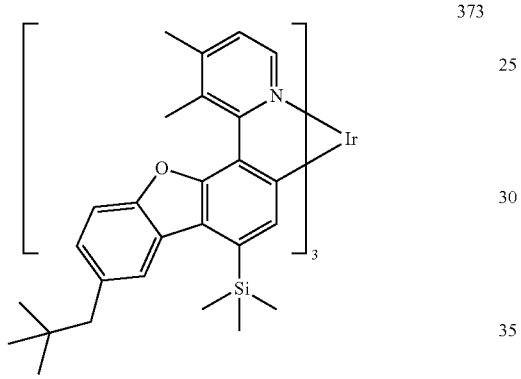
373
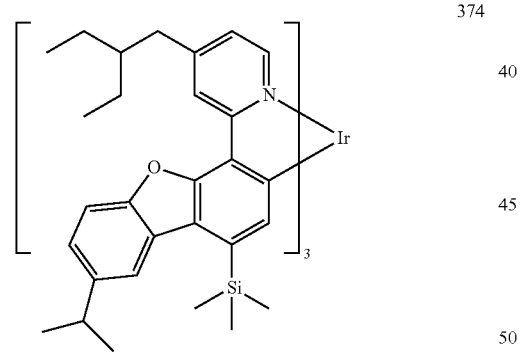
374
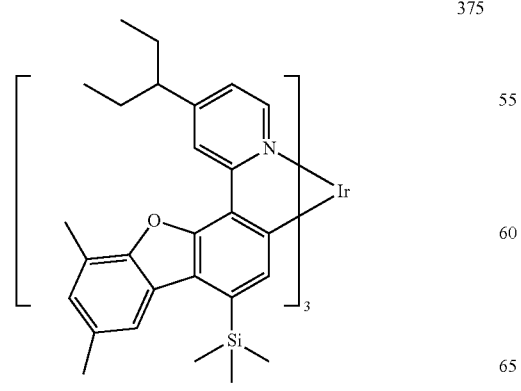
375
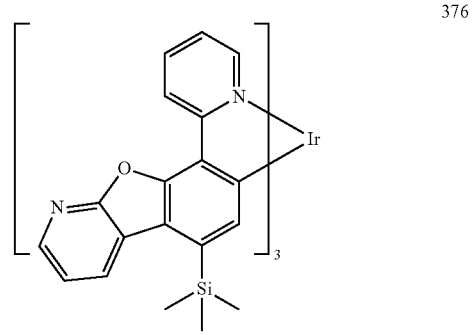
376
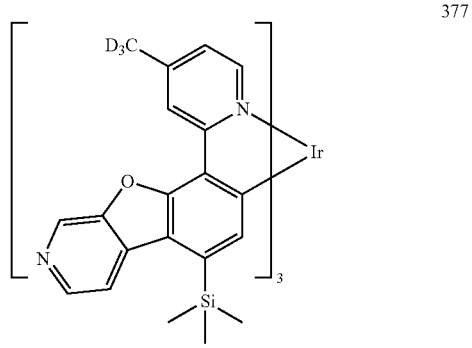
377
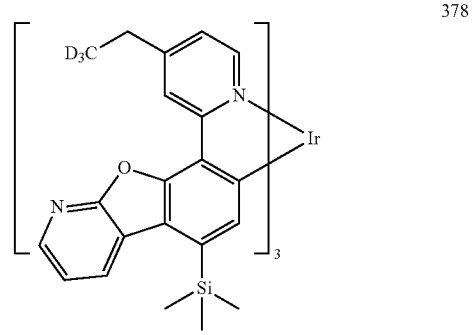
378
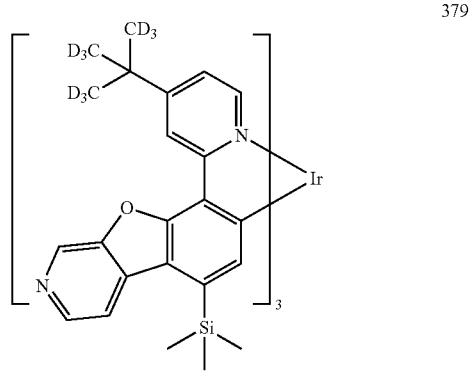
379

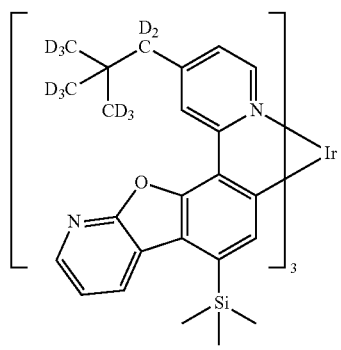
380
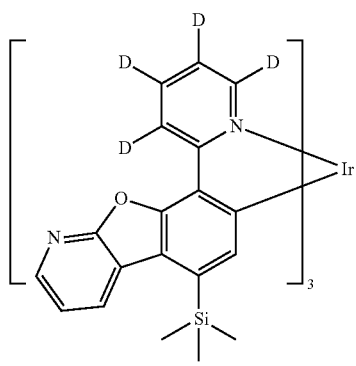
381
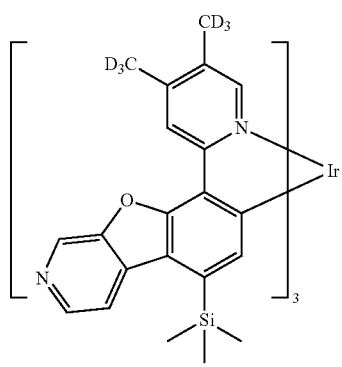
382
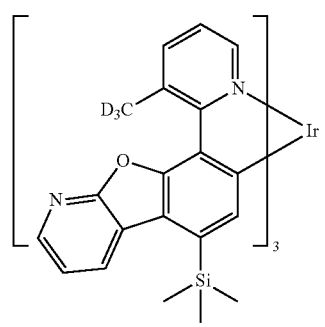
383
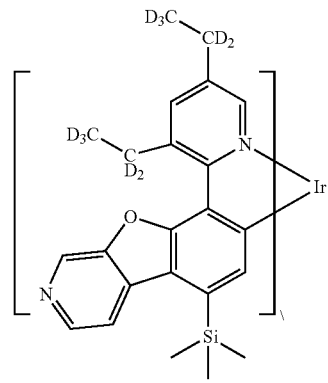
384
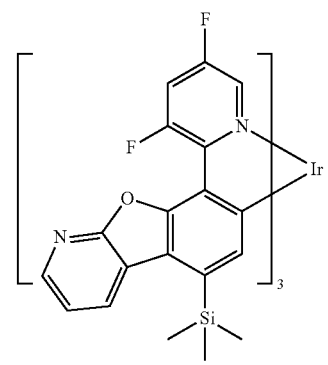
385
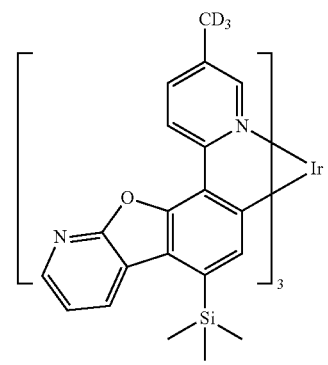
386
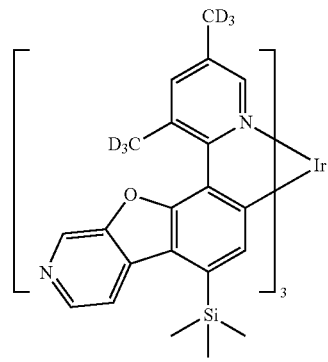
387

388
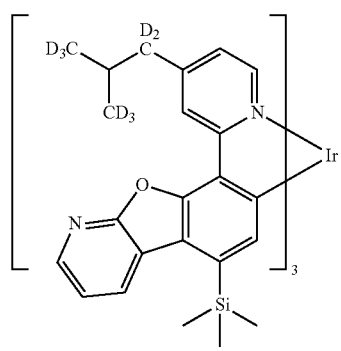
389
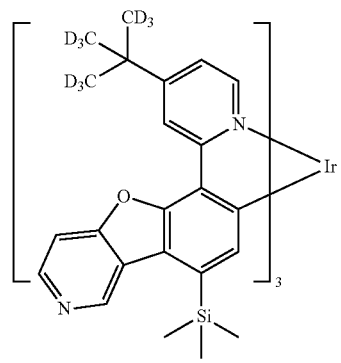
390
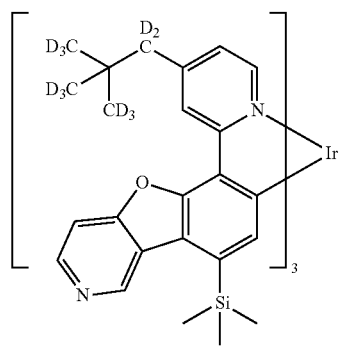
391
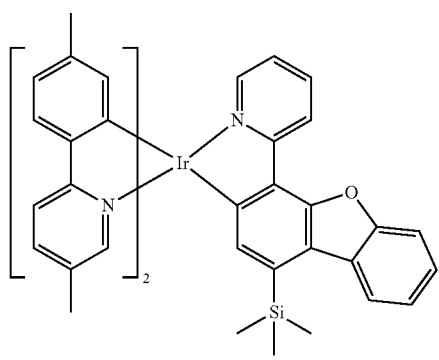
392
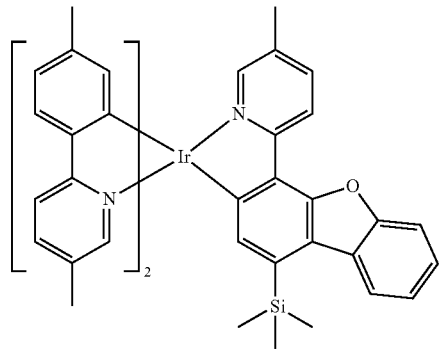
393
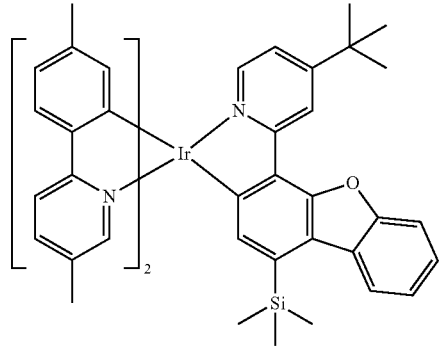
394
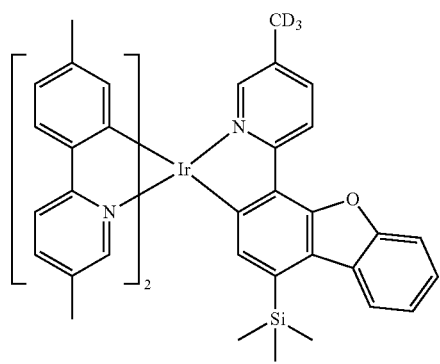
395
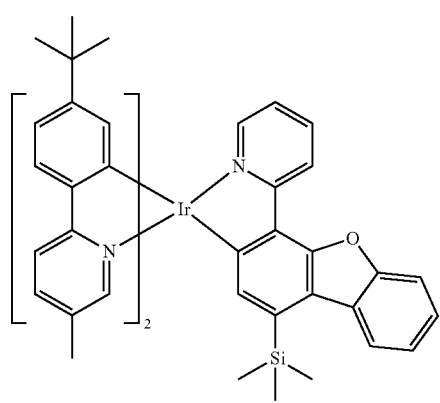

| 396 | 400 |
|---|---|
| 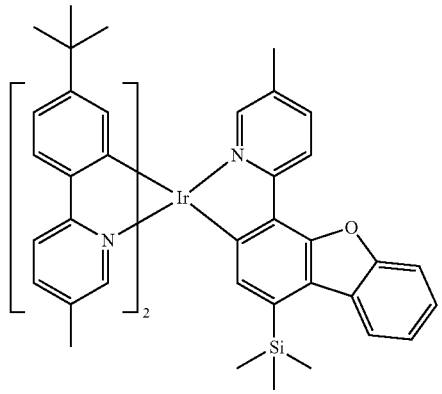 | 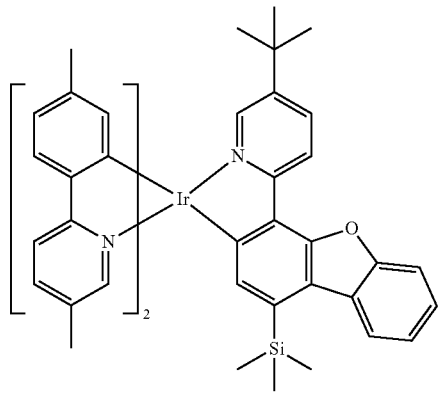 |
| 397 | 401 |
| 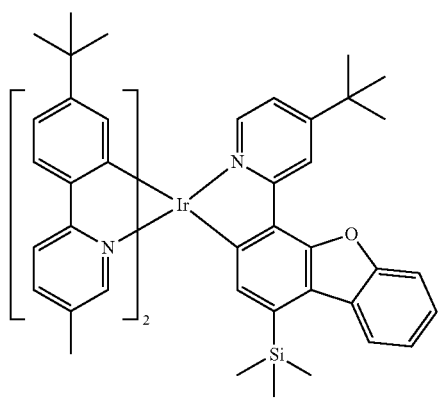 | 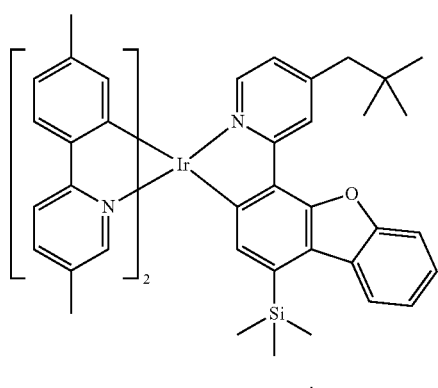 |
| 398 | 402 |
| 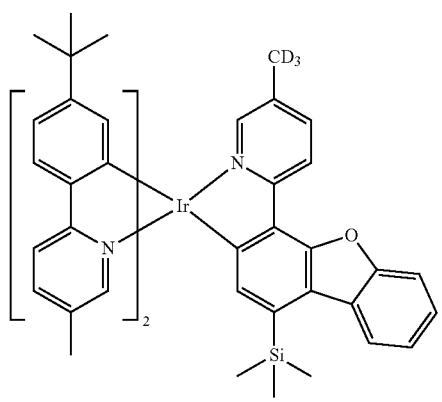 | 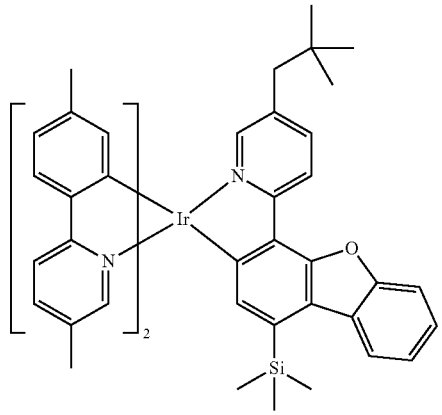 |
| 399 | 403 |
| 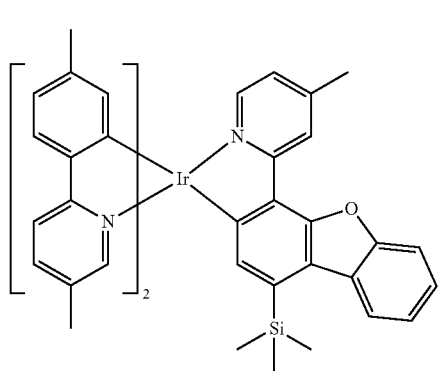 | 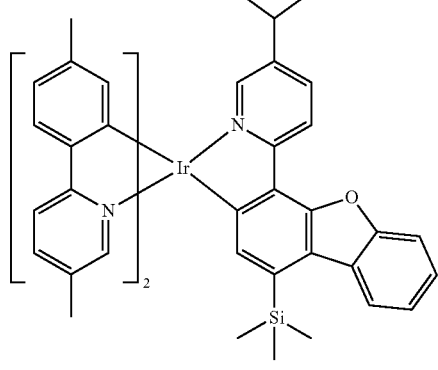 |

-continued

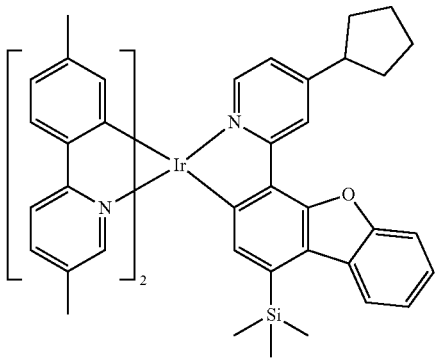

404

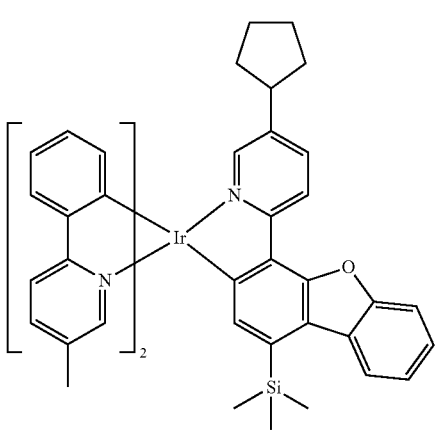

405

[Synthesis of Intermediated Compounds]
1. Synthesis of the Compound A
   (1) The Compound A-4

[Reaction Formula 1-1]

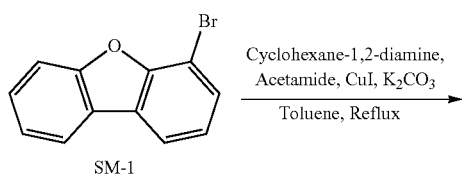

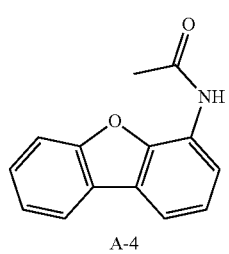

In the round bottom flask (1 L) under nitrogen atmosphere, SM-1 (49.14 g, 0.20 mol), (1R,2R)-cyclohexane-1,2-diamine (23.11 g, 0.20 mol), acetamide (35.85 g, 0.61 mol), copper(I) iodide (38.54 g, 0.20 mol) and potassium carbonate (100 g, 0.40 mol) were dissolved in toluene (500 mL), and the mixture was stirred under reflux while heating overnight. When the reaction was completed, the organic layer was extracted and separated using ethyl acetate and distilled water after filtering through a celite pad filter. The organic layer was dried with anhydrous magnesium sulfate, filtered through a filter, and then concentrated under reduced pressure. The crude product was recrystallized using dichloromethane and hexane to obtain the compound A-4 (18.45 g, 41%).

(2) The Compound A-3

[Reaction Formula 1-2]

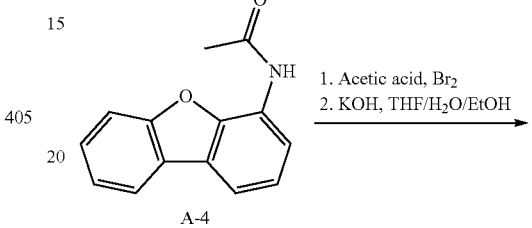

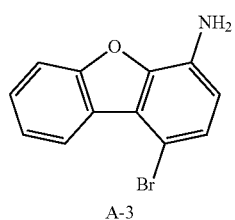

In the round bottom flask (250 mL) under nitrogen atmosphere, A-4 (24.75 g, 0.11 mol) was dissolved in acetic acid (300 mL), and bromine (5.69 mL, 0.11 mol) diluted with acetic acid (100 mL) was added to the reaction solution. The mixture was stirred at room temperature for 4 hours. When the reaction was completed, the solid formed at the bottom of the reaction vessel was filtered, and then sufficiently washed with distilled water. The solid obtained after filtration was dissolved in a mixed solution (THF:EtOH:distilled water=1:1:1, 500 mL), potassium hydroxide (125 g, 0.56 mol) was added thereto, and the mixture was stirred and refluxed overnight. After completion of the reaction, the organic layer was extracted and separated using ethyl acetate and distilled water. The organic layer was dried with anhydrous magnesium sulfate, filtered through a filter, and then concentrated under reduced pressure. The crude product was recrystallized from ethyl acetate and hexane to obtain the compound A-3 (20.67 g, 72%).

(3) The Compound A-2

[Reaction Formula 1-3]

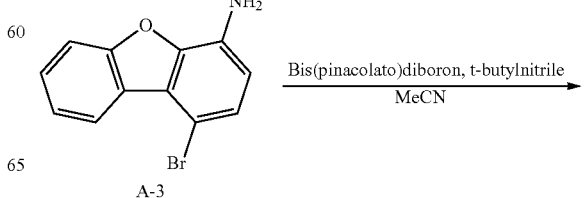

-continued

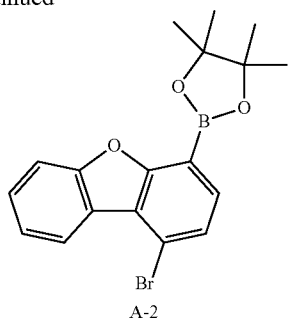

A-2

In the round bottom flask (250 mL) under nitrogen atmosphere, A-3 (18.27 g, 0.07 mol) and bis(pinacolato)diboron (25.84 g, 0.07 mol) were dissolved in acetonitrile (200 mL) and stirred at room temperature. Thereafter, tertiary-butylnitrile (13.1 g, 0.12 mol) was added to the reaction solution, and the temperature was increased and stirred at 80° C. for 2 hours. When the reaction is completed, the temperature of the reaction vessel is lowered to room temperature. The reaction solution was concentrated under reduced pressure, separated and purified by column chromatography to obtain the compound A-2 (10.94 g, 42%).

(4) The Compound A-1

[Reaction Formula 1-4]

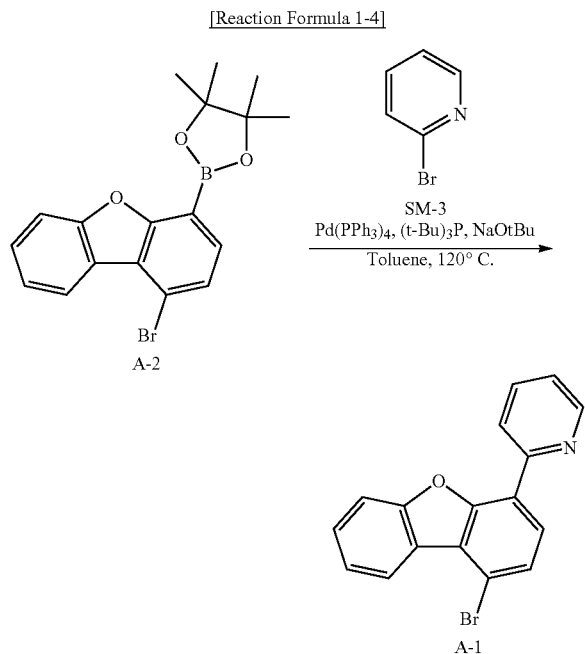

In the round bottom flask (250 mL) under nitrogen atmosphere, A-2 (7.44 g, 20 mmol), SM-3 (3.14 g, 20 mmol), Pd(PPh$_3$)$_4$ (2.31 g, 2 mmol), P(t-Bu)$_3$ (0.81 g, 4 mmol), and NaOtBu (7.68 g, 80 mmol) was dissolved in toluene (200 mL) and stirred and refluxed for 12 hours. After completion of the reaction, the temperature was lowered to room temperature, and the organic layer was extracted with dichloromethane and washed sufficiently with water. Moisture was removed with anhydrous magnesium sulfate, and the filtered solution was concentrated under reduced pressure. The mixture was separated by column chromatography to obtain the compound A-1 (5.49 g, 85%).

(5) The Compound A

[Reaction Formula 1-5]

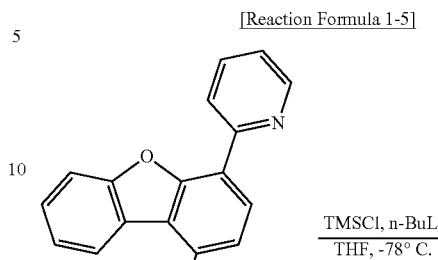

In the round bottom flask (250 mL) under nitrogen atmosphere, A-1 (4.84 g, 15 mmol) was added to THF (100 mL) and cooled to −78° C. After slowly adding 1.6M n-BuLi (14.06 mL, 22.50 mmol), the mixture was stirred at −78° C. for 1 hour. Trimethylsilyl chloride (TMSCl, 2.85 mL, 22.50 mmol) was added to the reaction vessel, stirred at −78° C. for 1 hour, and then the temperature was raised and the reaction was carried out at room temperature for 12 hours. After completion of the reaction, the organic layer was extracted with dichloromethane and washed with water. Anhydrous magnesium sulfate was added to remove moisture, and the filtered solution was concentrated under reduced pressure. The mixture was separated by column chromatography under the condition of ethylacetate:hexane=10:90 to obtain the compound A (3.09 g, 65%).

2. Synthesis of the Compound B (1) The Compound B-1

[Reaction Formula 2-1]

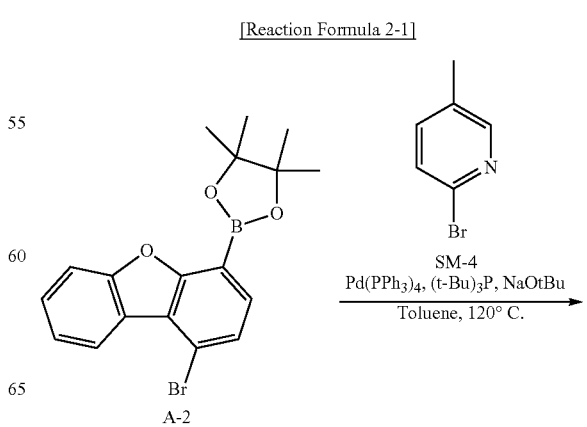

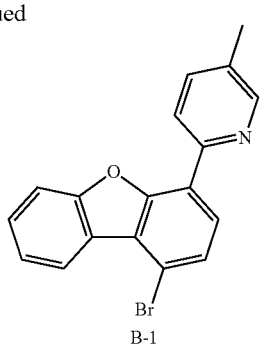

B-1

In the round bottom flask (250 mL) under nitrogen atmosphere, A-2 (7.44 g, 20 mmol), SM-4 (3.42 g, 20 mmol), Pd(PPh$_3$)$_4$ (2.31 g, 2 mmol), P(t-Bu)$_3$ (0.81 g, 4 mmol), and NaOtBu (7.68 g, 80 mmol) was dissolved in toluene (200 mL) and stirred and refluxed for 12 hours. After completion of the reaction, the temperature was lowered to room temperature, and the organic layer was extracted with dichloromethane and washed sufficiently with water. Moisture was removed with anhydrous magnesium sulfate, and the filtered solution was concentrated under reduced pressure. The mixture was separated by column chromatography to obtain the compound B-1 (5.53 g, 82%).

(2) The Compound B

[Reaction Formula 2-2]

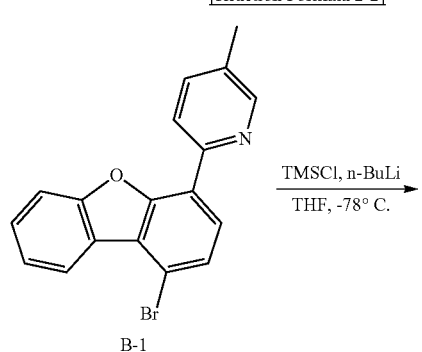

B-1

TMSCl, n-BuLi
THF, -78° C.

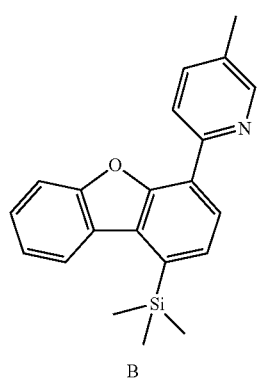

B

In the round bottom flask (250 mL) under nitrogen atmosphere, B-1 (5.06 g, 15 mmol) was added to THF (100 mL) and cooled to −78° C. After slowly adding 1.6M n-BuLi (14.06 mL, 22.50 mmol), the mixture was stirred at −78° C. for 1 hour. TMSCl (2.85 mL, 22.50 mmol) was added to the reaction vessel, stirred at −78° C. for 1 hour, and then the temperature was raised and the reaction was carried out at room temperature for 12 hours. After completion of the reaction, the organic layer was extracted with dichloromethane and washed with water. Anhydrous magnesium sulfate was added to remove moisture, and the filtered solution was concentrated under reduced pressure. The mixture was separated by column chromatography under the condition of ethylacetate:hexane=10:90 to obtain the compound B (3.73 g, 75%).

3. Synthesis of the Compound C (1) The Compound C-1

[Reaction Formula 3-1]

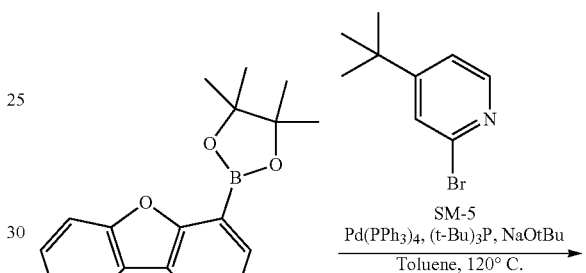

SM-5
Pd(PPh$_3$)$_4$, (t-Bu)$_3$P, NaOtBu
Toluene, 120° C.

A-2

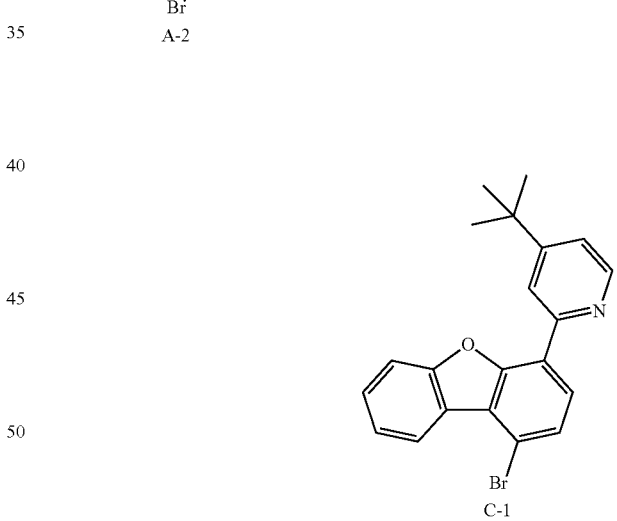

C-1

In the round bottom flask (250 mL) under nitrogen atmosphere, A-2 (7.44 g, 20 mmol), SM-5 (4.26 g, 20 mmol), Pd(PPh$_3$)$_4$ (2.31 g, 2 mmol), P(t-Bu)$_3$ (0.81 g, 4 mmol), and NaOtBu (7.68 g, 80 mmol) was dissolved in toluene (200 mL) and stirred and refluxed for 12 hours. After completion of the reaction, the temperature was lowered to room temperature, and the organic layer was extracted with dichloromethane and washed sufficiently with water. Moisture was removed with anhydrous magnesium sulfate, and the filtered solution was concentrated under reduced pressure. The mixture was separated by column chromatography to obtain the compound C-1 (6.44 g, 85%).

(2) The Compound C

[Reaction Formula 3-2]

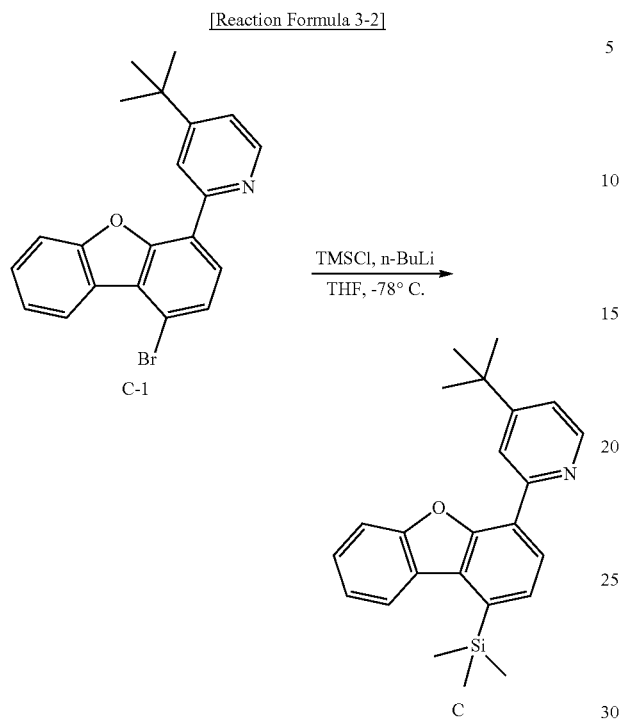

In the round bottom flask (250 mL) under nitrogen atmosphere, C-1 (5.69 g, 15 mmol) was added to THF (100 mL) and cooled to −78° C. After slowly adding 1.6M n-BuLi (14.06 mL, 22.50 mmol), the mixture was stirred at −78° C. for 1 hour. TMSCl (2.85 mL, 22.50 mmol) was added to the reaction vessel, stirred at −78° C. for 1 hour, and then the temperature was raised and the reaction was carried out at room temperature for 12 hours. After completion of the reaction, the organic layer was extracted with dichloromethane and washed with water. Anhydrous magnesium sulfate was added to remove moisture, and the filtered solution was concentrated under reduced pressure. The mixture was separated by column chromatography under the condition of ethylacetate:hexane=10:90 to obtain the compound C (3.97 g, 71%).

4. Synthesis of the Compound D
(1) The Compound D-1

[Reaction Formula 4-1]

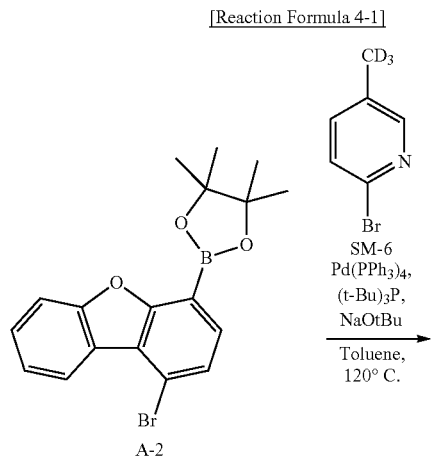

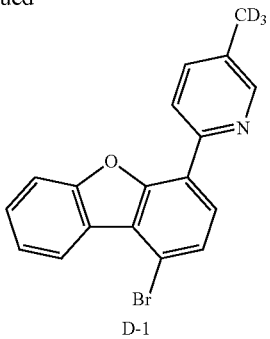

In the round bottom flask (250 mL) under nitrogen atmosphere, A-2 (7.44 g, 20 mmol), SM-6 (3.48 g, 20 mmol), Pd(PPh$_3$)$_4$ (2.31 g, 2 mmol), P(t-Bu)$_3$ (0.81 g, 4 mmol), and NaOtBu (7.68 g, 80 mmol) was dissolved in toluene (200 mL) and stirred and refluxed for 12 hours. After completion of the reaction, the temperature was lowered to room temperature, and the organic layer was extracted with dichloromethane and washed sufficiently with water. Moisture was removed with anhydrous magnesium sulfate, and the filtered solution was concentrated under reduced pressure. The mixture was separated by column chromatography to obtain the compound D-1 (5.44 g, 80%).

(2) The Compound D

[Reaction Formula 4-2]

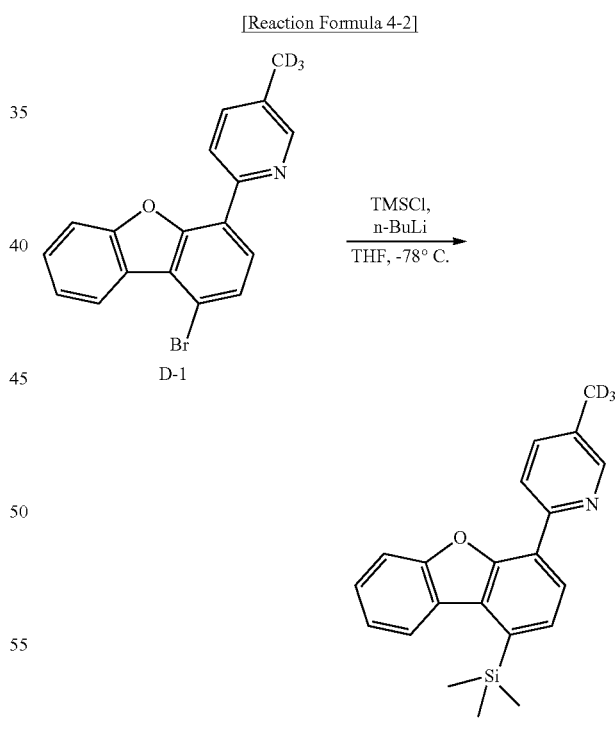

In the round bottom flask (250 mL) under nitrogen atmosphere, D-1 (5.10 g, 15 mmol) was added to THF (100 mL) and cooled to −78° C. After slowly adding 1.6M n-BuLi (14.06 mL, 22.50 mmol), the mixture was stirred at −78° C. for 1 hour. TMSCl (2.85 mL, 22.50 mmol) was added to the reaction vessel, stirred at −78° C. for 1 hour, and then the temperature was raised and the reaction was carried out at room temperature for 12 hours. After completion of the reaction, the organic layer was extracted with dichloromethane and washed with water. Anhydrous magnesium sulfate was added to remove moisture, and the filtered solution was concentrated under reduced pressure. The mixture was separated by column chromatography under the condition of ethylacetate:hexane=10:90 to obtain the compound D (3.16 g, 63%).

5. Synthesis of the Compound E (1) The Compound E-4

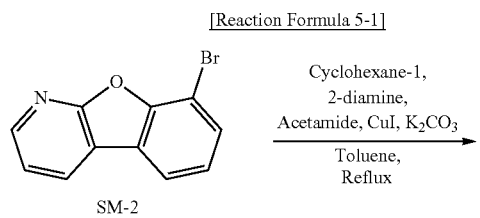

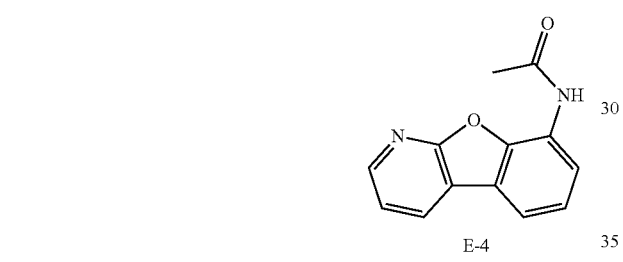

In the round bottom flask (1 L) under nitrogen atmosphere, SM-2 (49.39 g, 0.20 mol), (1R,2R)-cyclohexane-1,2-diamine (23.11 g, 0.20 mol), acetamide (35.85 g, 0.61 mol), copper(I) iodide (38.54 g, 0.20 mol) and potassium carbonate (100 g, 0.40 mol) were dissolved in toluene (500 mL), and the mixture was stirred under reflux while heating overnight. When the reaction was completed, the organic layer was extracted and separated using ethyl acetate and distilled water after filtering through a celite pad filter. The organic layer was dried with anhydrous magnesium sulfate, filtered through a filter, and then concentrated under reduced pressure. The crude product was recrystallized using dichloromethane and hexane to obtain the compound E-4 (21.25 g, 47%).

(2) The Compound E-3

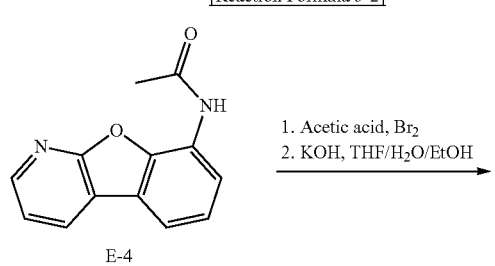

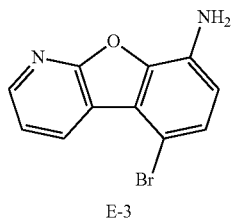

In the round bottom flask (250 mL) under nitrogen atmosphere, E-4 (24.87 g, 0.11 mol) was dissolved in acetic acid (300 mL), and bromine (5.69 mL, 0.11 mol) diluted with acetic acid (100 mL) was added to the reaction solution. The mixture was stirred at room temperature for 4 hours. When the reaction was completed, the solid formed at the bottom of the reaction vessel was filtered, and then sufficiently washed with distilled water. The solid obtained after filtration was dissolved in a mixed solution (THF:EtOH:distilled water=1:1:1, 500 mL), potassium hydroxide (125 g, 0.56 mol) was added thereto, and the mixture was stirred and refluxed overnight. After completion of the reaction, the organic layer was extracted and separated using ethyl acetate and distilled water. The organic layer was dried with anhydrous magnesium sulfate, filtered through a filter, and then concentrated under reduced pressure. The crude product was recrystallized from ethyl acetate and hexane to obtain the compound E-3 (19.88 g, 69%).

(3) The Compound E-2

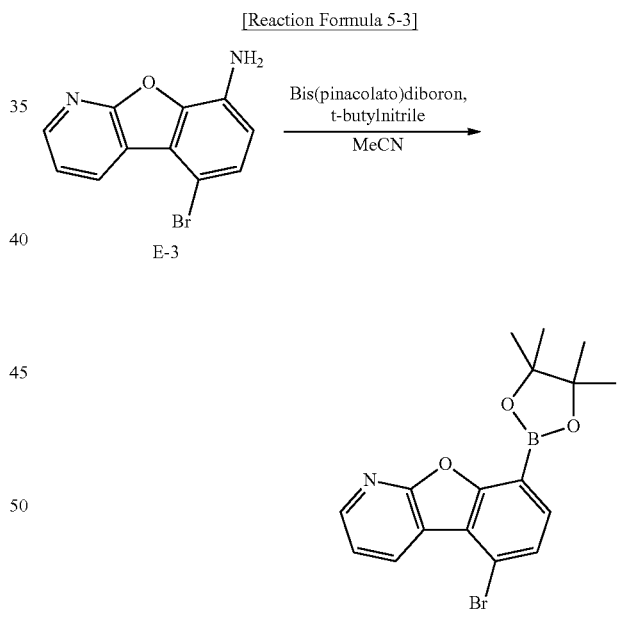

In the round bottom flask (250 mL) under nitrogen atmosphere, E-3 (18.34 g, 0.07 mol) and bis(pinacolato)diboron (25.84 g, 0.07 mol) were dissolved in acetonitrile (200 mL) and stirred at room temperature. Thereafter, tertiary-butylnitrile (13.1 g, 0.12 mol) was added to the reaction solution, and the temperature was increased and stirred at 80° C. for 2 hours. When the reaction is completed, the temperature of the reaction vessel is lowered to room temperature. The reaction solution was concentrated under reduced pressure, separated and purified by column chromatography to obtain the compound E-2 (12.27 g, 47%).

(4) The Compound E-1

[Reaction Formula 5-4]

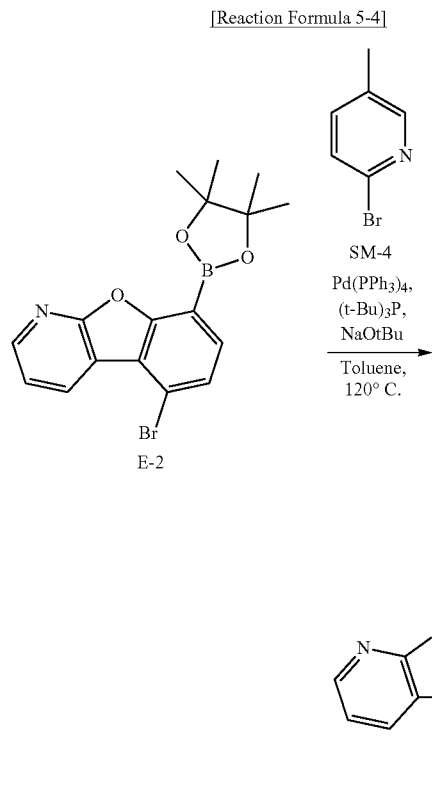

In the round bottom flask (250 mL) under nitrogen atmosphere, E-2 (7.46 g, 20 mmol), SM-4 (3.42 g, 20 mmol), Pd(PPh$_3$)$_4$ (2.31 g, 2 mmol), P(t-Bu)$_3$ (0.81 g, 4 mmol), and NaOtBu (7.68 g, 80 mmol) was dissolved in toluene (200 mL) and stirred and refluxed for 12 hours. After completion of the reaction, the temperature was lowered to room temperature, and the organic layer was extracted with dichloromethane and washed sufficiently with water.

Moisture was removed with anhydrous magnesium sulfate, and the filtered solution was concentrated under reduced pressure. The mixture was separated by column chromatography to obtain the compound E-1 (4.87 g, 72%).

(5) The Compound E

[Reaction Formula 5-5]

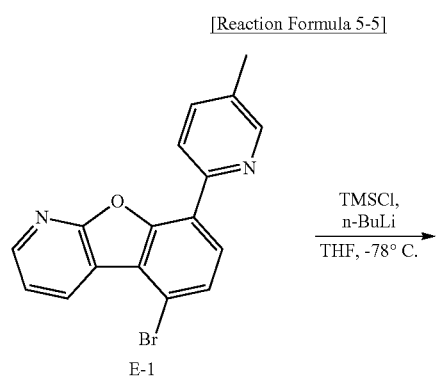

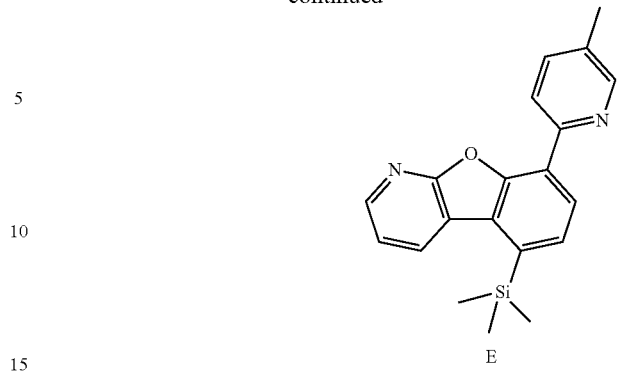

In the round bottom flask (250 mL) under nitrogen atmosphere, E-1 (5.07 g, 15 mmol) was added to THF (100 mL) and cooled to −78° C. After slowly adding 1.6M n-BuLi (14.06 mL, 22.50 mmol), the mixture was stirred at −78° C. for 1 hour. Trimethylsilyl chloride (TMSCl, 2.85 mL, 22.50 mmol) was added to the reaction vessel, stirred at −78° C. for 1 hour, and then the temperature was raised and the reaction was carried out at room temperature for 12 hours. After completion of the reaction, the organic layer was extracted with dichloromethane and washed with water. Anhydrous magnesium sulfate was added to remove moisture, and the filtered solution was concentrated under reduced pressure. The mixture was separated by column chromatography under the condition of ethylacetate:hexane=10:90 to obtain the compound E (2.84 g, 57%).

6. Synthesis of the Compound F (1) The Compound F-1

[Reaction Formula 6-1]

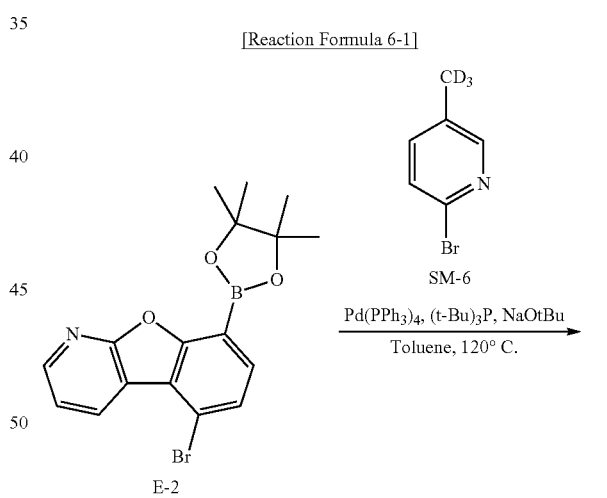

In the round bottom flask (250 mL) under nitrogen atmosphere, E-2 (7.46 g, 20 mmol), SM-6 (3.48 g, 20 mmol), Pd(PPh$_3$)$_4$ (2.31 g, 2 mmol), P(t-Bu)$_3$ (0.81 g, 4 mmol), and NaOtBu (7.68 g, 80 mmol) was dissolved in toluene (200 mL) and stirred and refluxed for 12 hours. After completion of the reaction, the temperature was lowered to room temperature, and the organic layer was extracted with dichloromethane and washed sufficiently with water. Moisture was removed with anhydrous magnesium sulfate, and the filtered solution was concentrated under reduced pressure. The mixture was separated by column chromatography to obtain the compound F-1 (5.25 g, 77%).

(2) The Compound F

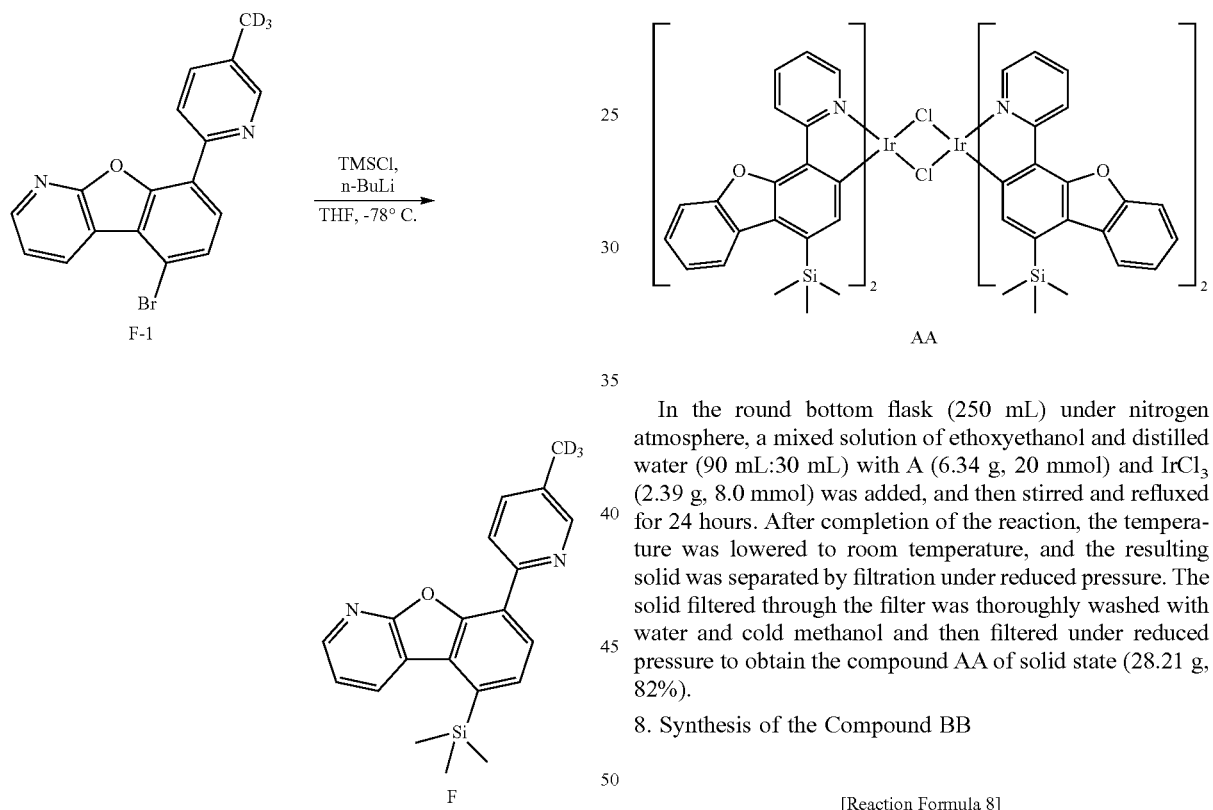

In the round bottom flask (250 mL) under nitrogen atmosphere, F-1 (5.12 g, 15 mmol) was added to THF (100 mL) and cooled to −78° C. After slowly adding 1.6M n-BuLi (14.06 mL, 22.50 mmol), the mixture was stirred at −78° C. for 1 hour. Trimethylsilyl chloride (TMSCl, 2.85 mL, 22.50 mmol) was added to the reaction vessel, stirred at −78° C. for 1 hour, and then the temperature was raised and the reaction was carried out at room temperature for 12 hours. After completion of the reaction, the organic layer was extracted with dichloromethane and washed with water. Anhydrous magnesium sulfate was added to remove moisture, and the filtered solution was concentrated under reduced pressure. The mixture was separated by column chromatography under the condition of ethylacetate:hexane=10:90 to obtain the compound F (2.26 g, 45%).

7. Synthesis of the Compound AA

[Reaction Formula 7]

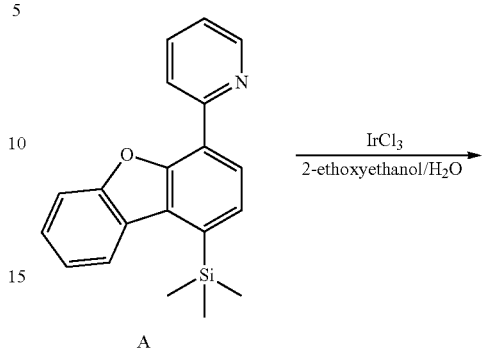

In the round bottom flask (250 mL) under nitrogen atmosphere, a mixed solution of ethoxyethanol and distilled water (90 mL:30 mL) with A (6.34 g, 20 mmol) and IrCl$_3$ (2.39 g, 8.0 mmol) was added, and then stirred and refluxed for 24 hours. After completion of the reaction, the temperature was lowered to room temperature, and the resulting solid was separated by filtration under reduced pressure. The solid filtered through the filter was thoroughly washed with water and cold methanol and then filtered under reduced pressure to obtain the compound AA of solid state (28.21 g, 82%).

8. Synthesis of the Compound BB

[Reaction Formula 8]

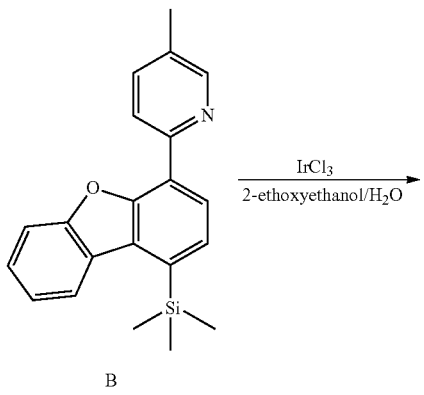

-continued

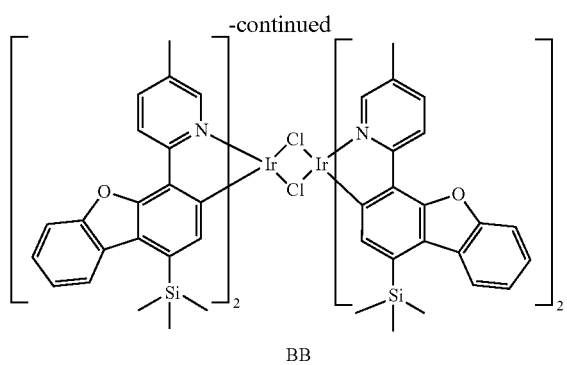

BB

In the round bottom flask (250 mL) under nitrogen atmosphere, a mixed solution of ethoxyethanol and distilled water (90 mL:30 mL) with B (6.62 g, 20 mmol) and $IrCl_3$ (2.39 g, 8.0 mmol) was added, and then stirred and refluxed for 24 hours. After completion of the reaction, the temperature was lowered to room temperature, and the resulting solid was separated by filtration under reduced pressure. The solid filtered through the filter was thoroughly washed with water and cold methanol and then filtered under reduced pressure to obtain the compound BB of solid state (26.83 g, 78%).

9. Synthesis of the Compound CC

[Reaction Formula 9]

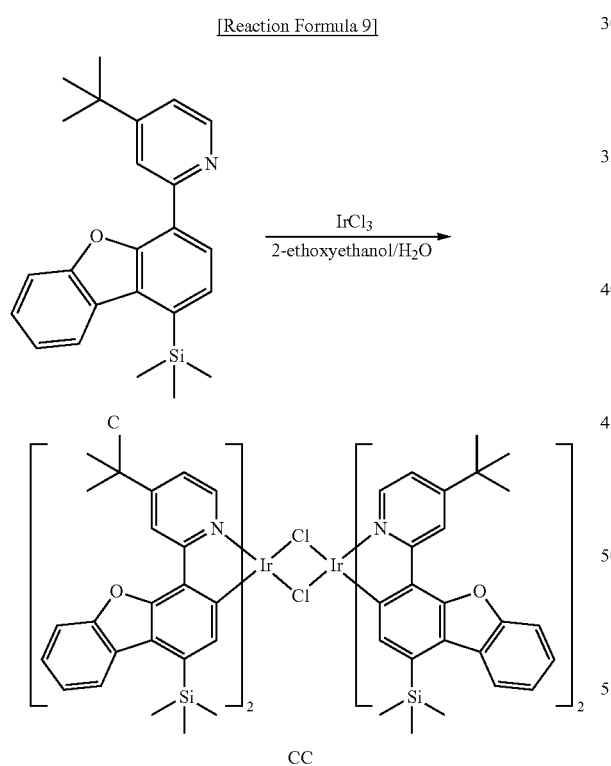

CC

In the round bottom flask (250 mL) under nitrogen atmosphere, a mixed solution of ethoxyethanol and distilled water (90 mL:30 mL) with C (7.46 g, 20 mmol) and $IrCl_3$ (2.39 g, 8.0 mmol) was added, and then stirred and refluxed for 24 hours. After completion of the reaction, the temperature was lowered to room temperature, and the resulting solid was separated by filtration under reduced pressure. The solid filtered through the filter was thoroughly washed with water and cold methanol and then filtered under reduced pressure to obtain the compound CC of solid state (33.06 g, 85%).

10. Synthesis of the Compound DD

[Reaction Formula 10]

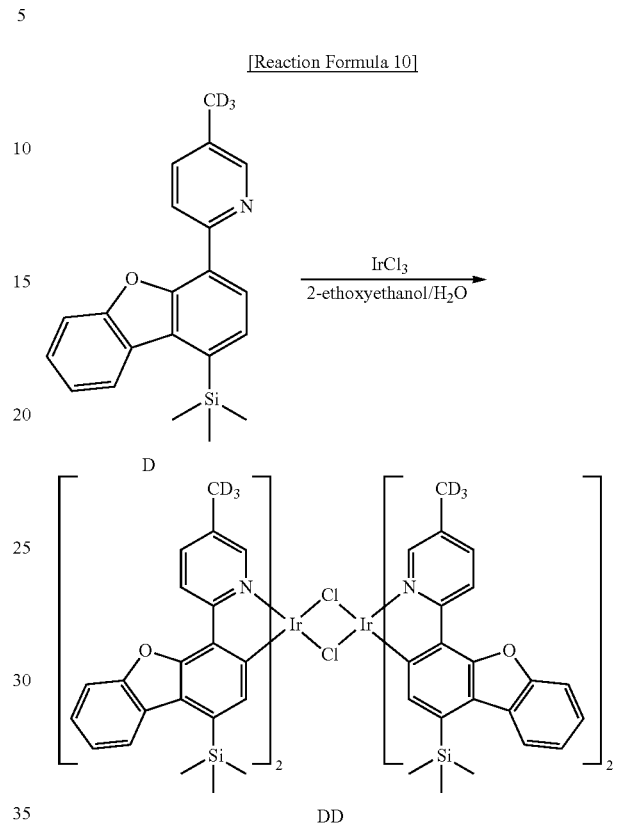

DD

In the round bottom flask (250 mL) under nitrogen atmosphere, a mixed solution of ethoxyethanol and distilled water (90 mL:30 mL) with D (6.68 g, 20 mmol) and $IrCl_3$ (2.39 g, 8.0 mmol) was added, and then stirred and refluxed for 24 hours. After completion of the reaction, the temperature was lowered to room temperature, and the resulting solid was separated by filtration under reduced pressure. The solid filtered through the filter was thoroughly washed with water and cold methanol and then filtered under reduced pressure to obtain the compound DD of solid state (28.26 g, 79%).

11. Synthesis of the Compound EE

[Reaction Formula 11]

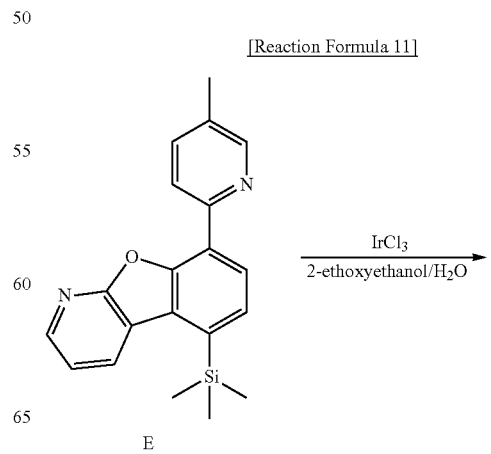

E

-continued

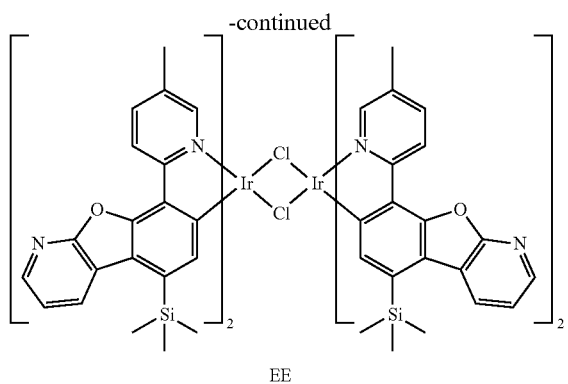

EE

In the round bottom flask (250 mL) under nitrogen atmosphere, a mixed solution of ethoxyethanol and distilled water (90 mL:30 mL) with E (6.64 g, 20 mmol) and IrCl₃ (2.39 g, 8.0 mmol) was added, and then stirred and refluxed for 24 hours. After completion of the reaction, the temperature was lowered to room temperature, and the resulting solid was separated by filtration under reduced pressure. The solid filtered through the filter was thoroughly washed with water and cold methanol and then filtered under reduced pressure to obtain the compound EE of solid state (26.35 g, 74%).

12. Synthesis of the Compound FF

[Reaction Formula 12]

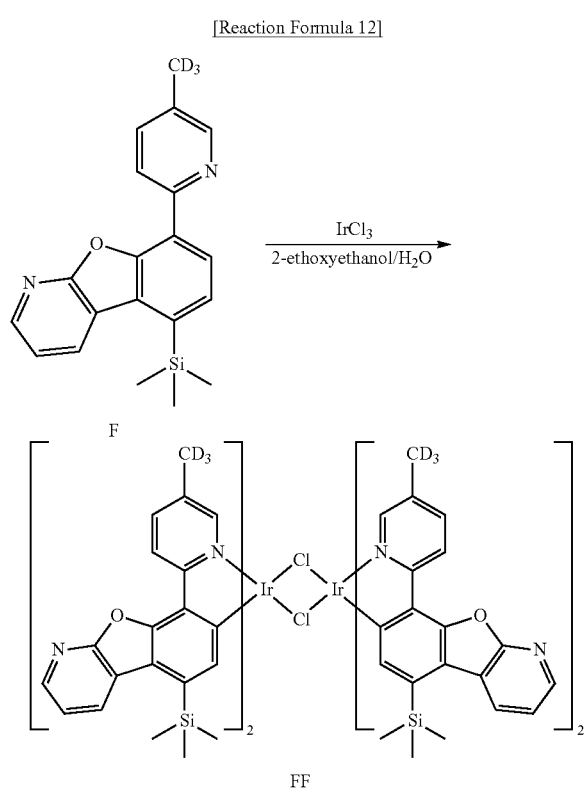

FF

In the round bottom flask (250 mL) under nitrogen atmosphere, a mixed solution of ethoxyethanol and distilled water (90 mL:30 mL) with F (6.70 g, 20 mmol) and IrCl₃ (2.39 g, 8.0 mmol) was added, and then stirred and refluxed for 24 hours. After completion of the reaction, the temperature was lowered to room temperature, and the resulting solid was separated by filtration under reduced pressure. The solid filtered through the filter was thoroughly washed with water and cold methanol and then filtered under reduced pressure to obtain the compound FF of solid state (29.04 g, 81%).

13. Synthesis of the Compound GG

[Reaction Formula 13]

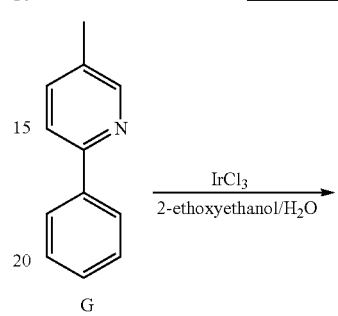

G

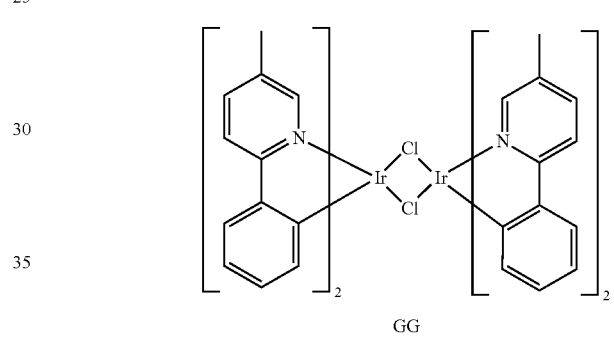

GG

In the round bottom flask (250 mL) under nitrogen atmosphere, a mixed solution of ethoxyethanol and distilled water (90 mL:30 mL) with G (3.38 g, 20 mmol) and IrCl₃ (2.39 g, 8.0 mmol) was added, and then stirred and refluxed for 24 hours. After completion of the reaction, the temperature was lowered to room temperature, and the resulting solid was separated by filtration under reduced pressure. The solid filtered through the filter was thoroughly washed with water and cold methanol and then filtered under reduced pressure to obtain the compound GG of solid state (21.66 g, 96%).

14. Synthesis of the Compound A'

[Reaction Formula 14]

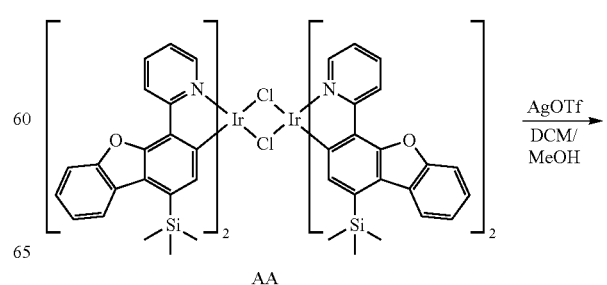

AA

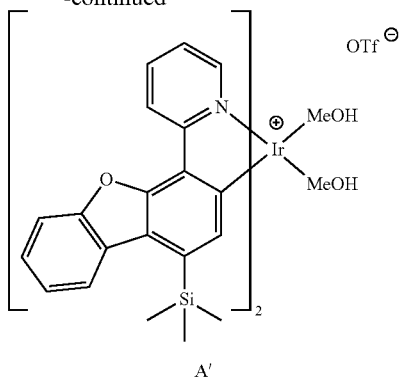

A'

In the round bottom flask (250 mL), AA (6.88 g, 4 mmol) and silver trifluoromethanesulfonate (AgOTf, 3.02 g, 12 mmol) were dissolved in dichloromethane and methanol and stirred at room temperature for 24 hours. After completion of the reaction, the solid precipitate is removed by filtration using celite. The filtered residual solution was distilled under reduced pressure to obtain the compound A' of solid state (3.98 g, 94%).

15. Synthesis of the Compound B'

[Reaction Formula 15]

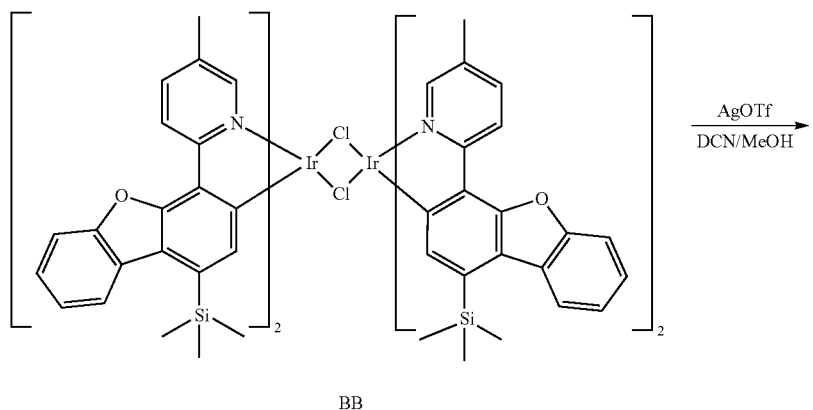

BB

In the round bottom flask (250 mL), BB (7.11 g, 4 mmol) and silver trifluoromethanesulfonate (AgOTf, 3.02 g, 12 mmol) were dissolved in dichloromethane and methanol and stirred at room temperature for 24 hours. After completion of the reaction, the solid precipitate is removed by filtration using celite. The filtered residual solution was distilled under reduced pressure to obtain the compound B' of solid state (4.09 g, 96%).

16. Synthesis of the Compound C'

[Reaction Formula 16]

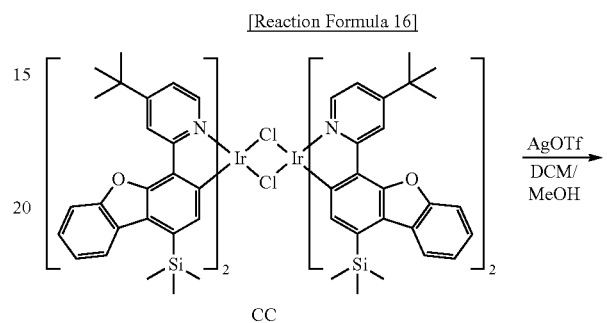

CC

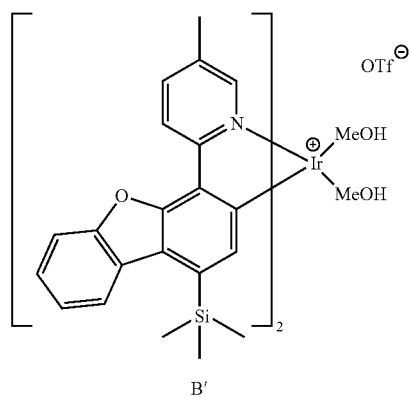

B'

-continued

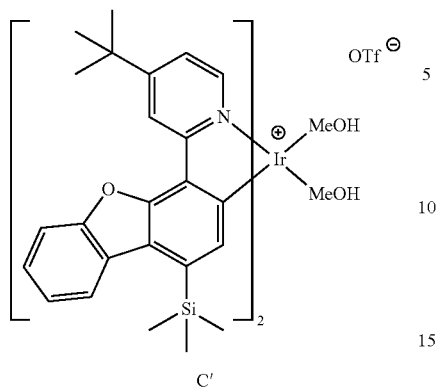

C'

In the round bottom flask (250 mL), CC (7.78 g, 4 mmol) and silver trifluoromethanesulfonate (AgOTf, 3.02 g, 12 mmol) were dissolved in dichloromethane and methanol and stirred at room temperature for 24 hours. After completion of the reaction, the solid precipitate is removed by filtration using celite. The filtered residual solution was distilled under reduced pressure to obtain the compound C' of solid state (4.19 g, 91%).

17. Synthesis of the Compound D'

[Reaction Formula 17]

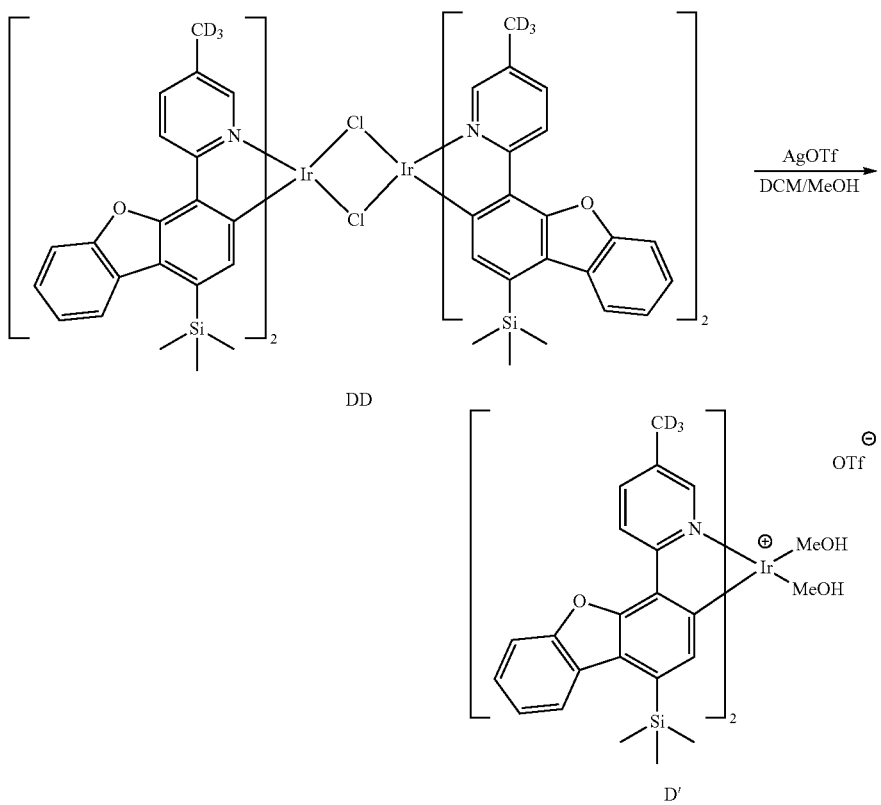

In the round bottom flask (250 mL), DD (7.15 g, 4 mmol) and silver trifluoromethanesulfonate (AgOTf, 3.02 g, 12 mmol) were dissolved in dichloromethane and methanol and stirred at room temperature for 24 hours. After completion of the reaction, the solid precipitate is removed by filtration using celite. The filtered residual solution was distilled under reduced pressure to obtain the compound D' of solid state (3.73 g, 87%).

18. Synthesis of the Compound E'

[Reaction Formula 18]

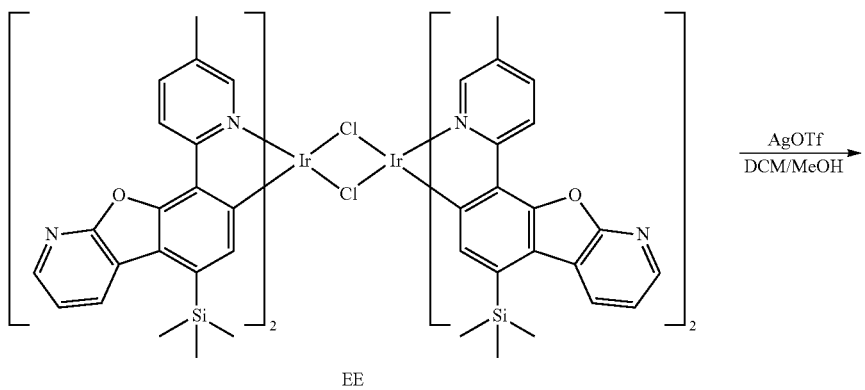

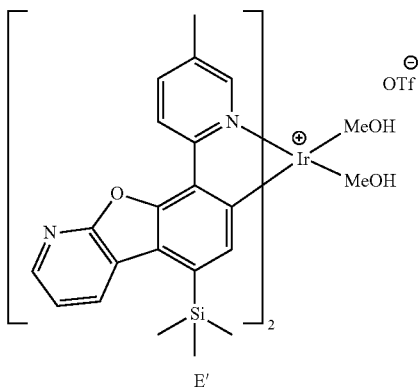

In the round bottom flask (250 mL), EE (7.12 g, 4 mmol) and silver trifluoromethanesulfonate (AgOTf, 3.02 g, 12 mmol) were dissolved in dichloromethane and methanol and stirred at room temperature for 24 hours. After completion of the reaction, the solid precipitate is removed by filtration using celite. The filtered residual solution was distilled under reduced pressure to obtain the compound E of solid state (3.85 g, 90%).

19. Synthesis of the Compound F'

[Reaction Formula 19]

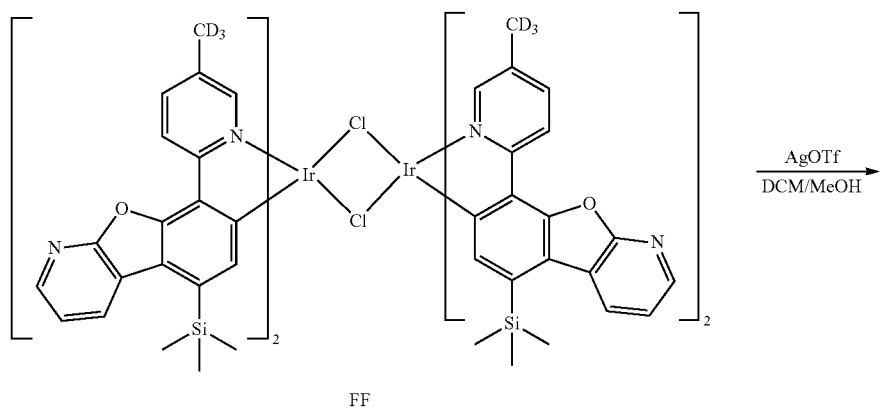

-continued

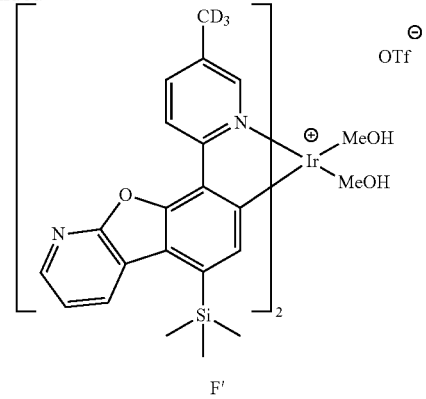

F'

In the round bottom flask (250 mL), FF (7.17 g, 4 mmol) and silver trifluoromethanesulfonate (AgOTf, 3.02 g, 12 mmol) were dissolved in dichloromethane and methanol and stirred at room temperature for 24 hours. After completion of the reaction, the solid precipitate is removed by filtration using celite. The filtered residual solution was distilled under reduced pressure to obtain the compound F' of solid state (4.00 g, 93%).

20. Synthesis of the Compound G'

[Reaction Formula 20]

21. Synthesis of the Compound 16

[Reaction Formula 21]

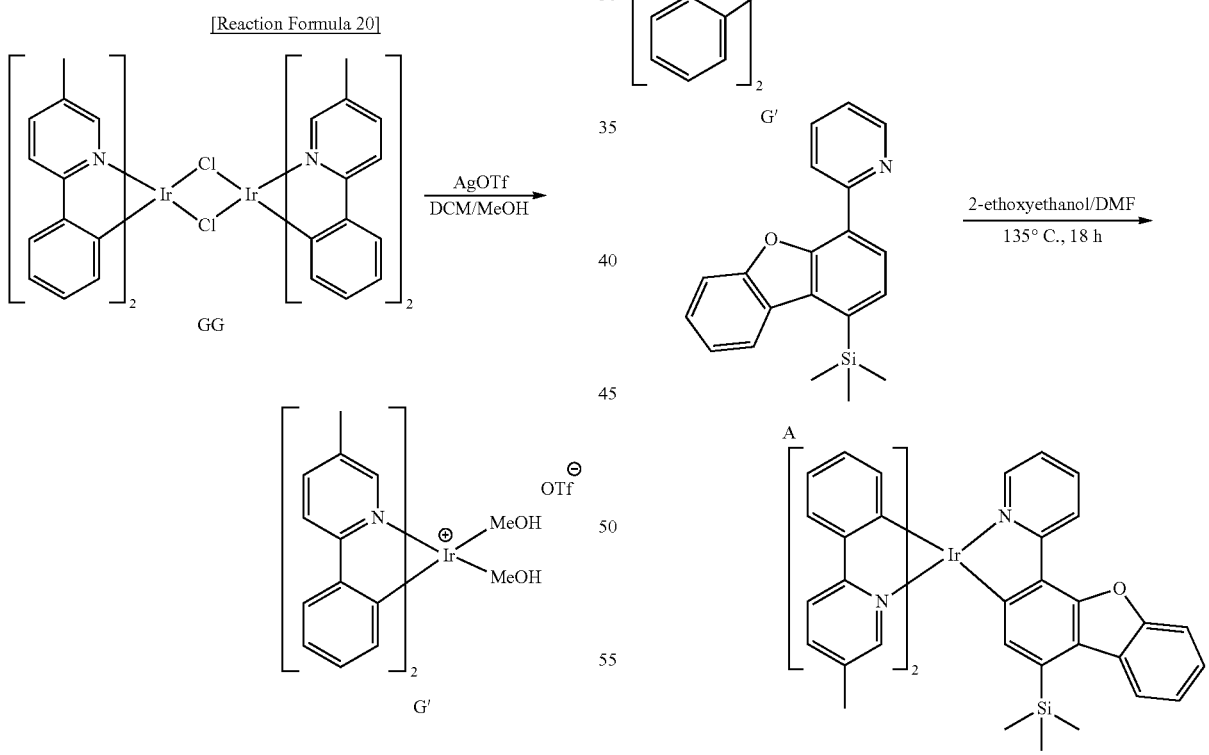

In the round bottom flask (250 mL), GG (4.51 g, 4 mmol) and silver trifluoromethanesulfonate (AgOTf, 3.02 g, 12 mmol) were dissolved in dichloromethane and methanol and stirred at room temperature for 24 hours. After completion of the reaction, the solid precipitate is removed by filtration using celite. The filtered residual solution was distilled under reduced pressure to obtain the compound G' of solid state (2.88 g, 97%). Synthesis of the organometallic compound In the round bottom flask (150 mL) under nitrogen atmosphere, G' (2.23 g, 3 mmol) and A (1.11 g, 3.5 mmol) were put in a mixed solvent (2-ethoxyethanol:DMF=40 mL:40 mL) and stirred at 135° C. for 18 hours. When the reaction was completed, the temperature was lowered to room temperature, the organic layer was extracted using dichloromethane and distilled water, and moisture was removed by adding anhydrous magnesium sulfate. The crude product obtained by depressurizing the filtered residual solution was purified by column chromatography under the condition of ethylacetate:hexane=25:75 to obtain the compound 16 (2.16 g, 85%).

22. Synthesis of the Compound 17

23. Synthesis of the Compound 64

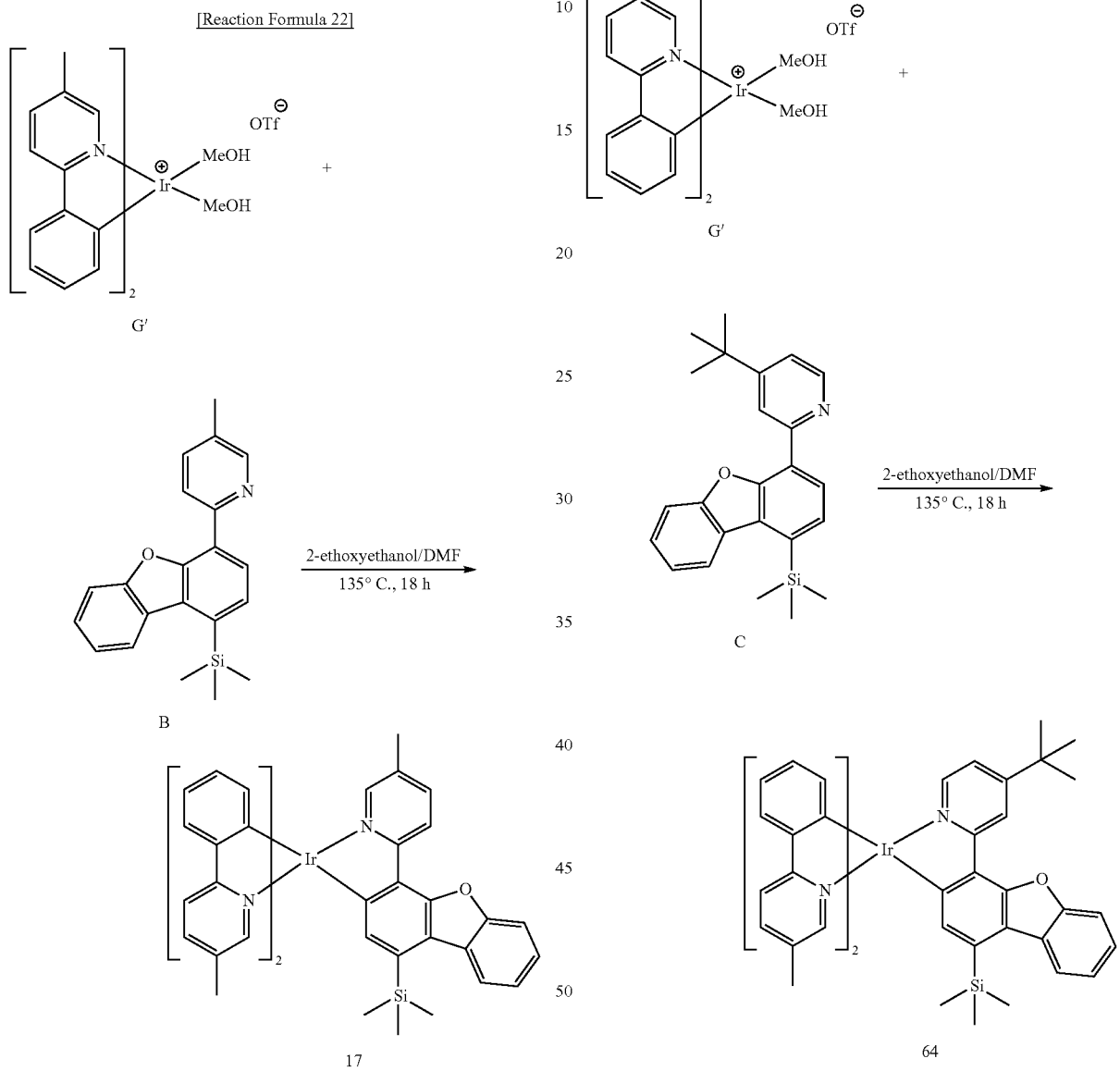

In the round bottom flask (150 mL) under nitrogen atmosphere, G' (2.23 g, 3 mmol) and B (1.16 g, 3.5 mmol) were put in a mixed solvent (2-ethoxyethanol:DMF=40 mL:40 mL) and stirred at 135° C. for 18 hours. When the reaction was completed, the temperature was lowered to room temperature, the organic layer was extracted using dichloromethane and distilled water, and moisture was removed by adding anhydrous magnesium sulfate. The crude product obtained by depressurizing the filtered residual solution was purified by column chromatography under the condition of ethylacetate:hexane=25:75 to obtain the compound 17 (2.27 g, 88%).

In the round bottom flask (150 mL) under nitrogen atmosphere, G' (2.23 g, 3 mmol) and C (1.31 g, 3.5 mmol) were put in a mixed solvent (2-ethoxyethanol:DMF=40 mL:40 mL) and stirred at 135° C. for 18 hours. When the reaction was completed, the temperature was lowered to room temperature, the organic layer was extracted using dichloromethane and distilled water, and moisture was removed by adding anhydrous magnesium sulfate. The crude product obtained by depressurizing the filtered residual solution was purified by column chromatography under the condition of ethylacetate:hexane=25:75 to obtain the compound 64 (2.22 g, 82%).

24. Synthesis of the Compound 136

[Reaction Formula 24]

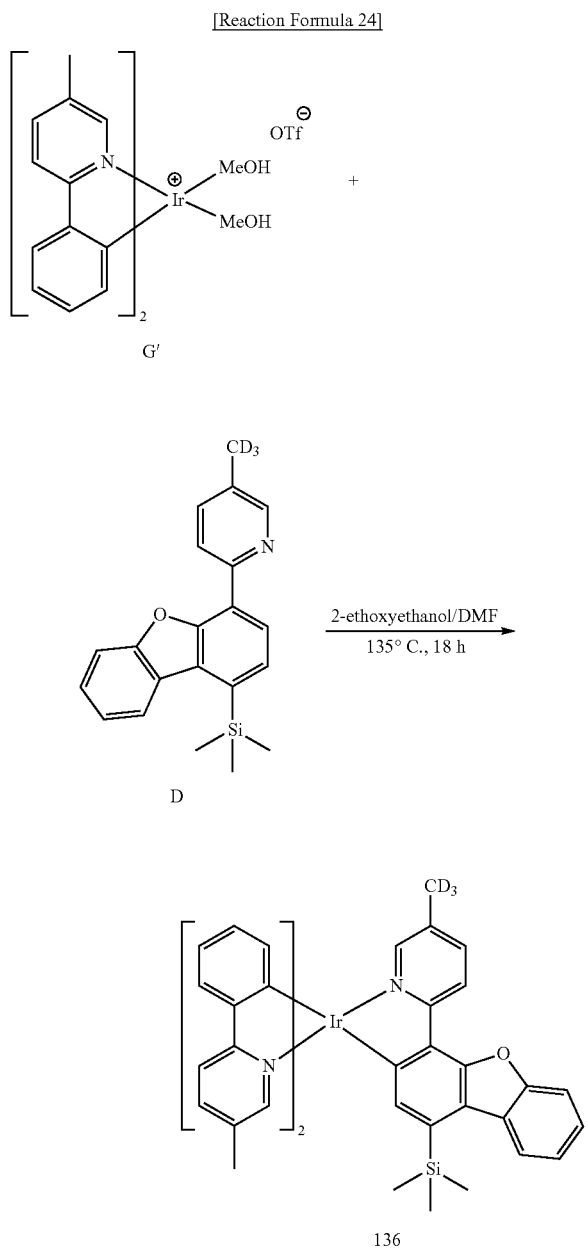

In the round bottom flask (150 mL) under nitrogen atmosphere, G' (2.23 g, 3 mmol) and D (1.17 g, 3.5 mmol) were put in a mixed solvent (2-ethoxyethanol:DMF=40 mL:40 mL) and stirred at 135° C. for 18 hours. When the reaction was completed, the temperature was lowered to room temperature, the organic layer was extracted using dichloromethane and distilled water, and moisture was removed by adding anhydrous magnesium sulfate. The crude product obtained by depressurizing the filtered residual solution was purified by column chromatography under the condition of ethylacetate:hexane=25:75 to obtain the compound 136 (2.25 g, 87%).

25. Synthesis of the Compound 220

[Reaction Formula 25]

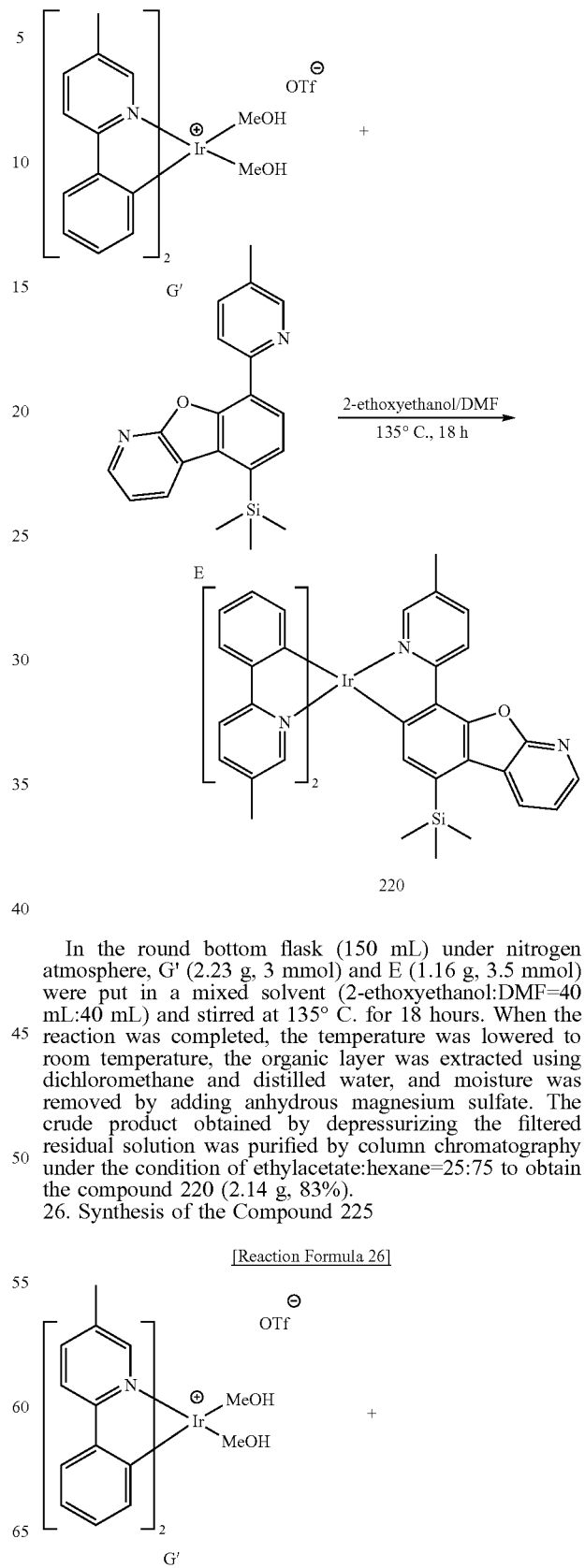

In the round bottom flask (150 mL) under nitrogen atmosphere, G' (2.23 g, 3 mmol) and E (1.16 g, 3.5 mmol) were put in a mixed solvent (2-ethoxyethanol:DMF=40 mL:40 mL) and stirred at 135° C. for 18 hours. When the reaction was completed, the temperature was lowered to room temperature, the organic layer was extracted using dichloromethane and distilled water, and moisture was removed by adding anhydrous magnesium sulfate. The crude product obtained by depressurizing the filtered residual solution was purified by column chromatography under the condition of ethylacetate:hexane=25:75 to obtain the compound 220 (2.14 g, 83%).

26. Synthesis of the Compound 225

[Reaction Formula 26]

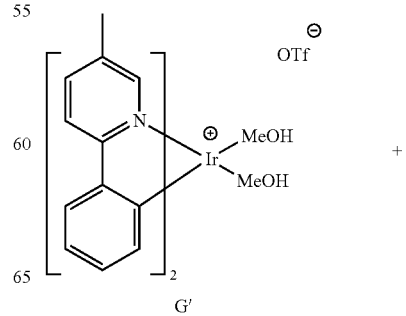

-continued

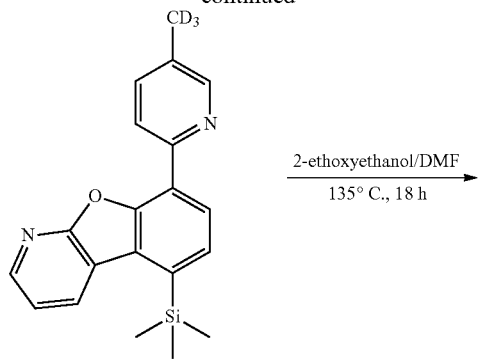

F

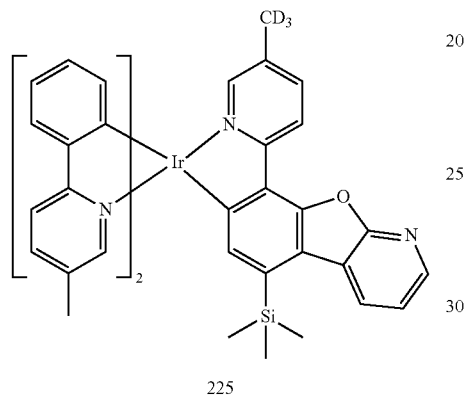

225

In the round bottom flask (150 mL) under nitrogen atmosphere, G' (2.23 g, 3 mmol) and F (1.17 g, 3.5 mmol) were put in a mixed solvent (2-ethoxyethanol:DMF=40 mL:40 mL) and stirred at 135° C. for 18 hours. When the reaction was completed, the temperature was lowered to room temperature, the organic layer was extracted using dichloromethane and distilled water, and moisture was removed by adding anhydrous magnesium sulfate. The crude product obtained by depressurizing the filtered residual solution was purified by column chromatography under the condition of ethylacetate:hexane=25:75 to obtain the compound 225 (2.07 g, 80%).

27. Synthesis of the Compound 271

-continued

G

271

In the round bottom flask (150 mL) under nitrogen atmosphere, A' (3.11 g, 3 mmol) and G (0.59 g, 3.5 mmol) were put in a mixed solvent (2-ethoxyethanol:DMF=40 mL:40 mL) and stirred at 135° C. for 24 hours. When the reaction was completed, the temperature was lowered to room temperature, the organic layer was extracted using dichloromethane and distilled water, and moisture was removed by adding anhydrous magnesium sulfate. The crude product obtained by depressurizing the filtered residual solution was purified by column chromatography under the condition of toluene:hexane=1:1 to obtain the compound 271 (2.44 g, 82%).

28. Synthesis of the Compound 276

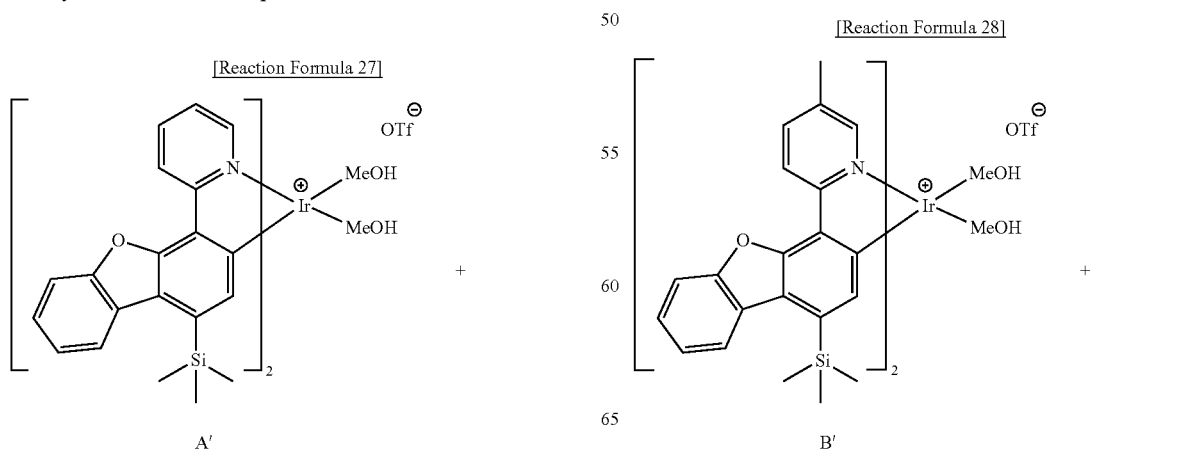

-continued

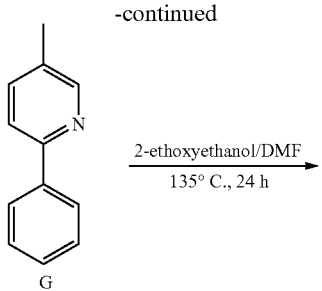

G 2-ethoxyethanol/DMF
135° C., 24 h →

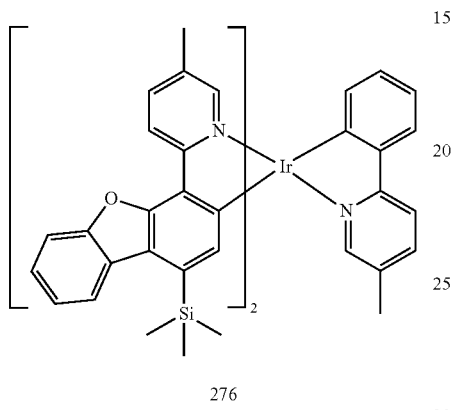

276

In the round bottom flask (150 mL) under nitrogen atmosphere, B' (3.20 g, 3 mmol) and G (0.59 g, 3.5 mmol) were put in a mixed solvent (2-ethoxyethanol:DMF=40 mL:40 mL) and stirred at 135° C. for 24 hours. When the reaction was completed, the temperature was lowered to room temperature, the organic layer was extracted using dichloromethane and distilled water, and moisture was removed by adding anhydrous magnesium sulfate. The crude product obtained by depressurizing the filtered residual solution was purified by column chromatography under the condition of toluene:hexane=1:1 to obtain the compound 276 (2.60 g, 85%).

29. Synthesis of the Compound 274

[Reaction Formula 29]

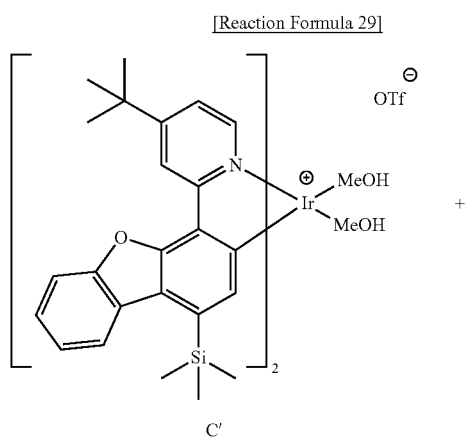

C'

-continued

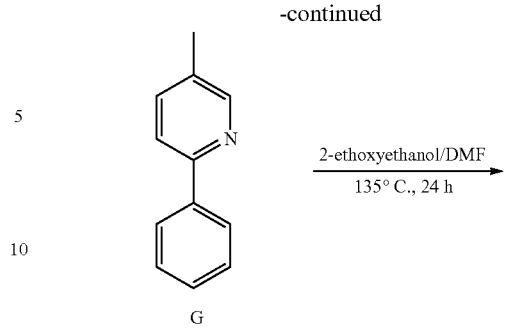

G 2-ethoxyethanol/DMF
135° C., 24 h →

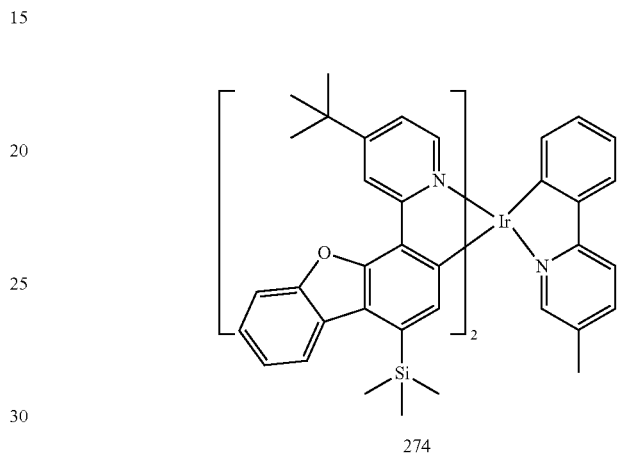

274

In the round bottom flask (150 mL) under nitrogen atmosphere, C' (3.45 g, 3 mmol) and G (0.59 g, 3.5 mmol) were put in a mixed solvent (2-ethoxyethanol:DMF=40 mL:40 mL) and stirred at 135° C. for 24 hours. When the reaction was completed, the temperature was lowered to room temperature, the organic layer was extracted using dichloromethane and distilled water, and moisture was removed by adding anhydrous magnesium sulfate. The crude product obtained by depressurizing the filtered residual solution was purified by column chromatography under the condition of toluene:hexane=1:1 to obtain the compound 274 (2.59 g, 78%).

30. Synthesis of the Compound 292

[Reaction Formula 30]

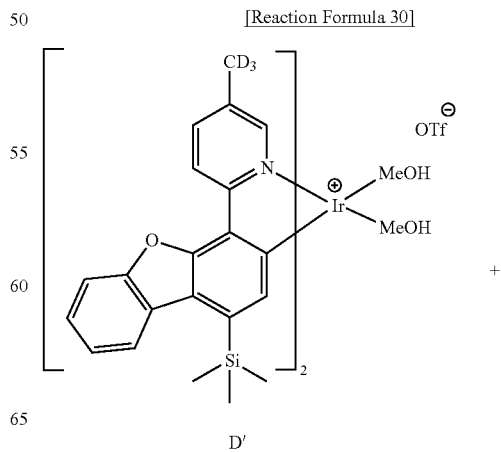

D'

-continued

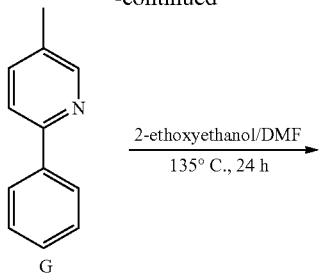

G

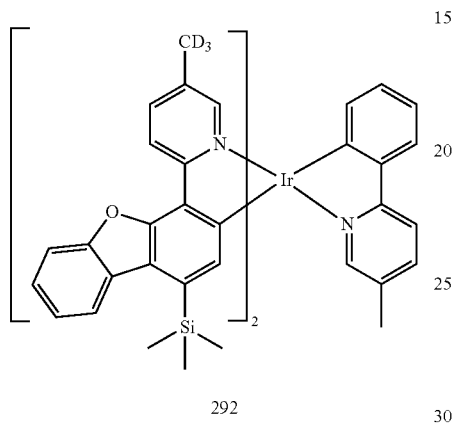

292

In the round bottom flask (150 mL) under nitrogen atmosphere, D' (3.22 g, 3 mmol) and G (0.59 g, 3.5 mmol) were put in a mixed solvent (2-ethoxyethanol:DMF=40 mL:40 mL) and stirred at 135° C. for 24 hours. When the reaction was completed, the temperature was lowered to room temperature, the organic layer was extracted using dichloromethane and distilled water, and moisture was removed by adding anhydrous magnesium sulfate. The crude product obtained by depressurizing the filtered residual solution was purified by column chromatography under the condition of toluene:hexane=1:1 to obtain the compound 292 (2.50 g, 81%).

31. Synthesis of the Compound 284

[Reaction Formula 31]

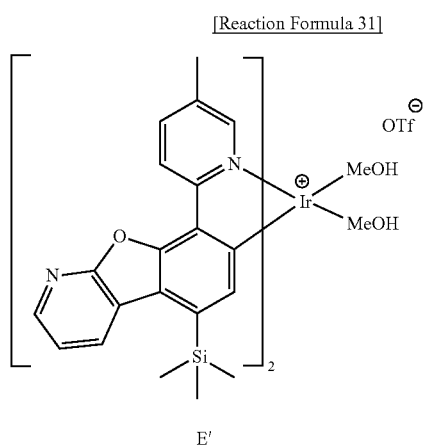

E'

-continued

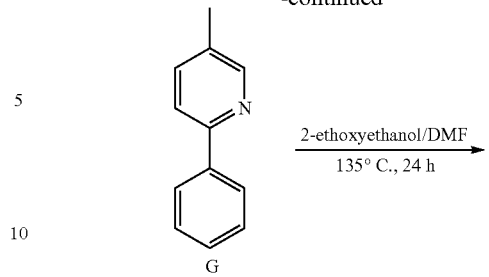

G

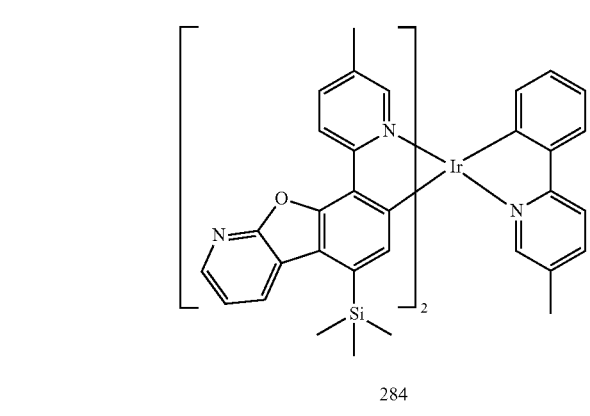

284

In the round bottom flask (150 mL) under nitrogen atmosphere, E' (3.20 g, 3 mmol) and G (0.59 g, 3.5 mmol) were put in a mixed solvent (2-ethoxyethanol:DMF=40 mL:40 mL) and stirred at 135° C. for 24 hours. When the reaction was completed, the temperature was lowered to room temperature, the organic layer was extracted using dichloromethane and distilled water, and moisture was removed by adding anhydrous magnesium sulfate. The crude product obtained by depressurizing the filtered residual solution was purified by column chromatography under the condition of toluene:hexane=1:1 to obtain the compound 284 (2.73 g, 89%).

32. Synthesis of the Compound 279

[Reaction Formula 32]

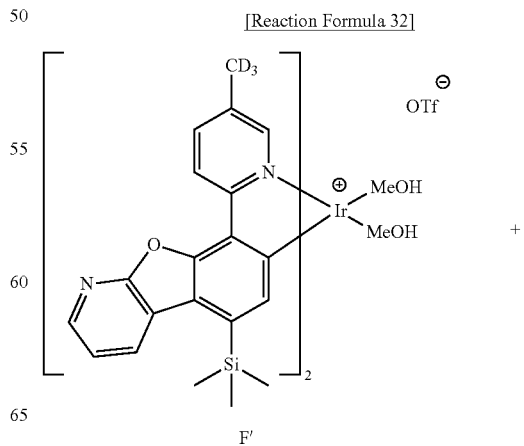

F'

-continued

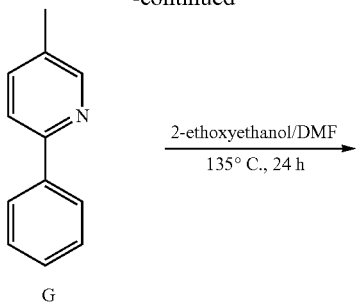

G

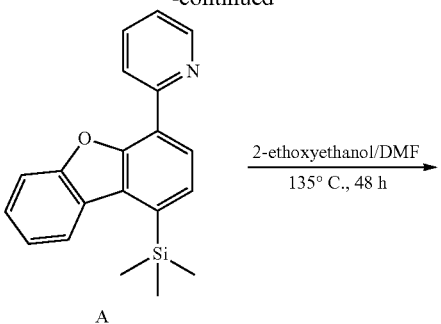

A

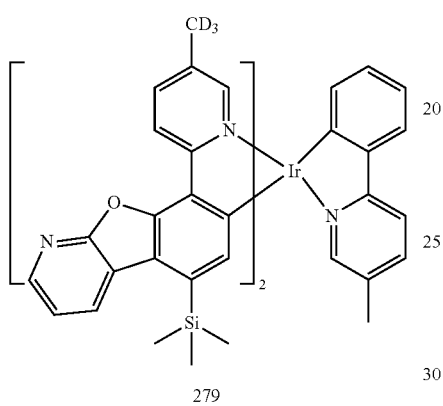

279

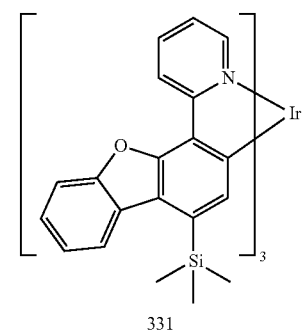

331

In the round bottom flask (150 mL) under nitrogen atmosphere, F' (3.22 g, 3 mmol) and G (0.59 g, 3.5 mmol) were put in a mixed solvent (2-ethoxyethanol:DMF=40 mL:40 mL) and stirred at 135° C. for 24 hours. When the reaction was completed, the temperature was lowered to room temperature, the organic layer was extracted using dichloromethane and distilled water, and moisture was removed by adding anhydrous magnesium sulfate. The crude product obtained by depressurizing the filtered residual solution was purified by column chromatography under the condition of toluene:hexane=1:1 to obtain the compound 279 (2.69 g, 87%).

33. Synthesis of the Compound 331

In the round bottom flask (150 mL) under nitrogen atmosphere, A' (3.11 g, 3 mmol) and A (1.11 g, 3.5 mmol) were put in a mixed solvent (2-ethoxyethanol:DMF=40 mL:40 mL) and stirred at 135° C. for 48 hours. When the reaction was completed, the temperature was lowered to room temperature, the organic layer was extracted using dichloromethane and distilled water, and moisture was removed by adding anhydrous magnesium sulfate. The crude product obtained by depressurizing the filtered residual solution was purified by column chromatography under the condition of toluene:hexane=1:1 to obtain the compound 331 (2.67 g, 78%).

34. Synthesis of the Compound 336

[Reaction Formula 33]

[Reaction Formula 34]

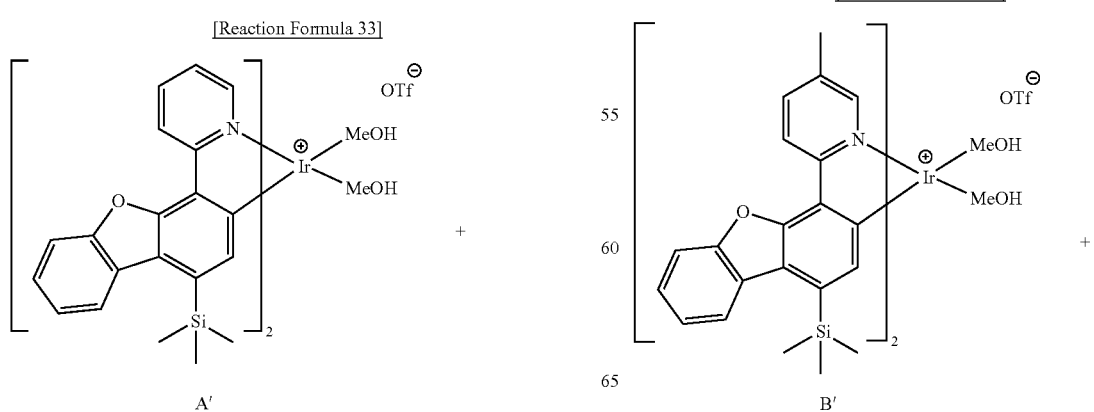

-continued

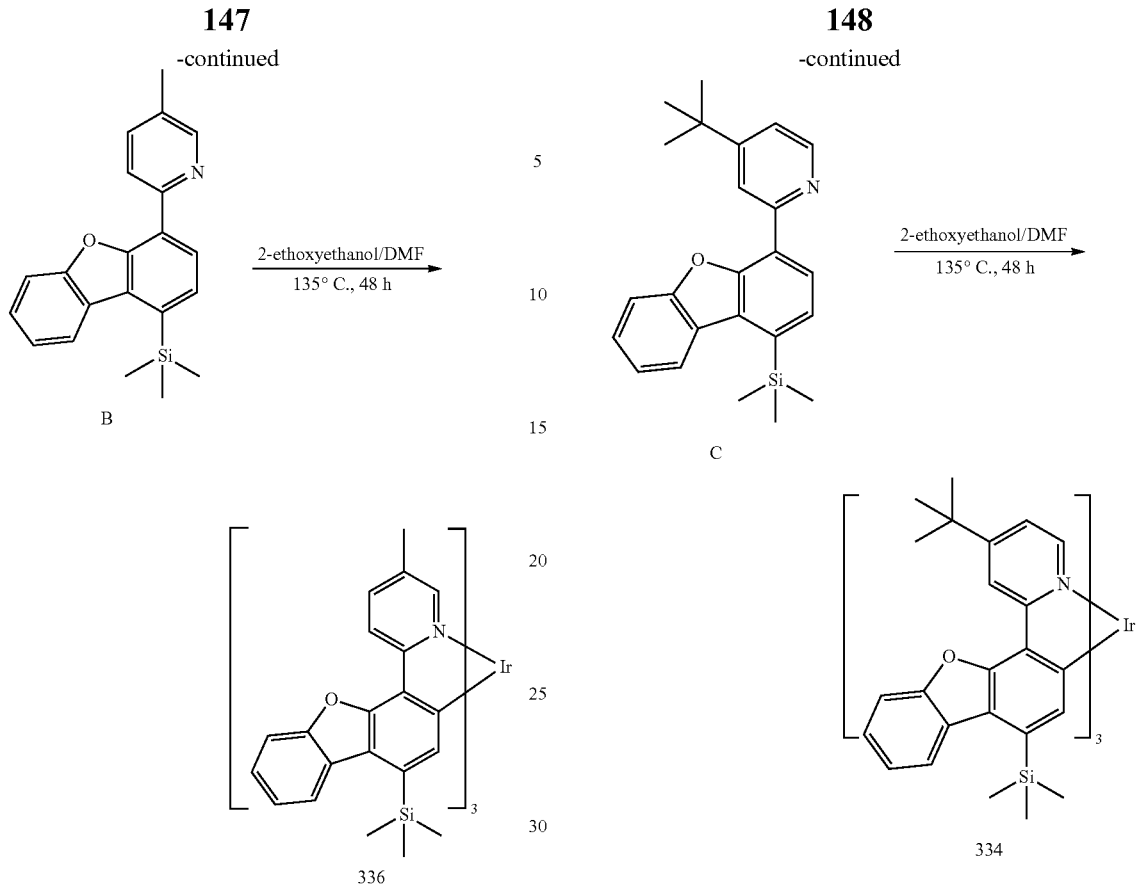

In the round bottom flask (150 mL) under nitrogen atmosphere, B' (3.20 g, 3 mmol) and B (1.16 g, 3.5 mmol) were put in a mixed solvent (2-ethoxyethanol:DMF=40 mL:40 mL) and stirred at 135° C. for 48 hours. When the reaction was completed, the temperature was lowered to room temperature, the organic layer was extracted using dichloromethane and distilled water, and moisture was removed by adding anhydrous magnesium sulfate. The crude product obtained by depressurizing the filtered residual solution was purified by column chromatography under the condition of toluene:hexane=1:1 to obtain the compound 336 (3.02 g, 85%).

35. Synthesis of the Compound 334

In the round bottom flask (150 mL) under nitrogen atmosphere, C' (3.45 g, 3 mmol) and C (1.31 g, 3.5 mmol) were put in a mixed solvent (2-ethoxyethanol:DMF=40 mL:40 mL) and stirred at 135° C. for 48 hours. When the reaction was completed, the temperature was lowered to room temperature, the organic layer was extracted using dichloromethane and distilled water, and moisture was removed by adding anhydrous magnesium sulfate. The crude product obtained by depressurizing the filtered residual solution was purified by column chromatography under the condition of toluene:hexane=1:1 to obtain the compound 334 (3.26 g, 83%).

36. Synthesis of the Compound 351

[Reaction Formula 35]

[Reaction Formula 36]

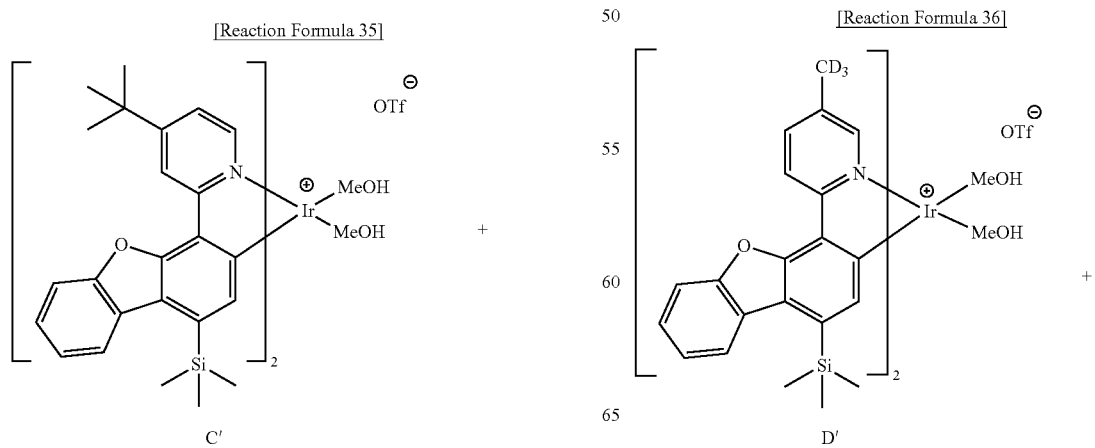

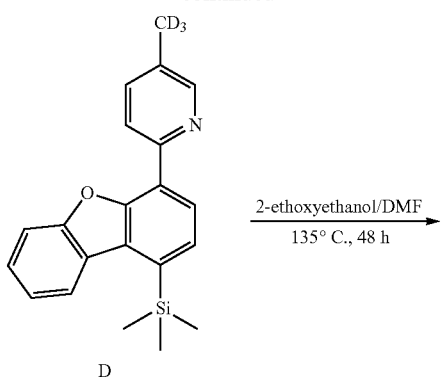

D

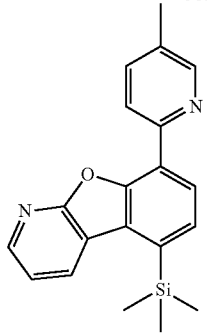

E

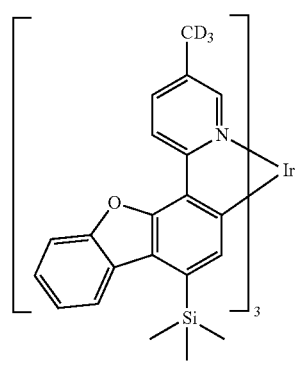

351

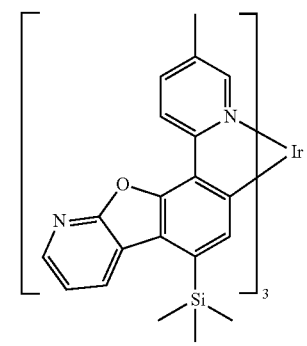

341

In the round bottom flask (150 mL) under nitrogen atmosphere, D' (3.22 g, 3 mmol) and D (1.17 g, 3.5 mmol) were put in a mixed solvent (2-ethoxyethanol:DMF=40 mL:40 mL) and stirred at 135° C. for 48 hours. When the reaction was completed, the temperature was lowered to room temperature, the organic layer was extracted using dichloromethane and distilled water, and moisture was removed by adding anhydrous magnesium sulfate. The crude product obtained by depressurizing the filtered residual solution was purified by column chromatography under the condition of toluene:hexane=1:1 to obtain the compound 351 (2.90 g, 81%).

37. Synthesis of the Compound 341

In the round bottom flask (150 mL) under nitrogen atmosphere, E' (3.20 g, 3 mmol) and E (1.16 g, 3.5 mmol) were put in a mixed solvent (2-ethoxyethanol:DMF=40 mL:40 mL) and stirred at 135° C. for 48 hours. When the reaction was completed, the temperature was lowered to room temperature, the organic layer was extracted using dichloromethane and distilled water, and moisture was removed by adding anhydrous magnesium sulfate. The crude product obtained by depressurizing the filtered residual solution was purified by column chromatography under the condition of toluene:hexane=1:1 to obtain the compound 341 (2.99 g, 84%).

38. Synthesis of the Compound 386

[Reaction Formula 37]

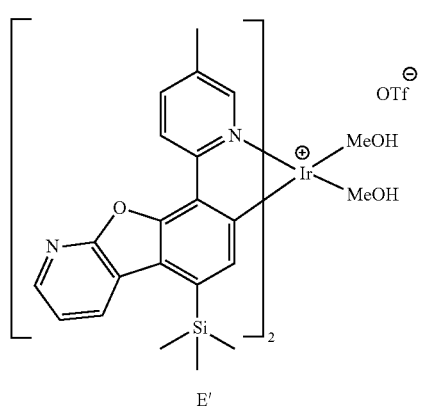

E'

[Reaction Formula 38]

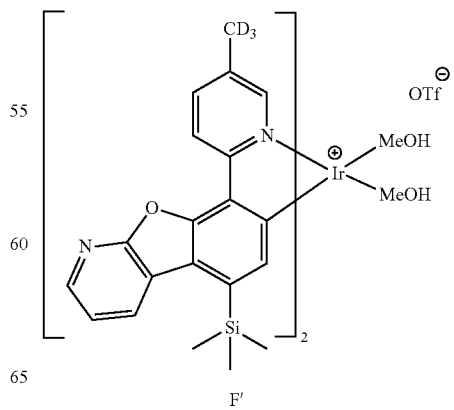

F'

-continued

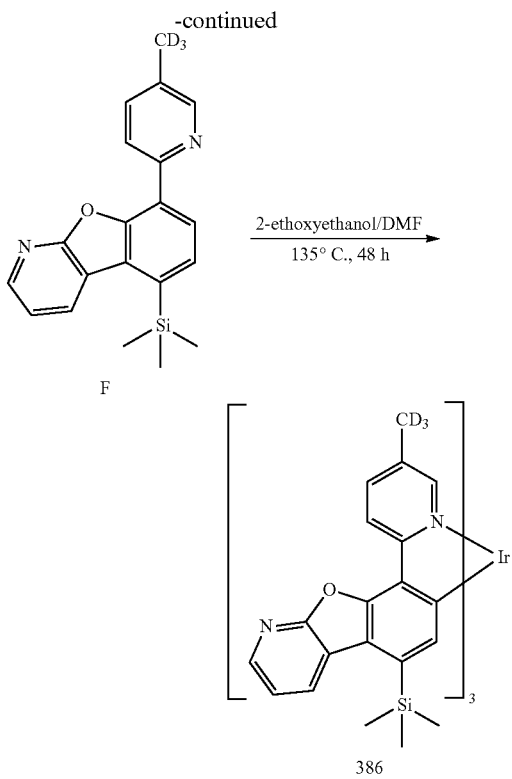

In the round bottom flask (150 mL) under nitrogen atmosphere, F' (3.22 g, 3 mmol) and F (1.17 g, 3.5 mmol) were put in a mixed solvent (2-ethoxyethanol:DMF=40 mL:40 mL) and stirred at 135° C. for 48 hours. When the reaction was completed, the temperature was lowered to room temperature, the organic layer was extracted using dichloromethane and distilled water, and moisture was removed by adding anhydrous magnesium sulfate. The crude product obtained by depressurizing the filtered residual solution was purified by column chromatography under the condition of toluene:hexane=1:1 to obtain the compound 386 (3.12 g, 87%).

FIG. 1 is a schematic circuit diagram illustrating an organic light emitting display device of the present disclosure. All the components of each organic light emitting display device according to all embodiments of the present disclosure are operatively coupled and configured.

Referring to FIG. 1, the display device includes a plurality of pixels P for displaying images. As shown, a gate line GL and a data line DL, which cross each other to define a pixel region (pixel) P, and a power line PL are formed in an organic light emitting display device. A switching thin film transistor (TFT) Ts, a driving thin film transistor Td, a storage capacitor Cst and an OLED D are formed in the pixel region P. The pixel region P can include a red pixel region, a green pixel region and a blue pixel region.

The switching thin film transistor Ts is connected to the gate line GL and the data line DL, and the driving thin film transistor Td and the storage capacitor Cst are connected between the switching thin film transistor Ts and the power line PL. The OLED D is connected to the driving thin film transistor Td. When the switching thin film transistor Ts is turned on by the gate signal applied through the gate line GL, the data signal applied through the data line DL is applied to a gate electrode of the driving thin film transistor Td and one electrode of the storage capacitor Cst through the switching thin film transistor Ts.

The driving thin film transistor Td is turned on by the data signal applied into the gate electrode so that a current proportional to the data signal is supplied from the power line PL to the OLED D through the driving thin film transistor Td. The OLED D emits light having a luminance proportional to the current flowing through the driving thin film transistor Td. In this case, the storage capacitor Cst is charged with a voltage proportional to the data signal so that the voltage of the gate electrode in the driving thin film transistor Td is kept constant during one frame. Therefore, the organic light emitting display device can display a desired image.

Figure 2:
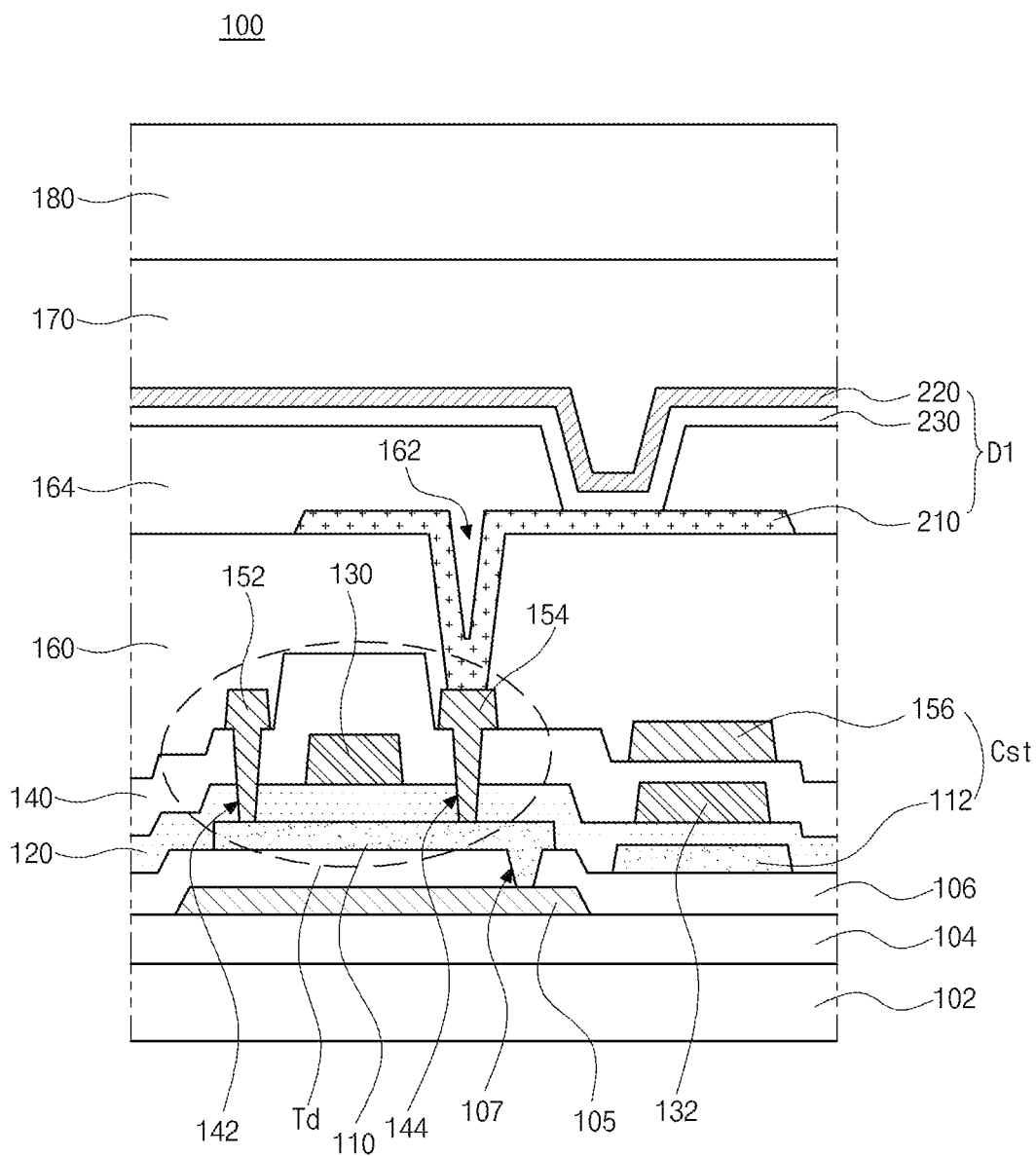
FIG. 2 is a schematic cross-sectional view illustrating an organic light emitting display device according to a first embodiment of the present disclosure.

FIG. 2 is a schematic cross-sectional view illustrating an organic light emitting display device according to a first embodiment of the present disclosure.

As illustrated in FIG. 2, an organic light emitting display device 100 includes a substrate 102, a driving TFT Td disposed over the substrate 102 and an OLED D1 connected to the driving TFT Td.

For example, a red pixel region, a green pixel region and a blue pixel region can be defined on the substrate 102, and the OLED D1 can be positioned in each of the red, green and blue pixel regions. Namely, the OLEDs D1 respectively emitting red, green and blue light are respectively disposed in the red, green and blue pixel regions.

The substrate 102 can be a glass substrate or a flexible substrate. For example, the flexible substrate can be a polyimide (PI) substrate, a polyethersulfone (PES) substrate, a polyethylenenaphthalate (PEN) substrate, a polyethylene terephthalate (PET) substrate or a polycarbonate (PC) substrate.

A first buffer layer 104 is formed on the substrate 102, and a light shielding pattern 105, which corresponds to the driving TFT Td, is formed on the first buffer layer 104. In addition, a second buffer layer 106 is formed on the light shielding pattern 105, and a buffer contact hole 107 exposing a portion of the light shielding pattern 105 is formed through the second buffer layer 106.

For example, each of the first and second buffer layers 104 and 106 can be formed of an inorganic insulating material, e.g., silicon oxide or silicon nitride, and the light shielding pattern 105 can be formed of an opaque metallic material. The first and second buffer layers 104 and 106 and the light shielding pattern 105 can be omitted.

The driving TFT Td, which includes a semiconductor layer 110, a gate electrode 130, a source electrode 152 and a drain electrode 154, and a storage capacitor Cst, which includes first to third storage electrodes 112, 132 and 156, are formed on the second buffer layer 106.

The semiconductor layer 110 and the first storage electrode 112 are formed on the second buffer layer 106. For example, the semiconductor layer 110 can include polycrystalline silicon, and impurities can be doped into both sides of the semiconductor layer 110. An end of the semiconductor layer 110, e.g., an end at a drain electrode side, is connected to the light shielding pattern 105 through the buffer contact hole 107. In addition, impurities are doped into polycrystalline silicon to form the first storage electrode 112 acting as an electrode of the storage capacitor Cst. Alternatively, the semiconductor layer 110 can include an oxide semiconductor material.

A gate insulating layer 120 is formed on the semiconductor layer 110 and the first storage electrode 112 and over an entire surface of the substrate 102. The gate insulating layer 120 can be formed of an inorganic insulating material such as silicon oxide or silicon nitride.

The gate electrode 130, which is formed of a conductive material, e.g., metal, is formed on the gate insulating layer 120 to correspond to a center of the semiconductor layer 110. In FIG. 2, the gate insulating layer 120 is formed on an entire surface of the substrate 102. Alternatively, the gate insulating layer 120 can be patterned to have the same shape as the gate electrode 130.

In addition, the second storage electrode 132 overlapping and corresponding to the first storage electrode 112 is formed on the same layer and of the same material as the gate electrode 130.

An interlayer insulating layer 140, which is formed of an insulating material, is formed on the gate electrode 130 and the second storage electrode 132. The interlayer insulating layer 140 can be formed of an inorganic insulating material, e.g., silicon oxide or silicon nitride, or an organic insulating material, e.g., benzocyclobutene or photo-acryl.

The interlayer insulating layer 140 includes first and second contact holes 142 and 144 exposing both sides, e.g., an upper surface of the both sides, of the semiconductor layer 110. The first and second contact holes 142 and 144 are positioned at both sides of the gate electrode 130 to be spaced apart from the gate electrode 130. In FIG. 2, the first and second contact holes 142 and 144 are formed through the gate insulating layer 120. Alternatively, when the gate insulating layer 120 is patterned to have the same shape as the gate electrode 130, the first and second contact holes 142 and 144 is formed only through the interlayer insulating layer 140.

The source electrode 152 and the drain electrode 154, which are formed of a conductive material, e.g., metal, are formed on the interlayer insulating layer 140. The source electrode 152 and the drain electrode 154 are spaced apart from each other with respect to the gate electrode 130 and respectively contact both sides of the semiconductor layer 110 through the first and second contact holes 142 and 144.

In addition, the third storage electrode 156 overlapping and corresponding to the second storage electrode 132 is formed on the interlayer insulating layer 140.

As described above, the semiconductor layer 110, the gate electrode 130, the source electrode 152 and the drain electrode 154 constitute the driving TFT Td, and the first to third storage electrodes 112, 132 and 156 with the gate insulating layer 120 and the interlayer insulating layer 140 as a dielectric layer constitute the storage capacitor Cst.

In the driving TFT Td of FIG. 2, the gate electrode 130, the source electrode 152, and the drain electrode 154 are positioned over the semiconductor layer 110. Namely, the driving TFT Td has a coplanar structure. Alternatively, in the driving TFT Td, the gate electrode can be positioned under the semiconductor layer, and the source and drain electrodes can be positioned over the semiconductor layer such that the driving TFT Td can have an inverted staggered structure. In this instance, the semiconductor layer can include amorphous silicon.

The gate line GL (of FIG. 1) and the data line DL (of FIG. 1) cross each other to define the pixel region, and the switching TFT Ts (of FIG. 1) is formed to be connected to the gate and data lines GL and DL. The switching TFT Ts is connected to the driving TFT Td. In addition, the power line PL (of FIG. 1), which can be formed to be parallel to and spaced apart from the data line DL.

A passivation (planarization) layer 160 is formed on the source electrode 152, the drain electrode 154 and the third storage electrode 156 to cover an entire surface of the substrate 102. The passivation layer 160 can provide a flat top surface and includes a drain contact hole 162 exposing the drain electrode 154 of the driving TFT Td.

The OLED D1 is positioned on the passivation layer 160 and includes a first electrode 210, a second electrode 220 and an organic light emitting layer 230. The first electrode 210 is connected to the drain electrode 154 of the driving TFT Td through the drain contact hole 162, and the organic light emitting layer 230 and the second electrode 220 are sequentially stacked on the first electrode 210.

The first electrode 210 is separately formed in each pixel region and on the passivatgion layer 160. The first electrode 210 can be an anode and can be formed of a conductive material, e.g., a transparent conductive oxide (TCO), having a relatively high work function. For example, the first electrode 210 can be formed of indium-tin-oxide (ITO), indium-zinc-oxide (IZO), indium-tin-zinc-oxide (ITZO), tin oxide (SnO), zinc oxide (ZnO), indium-copper-oxide (ICO) or aluminum-zinc oxide (Al:ZnO, AZO).

When the organic light emitting display device 100 is operated in a bottom-emission type, the first electrode 210 can have a single-layered structure of the transparent conductive material layer. When the organic light emitting display device 100 is operated in a top-emission type, a reflection electrode or a reflection layer can be formed under the first electrode 210. For example, the reflection electrode or the reflection layer can be formed of silver (Ag) or aluminum-palladium-copper (APC) alloy. In this instance, the first electrode 210 can have a triple-layered structure of ITO/Ag/ITO or ITO/APC/ITO.

A bank layer 164 is formed on the passivation layer 160 to cover an edge of the first electrode 210. Namely, the bank layer 164 is positioned at a boundary of the pixel region and exposes a center of the first electrode 210 in the pixel region.

An organic light emitting layer 230 is formed on the first electrode 210. The organic light emitting layer 230 can have a single-layered structure of an emitting material layer (EML). Alternatively, the organic emitting layer 230 can have a multi-layered structure by further including at least one of a hole injection layer (HIL), a hole transporting layer (HTL), an electron blocking layer (EBL), a hole blocking layer (HBL), an electron transporting layer (ETL) and an electron injection layer (EIL).

In the green pixel region, the organic light emitting layer 230 of the OLED D1 includes the organometallic compound of the present disclosure such that the emitting efficiency and the emitting lifespan of the OLED D1 and the organic light emitting display device 100 are significantly improved.

The second electrode 220 is formed over the substrate 102 where the organic light emitting layer 230 is formed. The second electrode 220 covers an entire surface of the display area and can be formed of a conductive material having a relatively low work function to serve as a cathode. For example, the second electrode 220 can be formed of aluminum (Al), magnesium (Mg), silver (Ag) or their alloy, e.g., Al—Mg alloy (AlMg) or Ag—Mg alloy (MgAg). In the top-emission type organic light emitting display device 100, the second electrode 220 can have a thin profile (small thickness) to provide a light transmittance property (or a semi-transmittance property).

Namely, one of the first and second electrodes 210 and 220 is a transparent (semi-transparent) electrode, and the other one of the first and second electrodes 210 and 220 is a reflective electrode.

An encapsulation film 170 and a barrier layer 180 are formed on the second electrode 220 to prevent penetration of moisture into the OLED D. The barrier layer 180 can be a barrier substrate.

The organic light emitting display device 100 can further include a color filter layer. The color filter layer can include a red color filter, a green color filter and a blue color filter respectively corresponding to the red, green and blue pixel regions. The color purity of the organic light emitting display device 100 can be improved due to the color filter layer.

The organic light emitting display device 100 can further include a polarization plate for reducing an ambient light reflection. For example, the polarization plate can be a circular polarization plate. In the bottom-emission type organic light emitting display device 100, the polarization plate can be disposed under the substrate 102. In the top-emission type organic light emitting display device 100, the polarization plate can be disposed on or over the barrier layer 180.

Figure 3:
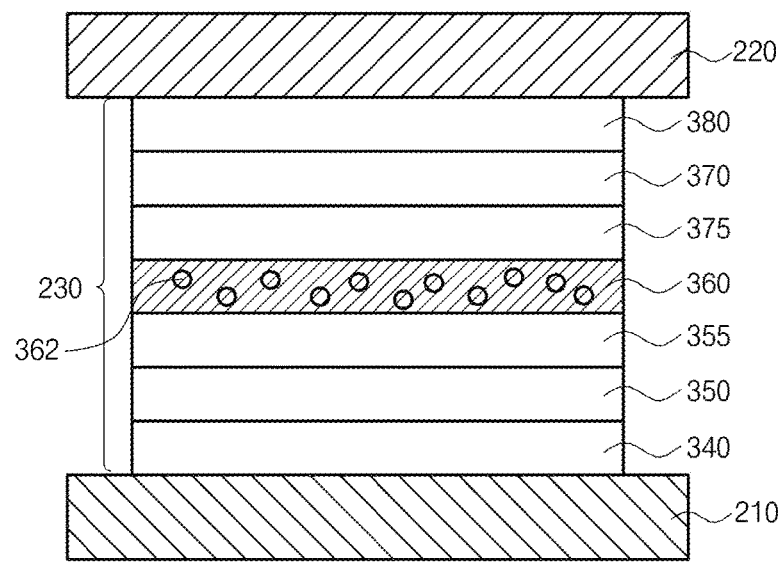
FIG. 3 is a schematic cross-sectional view illustrating an OLED according to a second embodiment of the present disclosure.

FIG. 3 is a schematic cross-sectional view illustrating an OLED according to a second embodiment of the present disclosure.

As shown in FIG. 3, the OLED D1 includes the first and second electrodes 210 and 220 facing each other and the organic light emitting layer 230 between the first and second electrodes 210 and 220. The OLED D1 is positioned in a green pixel region.

The first electrode 210 can be an anode, and the second electrode 220 can be a cathode. For example, each of the first and second electrodes 210 and 220 can have a thickness of 30 to 300 nm.

The organic light emitting layer 230 includes the EML 360.

In addition, the organic light emitting layer 230 can further include at least one of an HTL 350 between the first electrode 210 and the EML 360 and an ETL 370 between the EML 360 and the second electrode 220.

Moreover, the organic light emitting layer 230 can further include at least one of an HIL 340 between the first electrode 210 and the HTL 350 and an EIL 380 between the second electrode 220 and the ETL 370.

Furthermore, the organic light emitting layer 230 can further include at least one of an HBL 355 between the HTL 350 and the EML 360 and an EBL 375 between the EML 360 and the ETL 370.

The OLED D1 according to the second embodiment of the present disclosure has a single emitting unit.

An interfacial property between the first electrode 210 of an inorganic material and the HTL 350 of an organic material is improved by the HIL 340, which is positioned between the first electrode 210 and the HTL 350. For example, the HIL 340 can include a hole injection material being at least one compound selected from the group consisting of 4,4',4''-tris(3-methylphenylamino)triphenylamine (MTDATA), 4,4',4''-tris(N,N-diphenyl-amino)triphenylamine(NATA), 4,4',4''-tris(N-(naphthalene-1-yl)-N-phenyl-amino)triphenylamine(1T-NATA), 4,4',4''-tris(N-(naphthalene-2-yl)-N-phenyl-amino)triphenylamine(2T-NATA), copper phthalocyanine(CuPc), tris(4-carbazoyl-9-yl-phenyl) amine(TCTA), N,N'-diphenyl-N,N'-bis(1-naphthyl)-1,1'-biphenyl-4,4''-diamine(NPB or NPD), 1,4,5,8,9,11-hexaazatriphenylenehexacarbonitrile(dipyrazino[2,3-f:2'3'-h] quinoxaline-2,3,6,7,10,11-hexacarbonitrile; HAT-CN), 1,3,5-tris[4-(diphenylamino)phenyl]benzene(TDAPB), poly(3,4-ethylenedioxythiophene)polystyrene sulfonate(PEDOT/PSS), N-(biphenyl-4-yl)-9,9-dimethyl-N-(4-(9-phenyl-9H-carbazol-3-yl)phenyl)-9H-fluoren-2-amine, and N,N'-diphenyl-N,N'-di[4-(N,N-diphenyl-amino)phenyl]benzidine (NPNPB). For example, the hole injection material of the HIL 340 can be a compound in Formula 4. The HIL 340 can have a thickness of 20 to 120 nm, preferably 40 to 80 nm.

The HTL 350 is positioned between the first electrode 210 and the EML 360 and is adjacent to the EML 360. For example, the HTL 350 can include a hole transporting material being at least one compound selected from the group consisting of N,N'-diphenyl-N,N'-bis(3-methylphenyl)-1,1'-biphenyl-4,4'-diamine (TPD), NPB (or NPD), 4,4'-bis(N-carbazolyl)-1,1'-biphenyl (CBP), poly[N,N'-bis(4-butylphenyl)-N,N'-bis(phenyl)-benzidine] (poly-TPD), (poly[(9,9-dioctylfluorenyl-2,7-diyl)-co-(4,4'-(N-(4-sec-butylphenyl)diphenylamine))] (TFB), di[4-(N,N-di-p-tolyl-amino)-phenyl]cyclohexane (TAPC), 3,5-di(9H-carbazol-9-yl)-N,N-diphenylaniline (DCDPA), N-(biphenyl-4-yl)-9,9-dimethyl-N-(4-(9-phenyl-9H-carbazol-3-yl)phenyl)-9H-fluoren-2-amine, N-(biphenyl-4-yl)-N-(4-(9-phenyl-9H-carbazol-3-yl)phenyl)biphenyl-4-amine, and N-([1,1'-biphenyl]-4-yl)-9,9-dimethyl-N-(4-(9-phenyl-9H-carbazol-3-yl)phenyl)-9H-fluoren-2-amine, but it is not limited thereto. The HTL 350 can have a thickness of 30 to 150 nm, preferably 50 to 120 nm. For example, a thickness of the HTL 350 can be greater than that of the HIL 340.

The EML 360 includes a first compound being the organometallic compound of the present disclosure as a dopant (e.g., an emitter) 362. In addition, the EML 360 can further include a second compound as a host.

The EML 360 can have a thickness of 10 to 100 nm, preferably 20 to 50 nm. In the EML 360, the dopant 362 can have a weight % of 1 to 20 weight %, preferably 1 to 10 weight %.

For example, the host of the EML 360 can be selected from the group consisting of 9-(3-(9H-carbazol-9-yl)phenyl)-9H-carbazole-3-carbonitrile (mCP-CN), CBP, 3,3'-bis (N-carbazolyl)-1,1'-biphenyl (mCBP), 1,3-bis(carbazol-9-yl)benzene (mCP), DPEPO, 2,8-bis(diphenylphosphoryl) dibenzothiophene (PPT), 1,3,5-tri[(3-pyridyl)-phen-3-yl] benzene (TmPyPB), 2,6-di(9H-carbazol-9-yl)pyridine (PYD-2Cz), 2,8-di(9H-carbazol-9-yl)dibenzothiophene (DCzDBT), 3',5'-di(carbazol-9-yl)[1,1'-bipheyl]-3,5-dicarbonitrile (DCzTPA), 4'-(9H-carbazol-9-yl)biphenyl-3,5-dicarbonitrile (pCzB-2CN), 3'-(9H-carbazol-9-yl)biphenyl-3,5-dicarbonitrile (mCzB-2CN), TSPO1, 9-(9-phenyl-9H-carbazol-6-yl)-9H-carbazole (CCP), 4-(3-(triphenylen-2-yl) phenyl)dibenzo[b,d]thiophene, 9-(4-(9H-carbazol-9-yl) phenyl)-9H-3,9'-bicarbazole, 9-(3-(9H-carbazol-9-yl) phenyl)-9H-3,9'-bicarbazole, 9-(6-(9H-carbazol-9-yl) pyridin-3-yl)-9H-3,9'-bicabazole, 9,9'-diphenyl-9H,9'H-3,3'-bicarbazole (BCzPh), 1,3,5-tris(carbazole-9-yl)benzene (TCP), TCTA, 4,4'-bis(carbazole-9-yl)-2,2'-dimethylbiphenyl (CDBP), 2,7-bis(carbazole-9-yl)-9,9-dimethylfluorene (DMFL-CBP), 2,2',7,7'-tetrakis(carbazole-9-yl)-9,9-spiorofluorene (spiro-CBP), and 3,6-bis(carbazole-9-yl)-9-(2-ethyl-hexyl)-9H-carbazole (TCzl), but it is not limited thereto.

The ETL 370, which is positioned between the EML 360 and the second electrode 220, can include an electron transporting material being at least one selected from the group consisting of tris-(8-hydroxyquinoline) aluminum (Alq3), 2-biphenyl-4-yl-5-(4-t-butylphenyl)-1,3,4-oxadiazole (PBD), spiro-PBD, lithium quinolate (Liq), 1,3,5-tris(N-phenylbenzimidazol-2-yl)benzene (TPBi), bis(2-methyl-8-quinolinolato-N1,08)-(1,1'-biphenyl-4-olato)aluminum (BAlq), 4,7-diphenyl-1,10-phenanthroline (Bphen), 2,9-bis (naphthalene-2-yl)4,7-diphenyl-1,10-phenanthroline (NBphen), 2,9-dimethyl-4,7-diphenyl-1,10-phenanthroline (BCP), 3-(4-biphenyl)-4-phenyl-5-tert-butylphenyl-1,2,4-triazole (TAZ), 4-(naphthalen-1-yl)-3,5-diphenyl-4H-1,2,4-triazole (NTAZ), 1,3,5-tri(p-pyrid-3-yl-phenyl)benzene (Tp-PyPB), 2,4,6-tris(3'-(pyridin-3-yl)biphenyl-3-yl)1,3,5-triazine (TmPPPyTz), poly[9,9-bis(3'-(N,N-dimethyl)-N-ethylammonium)-propyl)-2,7-fluorene]-alt-2,7-(9,9-dioctylfluorene)] (PFNBr), tris(phenylquinoxaline) (TPQ), diphenyl-4-triphenylsilyl-phenylphosphine oxide (TSPO1), and 2-[4-(9,10-di-2-naphthalen-2-yl-2-anthracen-2-yl)phenyl]-1-phenyl-1H-benzimidazole (ZADN). For example, the electron transporting material of the ETL 370 can be a compound in Formula 7.

The EIL 380, which is positioned between the second electrode 220 and the ETL 370, can include an electron injection material being at least one of LiF, CsF, NaF, $BaF_2$, lithium quinolate (Liq), lithium benzoate, and sodium stearate.

Alternatively, the ETL 370 can be formed by co-depositing the electron transporting material in Formula 7 and the electron injection material, e.g., Liq, and the EIL 380 can be omitted. In this instance, the ETL 370 can have a thickness of 10 to 60 nm, preferably 20 to 40 nm.

The organometallic compound of the present disclosure is an Ir complex including the first ligand, which includes the pyridine moiety and the fused-ring moiety including O, and the alkylsilyl group is connected to a specific position of the fused-ring moiety, and the second ligand, which includes the benzene moiety and the pyridine moiety. The OLED D1 and the organic light emitting device 100 including the organometallic compound provides improved emitting efficiency and lifespan.

In addition, at least one of hydrogens in the pyridine moiety of the second ligand can be substituted with unsubstituted C1 to C10 alkyl such that, the emitting efficiency and the lifespan of the OLED D1 and the organic light emitting device 100 are further improved.

Moreover, at least one of hydrogens in the pyridine moiety of the first ligand can be substituted with unsubstituted or D-substituted C1 to C10 alkyl or unsubstituted C1 to C10 cycloalkyl group such that the emitting efficiency and the lifespan of the OLED D1 and the organic light emitting device 100 are further improved.

[OLED]

Over a glass substrate, on which an anode (ITO, 100 nm) is coated, an HIL (Formula 4, 60 nm), an HTL (Formula 5, 80 nm), an EML (host (Formula 6) and dopant, 30 nm), an ETL (Formula 7 and Liq (1:1), 30 nm) and a cathode (Al, 100 nm) are sequentially deposited.

[Formula 4]

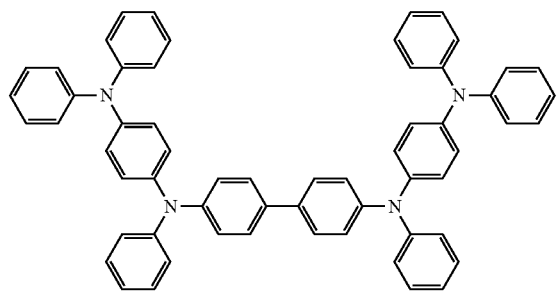

HI-1

[Formula 5]

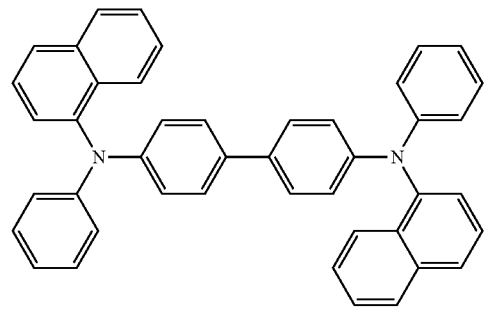

NPB

[Formula 6]

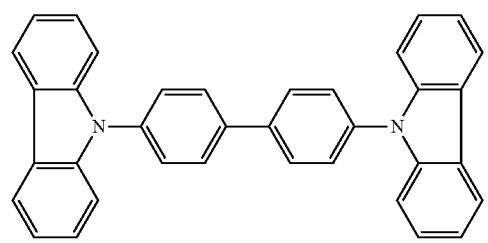

CBP

[Formula 7]

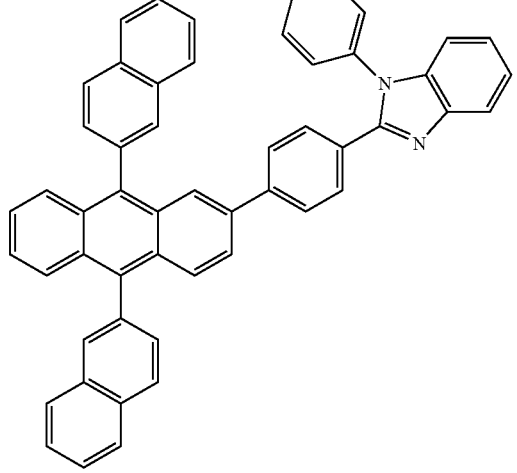

ET-1

1. Comparative Examples 1 to 13 (Ref1 to Ref13)

The compounds "Ref-1" to "Ref-13" in Formula 8 are used to as the dopant in the EML.

2. Examples 1 to 33 (Ex1 to Ex33)

The organometallic compounds 271, 292, 276, 279, 284, 336, 331, 334, 351, 386, 16, 17, 64, 136, 225, 220, 391 to 405, 20, and 62 in Formula 3 are used to as the dopant in the EML.

[Formula 8]
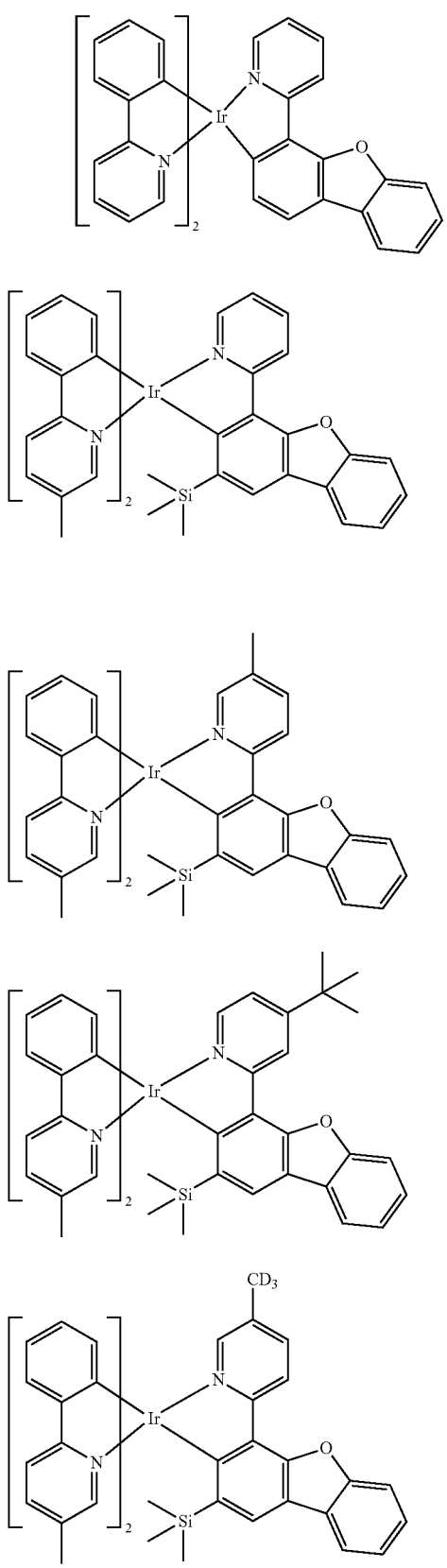
Ref-1
Ref-2
Ref-3
Ref-4
Ref-5
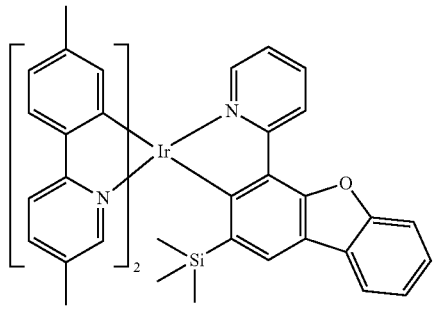
Ref-6
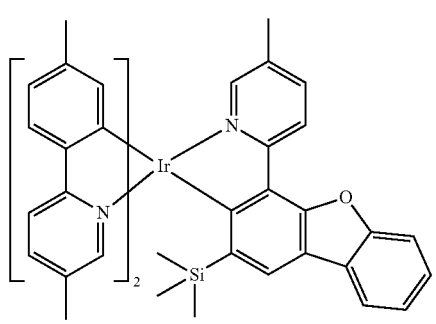
Ref-7
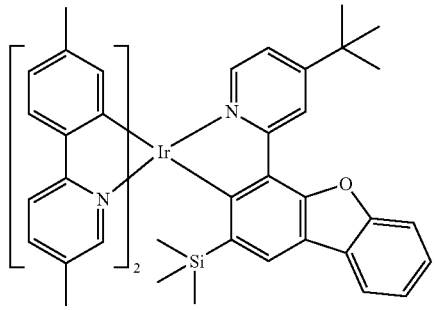
Ref-8
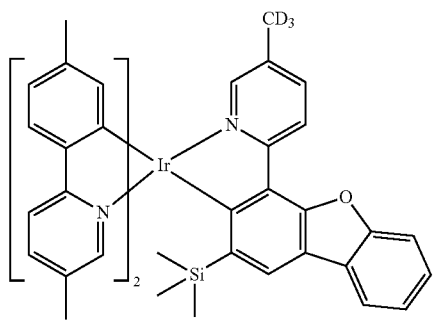
Ref-9
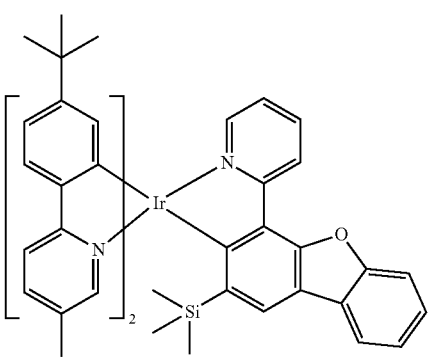
Ref-10

-continued

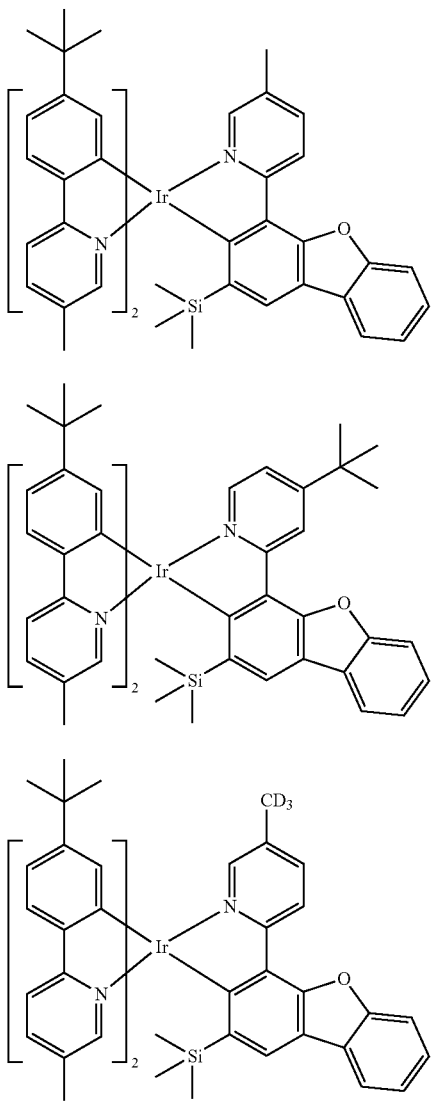

Ref-11

Ref-12

Ref-13

The properties, e.g., the driving voltage (V), the maximum emitting quantum efficiency (Emax), the external quantum efficiency (EQE) and the lifespan (LT95), of the OLEDs of the Ref1 to Ref13 and Ex1 to Ex33 are measured and listed in Tables 1 to 4. In this instance, the maximum emitting quantum efficiency (Emax), the external quantum efficiency (EQE) and the lifespan (LT95) are a relative value with respect to the values of Ref1.

TABLE 1

| | dopant | V | Emax [%] | EQE [%] | LT95 [%] |
|---|---|---|---|---|---|
| Ref1 | Ref-1 | 4.25 | 100 | 100 | 100 |
| Ref2 | Ref-2 | 4.38 | 111 | 88 | 102 |
| Ref3 | Ref-3 | 4.35 | 113 | 87 | 97 |
| Ref4 | Ref-4 | 4.43 | 115 | 80 | 117 |
| Ref5 | Ref-5 | 4.32 | 109 | 86 | 100 |
| Ref6 | Ref-6 | 4.36 | 103 | 85 | 92 |
| Ref7 | Ref-7 | 4.32 | 100 | 87 | 93 |
| Ref8 | Ref-8 | 4.44 | 113 | 77 | 95 |
| Ref9 | Ref-9 | 4.40 | 108 | 84 | 88 |
| Ref10 | Ref-10 | 4.35 | 95 | 78 | 84 |

TABLE 1-continued

| | dopant | V | Emax [%] | EQE [%] | LT95 [%] |
|---|---|---|---|---|---|
| Ref11 | Ref-11 | 4.33 | 99 | 81 | 80 |
| Ref12 | Ref-12 | 4.30 | 102 | 82 | 75 |
| Ref13 | Ref-13 | 4.28 | 98 | 84 | 78 |

TABLE 2

| | dopant | V | Emax [%] | EQE [%] | LT95 [%] |
|---|---|---|---|---|---|
| Ex1 | 271 | 4.24 | 108 | 106 | 122 |
| Ex2 | 292 | 4.22 | 110 | 108 | 126 |
| Ex3 | 276 | 4.24 | 106 | 107 | 124 |
| Ex4 | 279 | 4.25 | 105 | 104 | 121 |
| Ex5 | 284 | 4.24 | 99 | 101 | 105 |
| Ex6 | 336 | 4.25 | 105 | 103 | 121 |
| Ex7 | 331 | 4.26 | 103 | 104 | 123 |
| Ex8 | 334 | 4.24 | 107 | 106 | 122 |
| Ex9 | 351 | 4.24 | 106 | 104 | 122 |
| Ex10 | 386 | 4.27 | 101 | 102 | 116 |
| Ex11 | 16 | 4.21 | 114 | 109 | 136 |
| Ex12 | 17 | 4.22 | 113 | 103 | 134 |
| Ex13 | 64 | 4.20 | 116 | 89 | 137 |

TABLE 3

| | Dopant | V | Emax [%] | EQE [%] | LT95 [%] |
|---|---|---|---|---|---|
| Ex14 | 136 | 4.21 | 115 | 111 | 136 |
| Ex15 | 225 | 4.23 | 111 | 106 | 129 |
| Ex16 | 220 | 4.22 | 102 | 104 | 109 |
| Ex17 | 391 | 4.25 | 107 | 107 | 132 |
| Ex18 | 392 | 4.23 | 110 | 115 | 125 |
| Ex19 | 399 | 4.25 | 110 | 111 | 120 |
| Ex20 | 400 | 4.24 | 115 | 105 | 127 |
| Ex21 | 401 | 4.22 | 118 | 98 | 121 |
| Ex22 | 402 | 4.26 | 112 | 129 | 120 |
| Ex23 | 403 | 4.26 | 114 | 138 | 123 |
| Ex24 | 404 | 4.23 | 115 | 102 | 120 |
| Ex25 | 393 | 4.22 | 117 | 95 | 130 |
| Ex26 | 394 | 4.20 | 115 | 109 | 128 |

TABLE 4

| | dopant | V | Emax [%] | EQE [%] | LT95 [%] |
|---|---|---|---|---|---|
| Ex27 | 395 | 4.21 | 110 | 107 | 127 |
| Ex28 | 396 | 4.18 | 104 | 105 | 132 |
| Ex29 | 405 | 4.23 | 115 | 133 | 129 |
| Ex30 | 397 | 4.23 | 116 | 92 | 126 |
| Ex31 | 398 | 4.25 | 112 | 106 | 128 |
| Ex32 | 20 | 4.21 | 115 | 110 | 136 |
| Ex33 | 62 | 4.22 | 114 | 87 | 130 |

As shown in Tables 1 to 4, in comparison to the OLED of Ref1 to Ref13, the emitting efficiency and the lifespan of the OLED of Ex1 to Ex33 are increased. For example, the organometallic compounds 16, 17, 64, 136, 391 to 398 in Formula 3 respectively have a difference in a position of alkylsilyl, e.g., trimethylsilyl, with respect to the compounds "Ref-2 to Ref-13", in Formula 8, and the OLED of Ex11 to Ex14, Ex17, Ex18, Ex25 to Ex28, Ex30 and Ex31, which respectively use the above organometallic compound, has higher emitting efficiency and lifespan.

On the other hand, for example, the compounds 220, 225 and 284 in Formula 3 includes nitrogen in the fused-ring moiety, while nitrogen is not included or presented in the fused-ring moiety of the compound 17, 136 and 276 in Formula 3. In comparison to the OLEDs of Ex16, Ex15 and Ex5, which respectively use the compounds 220, 225 and 284 in Formula 3, the emitting efficiency and the lifespan of the OLEDs of Ex12, Ex14 and Ex3, which respectively use the compound 17, 136 and 276 in Formula 3, are improved. Namely, in each of Formula 1, 2-1, 2-2 and 2-3, X1 to X5 can be $CR^4$.

In addition, for example, the compounds 271, 276, and 292 in Formula 3 and the compounds 16, 17, and 136 respectively have a difference in a number of the first and second ligands. In comparison to the OLEDs of Ex1, Ex3 and Ex2, which respectively use the compound 271, 276 and 292, the emitting efficiency and the lifespan of the OLEDs of Ex11, Ex12 and Ex14, which respectively use the compounds 16, 17 and 136, are improved. Namely, in each of Formula 1, 2-1, 2-2 and 2-3, n can be 2.

Moreover, the compounds 17 and 20 and the compounds 62 and 64 respectively have a difference in a position of alkyl connected to the pyridine moiety of the first ligand. The emitting efficiency and the lifespan of the OLEDs of Ex12 and Ex32, which respectively use the compounds 17 and 20, are further improved.

Figure 4:
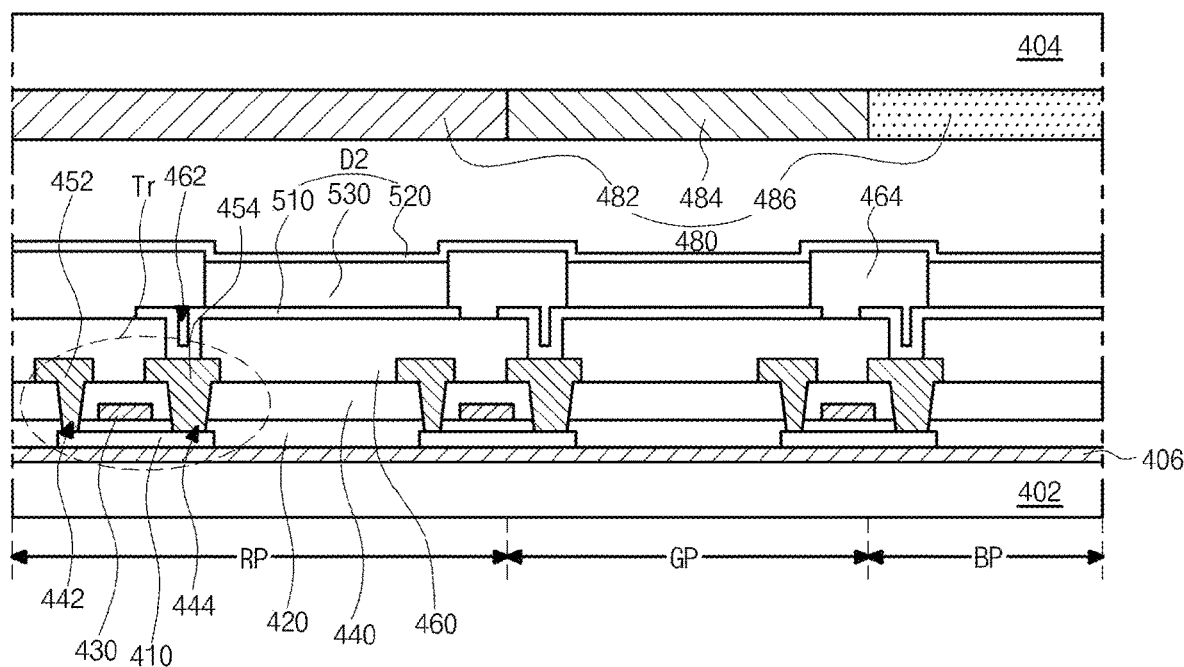
FIG. 4 is a schematic cross-sectional view illustrating an organic light emitting display device according to a third embodiment of the present disclosure.

FIG. 4 is a schematic cross-sectional view illustrating an organic light emitting display device according to a third embodiment of the present disclosure.

As shown in FIG. 4, an organic light emitting display device 400 according to the third embodiment of the present invention includes a first substrate 402, where a red pixel region RP, a green pixel region GP and a blue pixel region BP are defined, a second substrate 404 facing the first substrate 402, an OLED D2, which is positioned between the first and second substrates 402 and 404 and provides white emission, and a color filter layer 480 between the OLED D2 and the second substrate 404.

Each of the first and second substrates 402 and 404 can be a glass substrate or a flexible substrate. For example, each of the first and second substrates 402 and 404 can be a polyimide (PI) substrate, a polyethersulfone (PES) substrate, a polyethylenenaphthalate (PEN) substrate, a polyethylene terephthalate (PET) substrate or a polycarbonate (PC) substrate.

A buffer layer 406 is formed on the first substrate 402, and the TFT Tr corresponding to each of the red, green and blue pixel regions RP, GP and BP is formed on the buffer layer 406. The buffer layer 406 can be omitted. The TFT Tr can be the driving TFT.

A semiconductor layer 410 is formed on the buffer layer 406. The semiconductor layer 410 can include an oxide semiconductor material or polycrystalline silicon.

A gate insulating layer 420 is formed on the semiconductor layer 410. The gate insulating layer 420 can be formed of an inorganic insulating material such as silicon oxide or silicon nitride.

A gate electrode 430, which is formed of a conductive material, e.g., metal, is formed on the gate insulating layer 420 to correspond to a center of the semiconductor layer 410.

An interlayer insulating layer 440, which is formed of an insulating material, is formed on the gate electrode 430. The interlayer insulating layer 440 can be formed of an inorganic insulating material, e.g., silicon oxide or silicon nitride, or an organic insulating material, e.g., benzocyclobutene or photo-acryl.

The interlayer insulating layer 440 includes first and second contact holes 442 and 444 exposing an upper surface of both sides of the semiconductor layer 410. The first and second contact holes 442 and 444 are positioned at both sides of the gate electrode 430 to be spaced apart from the gate electrode 430.

A source electrode 452 and a drain electrode 454, which are formed of a conductive material, e.g., metal, are formed on the interlayer insulating layer 440. The source electrode 452 and the drain electrode 454 are spaced apart from each other with respect to the gate electrode 430 and respectively contact both sides of the semiconductor layer 410 through the first and second contact holes 442 and 444.

The semiconductor layer 410, the gate electrode 430, the source electrode 452 and the drain electrode 454 constitute the TFT Tr.

A passivation layer 460 is formed on the source and drain electrodes 452 and 454 to cover the TFT Tr. The passivation layer 460 includes a drain contact hole 462 exposing the drain electrode 454 of the TFT Tr and covers an entire surface of the first substrate 402.

The OLED D2 is positioned on the passivation layer 460. The OLED D2 includes a first electrode 510, which is connected to the drain electrode 454 of the TFT Tr through the drain contact hole 462, a second electrode 520 facing the first electrode 510 and an organic light emitting layer 530 therebetween.

The first electrode 510 is separately formed in each pixel region and can act as an anode. For example, the first electrode 510 can include a transparent conductive oxide material layer.

A bank layer 464 covering an edge of the first electrode 510 is formed on the passivation layer 460. The bank layer 464 is positioned at a boundary of the red, green and blue pixel regions RP, GP and BP and exposes a center of the first electrode 510 in the red, green and blue pixel regions RP, GP and BP. Since the OLED D2 emits the white light in the red, green and blue pixel regions RP, GP and BP, the organic emitting layer 530 can be formed as a common layer in the red, green and blue pixel regions RP, GP and BP without separation in the red, green and blue pixel regions RP, GP and BP. The bank layer 464 can be formed to prevent the current leakage at an edge of the first electrode 510 and can be omitted.

An organic light emitting layer 530 is formed on the first electrode 510 and has at least two emitting units as described below. Namely, the OLED D2 has a tandem structure. For example, as shown in FIGS. 5 to 8, the organic light emitting layer 530 includes at least two emitting units 630, 730, 630A, 730A, 830, 930, 1030, 830A, 930A and 1030A and can further include at least one charge generation layer (CGL) 690, 890 and 990. Each emitting unit includes an EML, and the CGL is positioned between adjacent emitting units.

The second electrode 520 is formed over the first substrate 402 where the organic light emitting layer 530 is formed. The second electrode 520 covers an entire surface of a display area and can act as a cathode.

In the organic light emitting display device 400, since the light emitted from the organic light emitting layer 530 is incident to the color filter layer 480 through the second electrode 520, the second electrode 520 has a thin profile for transmitting the light. In addition, a reflection electrode can be disposed under the first electrode 510.

The color filter layer 480 is positioned over the OLED D2 and includes a red color filter 482, a green color filter 484 and a blue color filter 486 respectively corresponding to the red, green and blue pixel regions RP, GP and BP. The red color filter 482 can include at least one of a red dye and a red pigment, the green color filter 484 can include at least one of a green dye and a green pigment, and the blue color filter 486 can include at least one of a blue dye and a blue pigment.

The color filter layer 480 can be attached to the OLED D2 by using an adhesive layer. Alternatively, the color filter layer 480 can be formed directly on the OLED D2.

In the organic light emitting display device 400 of FIG. 4, the light from the organic light emitting layer 530 passes through the second electrode 520, and the color filter layer 480 is disposed over the OLED D2. Alternatively, when the light from the organic light emitting layer 530 passes through the first electrode 510 (i.e., a bottom-emission type), the color filter layer 480 can be disposed between the OLED D2 and the first substrate 402.

A color conversion layer can be formed between the OLED D2 and the color filter layer 480. The color conversion layer can include a red color conversion layer, a green color conversion layer and a blue color conversion layer respectively corresponding to the red, green and blue pixel regions RP, GP and BP. The white light from the OLED D2 is converted into the red light, the green light and the blue light by the red, green and blue color conversion layer, respectively. For example, the color conversion layer can include a quantum dot.

As described above, the white light from the organic light emitting diode D2 passes through the red color filter 482, the green color filter 484 and the blue color filter 486 in the red pixel region RP, the green pixel region GP and the blue pixel region BP such that the red light, the green light and the blue light are provided from the red pixel region RP, the green pixel region GP and the blue pixel region BP, respectively.

Figure 5:
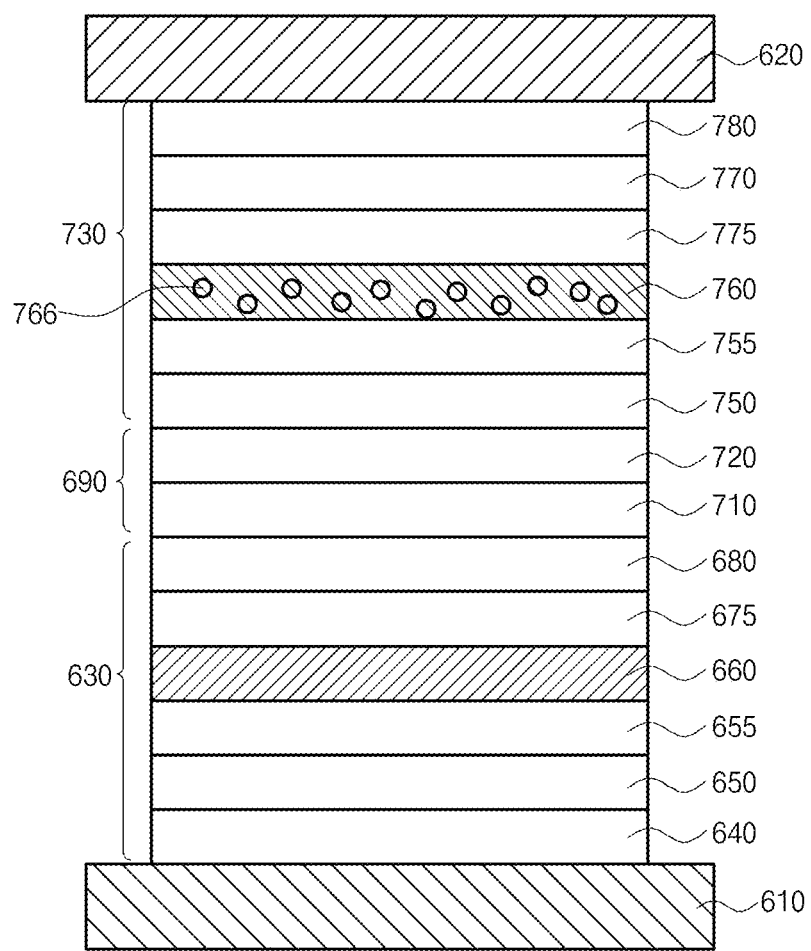
FIG. 5 is a schematic cross-sectional view illustrating an OLED according to a fourth embodiment of the present disclosure.

FIG. 5 is a schematic cross-sectional view illustrating an OLED according to a fourth embodiment of the present disclosure.

As shown in FIG. 5, the OLED D2 according to the fourth embodiment of the present disclosure includes first and second electrodes 610 and 620 facing each other, a first emitting unit 630 between the first and second electrodes 610 and 620, a second emitting unit 730 between the first emitting unit 630 and the second electrode 620, and a CGL 690 between the first and second emitting units 630 and 730.

The first electrode 610 can be an anode, and the second electrode 620 can be a cathode.

The first emitting unit 630 includes a first EML 660. In addition, the first emitting unit 630 can further include at least one of a first HTL (e.g., a lower HTL) 650 under the first EML 660 and a first ETL (e.g., a lower ETL) 680 on or over the first EML 660. Moreover, the first emitting unit 630 can further include an HIL 640 under the first HTL 650. In this instance, the HIL 640 is disposed between the first electrode 610 and the first HTL 650. Furthermore, the first emitting unit 630 can further include at least one of a first EBL (e.g., a lower EBL) 655 between the first HTL 650 and the first EML 660 and a first HBL (e.g., a lower HBL) 675 between the first EML 660 and the first ETL 680.

The second emitting unit 730 includes a second EML 760. In addition, the second emitting unit 730 can further include at least one of a second HTL (e.g., an upper HTL) 750 under the second EML 760 and a second ETL (e.g., an upper ETL) 770 on or over the second EML 760. Moreover, the second emitting unit 730 can further include an EIL 780 on the second ETL 770. In this instance, the EIL 780 is disposed between the second electrode 620 and the second ETL 770. Furthermore, the second emitting unit 730 can further include at least one of a second EBL (e.g., an upper EBL) 755 between the second HTL 750 and the second EML 760 and a second HBL (e.g., an upper HBL) 775 between the second EML 760 and the second ETL 770.

One of the first and second EMLs 660 and 760 includes the organometallic compound of the present invention and provides the green emission. For example, the second EML 760 can include the organometallic compound of the present invention. In this instance, the first EML 660 can provide the red emission and/or the blue emission. Accordingly, the OLED D2 can provide the white emission.

The CGL 690 is positioned between the first and second emitting units 630 and 730. The CGL 690 includes an n-type CGL (e.g., n-CGL) 710 being adjacent to the first emitting unit 630 and a p-type CGL (e.g., p-CGL) 720 being adjacent to the second emitting unit 730. The n-CGL 710 provides the electron into the first emitting unit 630, and the p-CGL 720 provides the hole into the second emitting unit 730.

The second EML 760 includes a first host and a first dopant 766, and the first dopant 766 is the organometallic compound of the present invention. For example, the first host can be one of mCP-CN, CBP, mCBP, mCP, DPEPO, PPT, TmPyPB, PYD-2Cz, DCzDBT, DCzTPA, pCzB-2CN, mCzB-2CN, TSPO1, CCP, 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole, 9-(6-(9H-carbazol-9-yl)pyridin-3-yl)-9H-3,9'-bicabazole, BCzPh, TCP, TCTA, CDBP, DMFL-CBP, Spiro-CBP, and TCzl.

In the second EML 760, the first dopant 766 can have a weight % of 1 to 20 weight %, preferably 1 to 10 weight %. For example, the second EML 760 can have a thickness of 10 to 100 nm, preferably 20 to 50 nm.

The first EML 660 can be a blue EML and/or a red EML. For example, the first EML 660 can include a blue EML and a red EML. In this instance, the first EML 660 can include a lower EML disposed between the first EBL 655 and the first HBL 675 and an upper EML disposed between the lower EML and the first HBL 675. One of the lower and upper EMLs is the red EML, and the other one of the lower and upper EMLs is the blue EML.

In exemplary embodiment, when the lower EML is the red EML, the lower EML can include a second host being a red host and a second dopant being a red dopant.

The second host being the red host can be one of the above material for the first host, bis(2-hydroxylphenyl)-pyridine) beryllium (Bepp$_2$), bis(10-hydroxylbenzo[h] quinolinato) beryllium (Bebq$_2$), and 1,3,5-tris(1-pyrenyl)benzene (TPB3), but it is not limited thereto.

The second dopant being the red dopant can be an organometallic compound in Formula 9 or 10, but it is not limited thereto.

[Formula 9]

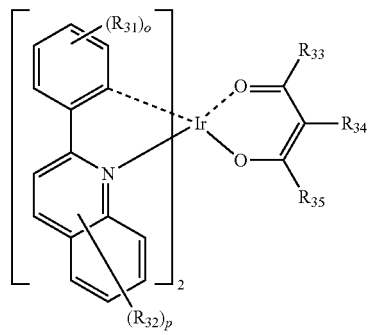

[Formula 10]

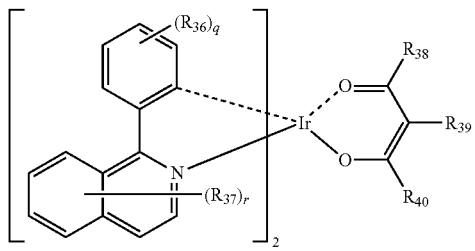

In each of Formulas 9 and 10, each of R31, R32, R36 and R37 is independently selected from D, halogen atom, C1 to C6 alkyl group, C3 to C6 cycloalkyl group, C6 to C10 aryl group and C4 to C10 heteroaryl group, and each of $R_{33}$, $R_{34}$, $R_{35}$, $R_{38}$, $R_{39}$ and $R_{40}$ is independently selected from the group consisting of H, D and C1 to C6 alkyl group. Each of o and q is independently an integer of 0 to 4, and p and r is independently an integer of 0 to 6.

The upper EML can include a third host being a blue host and a third dopant being a blue dopant.

For example, the third host can be one of mCP, mCP-CN, mCBP, CBP-CN, CBP, 9-(3-(9H-Carbazol-9-yl)phenyl)-3-(diphenylphosphoryl)-9H-carbazole (mCPPO1), 3,5-di(9H-carbazol-9-yl)biphenyl (Ph-mCP), TSPO1, 9-(3'-(9H-carba-zol-9-yl)-[1,1'-biphenyl]-3-yl)-9H-pyrido[2,3-b]indole (CzBPCb), bis(2-methylphenyl)diphenylsilane (UGH-1), 1,4-bis(triphenylsilyl)benzene (UGH-2), 1,3-bis(triphenyl-silyl)benzene (UGH-3), 9,9-spiorobifluoren-2-yl-diphenyl-phosphine oxide (SPPO1), and 9,9'-(5-(triphenylsilyl)-1,3-phenylene)bis(9H-carbazole) (SimCP), but it is not limited thereto.

The third dopant being the blue dopant can be one of perylene, 4,4'-bis[4-(di-p-tolylamino)styryl]biphenyl (DPAVBi), 4-(di-p-tolylamino)-4-4'-[(di-p-tolylamino) styryl]stilbene (DPAVB), 4,4'-bis[4-(diphenylamino)styryl] biphenyl (BDAVBi), 2,5,8,11-tetra-tetr-butylperylene (TBPe), Bepp2, 9-(9-Phenylcarbazole-3-yl)-10-(naphtha-lene-1-yl)anthracene (PCAN), mer-tris(1-phenyl-3-methyl-imidazolin-2-ylidene-C,C(2)'iridium(III) (mer-Ir(pmi)$_3$), fac-tris(1,3-diphenyl-benzimidazolin-2-ylidene-C,C(2) 'iridium(III) (fac-Ir(dpbic)$_3$), bis(3,4,5-trifluoro-2-(2-pyridyl)phenyl-(2-carboxypyridyl)iridium(III) (Ir(tfpd)$_2$pic), tris(2-(4,6-difluorophenyl)pyridine)iridium(III) (Ir (Fppy)$_3$), and bis[2-(4,6-difluorophenyl)pyridinato-C$^2$,N] (picolinato)iridium(III) (Flrpic), but it is not limited thereto.

For example, in each of the red and blue EMLs, each of the second and third dopant can have a weight % of 1 to 30 weight %.

The OLED D2 of the present disclosure has a tandem structure, and one of the EMLs includes the organometallic compound of the present disclosure. Accordingly, the OLED D2 can provide the white emission with improved emitting efficiency, color purity and lifespan.

The OLED D2 is applied to the organic light emitting display device 400 (of FIG. 4) including the color filter layer 480 such that a full-color image can be provided.

Figure 6:
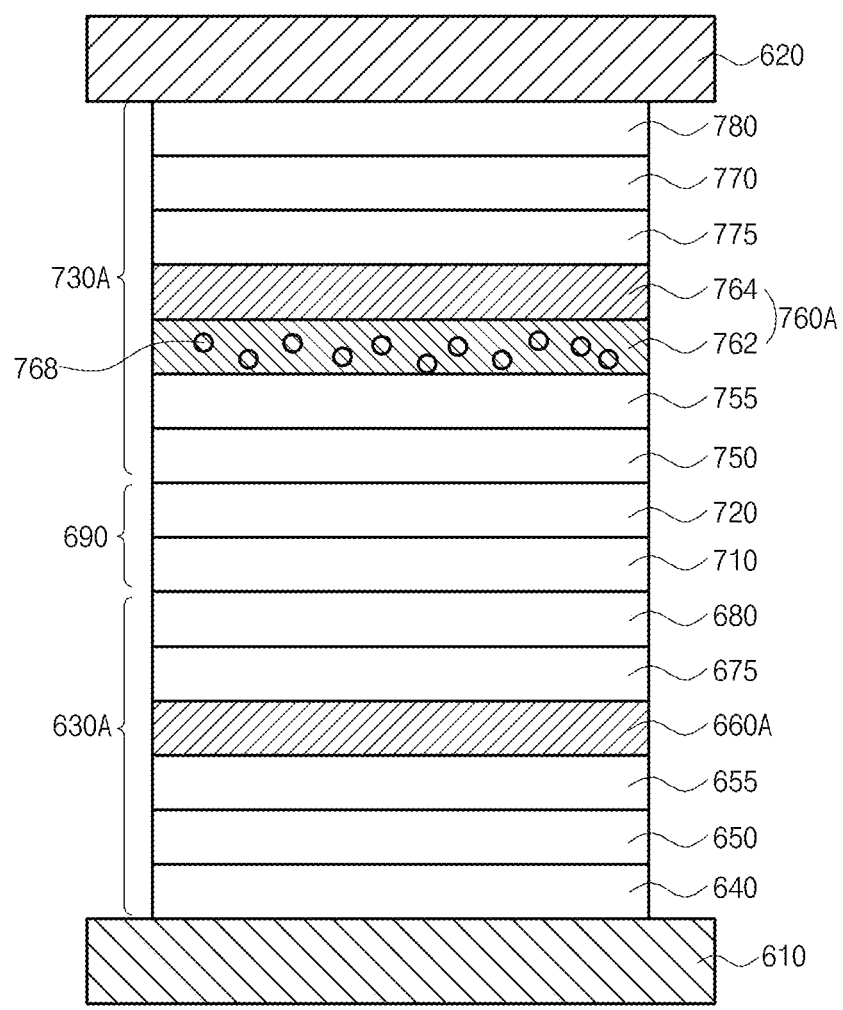
FIG. 6 is a schematic cross-sectional view illustrating an OLED according to a fifth embodiment of the present disclosure.

FIG. 6 is a schematic cross-sectional view illustrating an OLED according to a fifth embodiment of the present disclosure.

As shown in FIG. 6, the OLED D2 according to the fifth embodiment of the present disclosure includes first and second electrodes 610 and 620 facing each other, a first emitting unit 630A between the first and second electrodes 610 and 620, a second emitting unit 730A between the first emitting unit 630A and the second electrode 620, and a CGL 690 between the first and second emitting units 630A and 730A.

The first emitting unit 630A includes a first EML 660A. In addition, the first emitting unit 630A can further include at least one of a first HTL (e.g., a lower HTL) 650 under the first EML 660A and a first ETL (e.g., a lower ETL) 680 on or over the first EML 660A. Moreover, the first emitting unit 630A can further include an HIL 640 under the first HTL 650. In this instance, the HIL 640 is disposed between the first electrode 610 and the first HTL 650. Furthermore, the first emitting unit 630A can further include at least one of a first EBL (e.g., a lower EBL) 655 between the first HTL 650 and the first EML 660A and a first HBL (e.g., a lower HBL) 675 between the first EML 660A and the first ETL 680.

The second emitting unit 730A includes a second EML 760A. In addition, the second emitting unit 730A can further include at least one of a second HTL (e.g., an upper HTL) 750 under the second EML 760A and a second ETL (e.g., an upper ETL) 770 on or over the second EML 760A. Moreover, the second emitting unit 730A can further include an EIL 780 on the second ETL 770. In this instance, the EIL 780 is disposed between the second electrode 620 and the second ETL 770. Furthermore, the second emitting unit 730A can further include at least one of a second EBL (e.g., an upper EBL) 755 between the second HTL 750 and the second EML 760A and a second HBL (e.g., an upper HBL) 775 between the second EML 760A and the second ETL 770.

The CGL 690, which is positioned between the first and second emitting units 630A and 730A, includes an n-type CGL (e.g., n-CGL) 710 being adjacent to the first emitting unit 630A and a p-type CGL (e.g., p-CGL) 720 being adjacent to the second emitting unit 730A.

The OLED D2 in FIG. 5 and the OLED D2 in FIG. 6 have a difference in a structure or configuration of the first and second EMLs 660, 660A, 760 and 760A. The explanation of other elements except the first and second EMLs 660A and 760A is omitted.

The second EML 760A includes a lower EML 762 between the second EBL 755 and the second HBL 775 and an upper EML 764 between the lower EML 762 and the second HBL 775. In this instance, one of the lower and upper EMLs 762 and 764 includes the organometallic compound of the present disclosure to provide the green emission, and the other one of the lower and upper EMLs 762 and 764 provides the red emission. For example, the lower EML 762 can include the organometallic compound of the present disclosure.

The lower EML 762 of the second EML 760A includes a first host and a first dopant 768. The first host can be one of mCP-CN, CBP, mCBP, mCP, DPEPO, PPT, TmPyPB, PYD-2Cz, DCzDBT, DCzTPA, pCzB-2CN, mCzB-2CN, TSPO1, CCP, 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole, 9-(6-(9H-carbazol-9-yl)pyridin-3-yl)-9H-3,9'-bicabazole, BCzPh, TCP, TCTA, CDBP, DMFL-CBP, Spiro-CBP, and TCzl, and the first dopant 768 is the organometallic compound of the present disclosure.

The upper EML 764 of the second EML 760A includes a second host and a second dopant being a red dopant. For example, the second dopant can be an organometallic compound in Formula 9 or 10.

In the lower EML 762, the first dopant 768 can have a weight % of 1 to 20 weight %, preferably 1 to 10 weight %.

For example, the lower EML 762 can have a thickness of 10 to 100 nm, preferably 20 to 50 nm.

In the upper EML 764, the second dopant can have a weight % of 1 to 30 weight %. For example, the upper EML 764 can have a thickness of 10 to 100 nm, preferably 10 to 50 nm. But, it is not limited thereto.

The first EML 660A can be a blue EML. The first EML 660A can include a third host and a third dopant being a blue dopant. In the first EML 660A, the third dopant can have a weight % of 1 to 30 weight %. For example, the first EML 660A can have a thickness of 10 to 200 nm, preferably 20 to 100 nm, and more preferably 20 to 50 nm. But, it is not limited thereto.

The OLED D2 of the present disclosure has a tandem structure, and one of the EMLs includes the organometallic compound of the present disclosure. Accordingly, the OLED D2 can provide the white emission with improved emitting efficiency, color purity and lifespan.

The OLED D2 is applied to the organic light emitting display device 400 (of FIG. 4) including the color filter layer 480 such that a full-color image can be provided.

Figure 7:
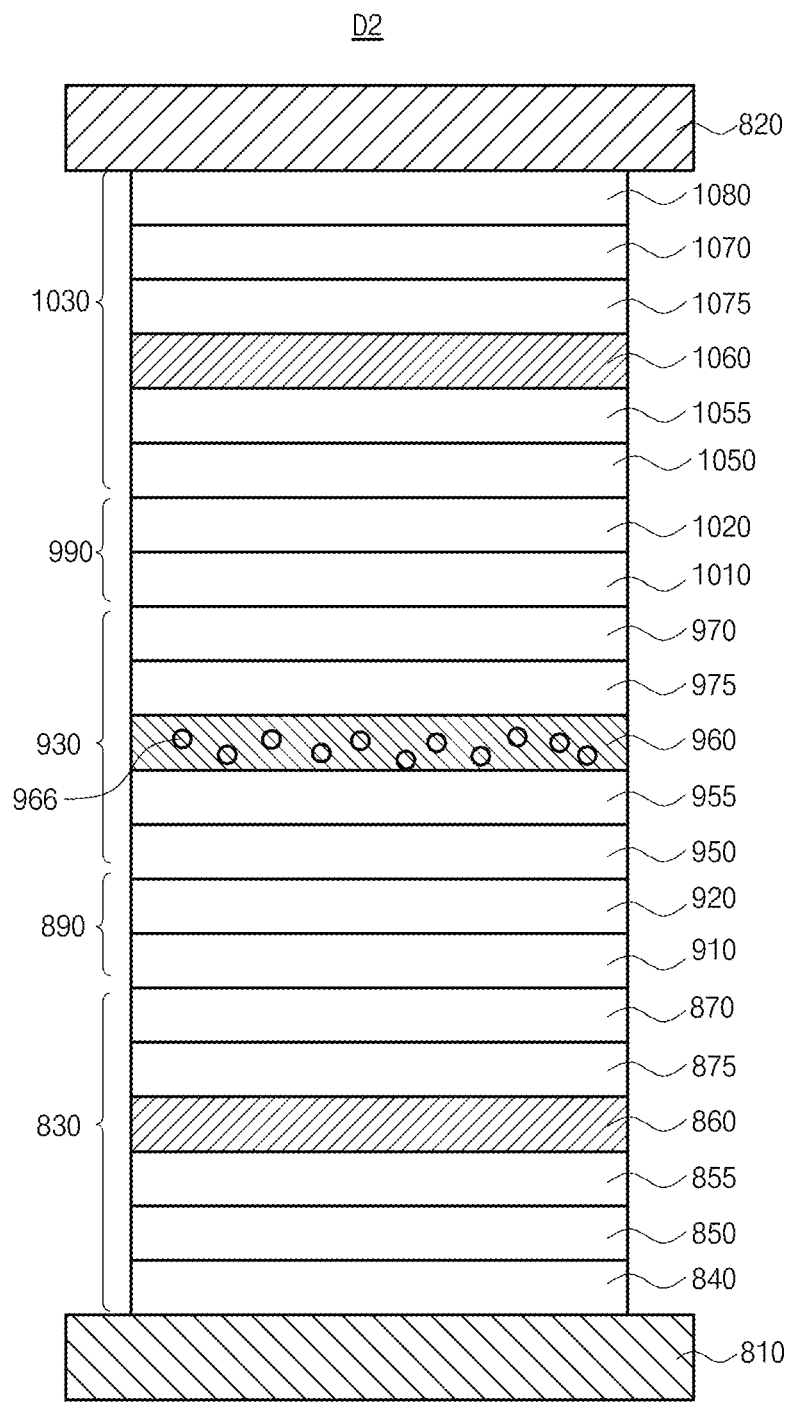
FIG. 7 is a schematic cross-sectional view illustrating an OLED according to a sixth embodiment of the present disclosure.

FIG. 7 is a schematic cross-sectional view illustrating an OLED according to a sixth embodiment of the present disclosure.

As shown in FIG. 7, the OLED D2 according to the sixth embodiment of the present disclosure includes first and second electrodes 810 and 820 facing each other, a first emitting unit 830 between the first and second electrodes 810 and 820, a second emitting unit 930 between the first emitting unit 830 and the second electrode 820, a third emitting unit 1030 between the second emitting unit 930 and the second electrode 820, a first CGL 890 between the first and second emitting units 830 and 930, and a second CGL 990 between the second and third emitting units 930 and 1030.

The first electrode 810 can be an anode, and the second electrode 820 can be a cathode.

The first emitting unit 830 includes an HIL 840, a first HTL 850, a first EML 860 and a first ETL 870 sequentially stacked. In addition, the first emitting unit 830 can further include at least one of a first EBL 855 between the first HTL 850 and the first EML 860 and a first HBL 875 between the first EML 860 and the first ETL 870.

The second emitting unit 930 includes a second HTL 950, a second EML 960 and a second ETL 970 sequentially stacked. In addition, the second emitting unit 930 can further include at least one of a second EBL 955 between the second HTL 950 and the second EML 960 and a second HBL 975 between the second EML 960 and the second ETL 970.

The third emitting unit 1030 includes a third HTL 1050, a third EML 1060, a third ETL 1070 and an EIL 1080 sequentially stacked. In addition, the third emitting unit 1030 can further include at least one of a third EBL 1055 between the third HTL 1050 and the third EML 1060 and a third HBL 1075 between the third EML 1060 and the third ETL 1070.

One of the first to third EMLs 860, 960 and 1060 includes the organometallic compound of the present disclosure and provides the green emission. Another one of the first to third EMLs 860, 960 and 1060 provides the red emission, and the other one of the first to third EMLs 860, 960 and 1060 provides the blue emission. Accordingly, the OLED D2 provides the white emission.

For example, the second EML 960 can include the organometallic compound of the present disclosure to provide the green emission, the first EML 860 can provide the red emission, and the third EML 1060 can provide the blue emission. Alternatively, the second EML 960 can include the organometallic compound of the present disclosure to provide the green emission, the first EML 860 can provide the blue emission, and the third EML 1060 can provide the red emission.

The first CGL 890 is positioned between the first and second emitting units 830 and 930, and the second CGL 990 is positioned between the second and third emitting units 930 and 1030. The first CGL 890 includes a first n-type CGL (e.g., first n-CGL) 910 being adjacent to the first emitting unit 830 and a first p-type CGL (e.g., first p-CGL) 920 being adjacent to the second emitting unit 930. The second CGL 990 includes a second n-type CGL (e.g., second n-CGL) 1010 being adjacent to the second emitting unit 930 and a second p-type CGL (e.g., second p-CGL) 1020 being adjacent to the third emitting unit 1030. The first and second n-CGLs 910 and 1010 respectively provide the electron into the first and second emitting units 830 and 930, and the first and second p-CGL 920 and 1020 respectively provide the hole into the second and third emitting units 930 and 1030.

The second EML 960 includes a first host and a first dopant 966, and the first dopant 966 is the organometallic compound of the present invention. For example, the first host can be one of mCP-CN, CBP, mCBP, mCP, DPEPO, PPT, TmPyPB, PYD-2Cz, DCzDBT, DCzTPA, pCzB-2CN, mCzB-2CN, TSPO1, CCP, 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole, 9-(6-(9H-carbazol-9-yl)pyridin-3-yl)-9H-3,9'-bicabazole, BCzPh, TCP, TCTA, CDBP, DMFL-CBP, spiro-CBP, and TCzl, but it is not limited thereto.

In the second EML 960, the first dopant 966 can have a weight % of 1 to 20 weight %, preferably 1 to 10 weight %. For example, the second EML 960 can have a thickness of 10 to 100 nm, preferably 20 to 50 nm.

The first EML 860 can be the red EML and can include a second host and a second dopant being the red dopant. The third EML 1060 can be the blue EML and can include a third host and a third dopant being the blue dopant.

In each of the first and third EMLs 860 and 1060, each of the second and third dopants can have a weight % of 1 to 30 weight %. Each of the first and third EMLs 860 and 1060 can have a thickness of 10 to 200 nm, preferably 20 to 100 nm, and more preferably 20 to 50 nm.

The OLED D2 has a tandem structure including the first emitting unit 830, which includes the first EML 860 and provides the red emission, the second emitting unit 930, which includes the second EML 960 and provides the green emission, and the third emitting unit 1030, which includes the third EML 1060 and provides the blue emission, and provides the white emission.

In addition, at least one of the EMLs includes the organometallic compound of the present disclosure. Accordingly, the emitting efficiency, the color purity and the lifespan of the OLED D2 and the organic light emitting display device 400 are improved.

The OLED D2 is applied to the organic light emitting display device 400 (of FIG. 4) including the color filter layer 480 such that a full-color image can be provided.

Figure 8:
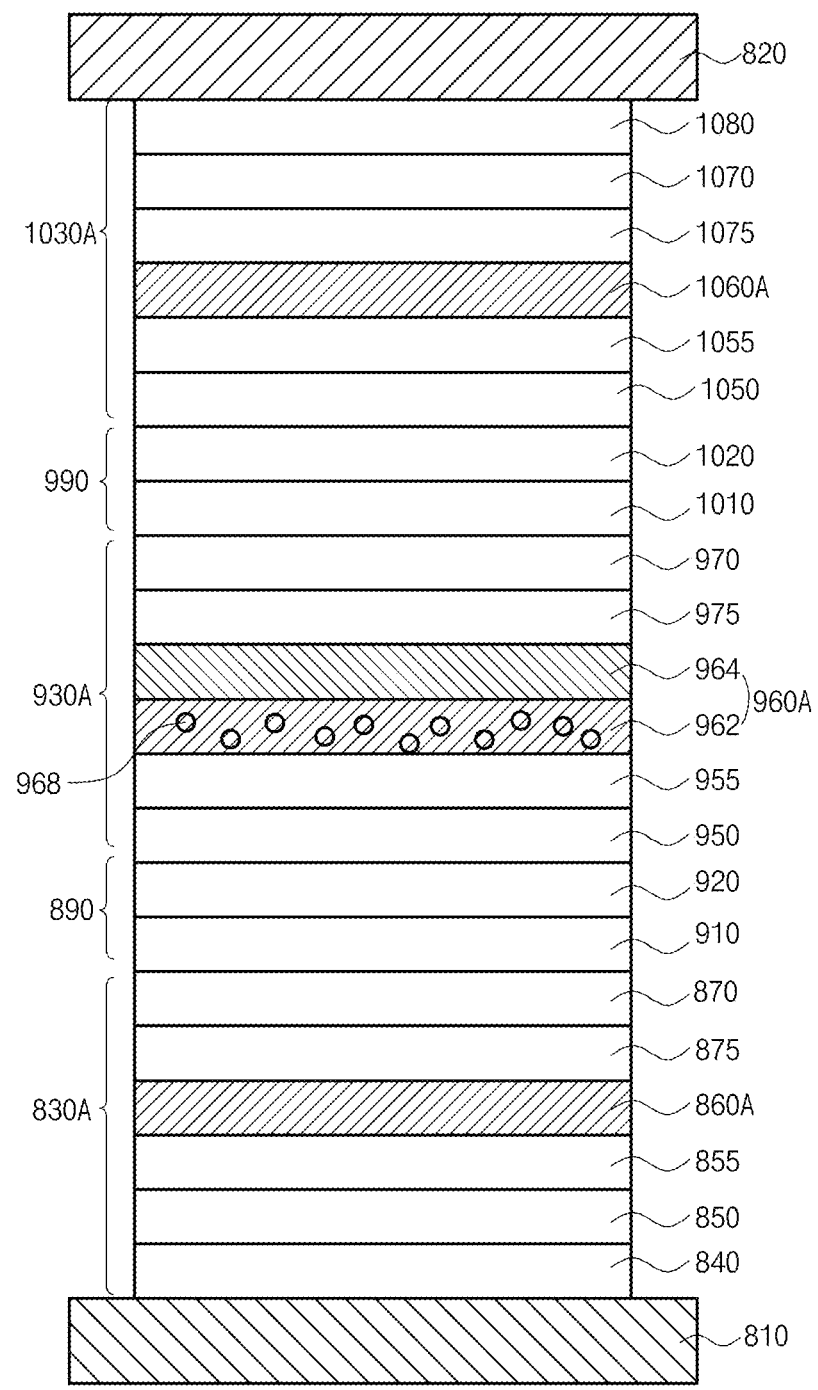
FIG. 8 is a schematic cross-sectional view illustrating an OLED according to a seventh embodiment of the present disclosure.

FIG. 8 is a schematic cross-sectional view illustrating an OLED according to a seventh embodiment of the present disclosure.

As shown in FIG. 8, the OLED D2 according to the seventh embodiment of the present disclosure includes first and second electrodes 810 and 820 facing each other, a first emitting unit 830A between the first and second electrodes 810 and 820, a second emitting unit 930A between the first emitting unit 830A and the second electrode 820, a third emitting unit 1030A between the second emitting unit 930A and the second electrode 820, a first CGL 890 between the first and second emitting units 830A and 930A, and a second CGL 990 between the second and third emitting units 930A and 1030A.

The first electrode 810 can be an anode, and the second electrode 820 can be a cathode.

The first emitting unit 830A includes an HIL 840, a first HTL 850, a first EML 860A and a first ETL 870 sequentially stacked. In addition, the first emitting unit 830A can further include at least one of a first EBL 855 between the first HTL 850 and the first EML 860A and a first HBL 875 between the first EML 860A and the first ETL 870.

The second emitting unit 930A includes a second HTL 950, a second EML 960A and a second ETL 970 sequentially stacked. In addition, the second emitting unit 930A can further include at least one of a second EBL 955 between the second HTL 950 and the second EML 960A and a second HBL 975 between the second EML 960A and the second ETL 970.

The third emitting unit 1030A includes a third HTL 1050, a third EML 1060A, a third ETL 1070 and an EIL 1080 sequentially stacked. In addition, the third emitting unit 1030A can further include at least one of a third EBL 1055 between the third HTL 1050 and the third EML 1060A and a third HBL 1075 between the third EML 1060A and the third ETL 1070.

The first CGL 890 is positioned between the first and second emitting units 830A and 930A, and the second CGL 990 is positioned between the second and third emitting units 930A and 1030A. The first CGL 890 includes a first n-type CGL (e.g., first n-CGL) 910 being adjacent to the first emitting unit 830A and a first p-type CGL (e.g., first p-CGL) 920 being adjacent to the second emitting unit 930A. The second CGL 990 includes a second n-type CGL (e.g., second n-CGL) 1010 being adjacent to the second emitting unit 930A and a second p-type CGL (e.g., second p-CGL) 1020 being adjacent to the third emitting unit 1030A.

The OLED D2 in FIG. 7 and the OLED D2 in FIG. 8 have a difference in a structure or configuration of the first to third EMLs 860, 860A, 960, 960A, 1060 and 1060A. The explanation of other elements except the first to third EMLs 860A, 960A and 1060A is omitted.

One of the first to third EMLs 860A, 960A and 1060A includes the organometallic compound of the present disclosure and provides the green emission. The OLED D2, where the second EML 960A includes the organometallic compound of the present disclosure, will be explained.

The second EML 960A includes a lower EML 962 between the second EBL 955 and the second HBL 975 and an upper EML 964 between the lower EML 962 and the second HBL 975. One of the lower and upper EMLs 962 and 964 includes the organometallic compound of the present disclosure to provide the green emission, and the other one of the lower and upper EMLs 962 and 964 provides the red emission. The OLED D2, where the lower EML 962 includes the organometallic compound of the present disclosure, will be explained.

The lower EML 962 of the second EML 960A includes a first host and a first dopant 968. The first host can be one of mCP-CN, CBP, mCBP, mCP, DPEPO, PPT, TmPyPB, PYD-2Cz, DCzDBT, DCzTPA, pCzB-2CN, mCzB-2CN, TSPO1, CCP, 4-(3-(triphenylen-2-yl)phenyl)dibenzo[b,d]thiophene, 9-(4-(9H-carbazol-9-yl)phenyl)-9H-3,9'-bicarbazole, 9-(3-(9H-carbazol-9-yl)phenyl)-9H-3,9'-bicarbazole, 9-(6-(9H-carbazol-9-yl)pyridin-3-yl)-9H-3,9'-bicabazole, BCzPh, TCP, TCTA, CDBP, DMFL-CBP, spiro-CBP, and TCzl, and the first dopant 968 is the organometallic compound of the present disclosure.

The upper EML 964 of the second EML 960A includes a second host and a second dopant being a red dopant. For example, the second dopant can be an organometallic compound in Formula 9 or 10.

In the lower EML 962, the first dopant 968 can have a weight % of 1 to 20 weight %, preferably 1 to 10 weight %. For example, the lower EML 962 can have a thickness of 10 to 100 nm, preferably 20 to 50 nm.

In the upper EML 964, the second dopant can have a weight % of 1 to 30 weight %. For example, the upper EML 964 can have a thickness of 10 to 100 nm, preferably 10 to 50 nm. But, it is not limited thereto.

Each of the first and third EML 860A and 1060A can be a blue EML. Each of the first and third EML 860A and 1060A can include a third host and a third dopant being a blue dopant. In each of the first and third EML 860A and 1060A, the third dopant can have a weight % of 1 to 30 weight %. For example, each of the first and third EML 860A and 1060A can have a thickness of 10 to 200 nm, preferably 20 to 100 nm, and more preferably 20 to 50 nm. But, it is not limited thereto.

The OLED D2 of the present disclosure has a tandem structure, and one of the EMLs includes the organometallic compound of the present disclosure. Accordingly, the OLED D2 can provide the white emission with improved emitting efficiency, color purity and lifespan.

The OLED D2 is applied to the organic light emitting display device 400 (of FIG. 4) including the color filter layer 480 such that a full-color image can be provided.

In FIGS. 4 to 8, the OLED emitting the white light is used for a display device. Alternatively, the OLED D can be formed on an entire surface of a substrate without at least one of the driving element and the color filter layer to be used for a lightening device. The display device and the lightening device each including the OLED D of the present disclosure can be referred to as an organic light emitting device.

It will be apparent to those skilled in the art that various modifications and variations can be made in the embodiments of the present disclosure without departing from the spirit or scope of the present disclosure. Thus, it is intended that the modifications and variations are covered by this disclosure provided they come within the scope of the appended claims and their equivalents.

What is claimed is:

1. An organometallic compound represented by Formula 1:

[Formula 1]

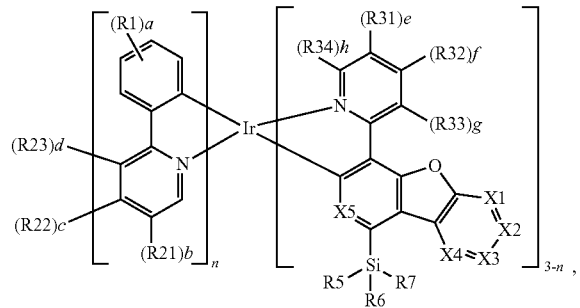

wherein each of X1 to X5 is independently N or CR4, and one of X1 to X5 is N, wherein each of R1, R21, R22, R23, R31, R32, R33 and R34 is independently selected from the group consisting of deuterium (D), halogen atom, C1 to C10 alkyl group unsubstituted or substituted with D or halogen atom, C3 to C20 cycloalkyl group unsubstituted or substituted with D, C6 to C30 aryl group unsubstituted or substituted with D or C1 to C10 alkyl and C3 to C30 heteroaryl group unsubstituted or substituted with D or C1 to C10 alkyl, wherein R4 is selected from the group consisting of hydrogen (H), D, halogen atom, C1 to C10 alkyl group unsubstituted or substituted with D, C3 to C20 cycloalkyl group unsubstituted or substituted with D, C6 to C30 aryl group unsubstituted or substituted with D or C1 to C10 alkyl and C3 to C30 heteroaryl group unsubstituted or substituted with D or C1 to C10 alkyl, wherein each of R5, R6 and R7 is independently C1 to C10 alkyl group, and wherein each of a to h is independently 0 or 1, and n is an integer of 0 to 2.

2. The organometallic compound according to claim 1, wherein the Formula 1 is represented by Formula 2-1:

[Formula 2-1]

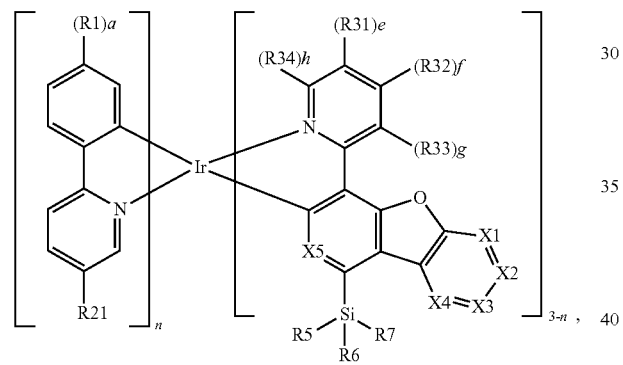

in Formula 2-1, the definitions of R1, R21, R31 to R34, R5 to R7, X1 to X5, a, e, f, g, h and n are the same as those in Formula 1.

3. The organometallic compound according to claim 2, wherein the Formula 2-1 is represented by one of Formulas 2-2 to 2-3:

[Formula 2-2]

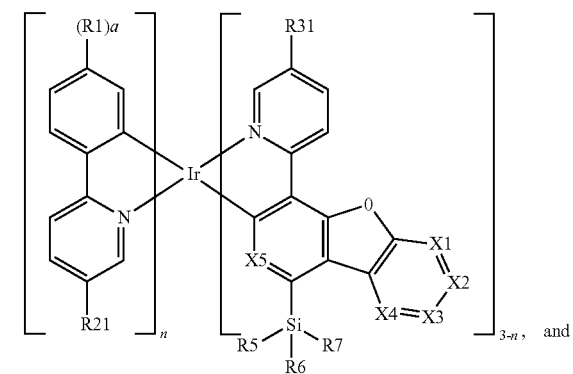

and

[Formula 2-3]

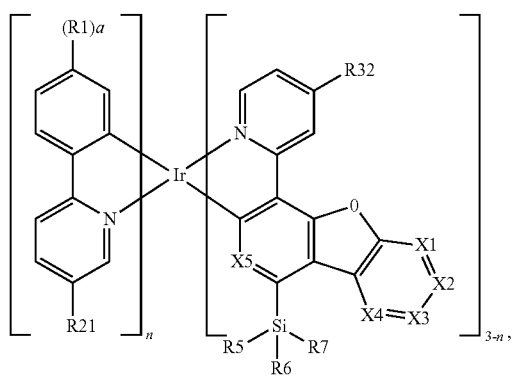

in Formulae 2-2 and 2-3, the definitions of R1, R21, R31, R32, R5 to R7, X1 to X5, a and n are the same as those in Formula 2-1.

4. The organometallic compound according to claim 1, wherein n is 2.

5. An organic light emitting diode, comprising:
a first electrode;
a second electrode facing the first electrode; and
a first emitting unit positioned between the first and second electrodes and including a first emitting material layer,
wherein the first emitting material layer includes the organometallic compound according to claim 1.

6. The organic light emitting diode according to claim 5, wherein the first emitting material layer includes a first host and a first dopant, and the first dopant is the organometallic compound.

7. The organic light emitting diode according to claim 6, further comprising:
a second emitting unit including a second emitting material layer and positioned between the first emitting unit and the first electrode; and
a first charge generation layer positioned between the first emitting unit and the second emitting unit,
wherein the second emitting material layer includes a blue dopant.

8. The organic light emitting diode according to claim 7, wherein the first emitting unit further includes a third emitting material layer disposed under or on the first emitting material layer, and
wherein the third emitting material layer includes a red dopant.

9. The organic light emitting diode according to claim 7, further comprising:
a third emitting unit positioned between the first emitting unit and the second electrode and including a third emitting material layer; and
a second charge generation layer positioned between the first emitting unit and the third emitting unit,
wherein the third emitting material layer includes a red dopant.

10. The organic light emitting diode according to claim 7, further comprising:
a third emitting unit positioned between the first emitting unit and the second electrode and including a third emitting material layer; and
a second charge generation layer positioned between the first emitting unit and the third emitting unit, wherein the first emitting unit further includes a fourth emitting material layer disposed under or on the first emitting material layer, and wherein the third emitting material layer includes a blue dopant, and the fourth emitting material layer includes a red dopant.

11. An organic light emitting device, comprising:
a substrate; and
an organic light emitting diode disposed on the substrate, the organic light emitting diode including:
a first electrode,
a second electrode facing the first electrode, and
a first emitting unit positioned between the first and second electrodes and including a first emitting material layer,
wherein the first emitting material layer includes the organometallic compound according to claim 1.

12. The organic light emitting device according to claim 11, wherein the first emitting material layer includes a first host and a first dopant, and the first dopant is the organometallic compound.

13. The organic light emitting device according to claim 11, wherein the organic light emitting diode further includes:
a second emitting unit including a second emitting material layer and positioned between the first emitting unit and the first electrode; and
a first charge generation layer positioned between the first emitting unit and the second emitting unit,
wherein the second emitting material layer includes a blue dopant.

14. The organic light emitting device according to claim 13, wherein the first emitting unit further includes a third emitting material layer disposed under or on the first emitting material layer, and
wherein the third emitting material layer includes a red dopant.

15. The organic light emitting device according to claim 13, wherein the organic light emitting diode further includes:
a third emitting unit positioned between the first emitting unit and the second electrode and including a third emitting material layer; and
a second charge generation layer positioned between the first emitting unit and the third emitting unit,
wherein the third emitting material layer includes a red dopant.

16. The organic light emitting device according to claim 13, wherein the organic light emitting diode further includes:
a third emitting unit positioned between the first emitting unit and the second electrode and including a third emitting material layer; and
a second charge generation layer positioned between the first emitting unit and the third emitting unit,
wherein the first emitting unit further includes a fourth emitting material layer disposed under or on the first emitting material layer, and
wherein the third emitting material layer includes a blue dopant, and the fourth emitting material layer includes a red dopant.

17. The organic light emitting device according to claim 11, wherein the substrate includes a red pixel region, a green pixel region and a blue pixel region, and the organic light emitting diode corresponds to each of the red, green and blue pixel regions, and wherein the organic light emitting device further comprises:
a color filter layer corresponding to the red, green and blue pixel regions and disposed between the substrate and the organic light emitting diode or over the organic light emitting diode.

18. The organometallic compound according to claim 1, wherein the organometallic compound is selected from compounds 211-270, 279-285, 311-315, 341-345 and 376-390:

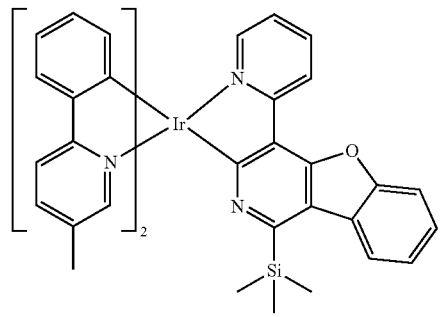

211

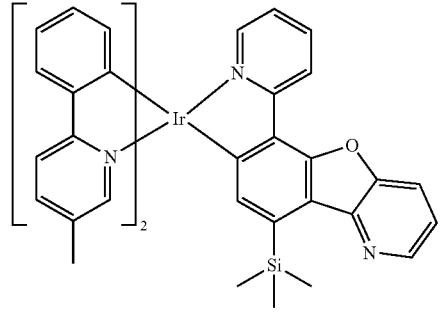

212

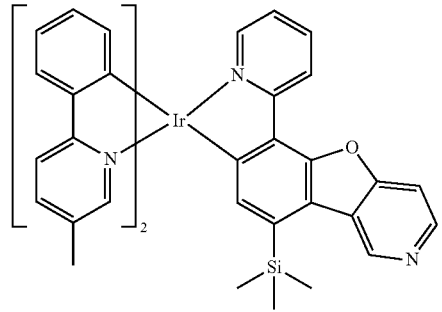

213

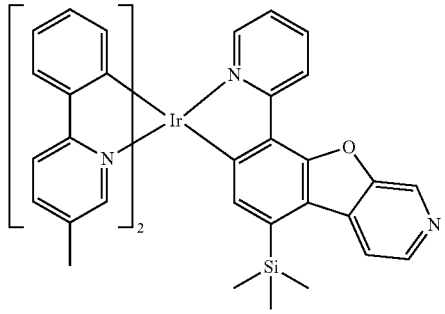

214

215 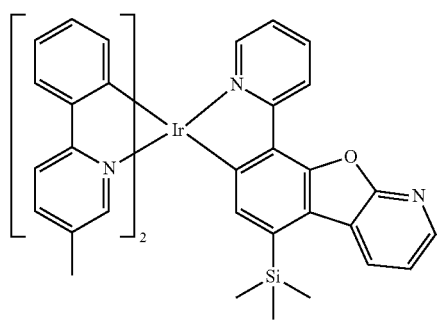
216 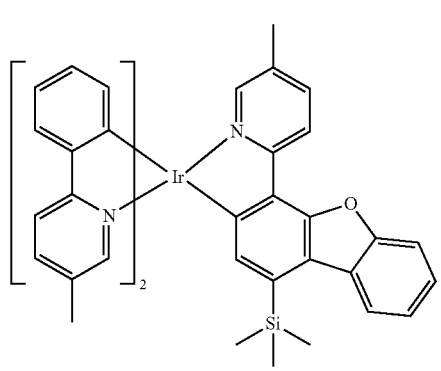
217 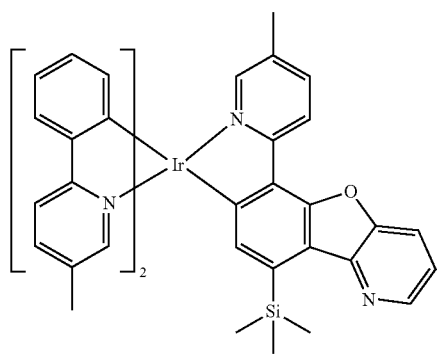
218 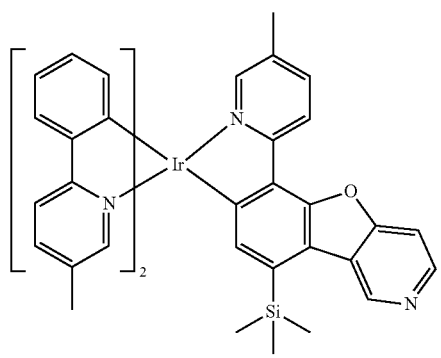
219 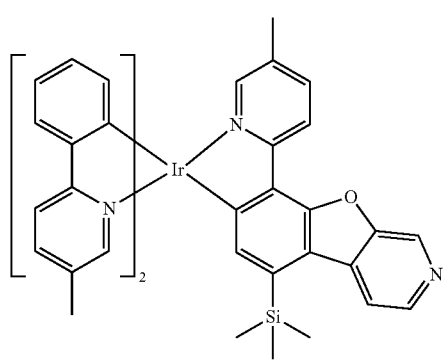
220 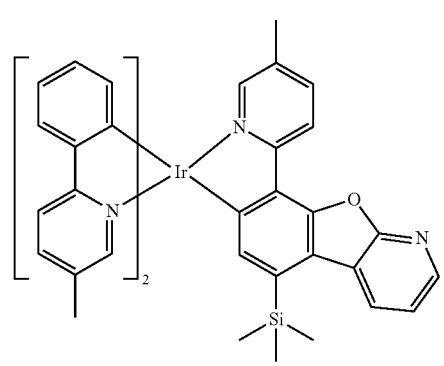
221 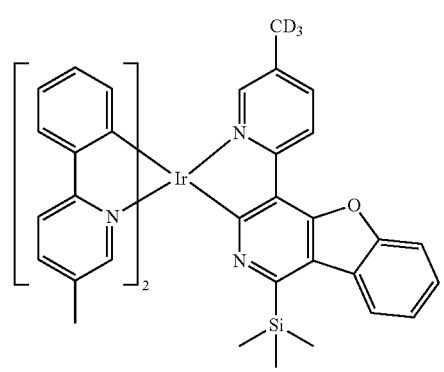
222 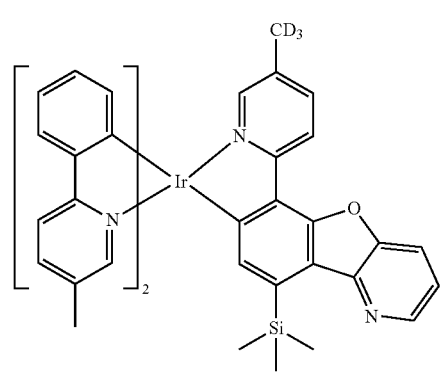

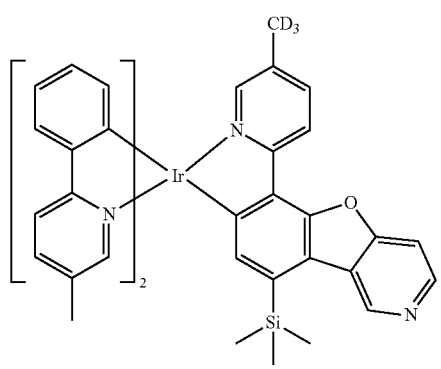
223
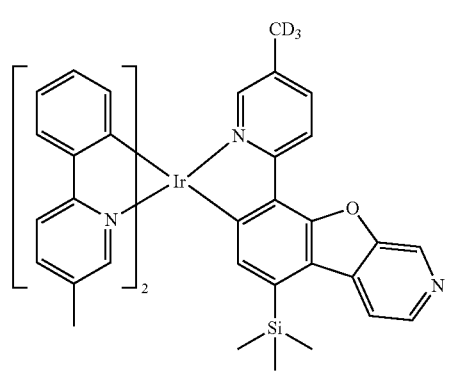
224
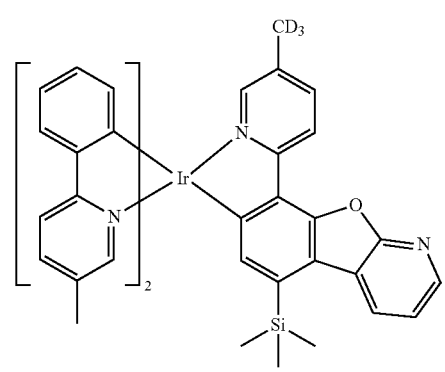
225
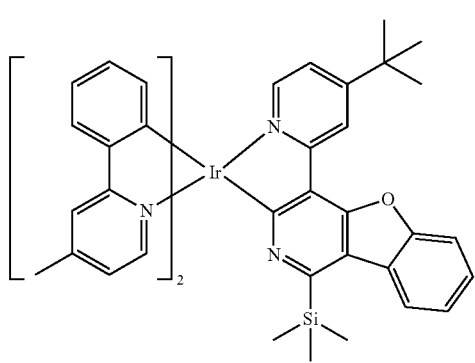
226
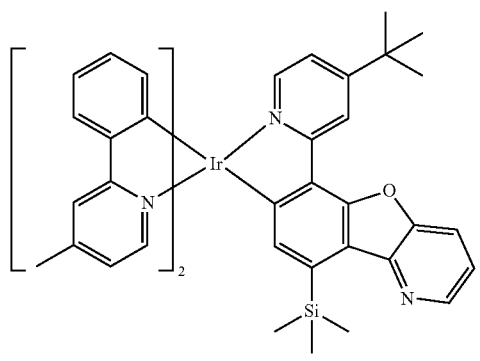
227
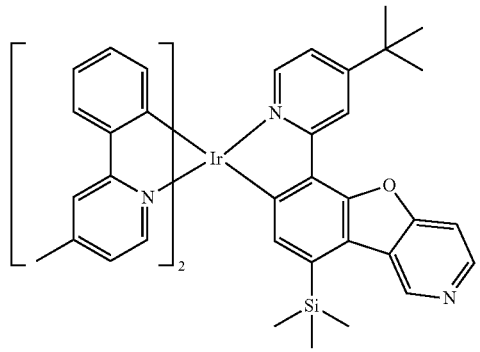
228
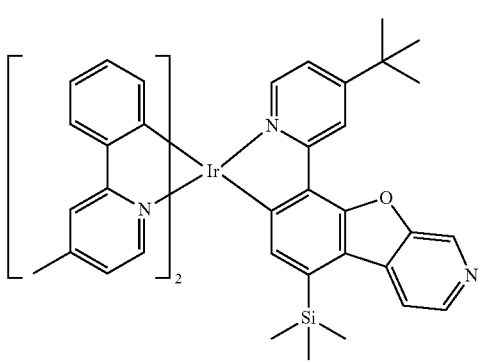
229
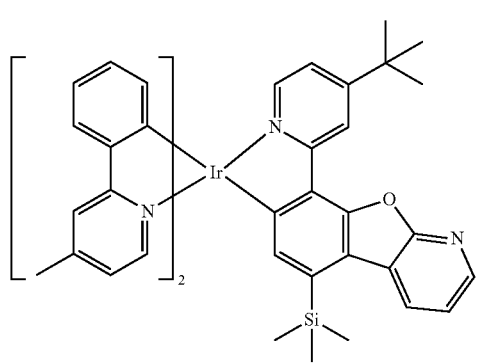
230

-continued
231
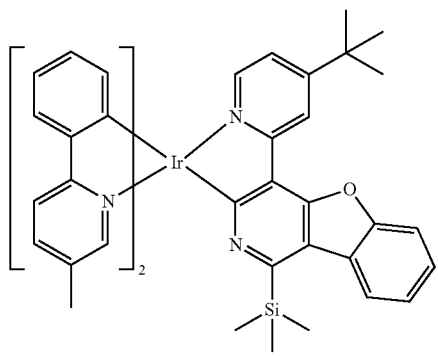
232
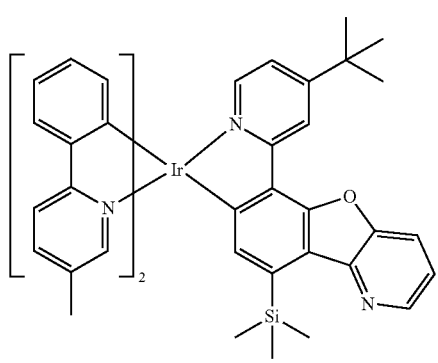
233
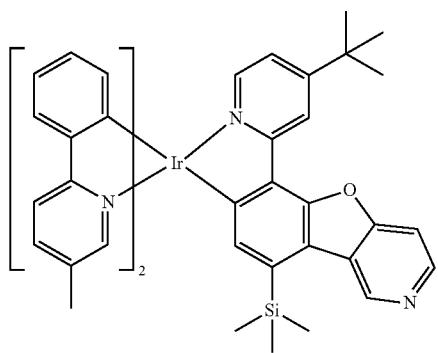
234
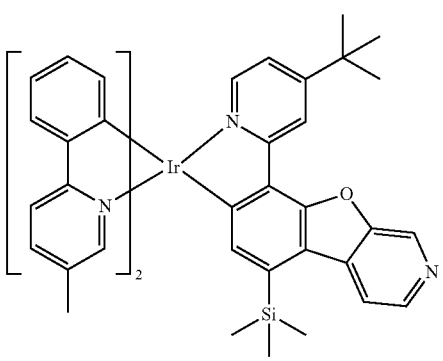
-continued
235
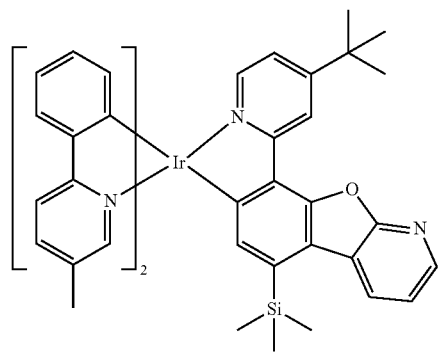
236
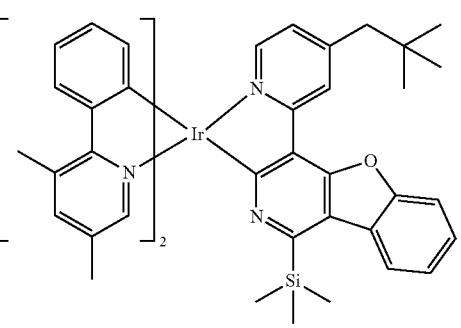
237
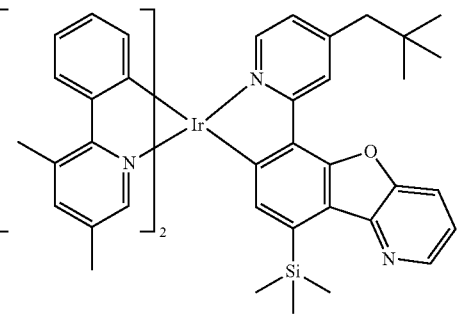
238
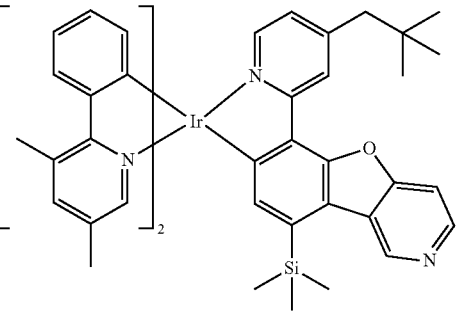
239
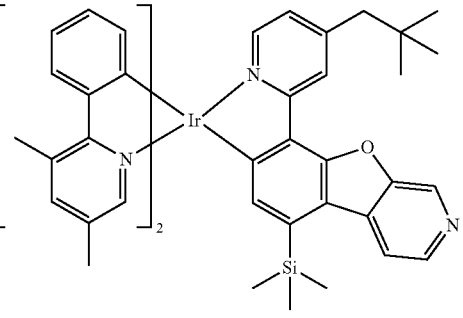

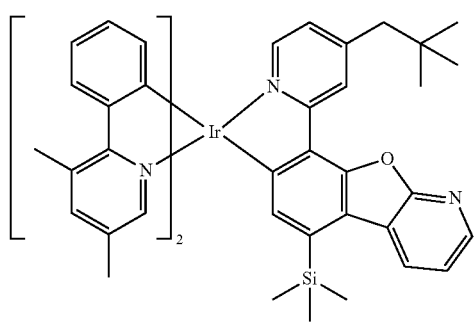
240
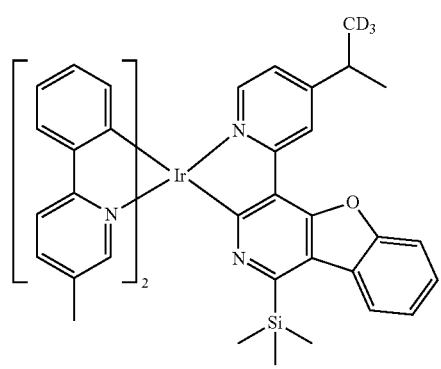
241
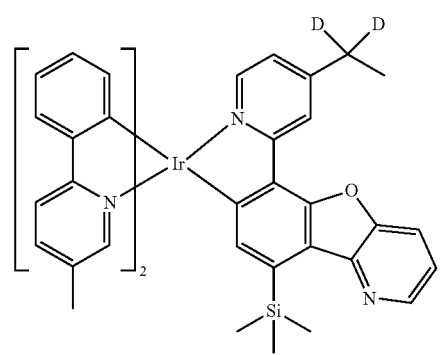
242
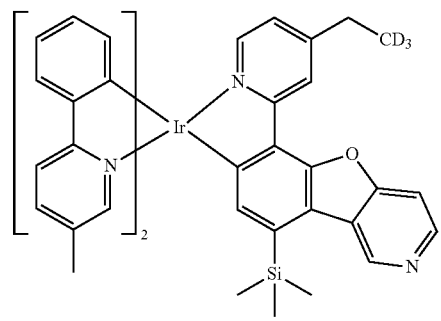
243
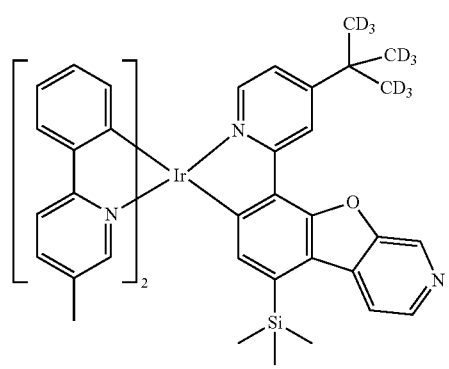
244
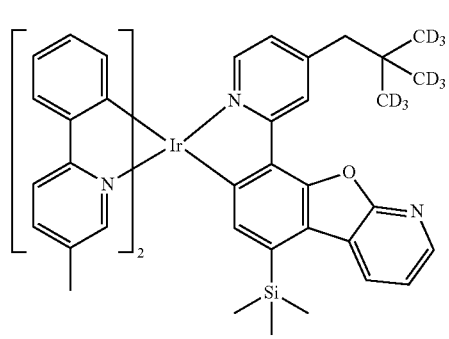
245
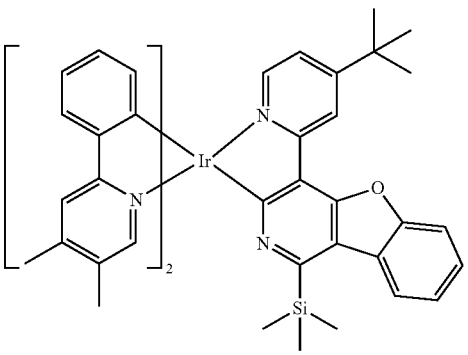
246
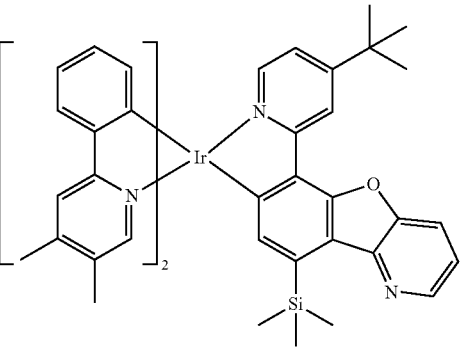
247

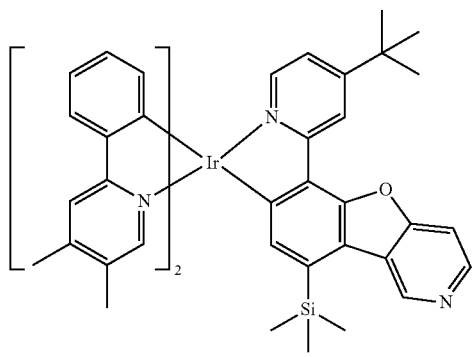
248
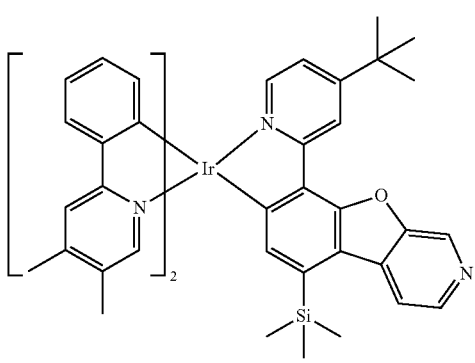
249
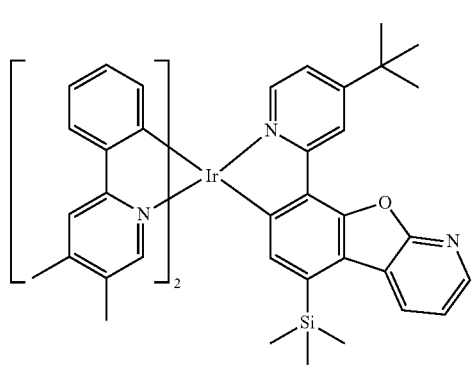
250
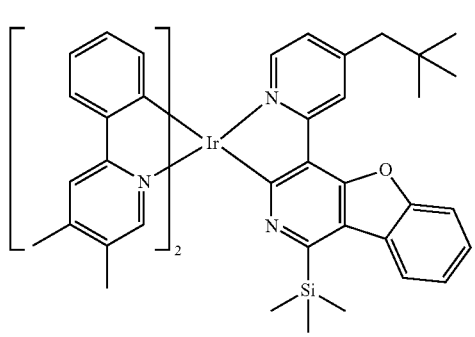
251
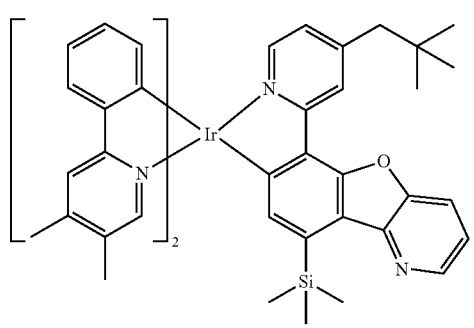
252
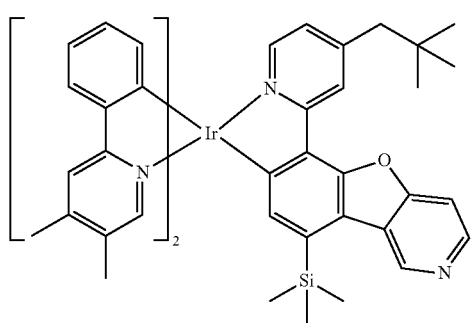
253
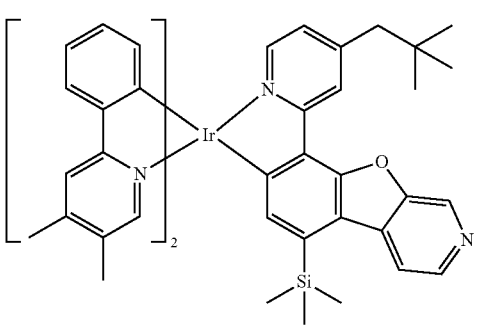
254
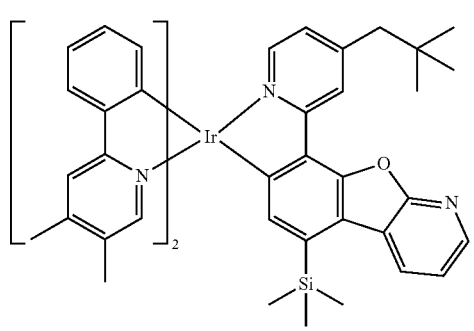
255
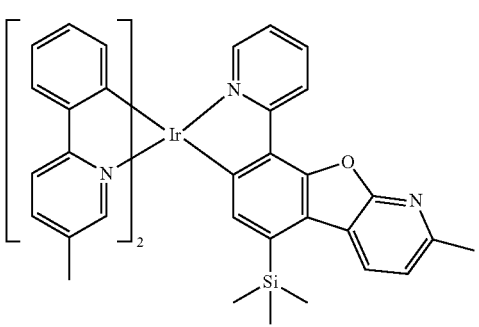
256

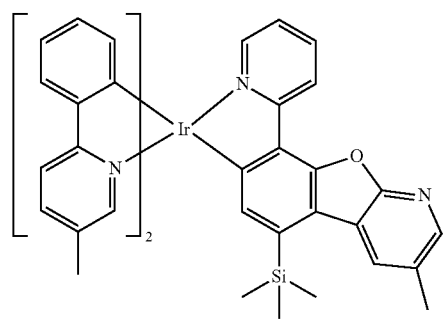
257
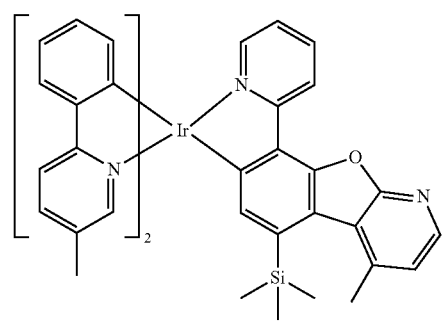
258
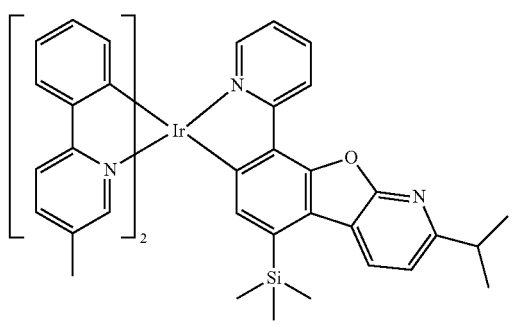
259
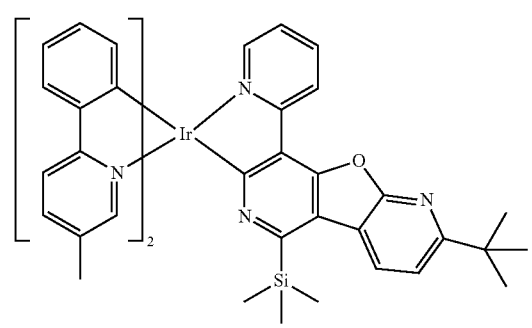
260
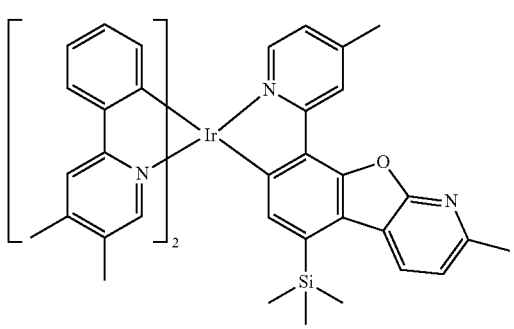
261
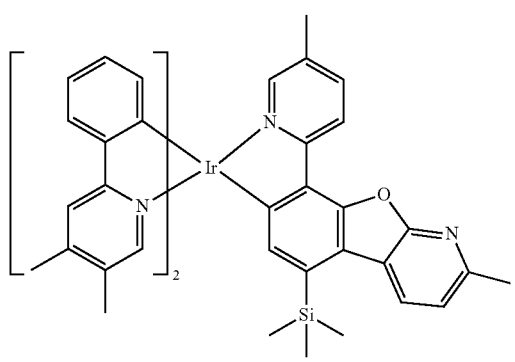
262
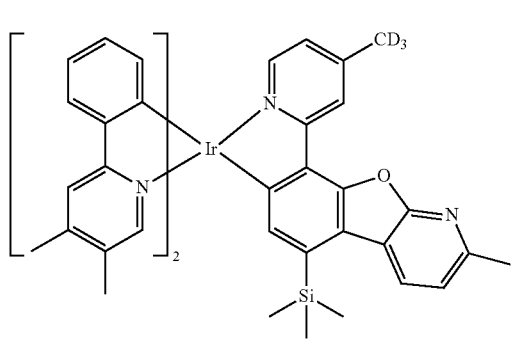
263
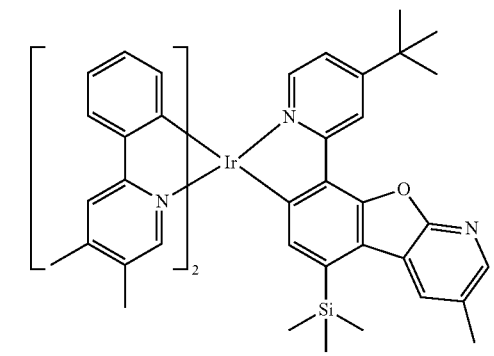
264
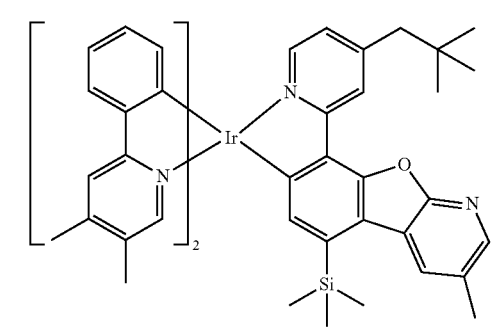
265

266 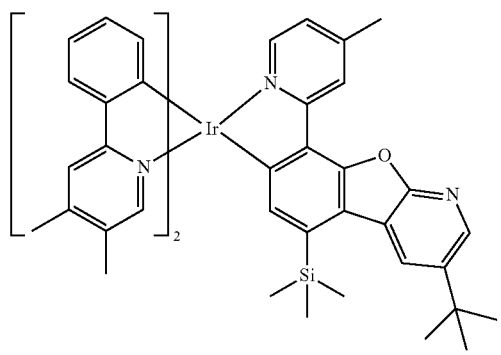
267 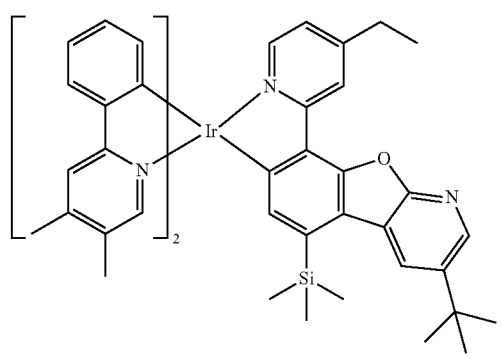
268 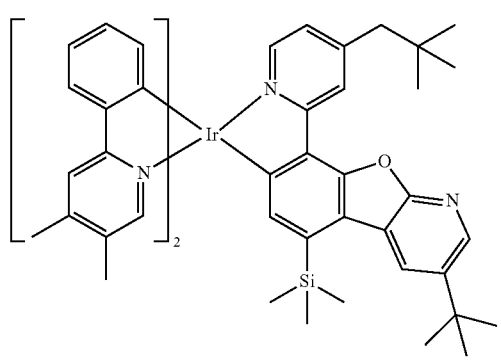
269 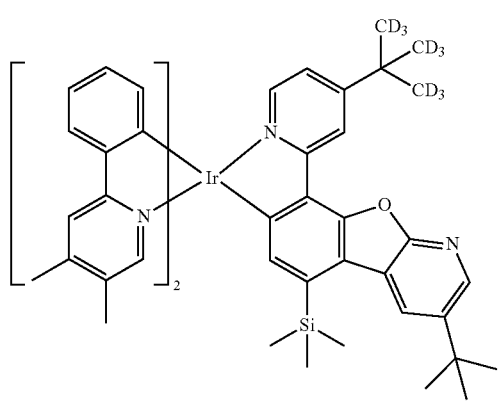
270 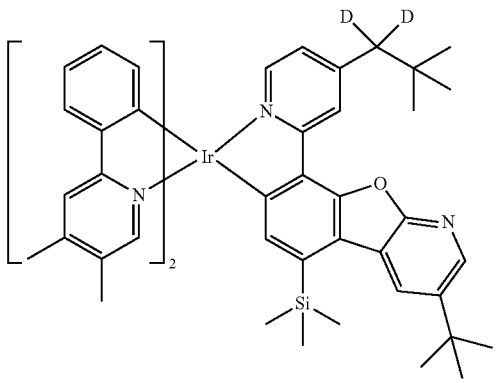
279 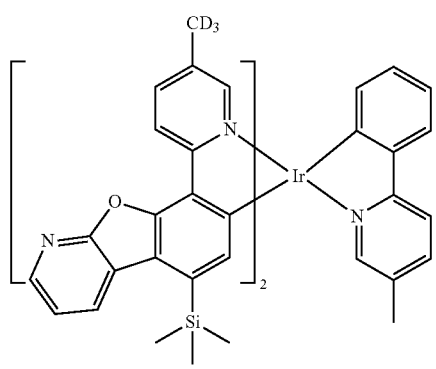
280 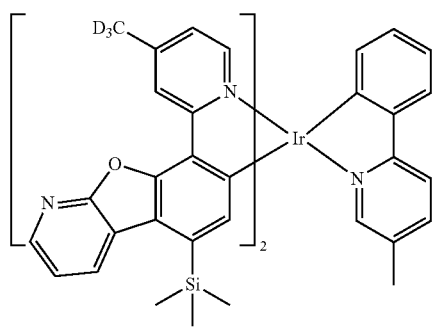
281 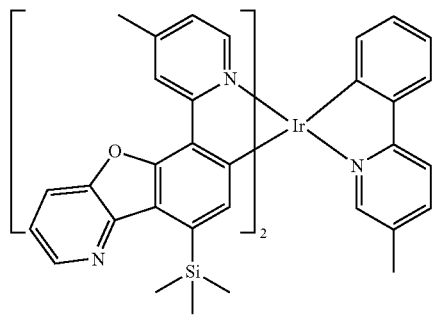

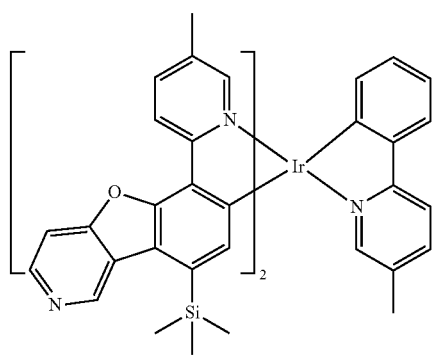
282
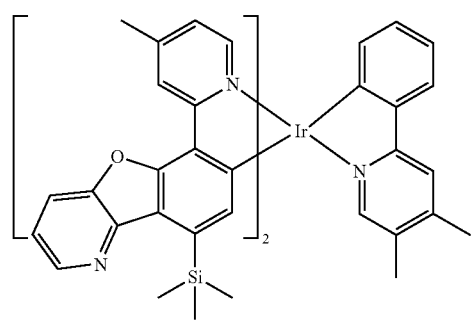
311
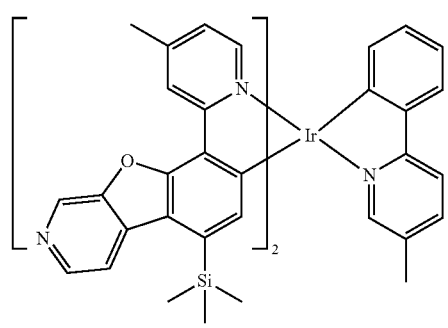
283
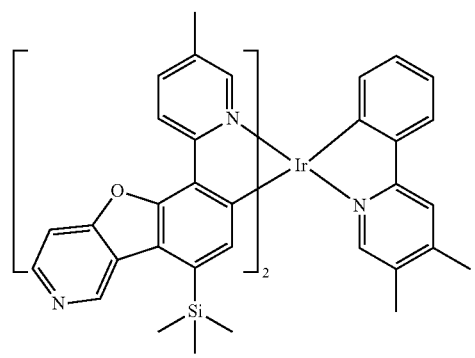
312
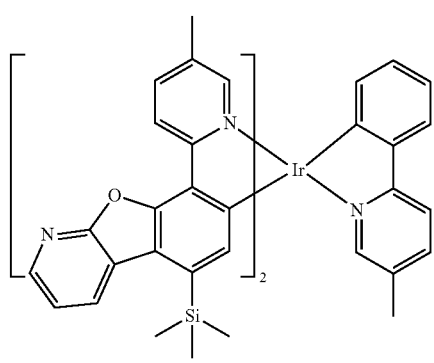
284
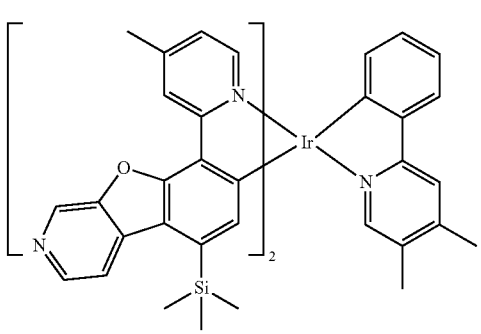
313
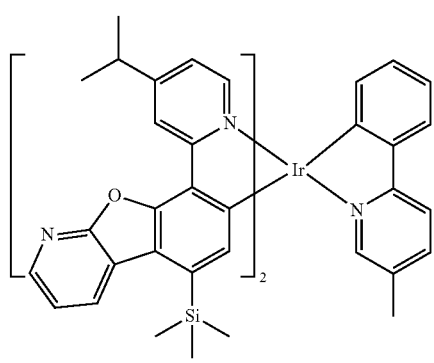
285
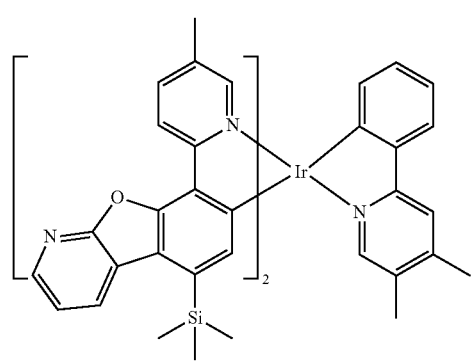
314

315
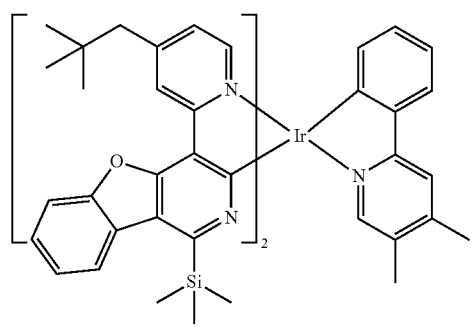
341
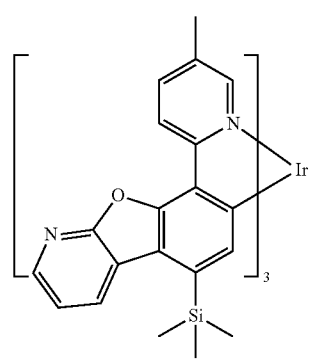
342
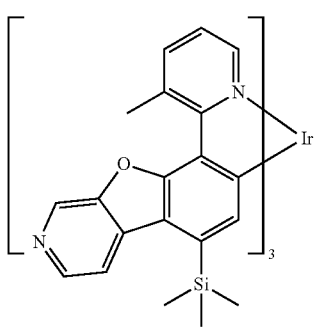
343
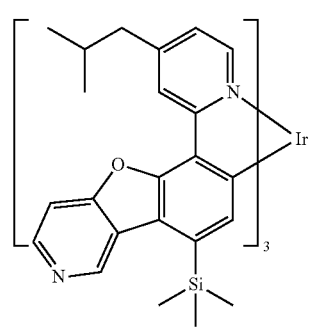
344
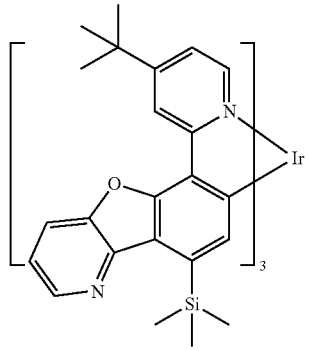
345
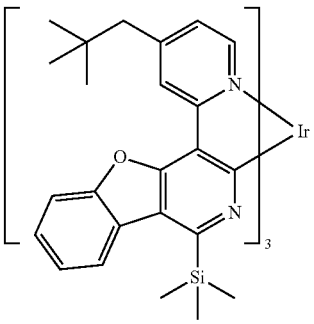
376
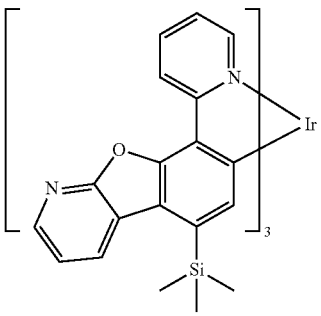
377
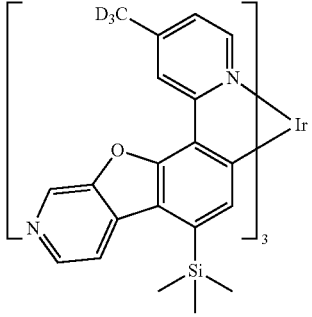
378
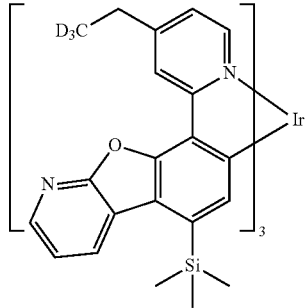

-continued
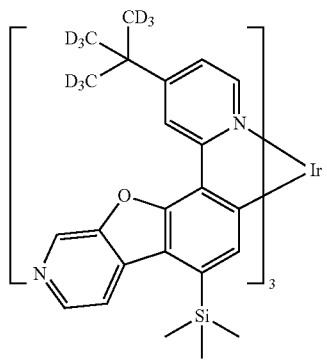
379
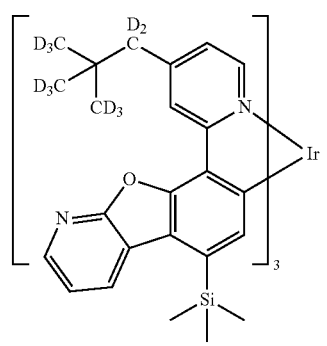
380
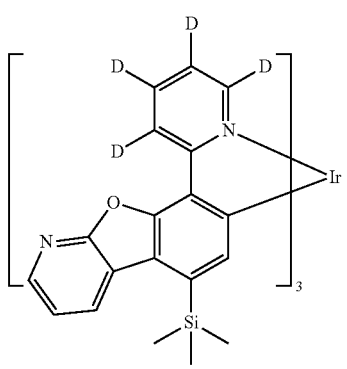
381
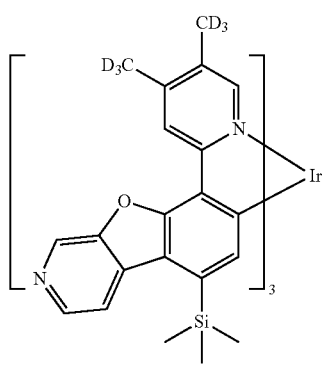
382
-continued
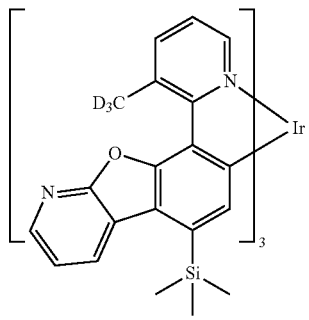
383
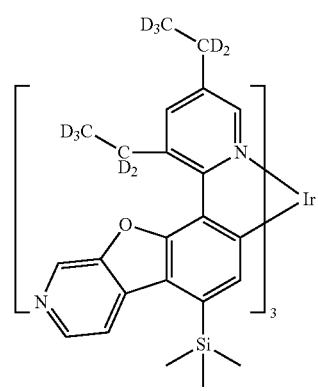
384
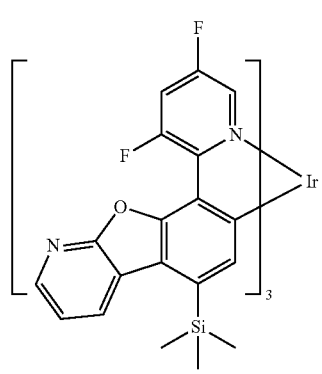
385
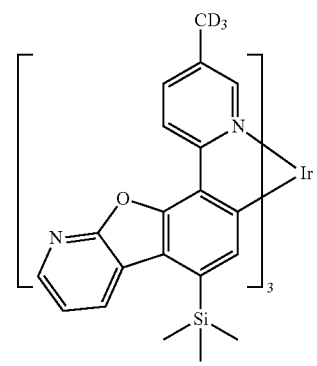
386

-continued

387
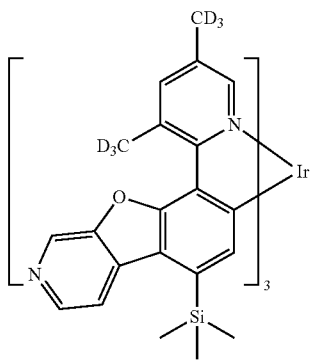

388
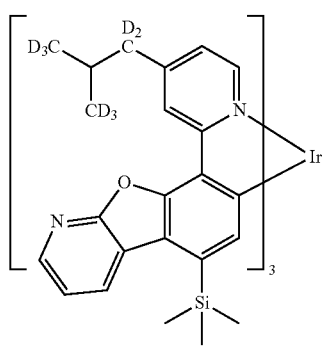

389
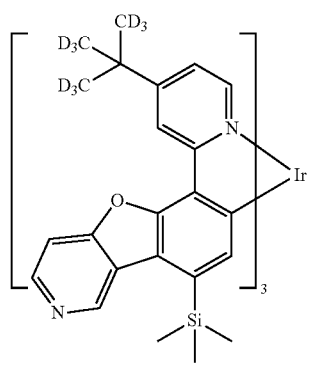

390
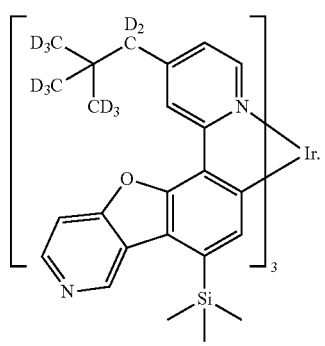

19. An organometallic compound represented by Formula 2-2:

[Formula 2-2]
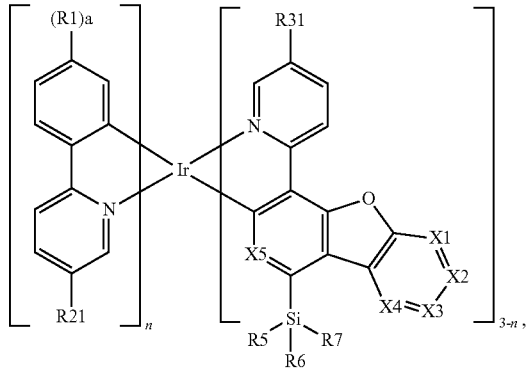

wherein each of X1 to X5 is independently N or CR4, wherein each of R1, R21, and R31 is independently selected from the group consisting of C1 to C10 alkyl group unsubstituted or substituted with deuterium (D) or halogen atom and C3 to C20 cycloalkyl group unsubstituted or substituted with D, wherein R4 is selected from the group consisting of hydrogen (H), D, halogen atom, C1 to C10 alkyl group unsubstituted or substituted with D, C3 to C20 cycloalkyl group unsubstituted or substituted with D, C6 to C30 aryl group unsubstituted or substituted with D or C1 to C10 alkyl and C3 to C30 heteroaryl group unsubstituted or substituted with D or C1 to C10 alkyl, wherein each of R5, R6 and R7 is independently C1 to C10 alkyl group, and wherein a is 1, and n is an integer of 0 to 2.

20. The organometallic compound according to claim 19, wherein the organometallic compound is selected from compounds 392, 394, 396, 398, 400, 402 and 403:

392
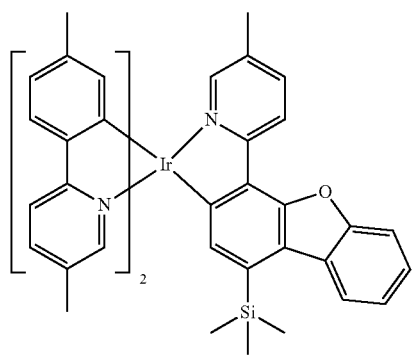

| 199 -continued | 200 -continued |
|---|---|
| 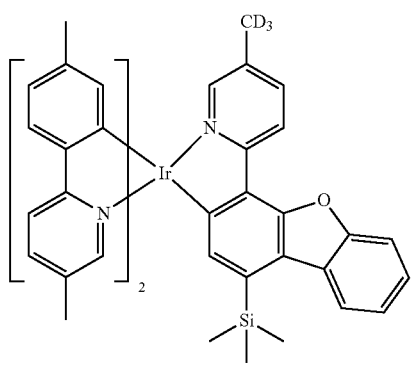 394 | 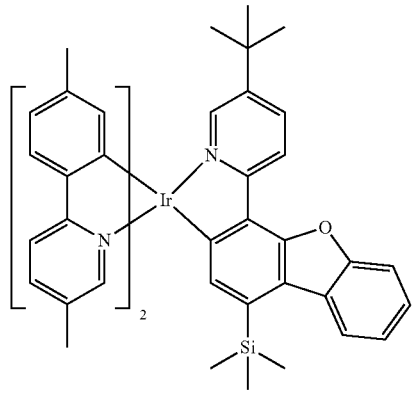 400 |
| 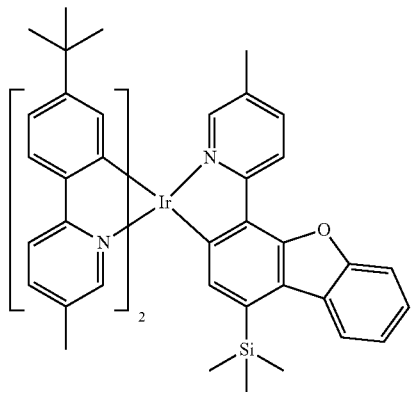 396 | 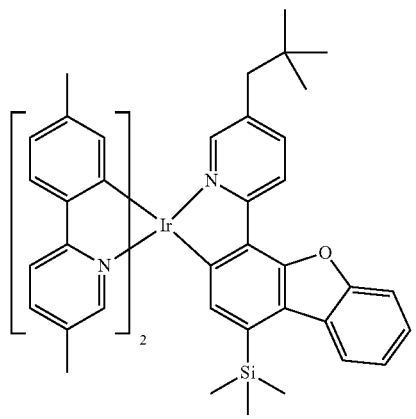 402 |
| 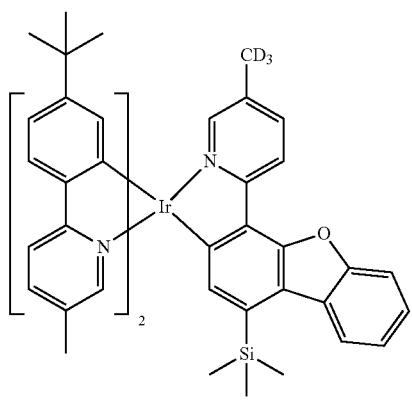 398 | 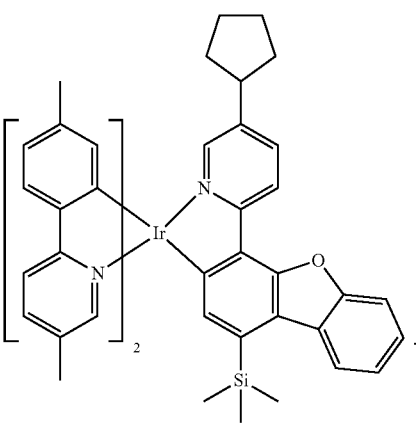 403 |
* * * * *